US011495758B2

(12) United States Patent
Kim et al.

(10) Patent No.: US 11,495,758 B2
(45) Date of Patent: Nov. 8, 2022

(54) COMPOSITION AND ORGANIC LIGHT-EMITTING DEVICE INCLUDING THE SAME

(71) Applicants: Samsung Electronics Co., Ltd., Suwon-si (KR); SAMSUNG SDI CO., LTD., Yongin-si (KR)

(72) Inventors: Sangdong Kim, Seongnam-si (KR); Seungyeon Kwak, Suwon-si (KR); Hyun Koo, Seongnam-si (KR); Sungjun Kim, Seongnam-si (KR); Hyungsun Kim, Suwon-si (KR); Chul Baik, Suwon-si (KR); Myungsun Sim, Suwon-si (KR); Yongtak Yang, Suwon-si (KR); Banglin Lee, Suwon-si (KR); Sunyoung Lee, Seoul (KR); Sunghun Lee, Hwaseong-si (KR); Jeoungin Yi, Seoul (KR); Yuri Cho, Suwon-si (KR); Pyeongseok Cho, Suwon-si (KR); Byoungki Choi, Hwaseong-si (KR); Hyeonho Choi, Seoul (KR); Dalho Huh, Suwon-si (KR); Seokhwan Hong, Seoul (KR)

(73) Assignee: SAMSUNG SDI CO., LTD., Gyeonggi-Do (KR)

( * ) Notice: Subject to any disclaimer, the term of this patent is extended or adjusted under 35 U.S.C. 154(b) by 351 days.

(21) Appl. No.: 16/912,752

(22) Filed: Jun. 26, 2020

(65) Prior Publication Data

US 2021/0009616 A1 Jan. 14, 2021

(30) Foreign Application Priority Data

Jul. 1, 2019 (KR) ........................ 10-2019-0078954

(51) Int. Cl.
*H01L 51/50* (2006.01)
*H01L 51/00* (2006.01)

(52) U.S. Cl.
CPC ...... *H01L 51/0087* (2013.01); *H01L 51/5072* (2013.01); *H01L 2251/552* (2013.01)

(58) Field of Classification Search
None
See application file for complete search history.

(56) References Cited

U.S. PATENT DOCUMENTS 9,917,264 B2 3/2018 Horiuchi et al.
2014/0197389 A1 7/2014 Adamovich et al.
(Continued)

FOREIGN PATENT DOCUMENTS

EP 3435438 A2 1/2019
EP 3439063 A1 2/2019
(Continued)

OTHER PUBLICATIONS

Extended European search report issued by the European Patent Office dated Oct. 27, 2020 in the examination of the European Patent Application No. 20182208.7, which corresponds to the U.S. Application above.
(Continued)

*Primary Examiner* — Gregory D Clark
(74) *Attorney, Agent, or Firm* — Cantor Colburn LLP

(57) ABSTRACT

A composition including a platinum-containing organometallic compound, a first compound, a second compound, and a third compound, and an organic light-emitting device including the same wherein the composition does not comprise iridium, the Pt-containing organometallic compound, the first compound, the second compound, and the third compound are different from each other, the first compound comprises at least one electron transport moiety, the second compound and the third compound do not include a metal, each of an absolute value of a HOMO energy level of the second compound and an absolute value of a HOMO energy level of the third compound is 5.30 eV to 5.85 eV, the difference between the absolute value of the HOMO energy level of the second compound and the absolute value of the HOMO energy level of the third compound is 0.01 eV to 0.30 eV.

20 Claims, 1 Drawing Sheet

(56) References Cited

U.S. PATENT DOCUMENTS

| | | | |
|---|---|---|---|
| 2015/0295188 A1 | 10/2015 | Kosuge et al. | |
| 2015/0357587 A1 | 12/2015 | Kishino et al. | |
| 2016/0072078 A1 | 3/2016 | Lee et al. | |
| 2016/0240800 A1 | 8/2016 | Ma et al. | |
| 2018/0013078 A1 | 1/2018 | Lee et al. | |
| 2018/0233679 A1 | 8/2018 | Baik et al. | |
| 2020/0168818 A1* | 5/2020 | Lin | C09K 11/06 |

FOREIGN PATENT DOCUMENTS

| | | |
|---|---|---|
| JP | 5984689 B2 | 9/2016 |
| KR | 1020160026744 A | 3/2016 |
| KR | 1020180005128 | 1/2018 |

OTHER PUBLICATIONS

Shiu-Lun Lai, et al., High Effi ciency White Organic Light-Emitting Devices Incorporating Yellow Phosphorescent Platinum(II) Complex and Composite Blue Host, Adv. Funct. Mater. 2013, 23, 5168-5176.

* cited by examiner

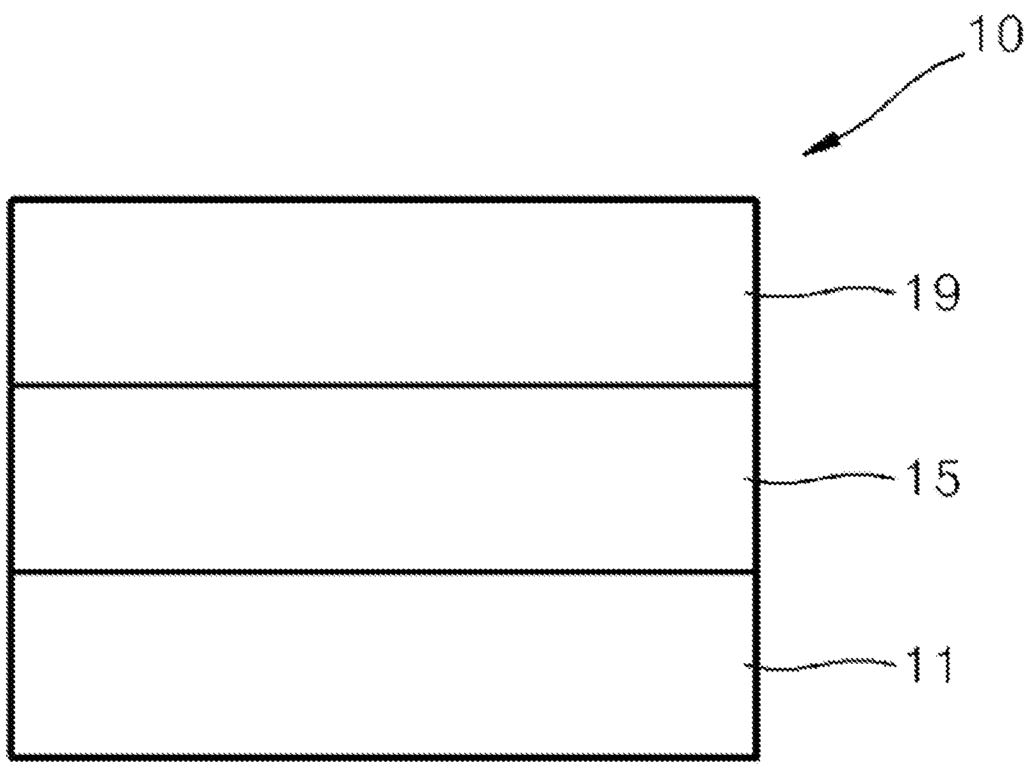
10
19
15
11

COMPOSITION AND ORGANIC LIGHT-EMITTING DEVICE INCLUDING THE SAME

CROSS-REFERENCE TO RELATED APPLICATION

This application claims the priority to and the benefit of Korean Patent Application No. 10-2019-0078954, filed on Jul. 1, 2019, in the Korean Intellectual Property Office, and all the benefits accruing under 35 U.S.C. § 119, the content of which is incorporated herein in its entirety by reference.

BACKGROUND

1. Field

One or more embodiments relate to a composition and an organic light-emitting device including the same.

2. Description of the Related Art

Organic light-emitting devices are self-emission devices, which have better characteristics in terms of viewing angle, response time, brightness, driving voltage, and response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

SUMMARY

One or more embodiments relate to a novel composition and an organic light-emitting device including the same.

Additional aspects will be set forth in part in the description which follows and, in part, will be apparent from the description, or may be learned by practice of the presented embodiments.

An aspect of the present disclosure provides a composition including:

a platinum (Pt)-containing organometallic compound, a first compound, a second compound, and a third compound, wherein the composition does not include iridium (Ir), the Pt-containing organometallic compound, the first compound, the second compound, and the third compound are different from each other, the first compound includes at least one electron transport moiety, the second compound and the third compound do not include a metal, each of an absolute value of a highest occupied molecular orbital (HOMO) energy level of the second compound and an absolute value of a HOMO energy level of the third compound is 5.30 eV to 5.85 eV, the difference between the absolute value of the HOMO energy level of the second compound and the absolute value of the HOMO energy level of the third compound is 0.01 eV to 0.30 eV, and each of the HOMO energy level of the second compound and the HOMO energy level of the third compound is measured using a photoelectron spectrometer in air.

Another aspect of the present disclosure provides an organic light-emitting device including: a first electrode; a second electrode; and an organic layer disposed between the first electrode and the second electrode and including an emission layer, wherein the organic layer includes the composition.

BRIEF DESCRIPTION OF THE DRAWING

These and/or other aspects will become apparent and more readily appreciated from the following description of the embodiments, taken in conjunction with FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as “lower” or “bottom” and “upper” or “top,” may be used herein to describe one element’s relationship to another element as illustrated in the FIGURES. It will be understood that relative terms are intended to encompass different orientations of the device in addition to the orientation depicted in the FIGURES. For example, if the device in one of the FIGURES is turned over, elements described as being on the “lower” side of other elements would then be oriented on “upper” sides of the other elements. The exemplary term “lower,” can therefore, encompasses both an orientation of “lower” and “upper,” depending on the particular orientation of the FIGURE. Similarly, if the device in one of the FIGURES is turned over, elements described as “below” or “beneath” other elements would then be oriented “above” the other elements. The exemplary terms “below” or “beneath” can, therefore, encompass both an orientation of above and below.

“About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing For example, a region illustrated or described as flat may, typically, have rough and/or nonlinear features Moreover, sharp angles that are illustrated may be rounded. Thus, the regions illustrated in the figures are schematic in nature and their shapes are not intended to illustrate the precise shape of a region and are not intended to limit the scope of the present claims.

A composition according to an aspect of the present disclosure may include a platinum (Pt)-containing organometallic compound, a first compound, a second compound, and a third compound. The Pt-containing organometallic compound, the first compound, the second compound, and the third compound will be described in detail below.

The composition may not include iridium (Ir).

The Pt-containing organometallic compound, the first compound, the second compound, and the third compound included in the composition may be different from each other. That is, the composition may include 4 or more different compounds.

In one or more embodiments, the Pt-containing organometallic compound may include Pt and an organic ligand, and the Pt and the organic ligand may form 1, 2, 3, or 4 cyclometallated ring(s).

In one or more embodiments, the Pt-containing organometallic compound may include Pt and a tetradentate organic ligand, and the Pt and the tetradentate organic ligand may form 3 or 4 cyclometallated rings.

In one or more embodiments, the Pt-containing organometallic compound may include Pt and a tetradentate organic ligand, and the tetradentate organic ligand may include a benzimidazole group and a pyridine group. Each of the benzimidazole group and the pyridine group may be directly linked to the Pt of the Pt-containing organometallic compound.

An absolute value of a highest occupied molecular orbital (HOMO) energy level of the Pt-containing organometallic compound may be 5.25 eV to 5.55 eV.

The first compound may include at least one electron transport moiety.

In the present specification, the term “electron transport moiety” may be a cyano group, a fluoro group, a π-electron-deficient nitrogen-containing cyclic group, a group represented by one of the following formulae, or any combination thereof:

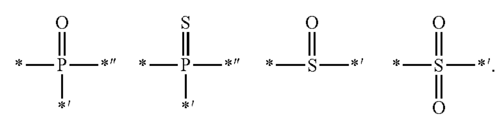

In the formulae above, *, *', and *" each indicate a binding site to a neighboring atom.

Neither of the second compound and third compound may include a metal.

For example, each of the absolute value of the HOMO energy level of the second compound and the absolute value of the HOMO energy level of the third compound may be 5.30 eV to 5.85 eV, for example, 5.50 eV to 5.75 eV.

The difference between the absolute value of the HOMO energy level of the second compound and the absolute value of the HOMO energy level of the third compound may be 0.01 eV to 0.30 eV, for example, 0.05 eV to 0.10 eV. When the difference between the absolute value of the HOMO energy level of the second compound and the absolute value of the HOMO energy level of the third compound is satisfied within the ranges above, the effective HOMO energy disorder parts of the Gaussian disorder model (GDM) are increased to facilitate hole transfer among the Pt-containing organometallic compound, the second compound, and the third compound, and the positive polaron density of the Pt-containing organometallic compound may be maintained at a high level. Accordingly, an electronic device, for example, an organic light-emitting device, including the composition may have high external quantum luminescence efficiency, low driving voltage, and high lifetime characteristics.

In one or more embodiments, at least one of the second compound and the third compound (for example, all of the second compound and the third compound) may not include the electron transport moiety.

In one or more embodiments, the first compound may include at least one π-electron-rich $C_3$-$C_{30}$ cyclic group and at least one electron transport moiety, and at least one of the second compound and the third compound (for example, all of the second compound and the third compound) may each independently include at least one π-electron-rich $C_3$-$C_{30}$ cyclic group and may not include the electron transport moiety.

In one or more embodiments, at least one of the second compound and the third compound (for example, all of the second compound and the third compound) may each independently be:

i) a condensed ring in which one or more fifth rings and one or more sixth rings are condensed with each other, ii) a group represented by

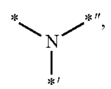

or iii) any combination thereof, wherein the fifth ring may be a cyclopentadiene group, a pyrrole group, a furan group, a thiophene group, or a silole group, the sixth ring may be a π-electron-rich $C_3$-$C_{30}$ cyclic group, and

*, *', and *" each indicate a binding site to a neighboring atom.

In the present specification, the HOMO energy level of each of the Pt-containing organometallic compound, the first compound, the second compound, and the third compound may be measured using a photoelectron spectrometer (for example, AC3 manufactured by RIKEN KEIKI Co., Ltd.) in air.

In one or more embodiments, the Pt-containing organometallic compound may be an organometallic compound represented by Formula 1, and/or the first compound may be a compound represented by Formula 2, and/or the second compound and the third compound may each independently be a compound represented by one of Formulae 3-1 to 3-4:

Formula 1

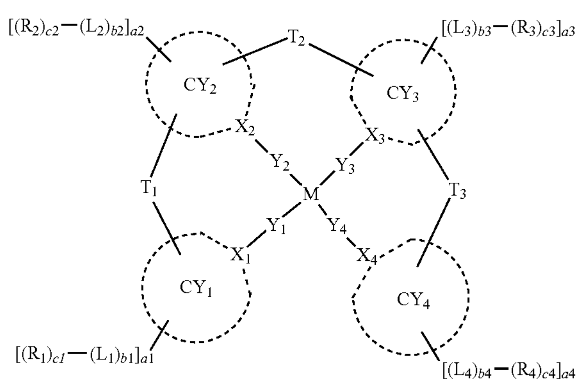

Formula 2

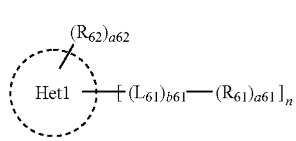

-continued

Formula 3-1

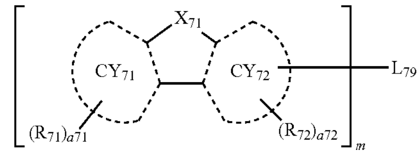

Formula 3-2

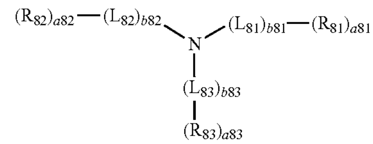

Formula 3-3

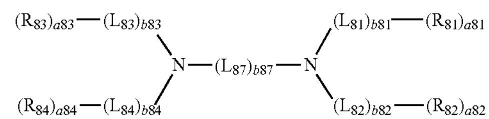

Formula 3-4

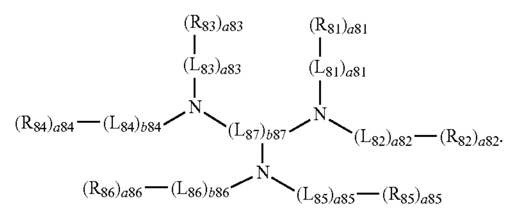

In Formula 1, M may be Pt.

In Formula 1, $Y_1$ to $Y_4$ may each independently be a chemical bond (e.g., a covalent bond or a coordinate bond), O, S, $N(R_a)$, $C(R_a)(R_b)$, or $Si(R_a)(R_b)$. When $Y_1$ is a chemical bond, $X_1$ may directly bind to M, when $Y_2$ is a chemical bond, $X_2$ may directly bind to M, when $Y_3$ is a chemical bond, $X_3$ may directly bind to M, and when $Y_4$ is a chemical bond, $X_4$ may directly bind to M.

For example, in Formula 1, $Y_1$ may be O or S, and $Y_2$ to $Y_4$ may be chemical bonds.

In Formula 1, $X_1$ to $X_4$ may each independently be C or N.

In one or more embodiments, in Formula 1, $Y_1$ may be O or S, $Y_2$ to $Y_4$ may each be a chemical bond, $X_1$ and $X_3$ may each be C, and $X_2$ and $X_4$ may each independently be N, but embodiments of the present disclosure are not limited thereto.

In Formula 1, two bonds among a bond between M and $Y_1$ or $X_1$, a bond between M and $Y_2$ or $X_2$, a bond between M and $Y_3$ or $X_3$, and a bond between M and $Y_4$ or $X_4$ may be coordinate bonds, and the other two bonds may each be covalent bonds. Therefore, the organometallic compound represented by Formula 1 may be electrically neutral.

For example, $Y_1$ may not be a chemical bond. $Y_2$ to $Y_4$ may each be a chemical bond. A bond between $Y_1$ and M and a bond between $X_3$ and M may be covalent bonds. A bond between $X_2$ and M and a bond between $X_4$ and M may be coordinate bonds.

In Formula 1, ring $CY_1$ to ring $CY_4$ may each independently be a $C_5$-$C_{30}$ carbocyclic group or a $C_1$-$C_{30}$ heterocyclic group.

In one or more embodiments, in Formula 1, ring $CY_1$ to ring $CY_4$ may each independently be i) a first ring, ii) a second ring, iii) a condensed ring in which two or more first rings are condensed with each other, iv) a condensed ring in which two or more second rings are condensed with each other, or v) a condensed ring in which one or more first rings are condensed with one or more second rings, wherein the first ring may be a cyclohexane group, a cyclohexene group, an adamantane group, a norbornane group, a norbornene group, a benzene group, a pyridine group, a pyrimidine group, a pyrazine group, a pyridazine group, or a triazine group, and the second ring may be a cyclopentane group, a cyclopentene group, a cyclopentadiene group, a furan group, a thiophene group, a silole group, a pyrrole group, a pyrazole group, an imidazole group, a triazole group, an oxazole group, an isoxazole group, a thiazole group, an isothiazole group, an azasilole group, an oxadiazole group, or thiadiazole group.

In one or more embodiments, in Formula 1, ring $CY_1$ to ring $CY_4$ may each independently be a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, ring $CY_1$ in Formula 1 may be a group represented by one of Formulae CY1-1 to CY1-26, and/or ring $CY_2$ in Formula 1 may be a group represented by one of Formulae CY2-1 to CY2-19, and/or ring $CY_3$ in Formula 1 may be a group represented by one of Formulae CY3-1 to CY3-18, and/or ring $CY_4$ in Formula 1 may be a group represented by one of Formulae CY4-1 to CY4-26:

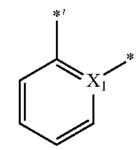
CY1-1

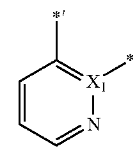
CY1-2

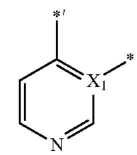
CY1-3

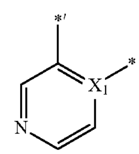
CY1-4

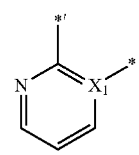
CY1-5

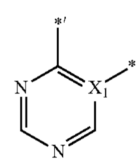
CY1-6

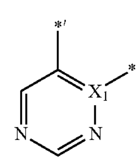
CY1-7

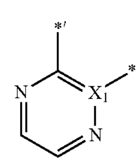
CY1-8

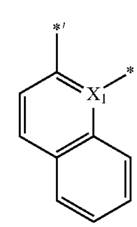
CY1-9

-continued
CY1-10
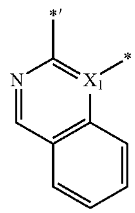
CY1-11
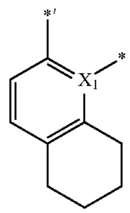
CY1-12
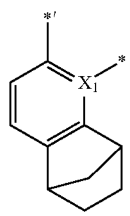
CY1-13
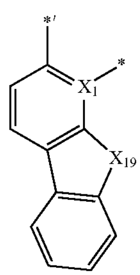
CY1-14
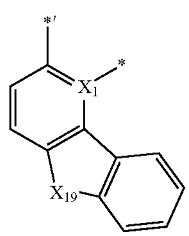
CY1-15
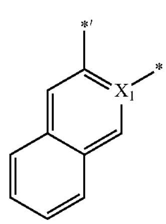
CY1-16
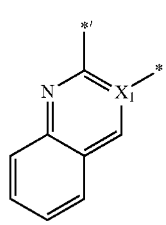
-continued
CY1-17
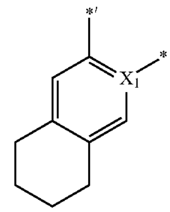
CY1-18
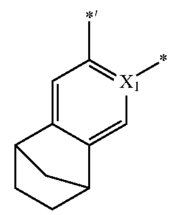
CY1-19
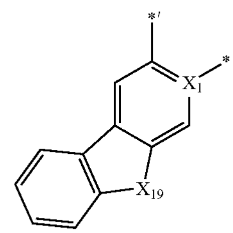
CY1-20
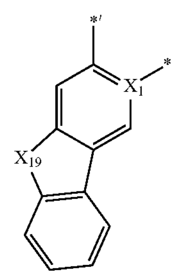
CY1-21
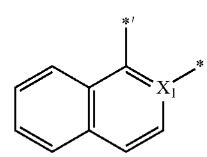
CY1-22
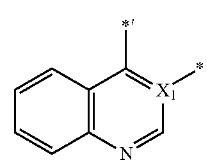
CY1-23
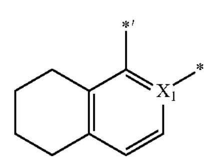
CY1-24
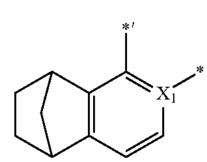

-continued
CY1-24
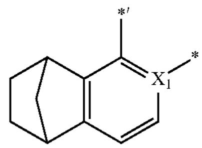
CY1-25
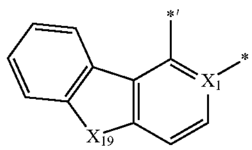
CY1-26
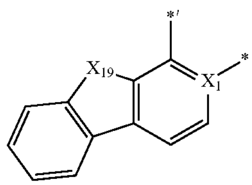
CY2-1
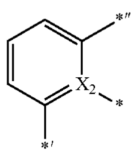
CY2-2
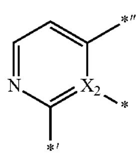
CY2-3
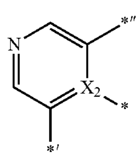
CY2-4
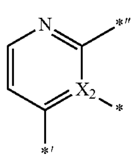
CY2-5
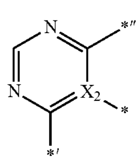
CY2-6
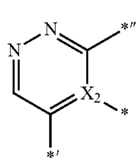
-continued
CY2-7
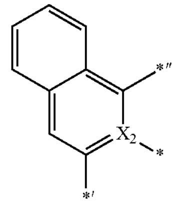
CY2-8
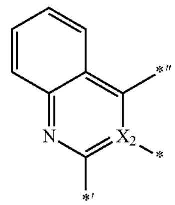
CY2-9
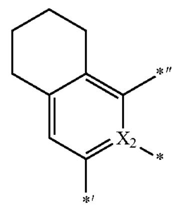
CY2-10
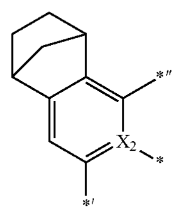
CY2-11
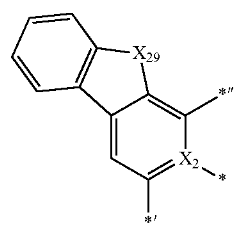
CY2-12
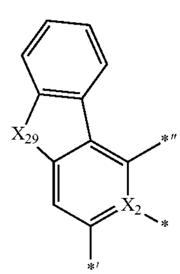
CY2-13
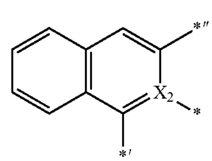

-continued
CY2-14
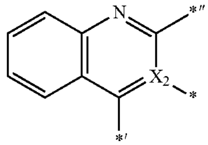
CY2-15
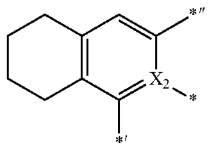
CY2-16
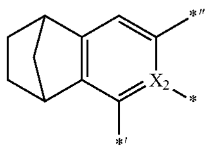
CY2-17
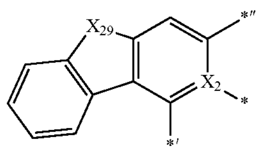
CY2-18
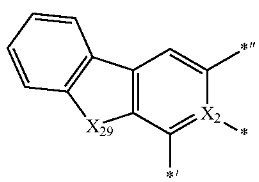
CY2-19
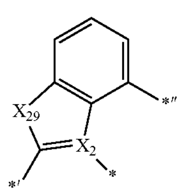
CY3-1
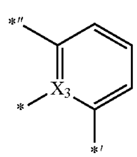
CY3-2
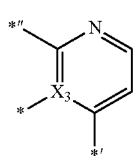
CY3-3
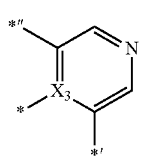
CY3-4
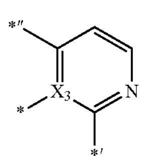
-continued
CY3-5
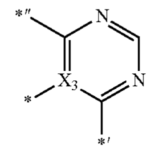
CY3-6
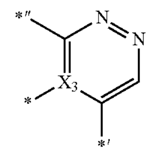
CY3-7
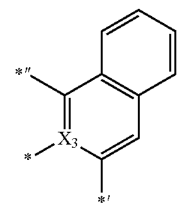
CY3-8
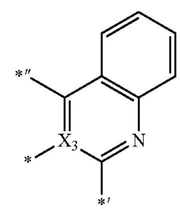
CY3-9
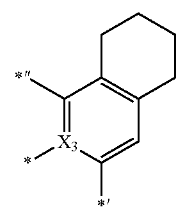
CY3-10
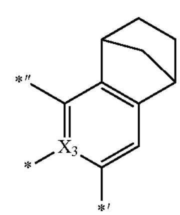
CY3-11
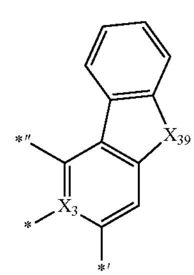

-continued
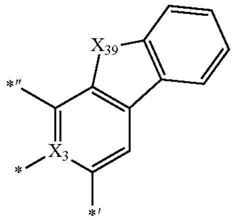
CY3-12
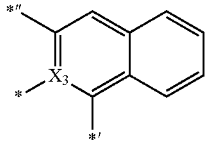
CY3-13
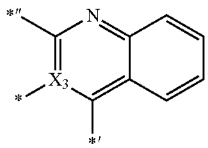
CY3-14
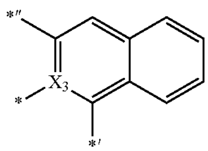
CY3-15
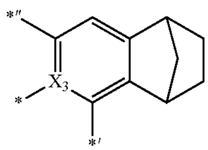
CY3-16
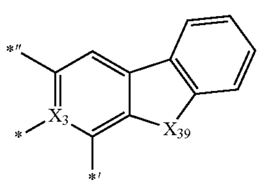
CY3-17
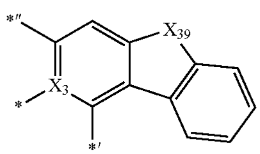
CY3-18
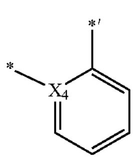
CY4-1
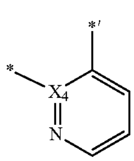
CY4-2
-continued
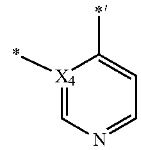
CY4-3
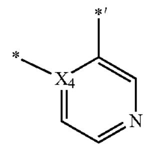
CY4-4
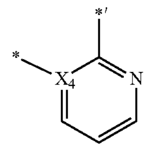
CY4-5
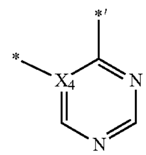
CY4-6
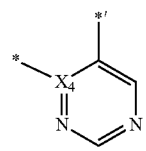
CY4-7
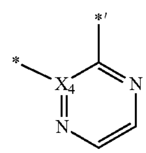
CY4-8
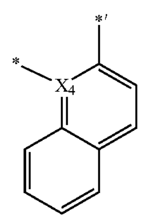
CY4-9
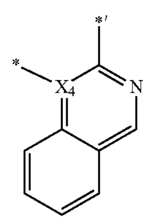
CY4-10
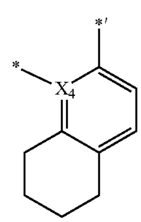
CY4-11

-continued
CY4-12
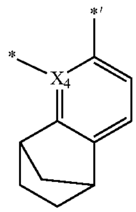
CY4-13
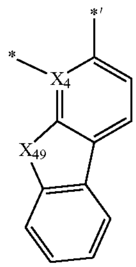
CY4-14
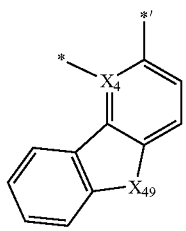
CY4-15
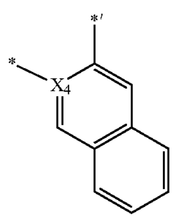
CY4-16
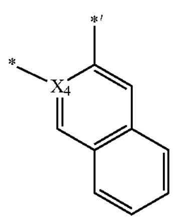
CY4-17
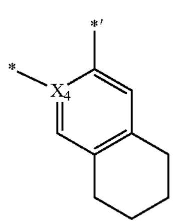
CY4-18
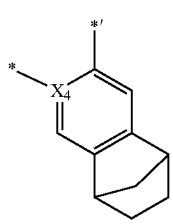
-continued
CY4-19
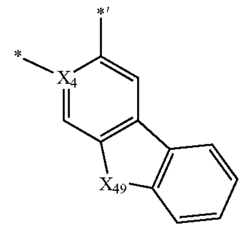
CY4-20
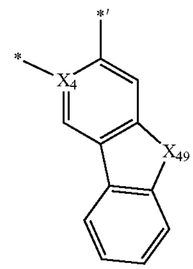
CY4-21
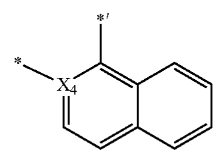
CY4-22
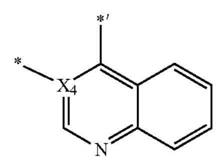
CY4-23
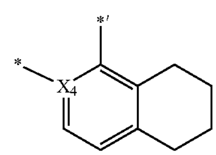
CY4-24
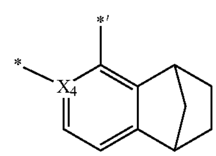
CY4-25
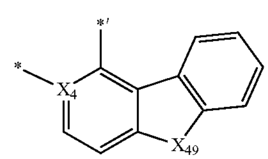
CY4-26
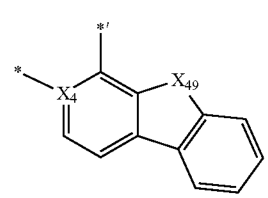
In Formulae CY1-1 to CY1-26, $X_{19}$ may be O, S, $C(R_{17})(R_{18})$, $Si(R_{17})(R_{18})$, or $N-[(L_{19})_{b19}-(R_{19})_{c19}]$, $R_{17}$ to $R_{19}$ may each be the same as defined in connection with $R_1$, $L_{19}$, b19, and c19 may each be the same as defined in connection with $L_1$, b1, and c1, respectively, * indicates a binding site to M or $Y_1$ in Formula 1, and *' indicates a binding site to $T_1$ or ring $CY_2$ in Formula 1.

In Formulae CY2-1 to CY2-19, $X_{29}$ may be O, S, $C(R_{27})(R_{28})$, $Si(R_{27})(R_{28})$, or $N-[(L_{29})_{b29}-(R_{29})_{c29}]$, $R_{27}$ to $R_{29}$ may each be the same as defined in connection with $R_2$, $L_{29}$, b29, and c29 may each be the same as defined in connection with $L_2$, b2, and c2, respectively, * indicates a binding site to M or $Y_2$ in Formula 1, *' indicates a binding site to $T_1$ or ring $CY_1$ in Formula 1, and *" indicates a binding site to $T_2$ or ring $CY_3$ in Formula 1.

In Formulae CY3-1 to CY3-18, $X_{39}$ may be O, S, $C(R_{37})(R_{38})$, $Si(R_{37})(R_{38})$, or $N-[(L_{39})_{b39}-(R_{39})_{c39}]$, $R_{37}$ to $R_{39}$ may each be the same as defined in connection with $R_3$, $L_{39}$, b39, and c39 may each be the same as defined in connection with $L_3$, b3, and c3, respectively, * indicates a binding site to M or $Y_3$ in Formula 1, *" indicates a binding site to $T_2$ or ring $CY_2$ in Formula 1, and *' indicates a binding site to $T_3$ or ring $CY_4$ in Formula 1.

In Formulae CY4-1 to CY4-26, $X_{49}$ may be O, S, $C(R_{47})(R_{48})$, $Si(R_{47})(R_{48})$, or $N-[(L_{49})_{b49}-(R_{49})_{c49}]$, $R_{47}$ to $R_{49}$ may each be the same as defined in connection with $R_4$, $L_{49}$, b49, and c49 may each be the same as defined in connection with $L_4$, b4, and c4, respectively, * indicates a binding site to M or $Y_4$ in Formula 1, and *' indicates a binding site to $T_3$ or ring $CY_3$ in Formula 1.

In Formula 1, $T_1$ may be a single bond, a double bond, $*—N(R_{51})—*'$, $*—B(R_{51})—*'$, $*—P(R_{51})—*'$, $*—C(R_{51})(R_{52})—*'$, $*—Si(R_{51})(R_{52})—*'$, $*—Ge(R_{51})(R_{52})—*'$, *—S—*', *—Se—*', *—O—*', *—C(=O)—*', *—S(=O)—*', $*—S(=O)_2—*$, $*—C(R_{51})=*'$, $*=C(R_{51})—*'$, $*—C(R_{51})=C(R_{52})—*'$, *—C(=S)—*', or *—C≡C—*', $T_2$ may be a single bond, a double bond, $*—N(R_{53})—*'$, $*—B(R_{53})—*'$, $*—P(R_{53})—*'$, $*—C(R_{53})(R_{54})—*'$, $*—Si(R_{53})(R_{54})—*'$, $*—Ge(R_{53})(R_{54})—*'$, *—S—*', *—Se—*', *—O—*, *—C(=O)—*', *—S(=O)—*', $*—S(=O)_2—*'$, $*—C(R_{53})=*'$, $*=C(R_{53})—*'$, $*—C(R_{53})=C(R_{54})—*'$, *—C(=S)—*', or *—C≡C—*', and $T_3$ may be a single bond, a double bond, $*—N(R_{55})—*'$, $*—B(R_{55})—*'$, $*—P(R_{55})—*'$, $*—C(R_{55})(R_{56})—*'$, $*—Si(R_{55})(R_{56})—*$, $*—Ge(R_{55})(R_{56})—*'$, *—S—*', *—Se—*', *—O—*', *—C(=O)—*', *—S(=O)—*', $*—S(=O)_2—*'$, $*—C(R_{55})=*'$, $*=C(R_{55})—*'$, $*—C(R_{55})=C(R_{56})—*'$, *—C(=S)—*', or *—C≡C—*'.

For example, in Formula 1, ring $CY_2$ may be a benzoxazole group, a benzothiazole group, or a benzimidazole group, and $T_1$ to $T_3$ may each be a single bond.

In one or more embodiments, in Formula 1, ring $CY_2$ may be a pyridine group, a pyrimidine group, a pyridazine group, a pyrazine group, a triazine group, a quinoline group, an isoquinoline group, an azafluorene group, an azacarbazole group, an azadibenzofuran group, or an azadibenzothiophene group, and at least one of $T_1$ to $T_3$ may not be a single bond.

In Formula 2, Het1 may be a π-electron-deficient nitrogen-containing $C_1$-$C_{30}$ cyclic group.

In Formula 3-1, ring $CY_{71}$ and ring $CY_{72}$ may each independently be a π-electron-rich $C_3$-$C_{30}$ cyclic group, and ring $CY_{71}$ and ring $CY_{72}$ may optionally be linked to each other via a π-electron-rich $C_3$-$C_{30}$ cyclic group unsubstituted or substituted with at least one $R_{10a}$.

In the present specification, the term "π-electron-deficient nitrogen-containing cyclic group" refers to a heterocyclic group including *=N—*' as a ring-forming moiety, and may be, for example, i) a third ring, ii) a condensed ring in which two or more third rings are condensed with each other, or iii) a condensed ring in which one or more third rings are condensed with one or more fourth rings. In the present specification, the term "π-electron-deficient nitrogen-containing $C_1$-$C_{30}$ cyclic group" refers to a π-electron-deficient nitrogen-containing cyclic group having 1 to 30 carbon atoms.

In the present specification, the term "π-electron-rich cyclic group" refers to a carbocyclic or heterocyclic group not including *=N—*' as a ring-forming moiety, and may be, for example, i) a fourth ring or ii) a condensed ring in which two or more fourth rings are condensed with each other. In the present specification, the term "π-electron-rich $C_3$-$C_{30}$ cyclic group" refers to a π-electron-rich cyclic group having 3 to 30 carbon atoms.

In the present specification, the "third ring" may be an imidazole group, a pyrazole group, a thiazole group, an isothiazole group, an oxazole group, an isoxazole group, an azasilole group, a triazole group, a tetrazole group, an oxadiazole group, a thiadiazole group, a pyridine group, a pyrazine group, a pyridazine group, a pyrimidine group, or a triazine group.

In the present specification, the "fourth ring" may be a benzene group, a cyclopentadiene group, a pyrrole group, a furan group, a thiophene group, or a silole group.

The "π-electron-deficient nitrogen-containing cyclic group" may be, for example, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a pyridopyrazine group, a pyrrolophenanthrene group, a furanophenanthrene group, or a thienophenanthrene group, but embodiments of the present disclosure are not limited thereto.

The "π-electron-rich cyclic group" may be, for example, a benzene group, a heptalene group, an indene group, a naphthalene group, an azulene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, a benzofuran group, a benzothiophene group, a benzosilole group, a naphtho pyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, a benzonaphthofuran group, a benzonaphthothiophene group, an (indolo)

phenanthrene group, a (benzofurano)phenanthrene group, or a (benzothieno)phenanthrene group, but embodiments of the present disclosure are not limited thereto.
In one or more embodiments, Het1 in Formula 2 may be a group represented by one of Formulae 2-1 to 2-42:
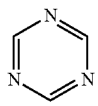
2-1
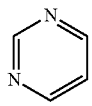
2-2
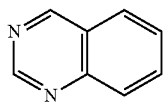
2-3
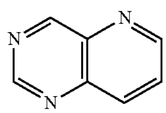
2-4
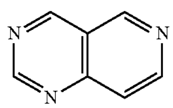
2-5
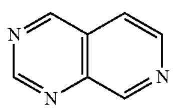
2-6
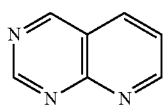
2-7
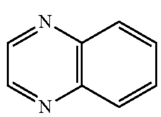
2-8
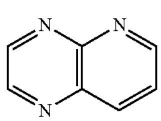
2-9
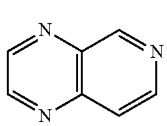
2-10
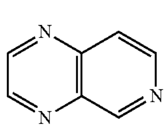
2-11
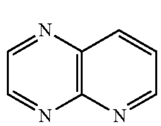
2-12
-continued
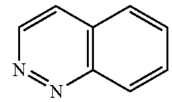
2-13
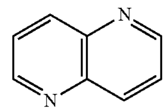
2-14
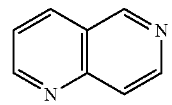
2-15
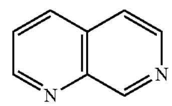
2-16
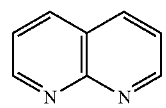
2-17
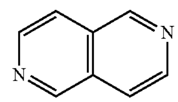
2-18
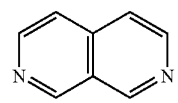
2-19
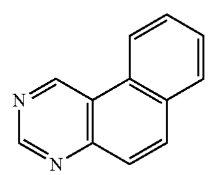
2-20
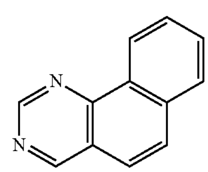
2-21
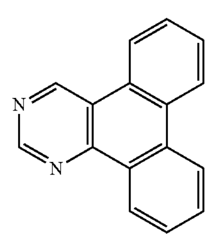
2-22
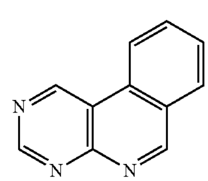
2-23

-continued
2-24
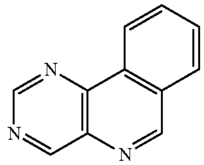
2-25
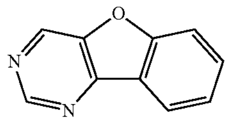
2-26
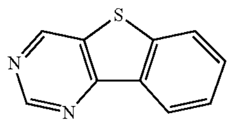
2-27
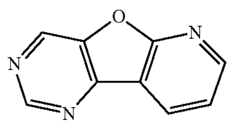
2-28
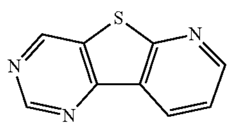
2-29
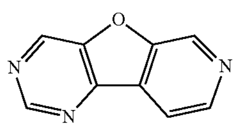
2-30
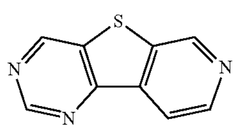
2-31
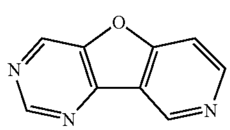
2-32
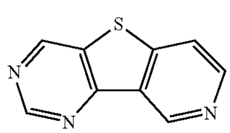
2-33
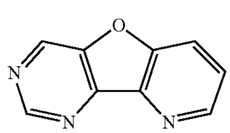
2-34
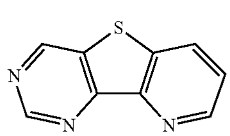
-continued
2-35
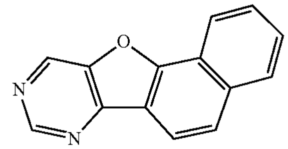
2-36
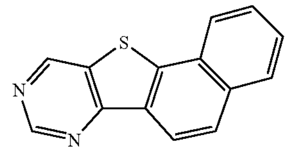
2-37
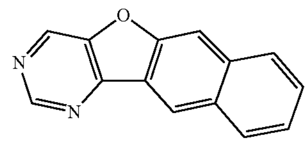
2-38
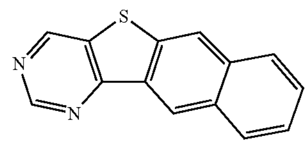
2-39
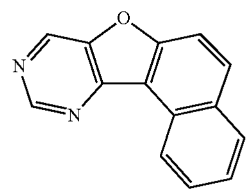
2-40
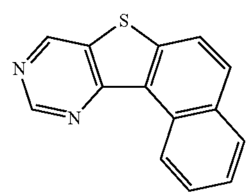
2-41
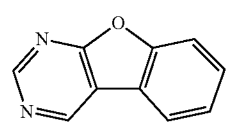
2-42
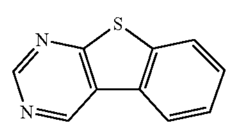
In one or more embodiments, a group represented by
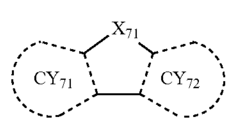
in Formula 3-1 may be a group represented by one of Formulae 3(1) to 3(96):

3(1)
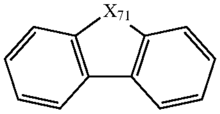
3(2)
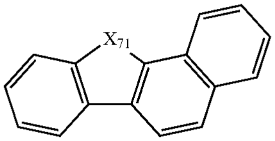
3(3)
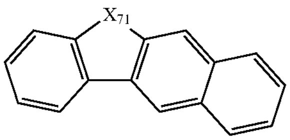
3(4)
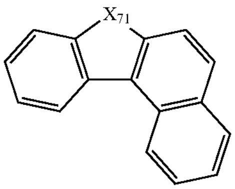
3(5)
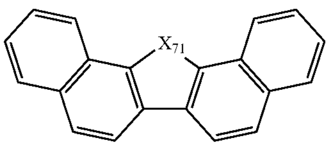
3(6)
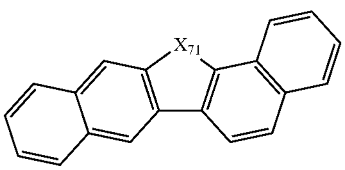
3(7)
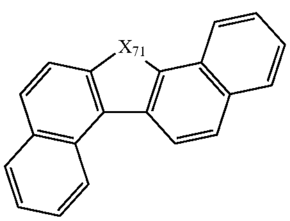
3(8)
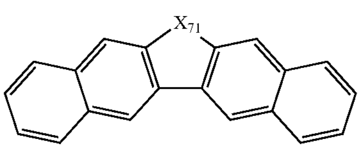
3(9)
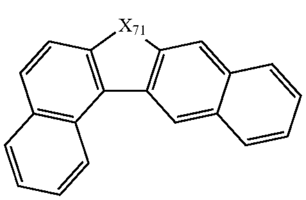
-continued
3(10)
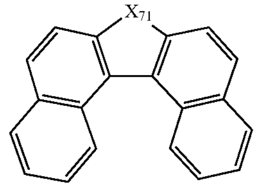
3(11)
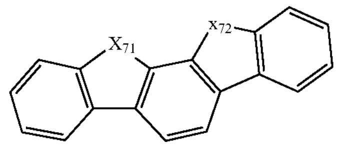
3(12)
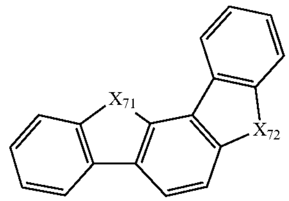
3(13)
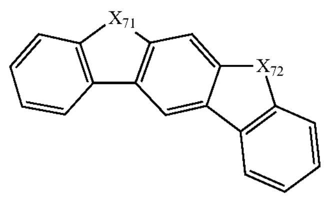
3(14)
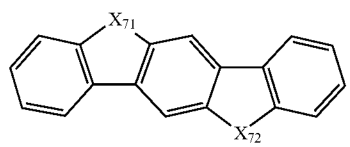
3(15)
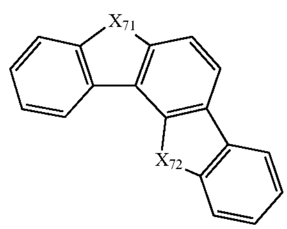
3(16)
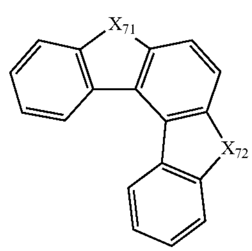
3(17)
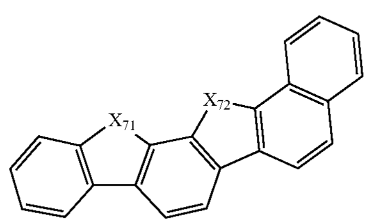

-continued
3(18)
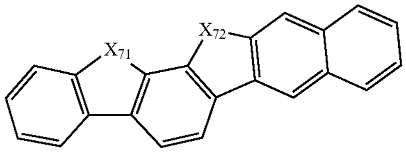
3(19)
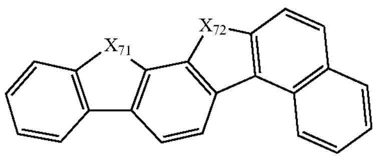
3(20)
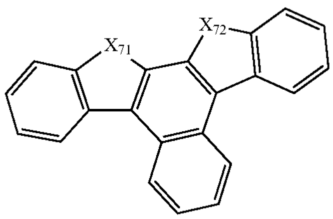
3(21)
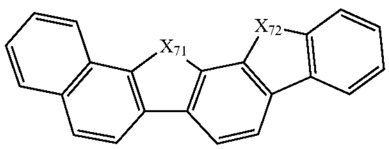
3(22)
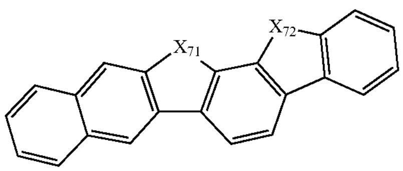
3(23)
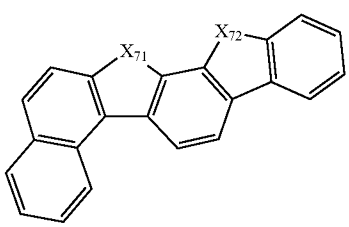
3(24)
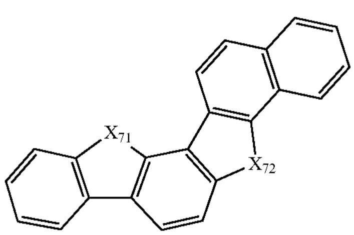
3(25)
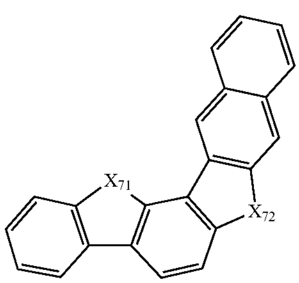
-continued
3(26)
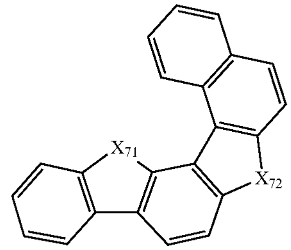
3(27)
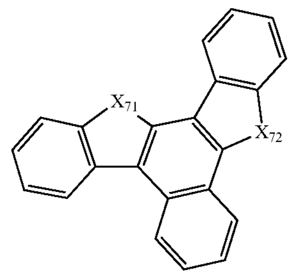
3(28)
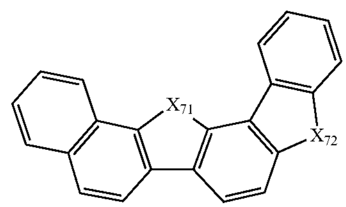
3(29)
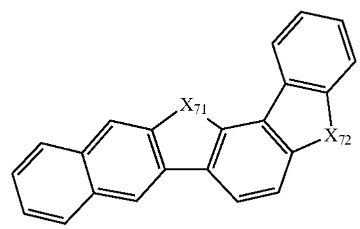
3(30)
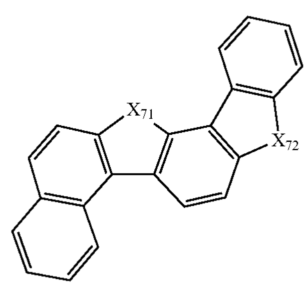
3(31)
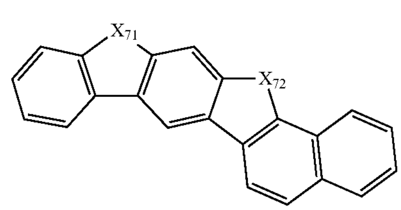

-continued
3(32)
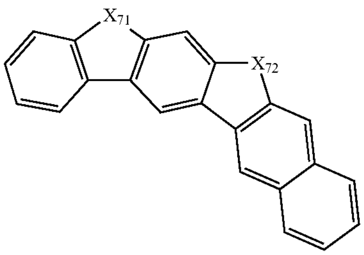
3(33)
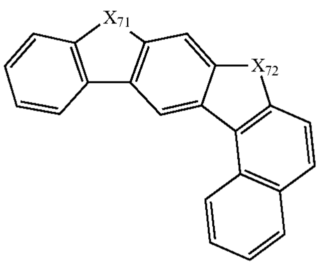
3(34)
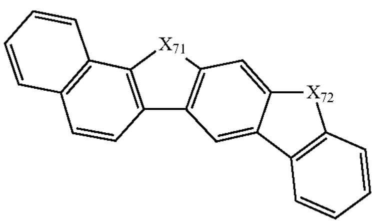
3(35)
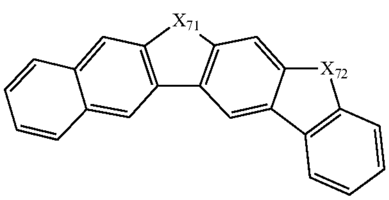
3(36)
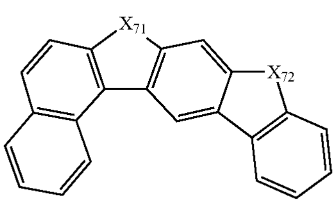
3(37)
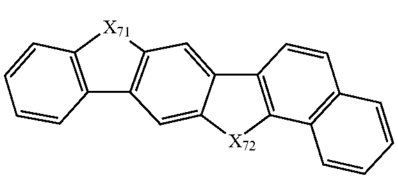
3(38)
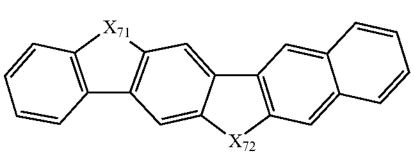
-continued
3(39)
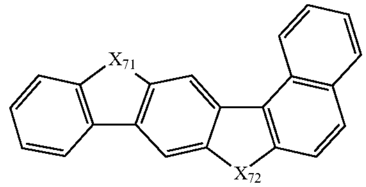
3(40)
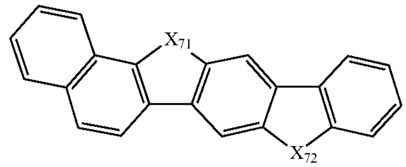
3(41)
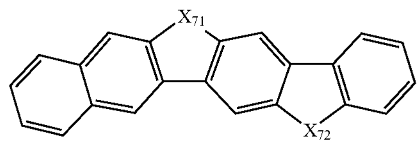
3(42)
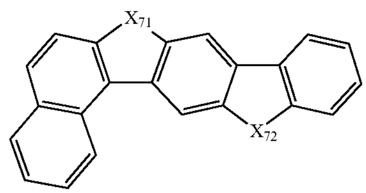
3(43)
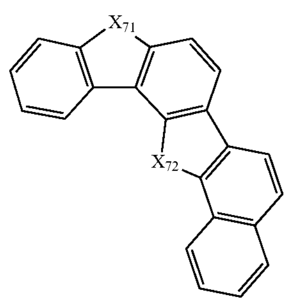
3(44)
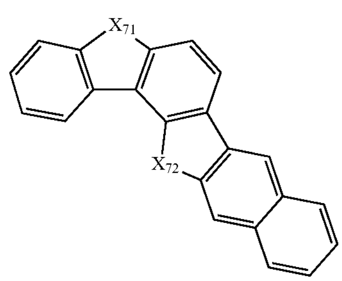
3(45)
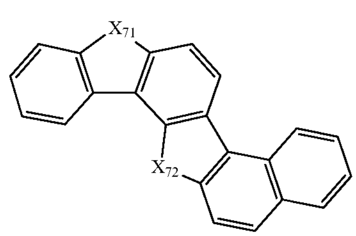

-continued
3(46)
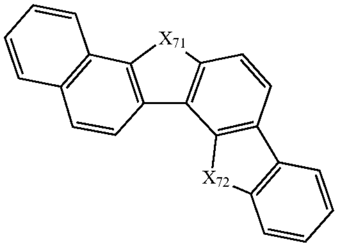
3(47)
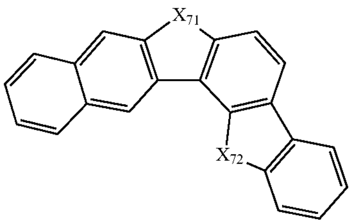
3(48)
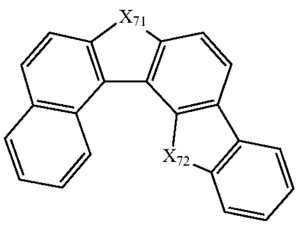
3(49)
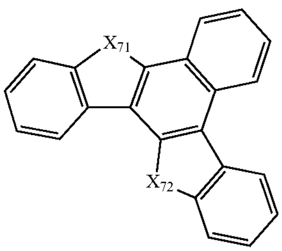
3(50)
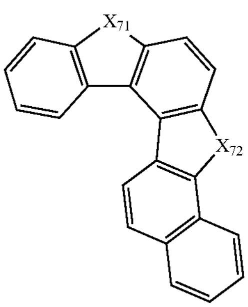
3(51)
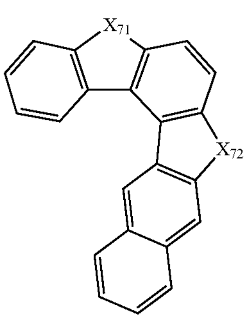
-continued
3(52)
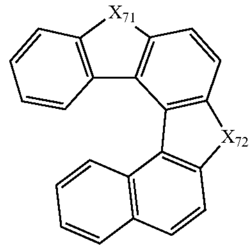
3(53)
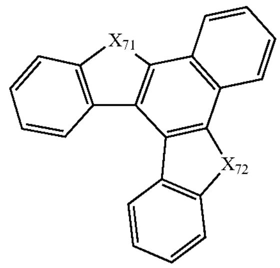
3(54)
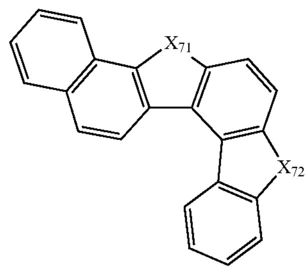
3(55)
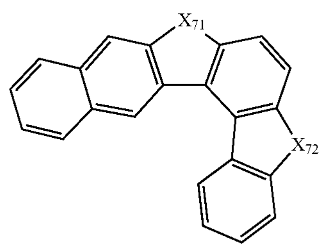
3(56)
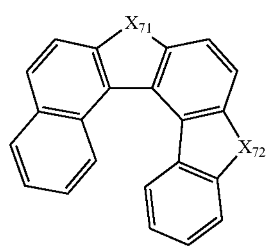
3(57)
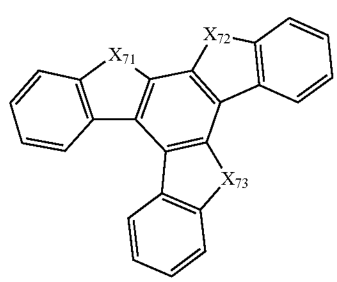

-continued
3(58)
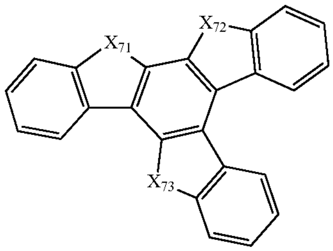
3(59)
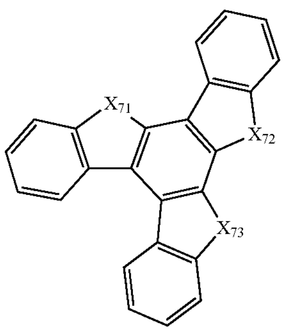
3(60)
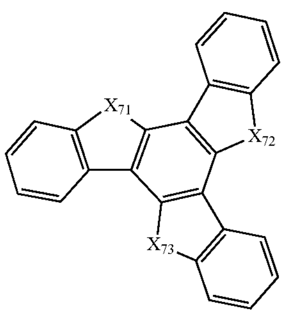
3(61)
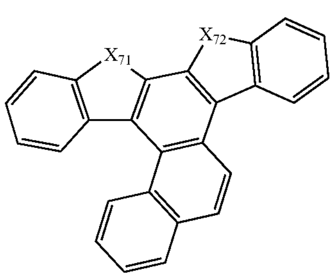
3(62)
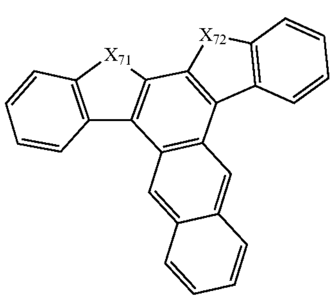
-continued
3(63)
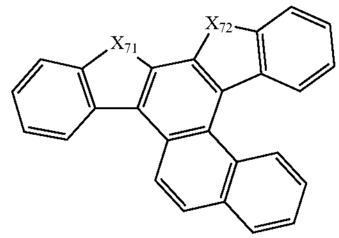
3(64)
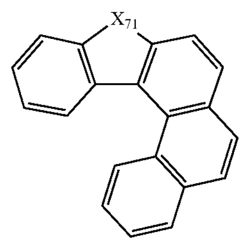
3(65)
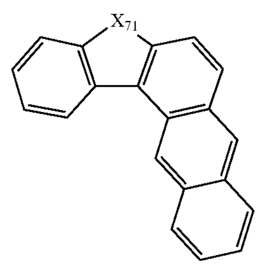
3(66)
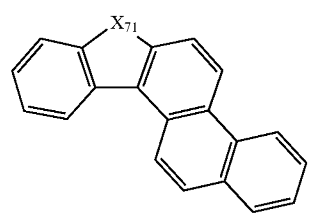
3(67)
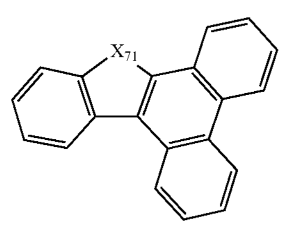
3(68)
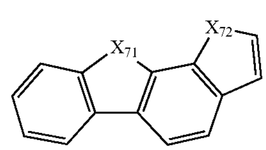
3(69)
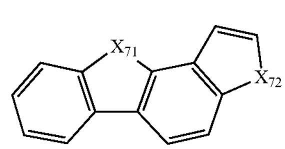
3(70)
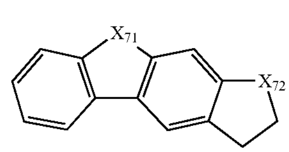

-continued
3(71)
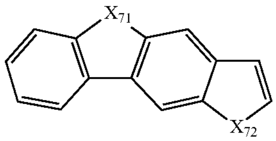
3(72)
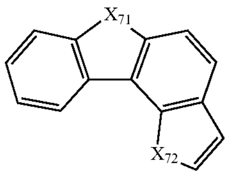
3(73)
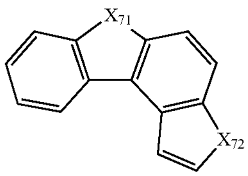
3(74)
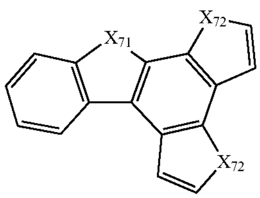
3(75)
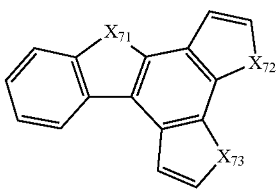
3(76)
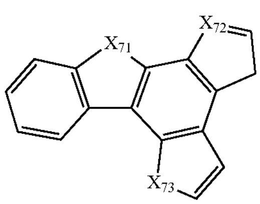
3(77)
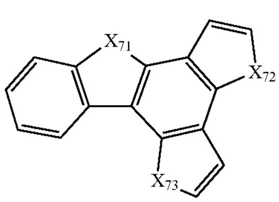
3(78)
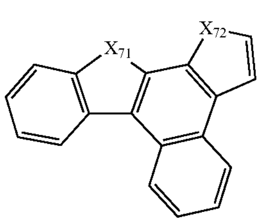
-continued
3(79)
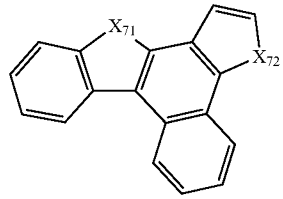
3(80)
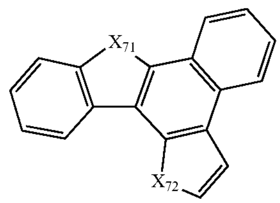
3(81)
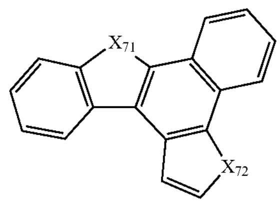
3(82)
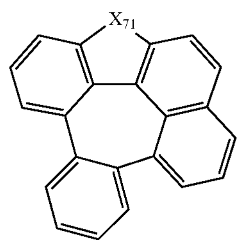
3(83)
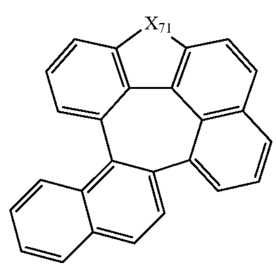
3(84)
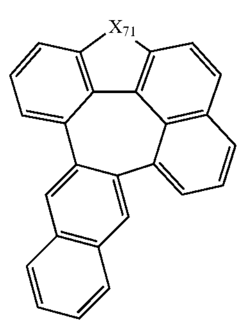

-continued
3(85)
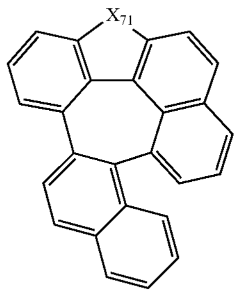
3(86)
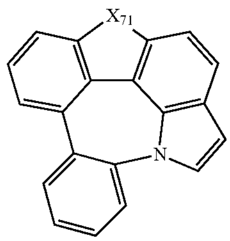
3(87)
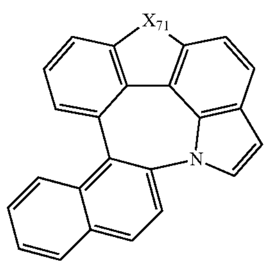
3(88)
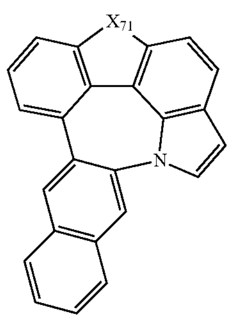
3(89)
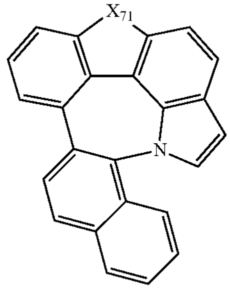
-continued
3(90)
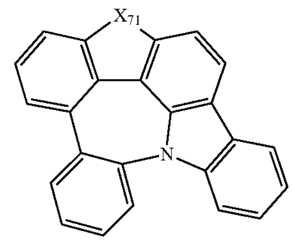
3(91)
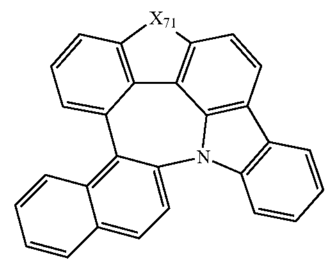
3(92)
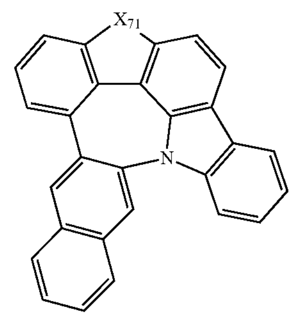
3(93)
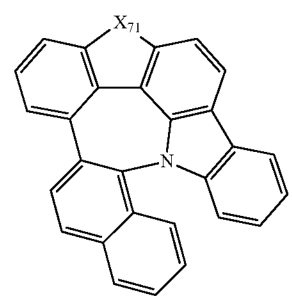
3(94)
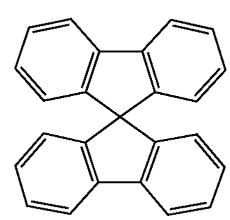
3(95)
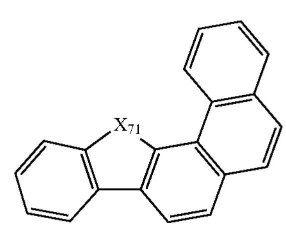

-continued

3(96)

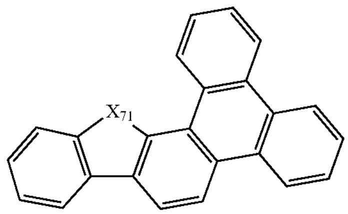

In Formulae 3(1) to 3(96), $X_{71}$ may be the same as described below, $X_{72}$ may be O, S, N($R_{78a}$), C($R_{78a}$)($R_{78b}$), or Si($R_{78a}$)($R_{78b}$), $X_{73}$ may be O, S, N($R_{79a}$), C($R_{79a}$)($R_{79b}$), or Si($R_{79a}$)($R_{79b}$), and $R_{78a}$, $R_{78b}$, $R_{79a}$, and $R_{79b}$ may each be the same as defined in connection with $R_{71}$.

In Formula 3-1, $X_{71}$ may be O, S, N-($L_{75}$)$_{b75}$-($R_{75}$)$_{a75}$, C($R_{75}$)($R_{76}$), or Si($R_{75}$)($R_{76}$).

In Formula 3-1, $L_{79}$ may be a single bond or a π-electron-rich $C_3$-$C_{30}$ cyclic group unsubstituted or substituted with at least one $R_{10a}$; or may be absent.

In Formula 2, n may be an integer from 1 to 10. When n is 2 or more, two or more groups represented by *-($L_{61}$)$_{b61}$-($R_{61}$)$_{a61}$ may be identical to or different from each other. For example, n in Formula 3 may be 1, 2, or 3, but embodiments of the present disclosure are not limited thereto.

In Formula 3-1, m may be 1, 2, or 3. When m is 1, $L_{79}$ may be absent. For example, m in Formula 3-1 may be 1 or 2.

In Formulae 1, 2, and 3-1 to 3-4, $L_1$ to $L_4$, $L_{61}$, $L_{75}$, and $L_{81}$ to $L_{87}$ may each independently be a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

For example, in Formulae 1, 2, and 3-1 to 3-4, $L_1$ to $L_4$, $L_{61}$, $L_{75}$, and $L_{81}$ to $L_{87}$ may each independently be a benzene group, a heptalene group, an indene group, a naphthalene group, an azulene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, a benzofuran group, a benzothiophene group, a benzosilole group, a naphtho pyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a benzonaphthofuran group, a benzonaphthothiophene group, an (indolo)phenanthrene group, a (benzofurano)phenanthrene group, or a (benzothieno)phenanthrene group, each unsubstituted or substituted with at least one $R_{10a}$.

In one or more embodiments, $L_{75}$ and $L_{81}$ to $L_{87}$ in Formulae 3-1 to 3-4 may each independently be a π-electron-rich $C_3$-$C_{30}$ cyclic group unsubstituted or substituted with at least one $R_{10a}$.

In one or more embodiments, $L_{75}$ and $L_{81}$ to $L_{87}$ in Formulae 3-1 to 3-4 may each independently be a benzene group unsubstituted or substituted with at least one $R_{10a}$, or a group represented by one of Formulae 3(1) to 3(96) unsubstituted or substituted with least one $R_{10a}$, but embodiments of the present disclosure are not limited thereto.

In Formulae 1, 2, and 3-1 to 3-4, b1 to b4, b61, b75, and b81 to b87 each indicate the numbers of $L_1$ to $L_4$, $L_{61}$, $L_{75}$, and $L_{81}$ to $L_{87}$, respectively, and may each independently be one of an integer from 1 to 10 (e.g., 1, 2, or 3).

In Formulae 1, 2, and 3-1 to 3-4, $R_a$, $R_b$, $R_1$ to $R_4$, $R_{51}$ to $R_{56}$, $R_{61}$, $R_{62}$, $R_{71}$, $R_{72}$, $R_{75}$, $R_{76}$, and $R_{81}$ to $R_{86}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(═O)($Q_8$)($Q_9$). $Q_1$ to $Q_9$ may be the same as described below.

In one or more embodiments, $R_a$, $R_b$, $R_1$ to $R_4$, $R_{51}$ to $R_{56}$, $R_{61}$, $R_{62}$, $R_{71}$, $R_{72}$, $R_{75}$, $R_{76}$, and $R_{81}$ to $R_{86}$ in Formulae 1, 2, and 3-1 to 3-4 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1] a hexyl group, a bicyclo[2.2.1] a heptyl group, a bicyclo[2.2.2] an octyl group, a phenyl group, a ($C_1$-$C_{20}$ alkyl) a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, $—Si(Q_{33})(Q_{34})(Q_{35})$, or any combination thereof; or $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$, and $Q_1$ to $Q_9$ and $Q_{33}$ to $Q_{35}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$, or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

In one or more embodiments, $R_a$, $R_b$, $R_1$ to $R_4$, $R_{51}$ to $R_{56}$, $R_{61}$, $R_{62}$, $R_{71}$, $R_{72}$, $R_{75}$, $R_{76}$, and $R_{61}$ to $R_{66}$ in Formulae 1, 2, and 3-1 to 3-4 may each independently be hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, a group represented by one of Formulae 9-1 to 9-66, a group represented by one of Formulae 9-1 to 9-66 in which at least one hydrogen is substituted with deuterium, a group represented by one of Formulae 10-1 to 10-249, a group represented by one of Formulae 10-1 to 10-249 in which at least one hydrogen is substituted with deuterium, $—N(Q_1)(Q_2)$, $—Si(Q_3)(Q_4)(Q_5)$, or $—B(Q_6)(Q_7)$ (wherein $Q_1$ to $Q_7$ may each be the same as described above):

9-1

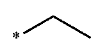

9-2

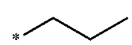

9-3

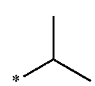

9-4

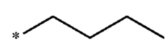

9-5

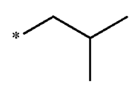

9-6

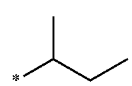

9-7

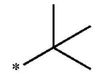

9-8

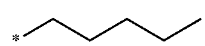

9-9

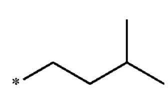

9-10

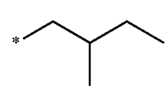

9-11

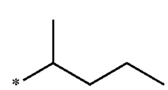

-continued
9-12
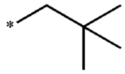
9-13
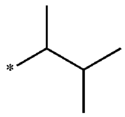
9-14
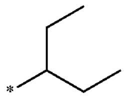
9-15
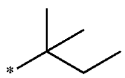
9-16
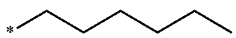
9-17
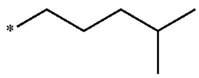
9-18
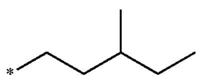
9-19
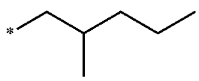
9-20
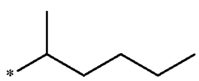
9-21
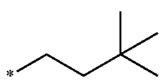
9-22
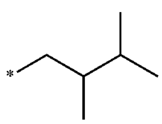
9-23
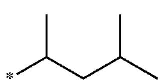
9-24
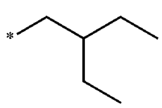
9-25
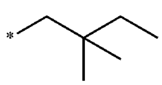
9-26
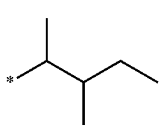
9-27
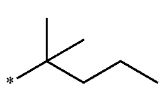
-continued
9-28
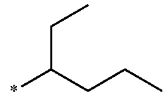
9-29
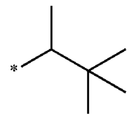
9-30
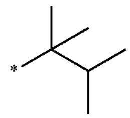
9-31
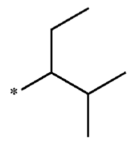
9-32
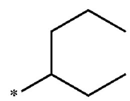
9-33
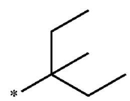
9-34
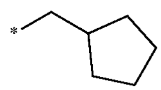
9-35
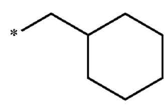
9-36
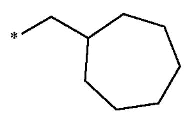
9-37
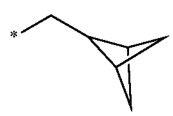
9-38
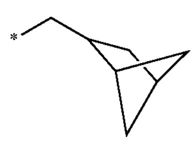
9-39
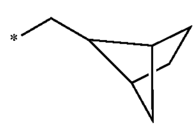
9-40
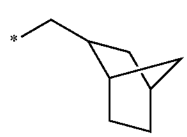

-continued
9-41
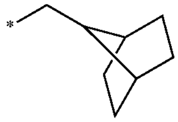
9-42
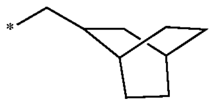
9-43
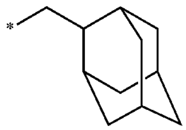
9-44
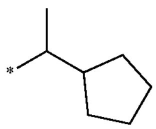
9-45
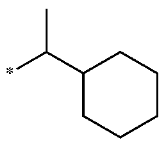
9-46
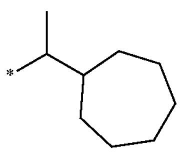
9-47
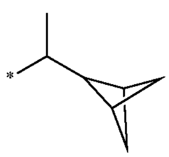
9-48
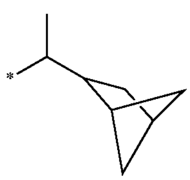
9-49
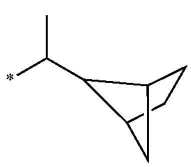
9-50
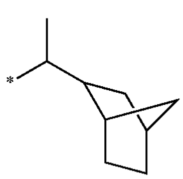
-continued
9-51
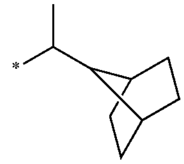
9-52
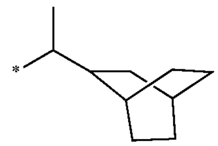
9-53
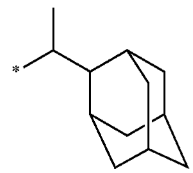
9-54
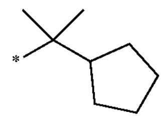
9-55
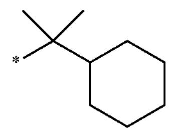
9-56
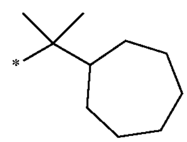
9-57
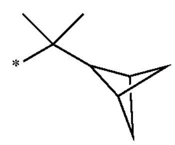
9-58
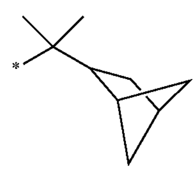
9-59
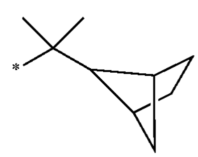
9-60
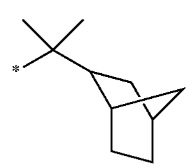

-continued
9-61
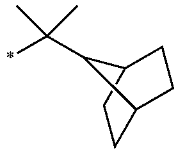
9-62
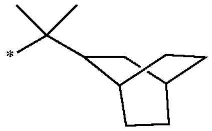
9-63
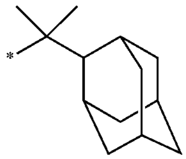
9-64
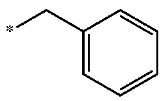
9-65
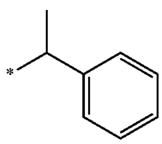
9-66
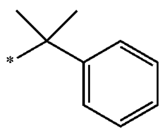
10-1
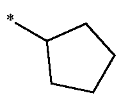
10-2
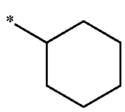
10-3
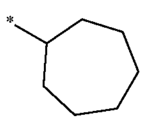
10-4
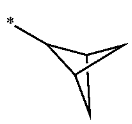
10-5
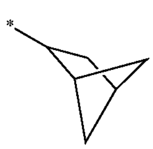
10-6
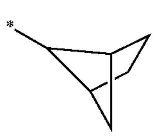
-continued
10-7
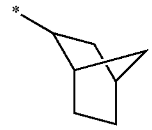
10-8
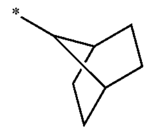
10-9
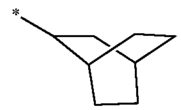
10-10
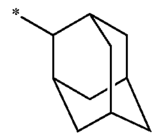
10-11
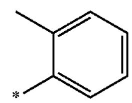
10-12
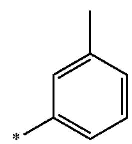
10-13
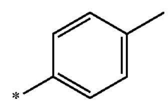
10-14
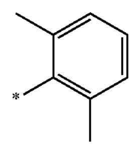
10-15
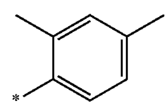
10-16
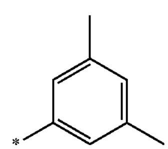
10-17
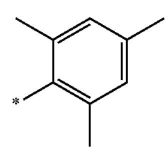
10-18
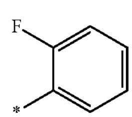

-continued
10-19
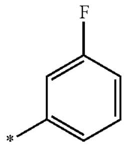
10-20
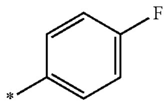
10-21
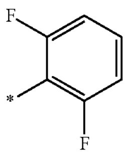
10-22
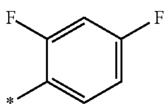
10-23
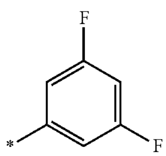
10-24
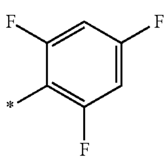
10-25
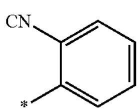
10-26
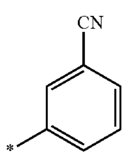
10-27
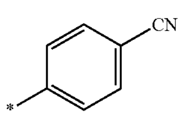
10-28
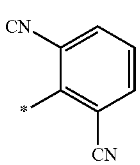
10-29
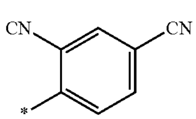
-continued
10-30
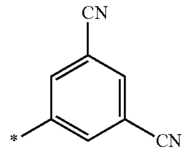
10-31
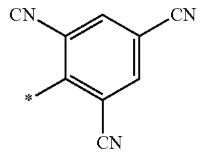
10-32
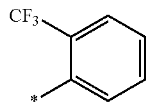
10-33
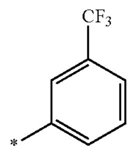
10-34
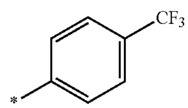
10-35
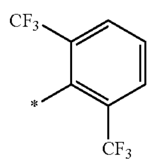
10-36
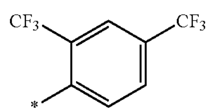
10-37
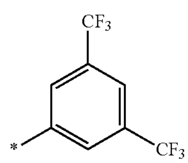
10-38
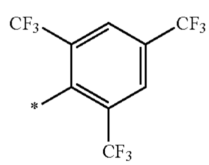
10-39
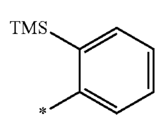
10-40
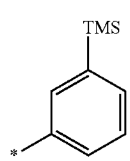

-continued
10-41
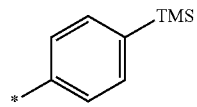
10-42
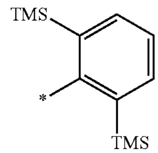
10-43
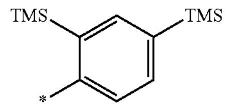
10-44
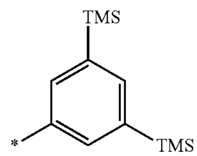
10-45
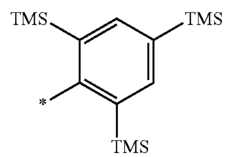
10-46
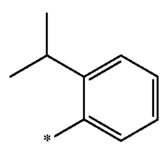
10-47
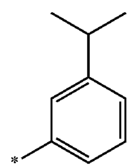
10-48
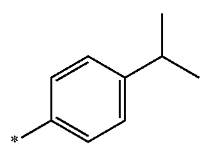
10-49
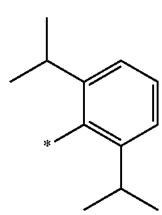
10-50
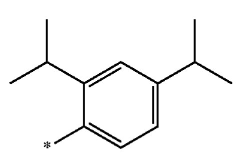
-continued
10-51
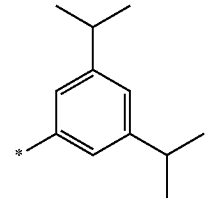
10-52
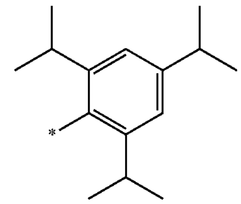
10-53
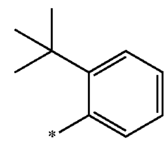
10-54
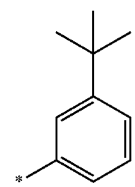
10-55
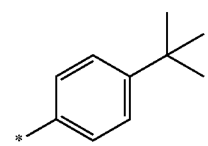
10-56
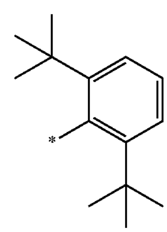
10-57
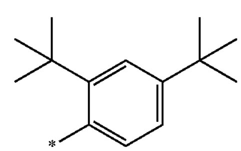
10-58
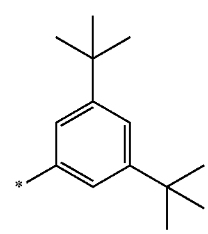

-continued
10-59
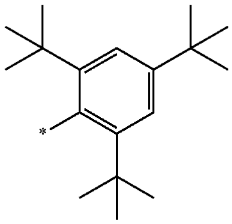
10-60
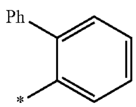
10-61
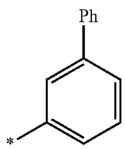
10-62
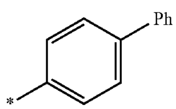
10-63
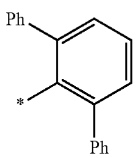
10-64
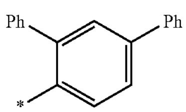
10-65
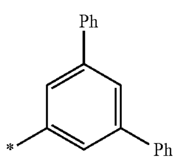
10-66
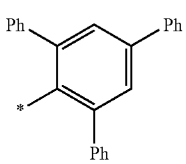
10-67
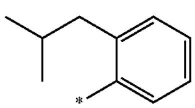
10-68
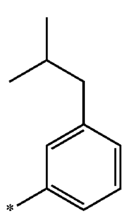
-continued
10-69
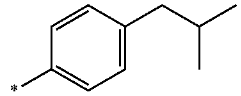
10-70
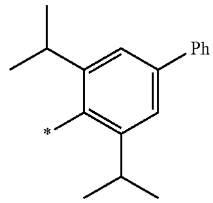
10-71
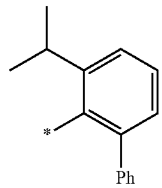
10-72
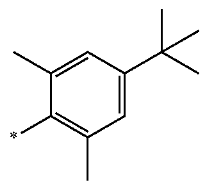
10-73
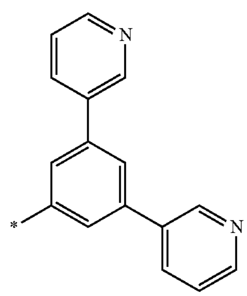
10-74
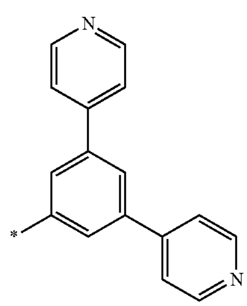
10-75
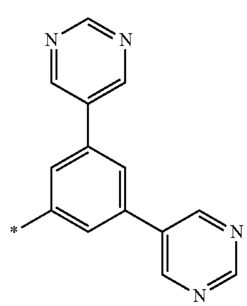

-continued
10-76
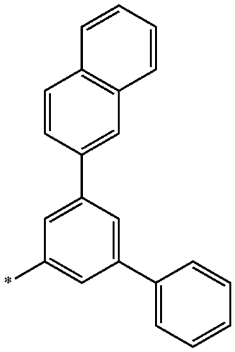
10-77
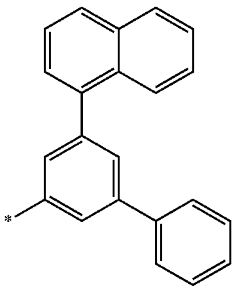
10-78
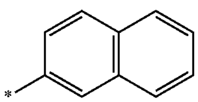
10-79
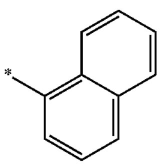
10-80
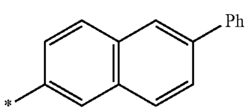
10-81
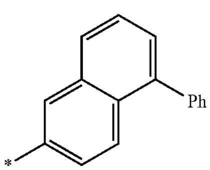
10-82
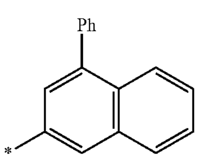
10-83
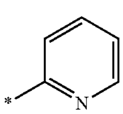
10-84
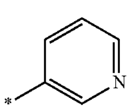
-continued
10-85
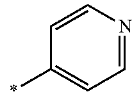
10-86
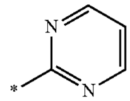
10-87
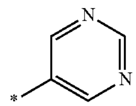
10-88
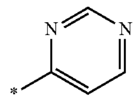
10-89
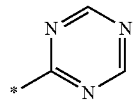
10-90
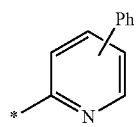
10-91
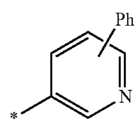
10-92
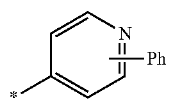
10-93
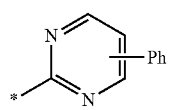
10-94
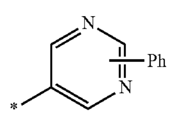
10-95
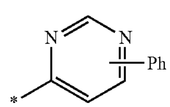
10-96
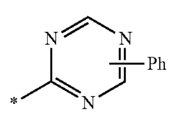
10-97
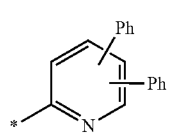

-continued
10-98
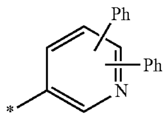
10-99
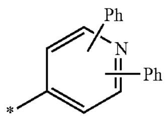
10-100
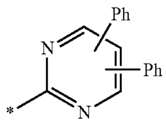
10-101
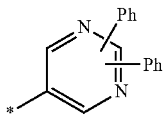
10-102
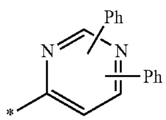
10-103
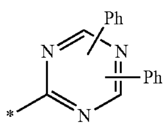
10-104
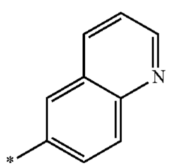
10-105
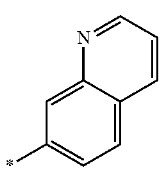
10-106
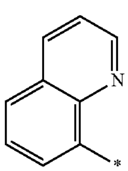
10-107
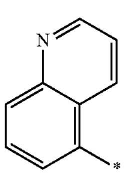
-continued
10-108
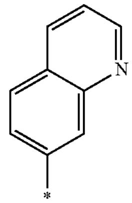
10-109
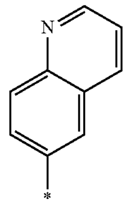
10-110
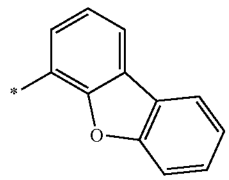
10-111
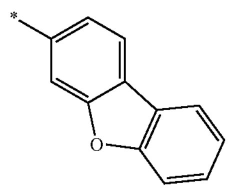
10-112
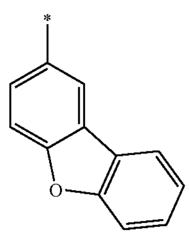
10-113
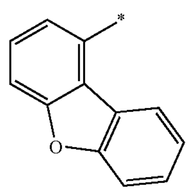
10-114
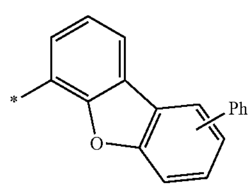
10-115
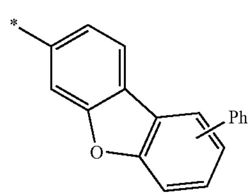

-continued
10-116
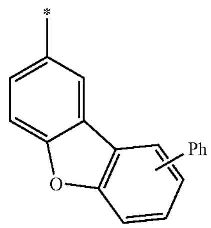
10-117
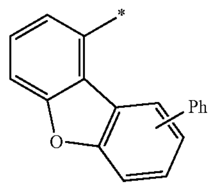
10-118
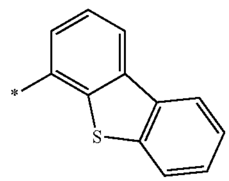
10-119
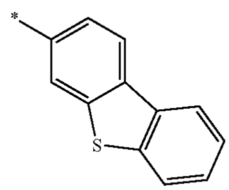
10-120
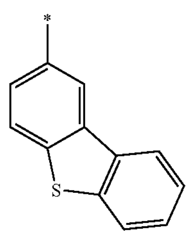
10-121
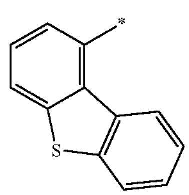
10-122
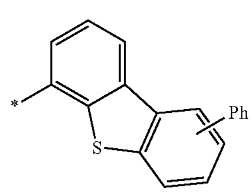
10-123
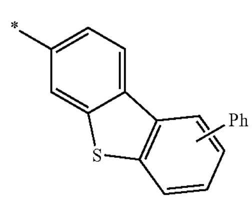
-continued
10-124
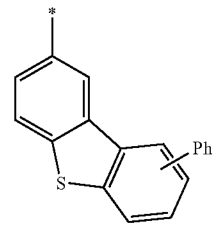
10-125
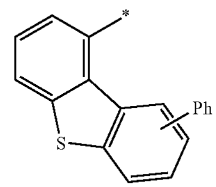
10-126
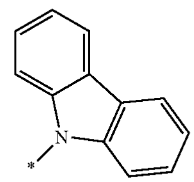
10-127
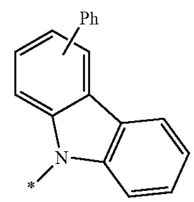
10-128
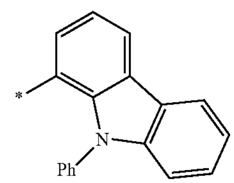
10-129
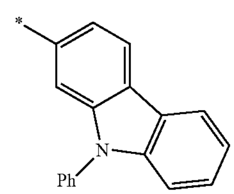
10-130
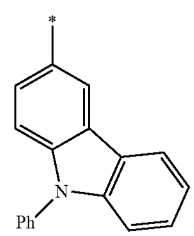
10-131
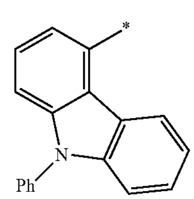

-continued
10-132
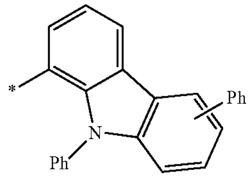
10-133
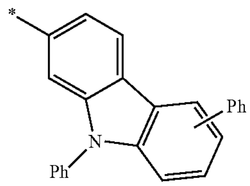
10-134
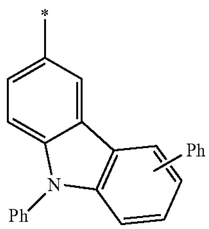
10-135
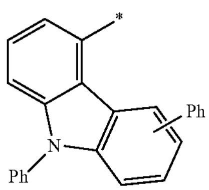
10-136
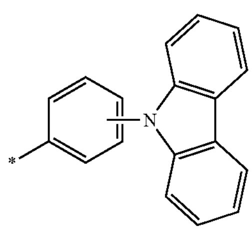
10-137
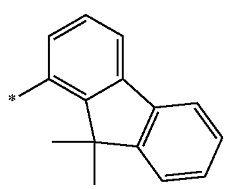
10-138
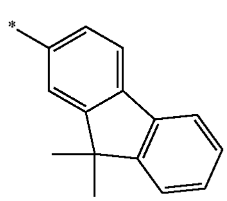
-continued
10-139
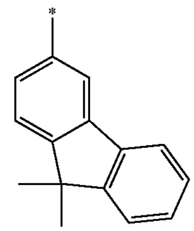
10-140
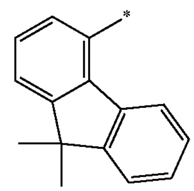
10-141
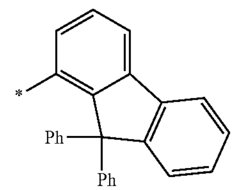
10-142
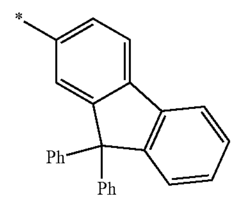
10-143
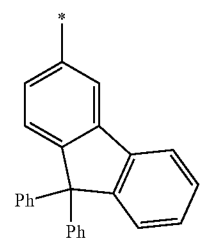
10-144
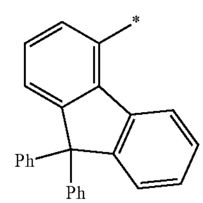
10-145
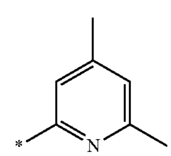
10-146
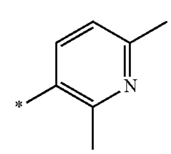

-continued
10-147
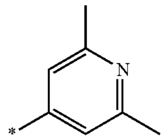
10-148
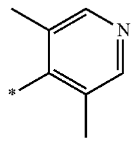
10-149
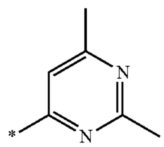
10-150
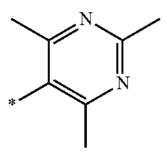
10-151
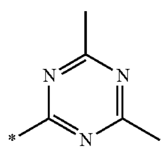
10-152
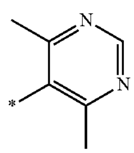
10-153
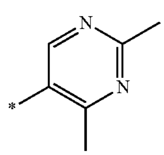
10-154
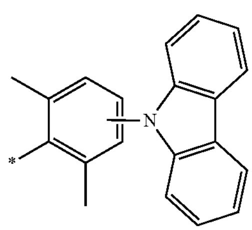
10-155
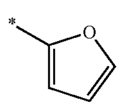
10-156
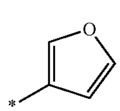
10-157
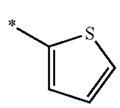
-continued
10-158
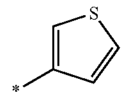
10-159
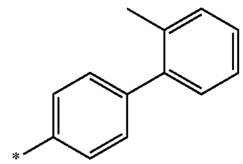
10-160
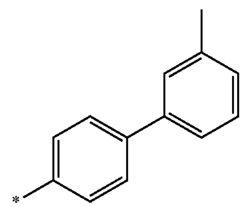
10-161
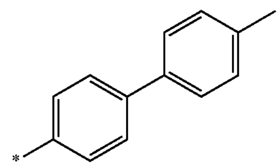
10-162
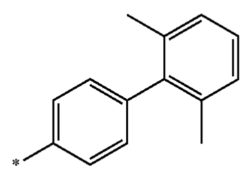
10-163
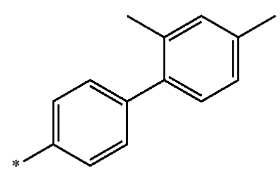
10-164
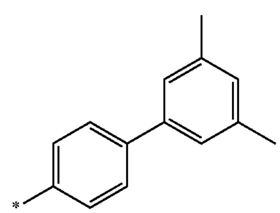
10-165
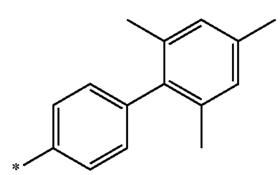
10-166
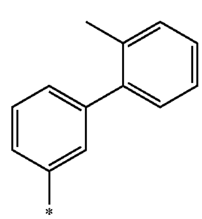

-continued
10-167
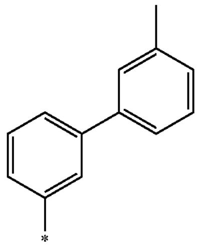
10-168
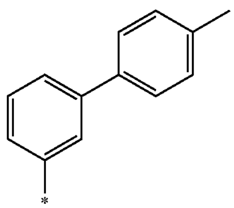
10-169
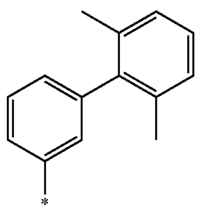
10-170
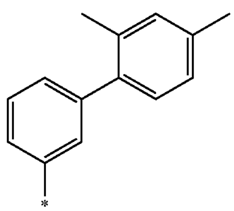
10-171
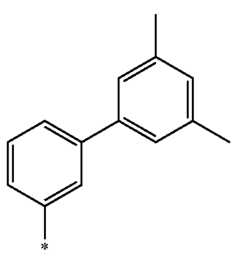
10-172
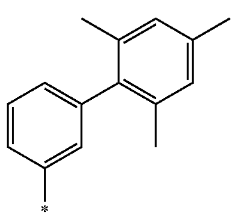
10-173
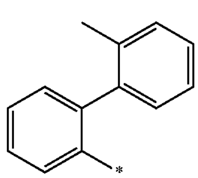
-continued
10-174
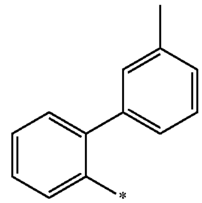
10-175
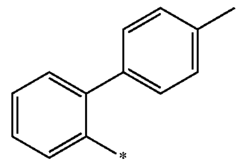
10-176
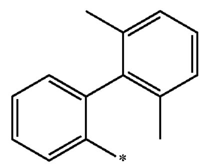
10-177
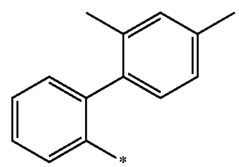
10-178
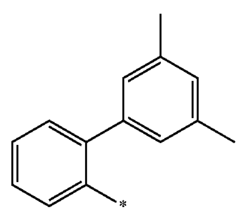
10-179
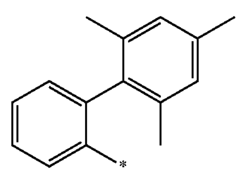
10-180
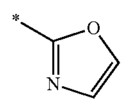
10-181
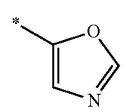
10-182
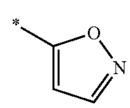
10-183
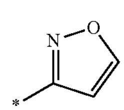

-continued
10-184
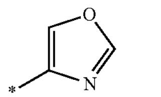
10-185
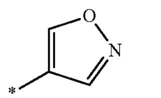
10-186
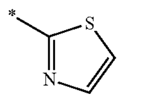
10-187
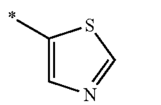
10-188
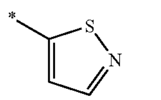
10-189
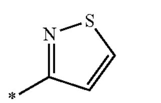
10-190
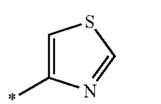
10-191
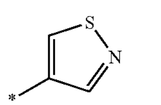
10-192
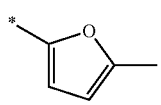
10-193
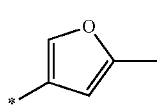
10-194
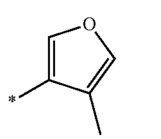
10-195
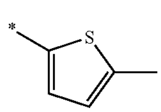
10-196
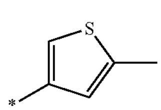
10-197
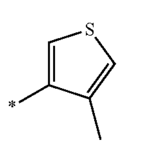
-continued
10-198
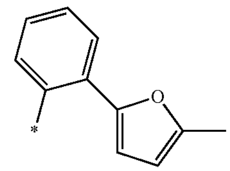
10-199
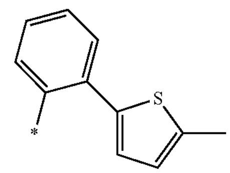
10-200
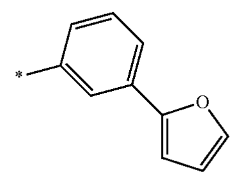
10-201
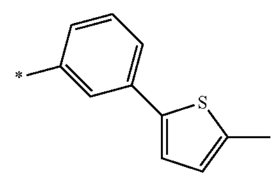
10-202
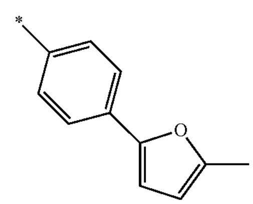
10-203
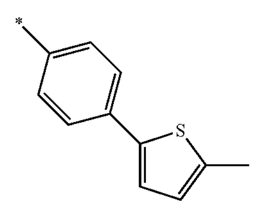
10-204
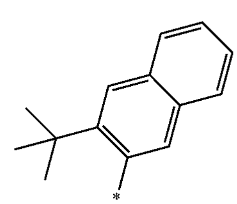
10-205
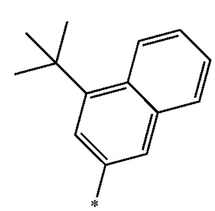

-continued
10-206
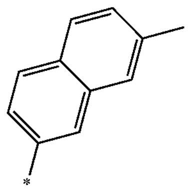
10-207
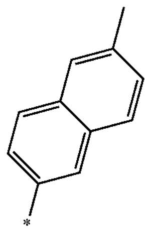
10-208
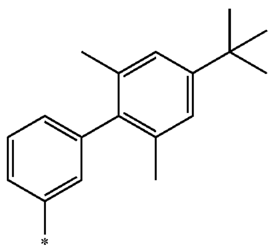
10-209
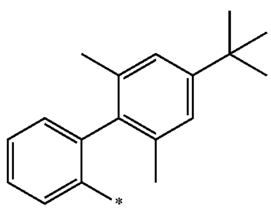
10-210
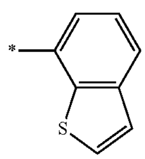
10-211
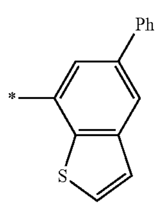
10-212
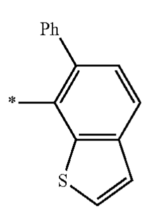
10-213
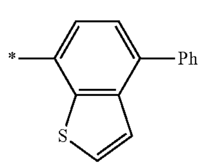
-continued
10-214
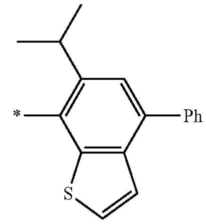
10-215
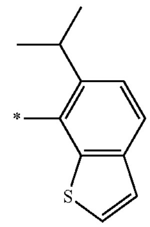
10-216
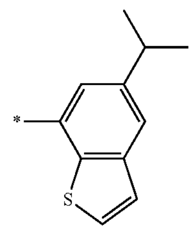
10-217
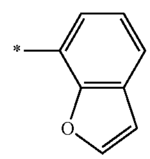
10-218
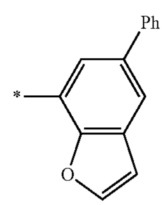
10-219
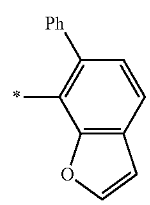
10-220
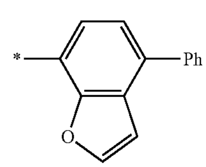

-continued
10-221
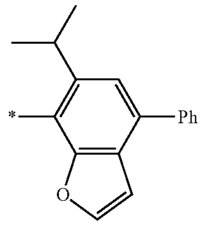
10-222
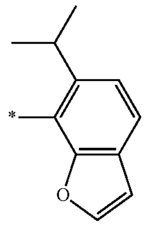
10-223
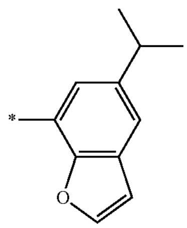
10-224
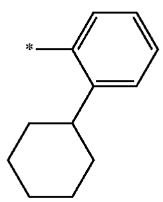
10-225
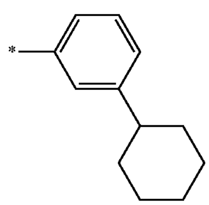
10-226
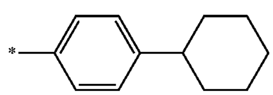
10-227
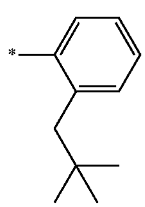
10-228
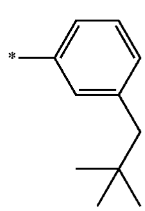
-continued
10-229
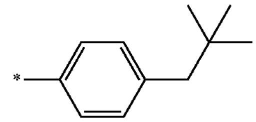
10-230
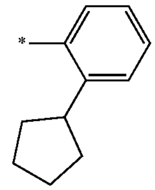
10-231
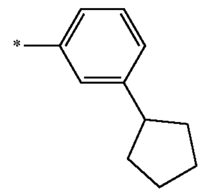
10-232
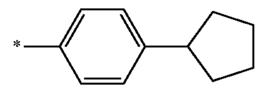
10-233
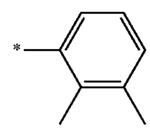
10-234
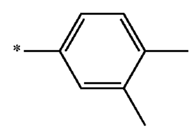
10-235
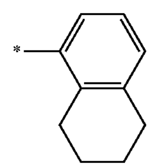
10-236
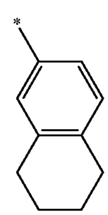
10-237
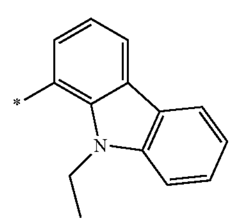

-continued
10-238
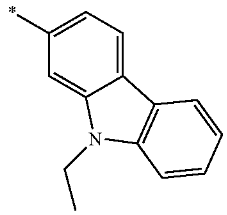
10-239
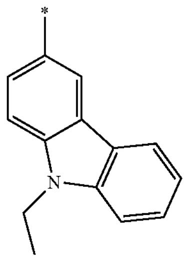
10-240
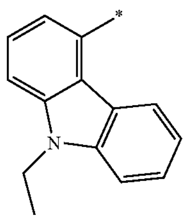
10-241
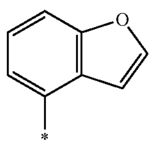
10-242
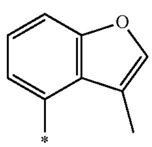
10-243
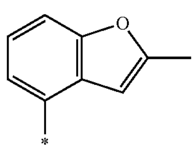
10-244
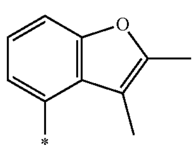
10-245
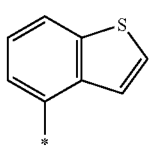
10-246
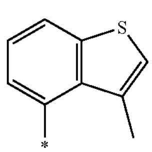
-continued
10-247
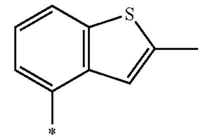
10-248
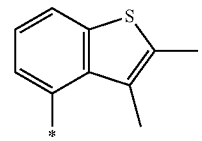
10-249
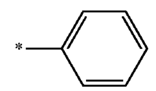
In Formulae 9-1 to 9-66 and 10-1 to 10-249, * indicates a binding site to a neighboring atom, Ph indicates a phenyl group, and TMS indicates a trimethylsilyl group.
The "group represented by one of Formulae 9-1 to 9-66 in which at least one hydrogen is substituted with deuterium" may be, for example, a group represented by one of Formulae 9-501 to 9-552:
9-501
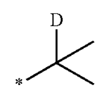
9-502
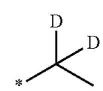
9-503
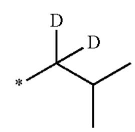
9-504
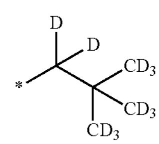
9-505
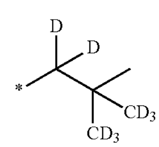
9-506
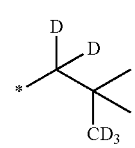
9-507
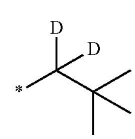

-continued
9-508
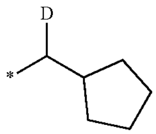
9-509
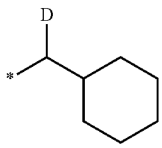
9-510
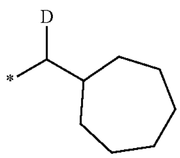
9-511
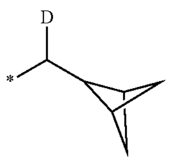
9-512
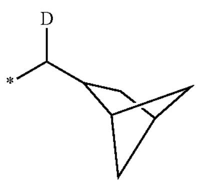
9-513
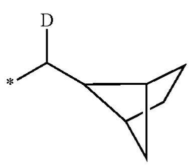
9-514
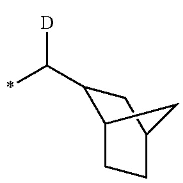
9-515
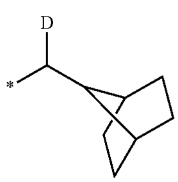
9-516
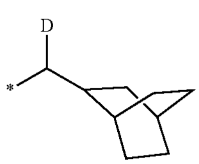
-continued
9-517
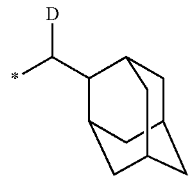
9-518
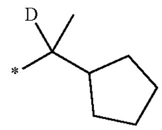
9-519
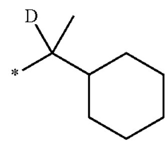
9-520
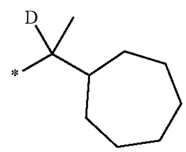
9-521
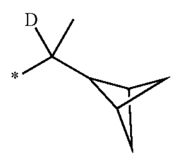
9-522
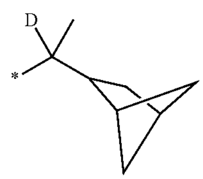
9-523
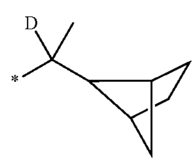
9-524
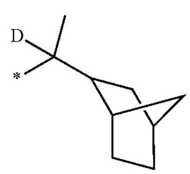
9-525
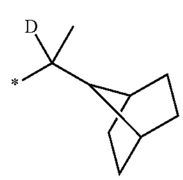

-continued
9-526
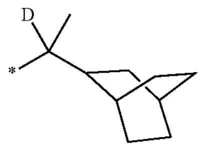
9-527
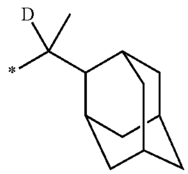
9-528
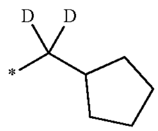
9-529
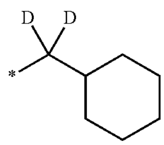
9-530
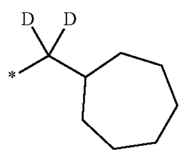
9-531
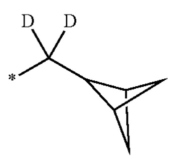
9-532
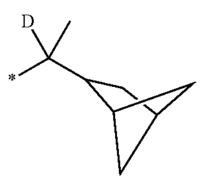
9-533
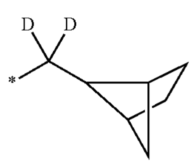
9-534
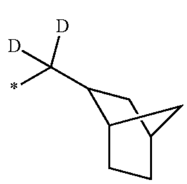
-continued
9-535
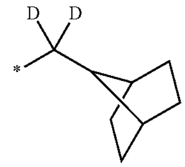
9-536
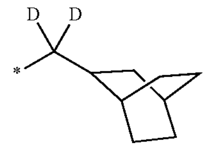
9-537
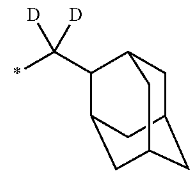
9-538
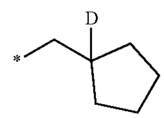
9-539
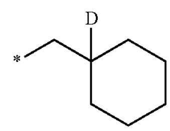
9-540
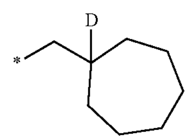
9-541
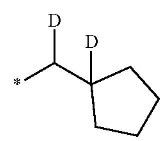
9-542
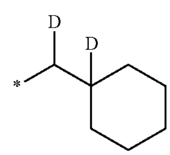
9-543
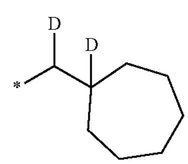
9-544
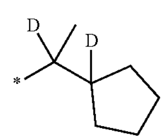

-continued
9-545
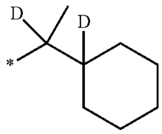
9-546
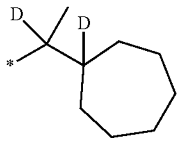
9-547
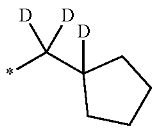
9-548
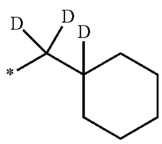
9-549
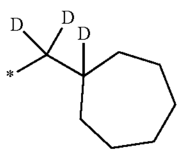
9-550
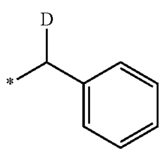
9-551
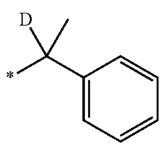
9-552
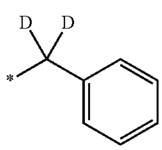
The "group represented by one of Formulae 10-1 to 10-249 in which at least one hydrogen is substituted with deuterium" may be, for example, a group represented by one of Formulae 10-501 to 10-510:
10-501
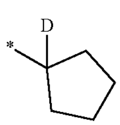
-continued
10-502
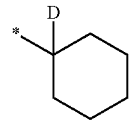
10-503
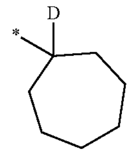
10-504
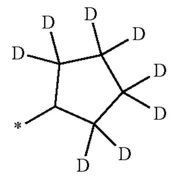
10-505
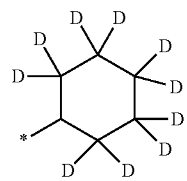
10-506
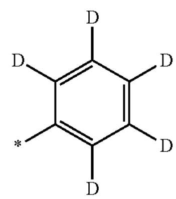
10-507
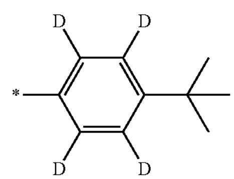
10-508
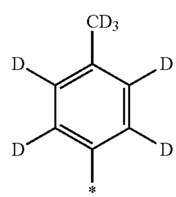
10-509
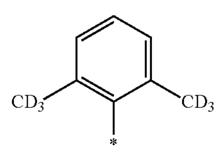
10-510
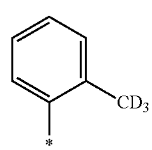
In Formula 1, c1 to c4 each indicate the numbers of $R_1$ to $R_4$, respectively, and may each independently be an integer from 1 to 10.

In Formulae 1, 2, and 3-1 to 3-4, a1 to a4, a61, a62, a71, a72, a75, and a81 to a86 may each independently be one of an integer from 0 to 20.

In one or more embodiments, $R_{71}$, $R_{72}$, $R_{75}$, $R_{76}$, and $R_{81}$ to $R_{86}$ in Formulae 3-1 to 3-4 may each independently be hydrogen, deuterium, a $C_1$-$C_{20}$ alkyl group, a π-electron-rich $C_3$-$C_{30}$ cyclic group unsubstituted or substituted with at least one $R_{10a}$, —N($Q_1$)($Q_2$), or —Si($Q_3$)($Q_4$)($Q_5$), but embodiments of the present disclosure are not limited thereto.

In Formula 1, two or more of $R_a$, $R_b$, $R_1$ to $R_4$, and $R_{51}$ to $R_{56}$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

In the present specification, $R_{10a}$ may be the same as defined in connection with $R_1$.

In the present specification, unless otherwise described, *, *', and *" each indicate a binding site to a neighboring atom.

In one or more embodiments, in Formula 1, a1 to a4 may each independently be one of an integer from 1 to 20, and at least one of $R_1$ to $R_4$ may each independently be a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), or —B($Q_6$)($Q_7$).

In one or more embodiments, in Formula 1, 1) ring $CY_2$ may be a benzoxazole group, a benzothiazole group, a benzimidazole group, a benzazasilole group, or a benzopyrrole group, a1 to a4 may each independently be one of an integer from 1 to 20, and at least one of $R_1$ to $R_4$ may each independently be a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, or 2) ring $CY_2$ may be a pyridine group, a1 to a4 may each independently be one of an integer from 1 to 20, and at least one of $R_1$ to $R_4$ may each independently be a substituted or unsubstituted $C_1$-$C_{60}$ alkoxy group, a substituted or unsubstituted $C_6$-$C_{60}$ aryloxy group, —N($Q_1$)($Q_2$), —Si($Q_3$)($Q_4$)($Q_5$), or —B($Q_6$)($Q_7$).

In one or more embodiments, $L_{75}$, $L_{79}$, and $L_{81}$ to $L_{87}$ in Formulae 3-1 to 3-4 may each independently be a π-electron-rich $C_3$-$C_{30}$ cyclic group unsubstituted or substituted with deuterium, a $C_1$-$C_{20}$ alkyl group, a $C_1$-$C_{20}$ alkoxy group, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, a tetraphenyl group, —N($Q_{31}$)($Q_{32}$), or any combination thereof; or $L_{79}$ in Formula 3-1 may be a single bond, and/or $R_{71}$, $R_{72}$, $R_{75}$, $R_{76}$, and $R_{81}$ to $R_{86}$ in Formulae 3-1 to 3-4 may each independently be:

hydrogen or deuterium;

a $C_1$-$C_{20}$ alkyl group unsubstituted or substituted with deuterium, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, a tetraphenyl group, —N($Q_{31}$)($Q_{32}$), or any combination thereof;

a π-electron-rich $C_3$-$C_{30}$ cyclic group unsubstituted or substituted with deuterium, a $C_1$-$C_{20}$ alkyl group, a $C_1$-$C_{20}$ alkoxy group, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, a tetraphenyl group, —N($Q_{31}$)($Q_{32}$), or any combination thereof; or

—N($Q_1$)($Q_2$), but embodiments of the present disclosure are not limited thereto.

In one or more embodiments, at least one of the second compound and the third compound (for example, all of the second compound and the third compound) may include a carbazole group.

In one or more embodiments, at least one of the second compound and the third compound may each independently be the compound represented by Formula 3-1, wherein $X_{71}$ in Formula 3-1 may be N-($L_{75}$)$_{b75}$-($R_{75}$)$_{a75}$.

In one or more embodiments, at least one of the second compound and the third compound may not include a carbazole group.

In one or more embodiments, at least one of the second compound and the third compound may each independently be the compound represented by one of Formulae 3-2 to 3-4.

In one or more embodiments, at least one of the second compound and the third compound may each independently be the compound represented by one of Formulae 3-2 to 3-4, wherein the compounds represented by Formulae 3-2 to 3-4 may include a carbazole group.

In one or more embodiments, at least one of the second compound and the third compound may each independently be the compound represented by one of Formulae 3-2 to 3-4, and the compounds represented by Formulae 3-2 to 3-4 may not include a carbazole group.

In one or more embodiments, in Formula 3-3, $R_{81}$ and $R_{82}$ may be linked to each other via a single bond or a (dim ethyl)methylene group, and/or $R_{83}$ and $R_{84}$ may be linked to each other via a single bond or a (dimethyl)methylene group (for example, see Compound H2-27 below).

In one or more embodiments, in Formula 3-4, $R_{81}$ and $R_{82}$ may be linked to each other via a single bond or a (dim ethyl)methylene group, and/or $R_{83}$ and $R_{84}$ may be linked to each other via a single bond or a (dimethyl)methylene group, and/or $R_{85}$ and $R_{86}$ may be linked to each other via a single bond or a (dimethyl)methylene group.

In one or more embodiments, the Pt-containing organometallic compound may be a compound represented by Formula 1-1 or 1-2:

1-1

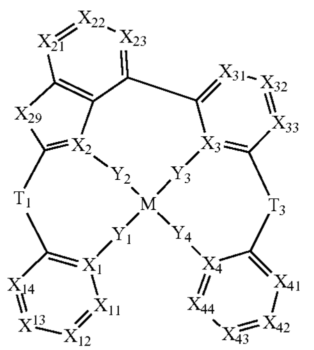

1-2

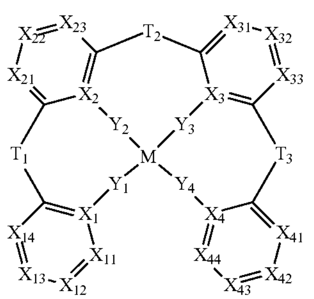

In Formulae 1-1 and 1-2,

M, $Y_1$ to $Y_4$, $X_1$ to $X_4$, and $T_1$ to $T_3$ may each be the same as described above, $X_{11}$ may be N or C-[$(L_{11})_{b11}$-$(R_{11})_{c11}$], $X_{12}$ may be N or C-[$(L_{12})_{b12}$-$(R_{12})_{c12}$], $X_{13}$ may be N or C-[$(L_{13})_{b13}$-$(R_{13})_{c13}$], and $X_{14}$ may be N or C-[$(L_{14})_{b14}$-$(R_{14})_{c14}$], $L_{11}$ to $L_{14}$, b11 to b14, $R_{11}$ to $R_{14}$, and c11 to c14 may each be the same as defined in connection with $L_1$, b1, $R_1$, and c1, respectively, $X_{21}$ may be N or C-[$(L_{21})_{b21}$-$(R_{21})_{c21}$], $X_{22}$ may be N or C-[$(L_{22})_{b22}$-$(R_{22})_{c22}$], and $X_{23}$ may be N or C-[$(L_{23})_{b23}$-$(R_{23})_{c23}$], $L_{21}$ to $L_{23}$, b21 to b23, $R_{21}$ to $R_{23}$, and c21 to c23 may each be the same as defined in connection with $L_2$, b2, $R_2$, and c2, respectively, $X_{29}$ may be O, S, C($R_{27}$)($R_{28}$), Si($R_{27}$)($R_{28}$), or N-[$(L_{29})_{b29}$-$(R_{29})_{c29}$], $R_{27}$ to $R_{29}$ may each be the same as defined in connection with $R_2$, and $L_{29}$, b29, and c29 may each be the same as defined in connection with $L_2$, b2, and c2, respectively, $X_{31}$ may be N or C-[$(L_{31})_{b31}$-$(R_{31})_{c31}$], $X_{32}$ may be N or C-[$(L_{32})_{b32}$-$(R_{32})_{c32}$], and $X_{33}$ may be N or C-[$(L_{33})_{b33}$-$(R_{33})_{c33}$], $L_{31}$ to $L_{33}$, b31 to b33, $R_{31}$ to $R_{33}$, and c31 to c33 may each be the same as defined in connection with $L_3$, b3, $R_3$, and c3, respectively, $X_{41}$ may be N or C-[$(L_{41})_{b41}$-$(R_{41})_{c41}$], $X_{42}$ may be N or C-[$(L_{42})_{b42}$-$(R_{42})_{c42}$], $X_{43}$ may be N or C-[$(L_{43})_{b43}$-$(R_{43})_{c43}$], and $X_{44}$ may be N or C-[$(L_{44})_{b44}$-$(R_{44})_{c44}$], $L_{41}$ to $L_{44}$, b41 to b44, $R_{41}$ to $R_{44}$, and c41 to c44 may each be the same as defined in connection with $L_4$, b4, $R_4$, and c4, respectively, two of $R_{11}$ to $R_{14}$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two of $R_{21}$ to $R_{23}$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two of $R_{31}$ to $R_{33}$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, and two of $R_{41}$ to $R_{44}$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

In the present specification, examples of "the $C_5$-$C_{30}$ carbocyclic group unsubstituted or substituted with at least one $R_{1a}$" and "the $C_1$-$C_{30}$ heterocyclic group unsubstituted or substituted with at least one at least one $R_{1a}$" include a cyclopentane group, a cyclohexane group, a cycloheptane group, a cyclooctane group, an adamantane group, a norbornene group, a cyclopentene group, a cyclohexene group, a cycloheptane group, a cyclooctene group, a bicyclo[1.1.1]pentane group, a bicyclo[2.1.1]hexane group, a bicyclo[2.2.1]heptane group, a bicyclo[2.2.2]octane group, a benzene group, a heptalene group, an indene group, a naphthalene group, an azulene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, a benzofuran group, a benzothiophene group, a benzosilole group, a naphtho pyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a pyrrolophenanthrene group, a furanophenanthrene group, a thienophenanthrene group, a benzonaphthofuran group, a benzonaphthothiophene group, an (indolo)phenanthrene group, a (benzofurano)phenanthrene group, and a (benzothieno)phenanthrene group, each unsubstituted or substituted with at least one at least one $R_{1a}$, but embodiments of the present disclosure are not limited thereto.

In the present specification, examples of "the $C_1$-$C_{60}$ alkyl group" include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group, but embodiments of the present disclosure are not limited thereto.

In the present specification, examples of "the $C_3$-$C_{10}$ cycloalkyl group" include a cyclopentyl group, a cyclohexyl group, a cycloheptyl group, a cyclooctyl group, an adamantyl group, a bicyclo[1.1.1]pentyl group, a bicyclo[2.1.1]hexyl group, a bicyclo[2.2.1]heptyl group, and a bicyclo[2.2.2]octyl group, but embodiments of the present disclosure are not limited thereto.

The Pt-containing organometallic compound may be one of Compounds 1-1 to 1-88, 2-1 to 2-47, 3-1 to 3-591, and D1 to D24, but embodiments of the present disclosure are not limited thereto:

1-1

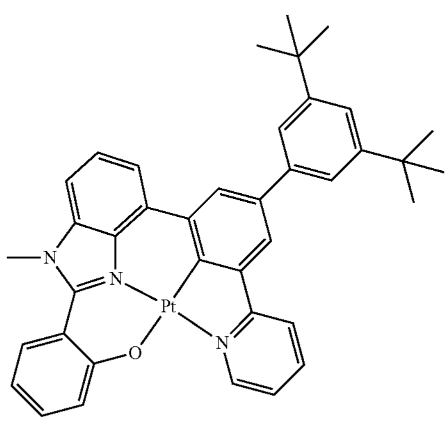

1-2

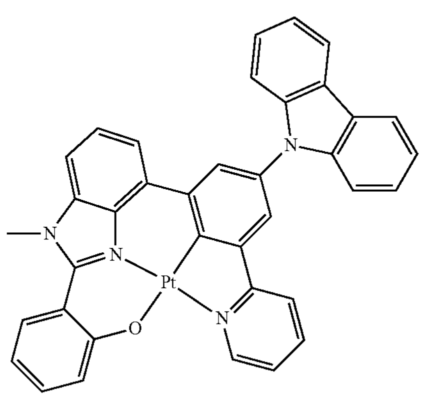

-continued 1-3

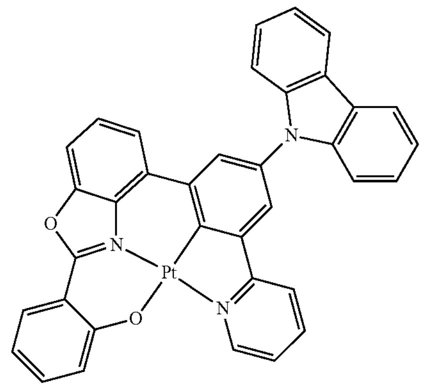

1-4

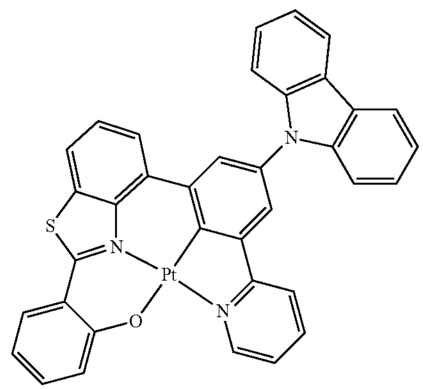

1-5

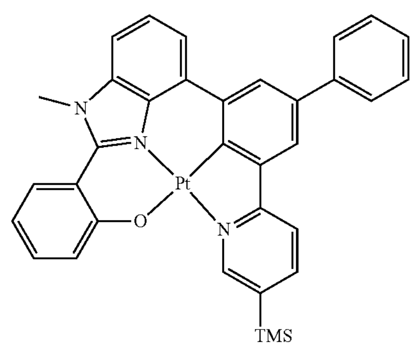

1-6

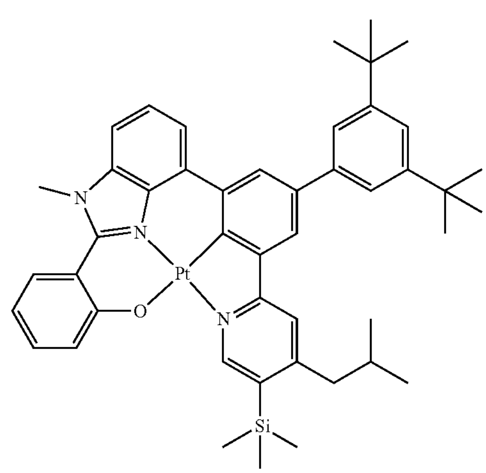

-continued
1-7
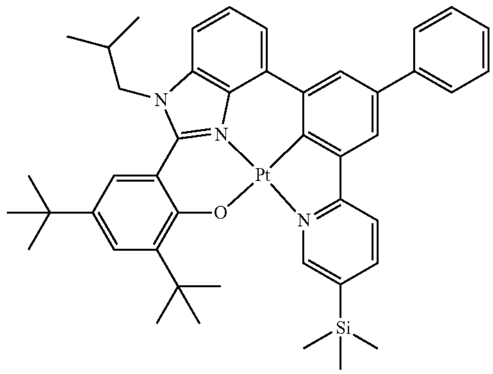
1-8
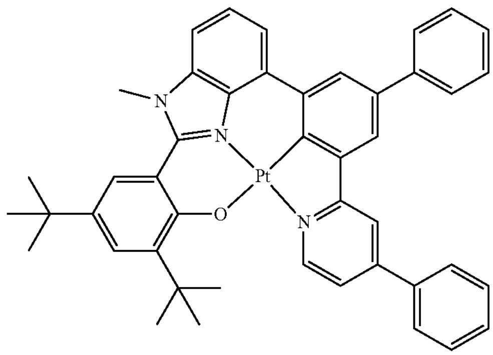
1-9
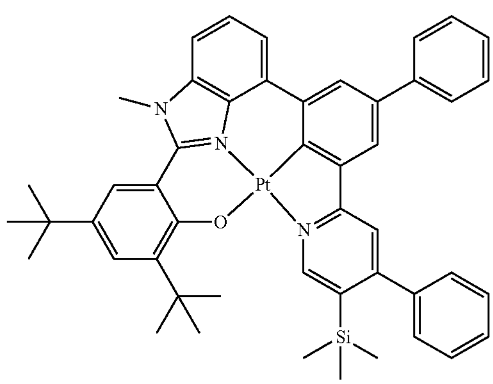
1-10
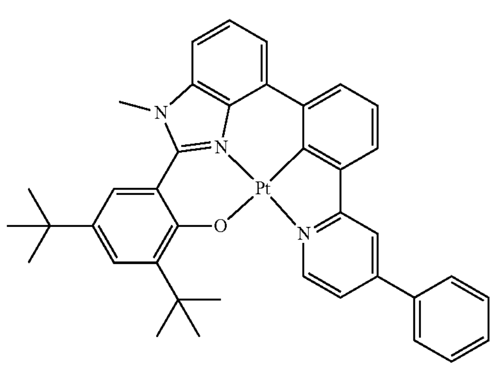
-continued
1-11
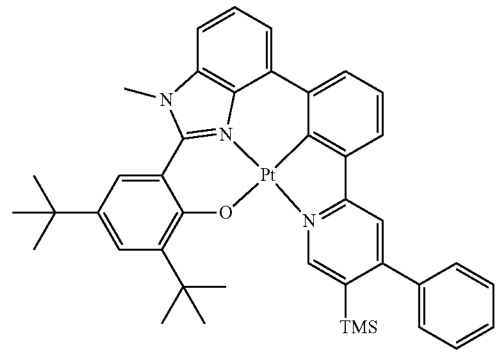
1-12
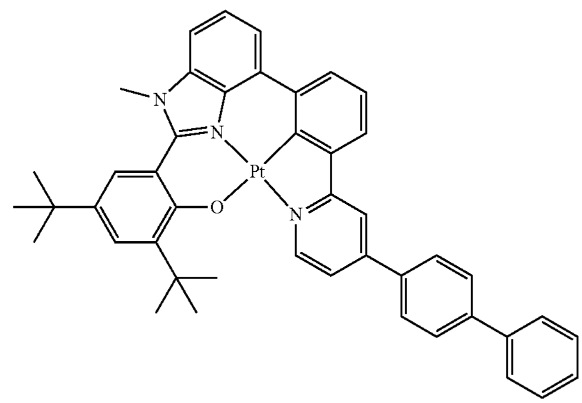
1-13
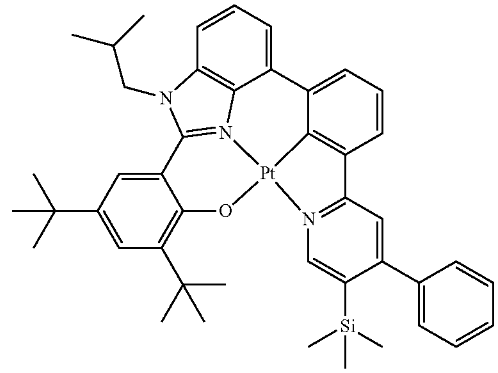
1-14
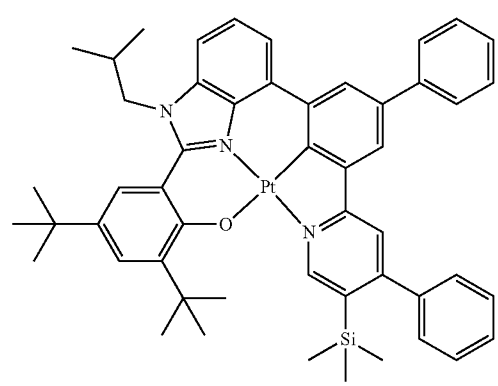

-continued
1-15
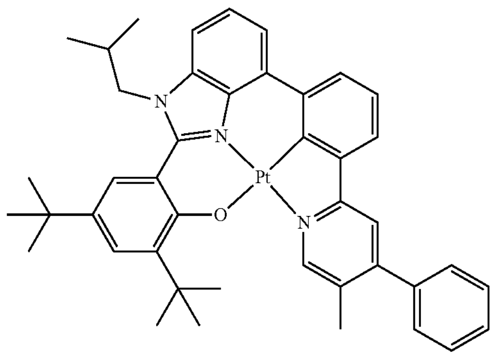
1-16
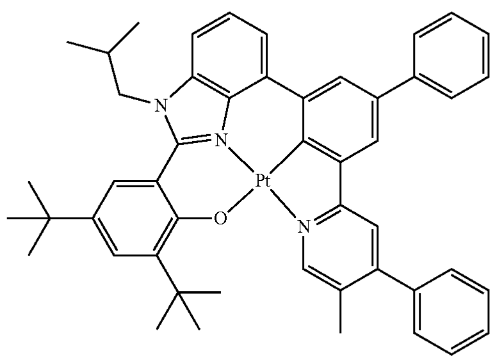
1-17
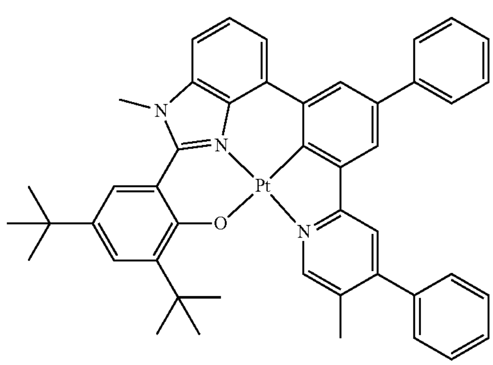
1-18
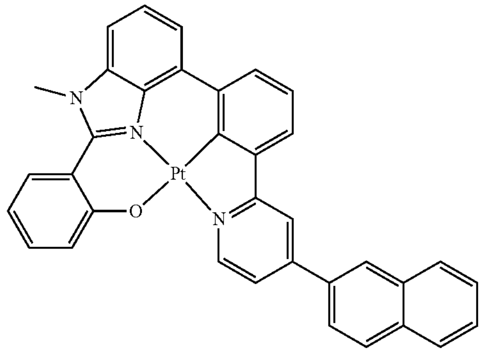
-continued
1-19
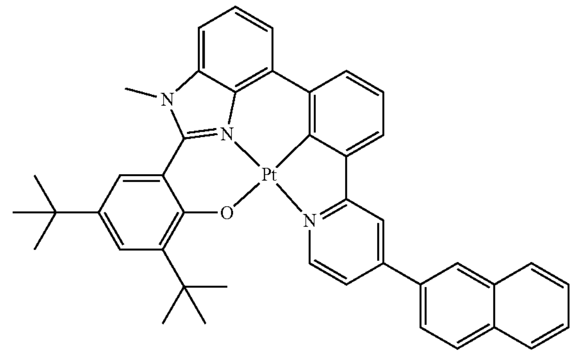
1-20
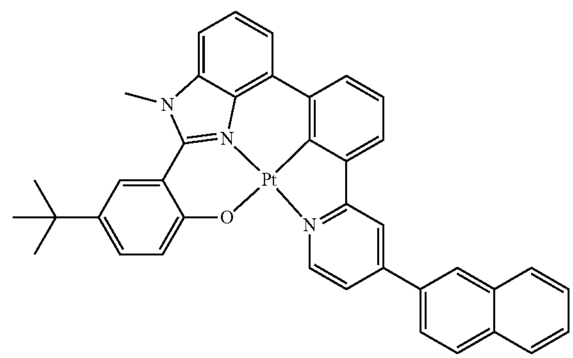
1-21
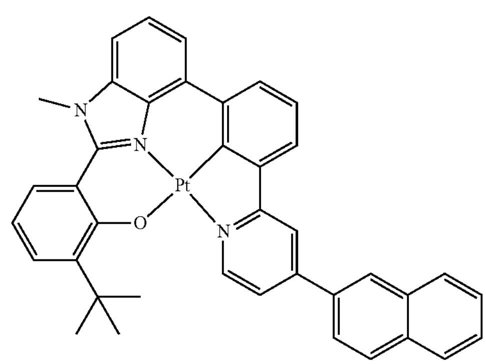
1-22
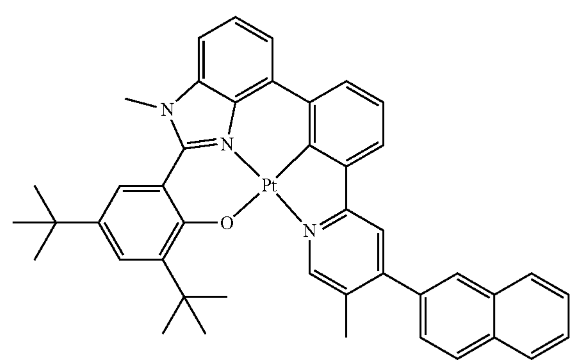

1-23
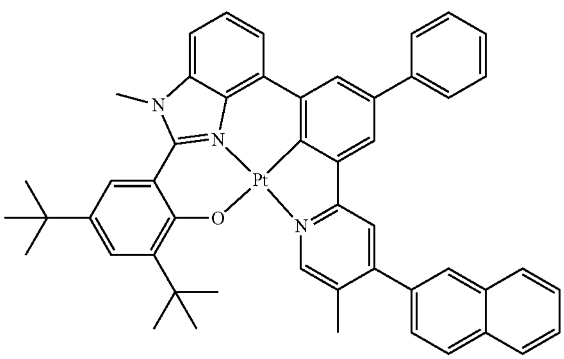
1-24
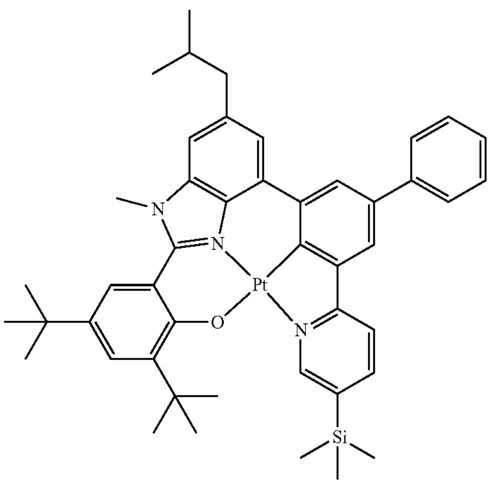
1-25
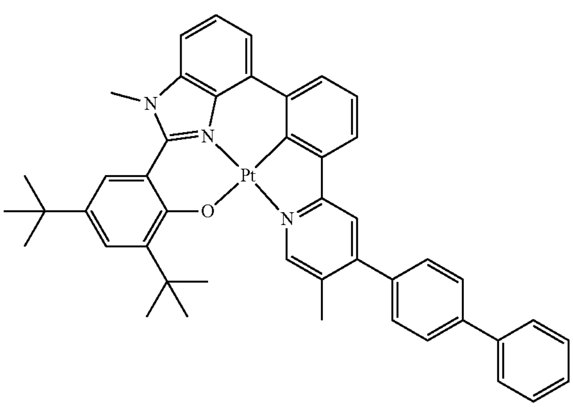
1-26
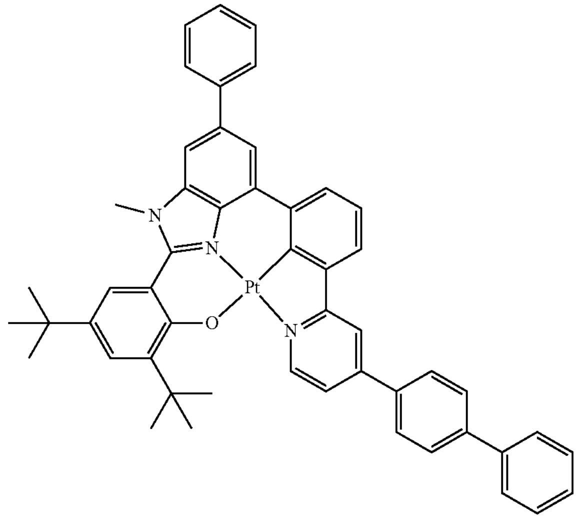
1-27
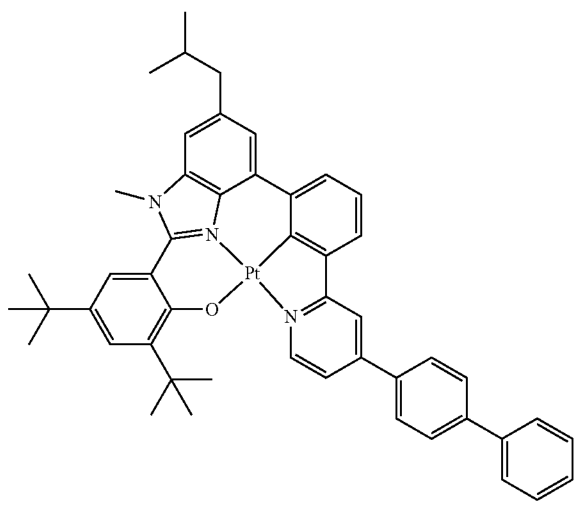
1-28
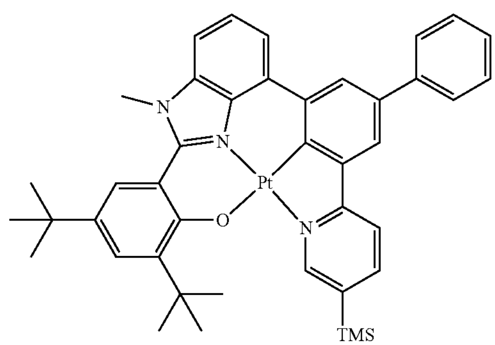

-continued
1-29
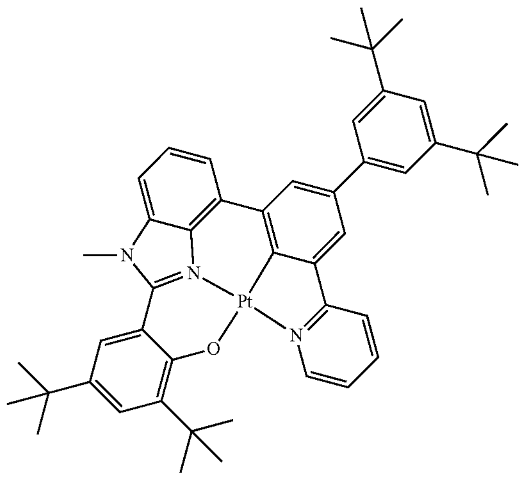
1-30
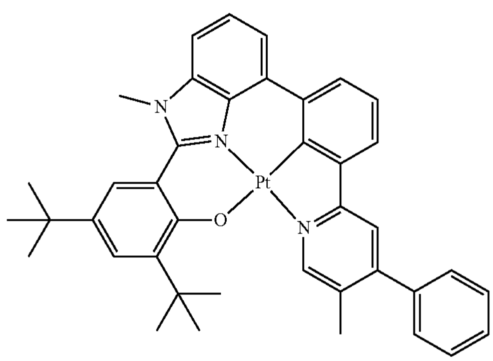
1-31
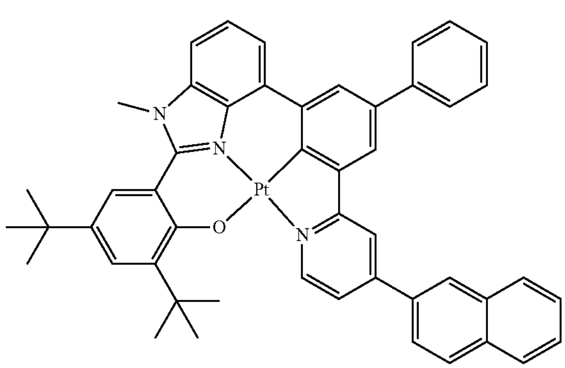
-continued
1-32
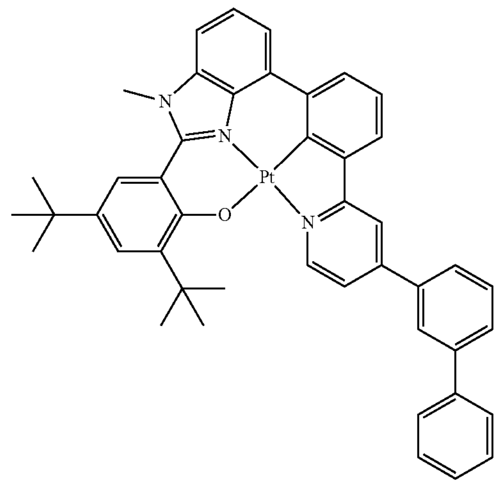
1-33
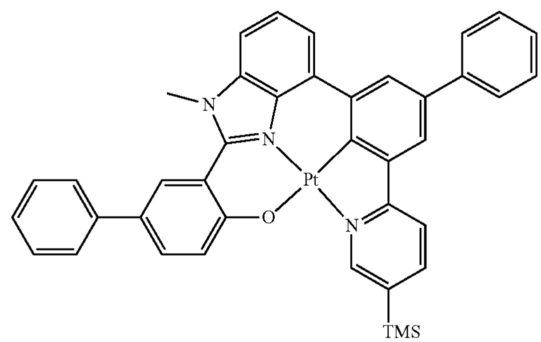
1-34
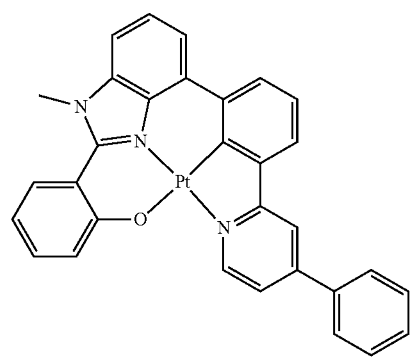
1-35
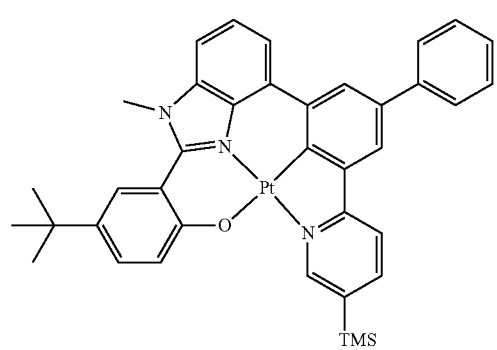

-continued
1-36
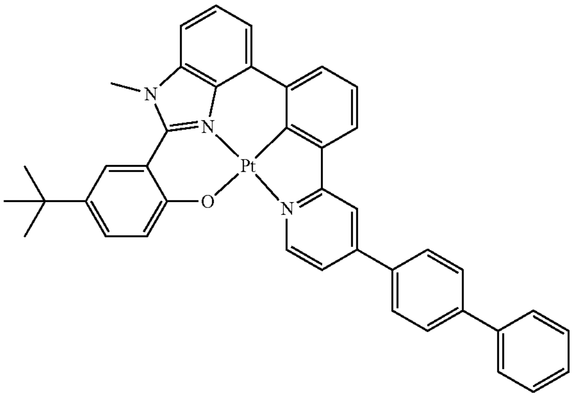
1-37
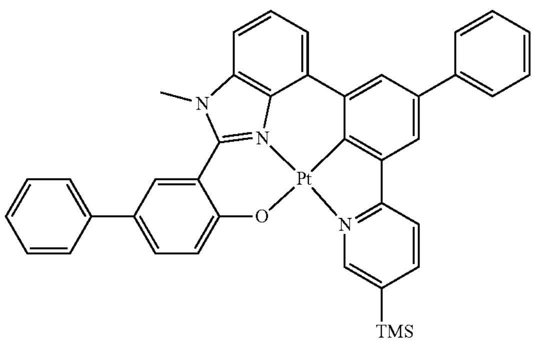
1-38
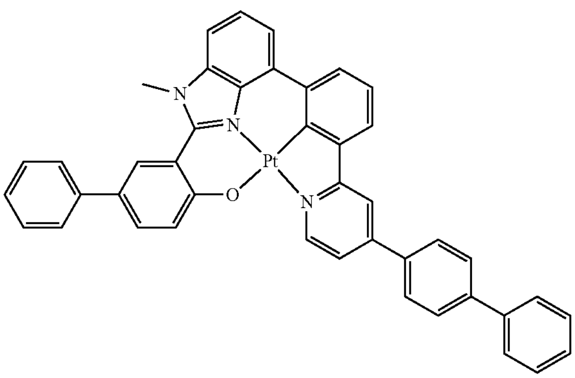
1-39
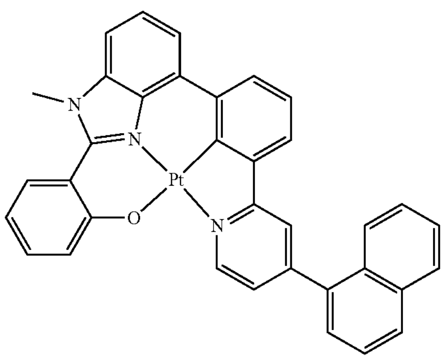
-continued
1-40
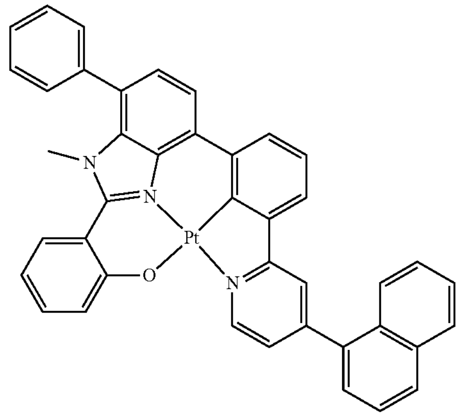
1-41
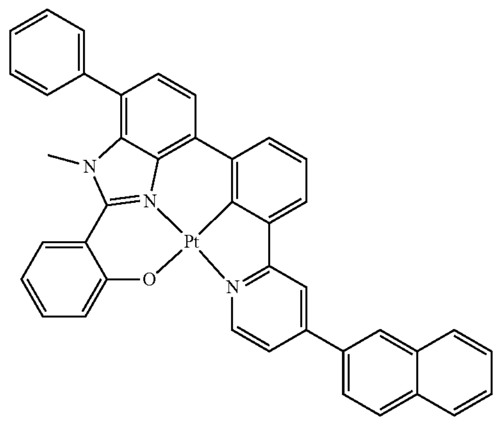
1-42
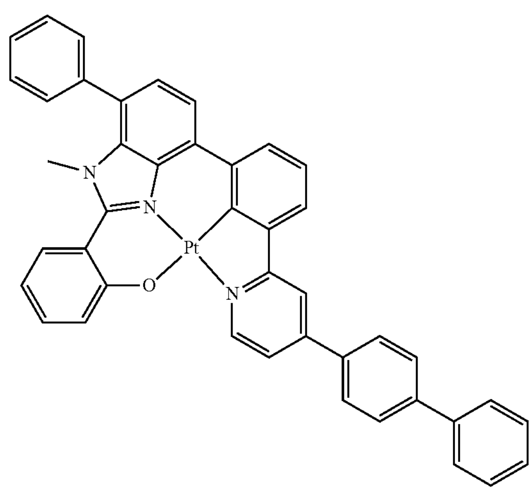

-continued
1-43
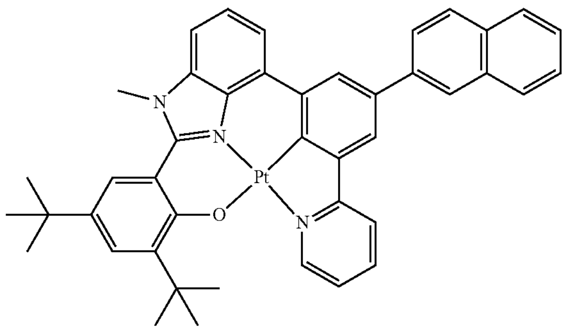
1-44
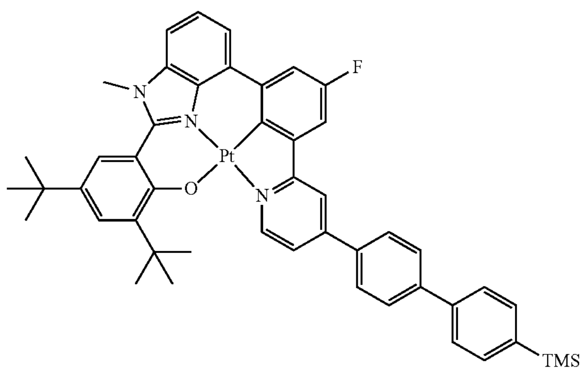
1-45
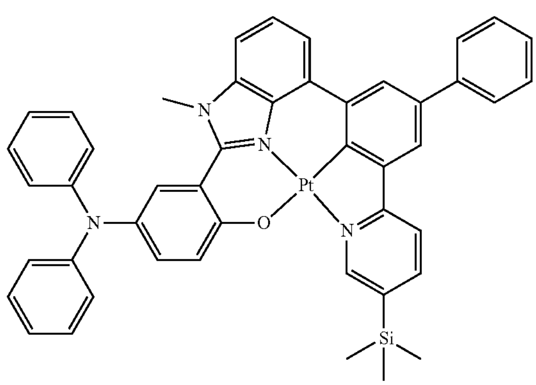
1-46
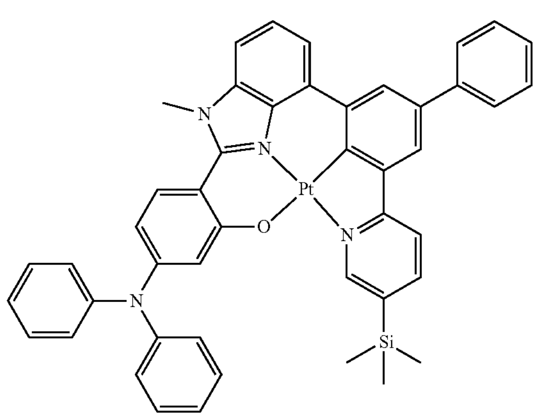
-continued
1-47
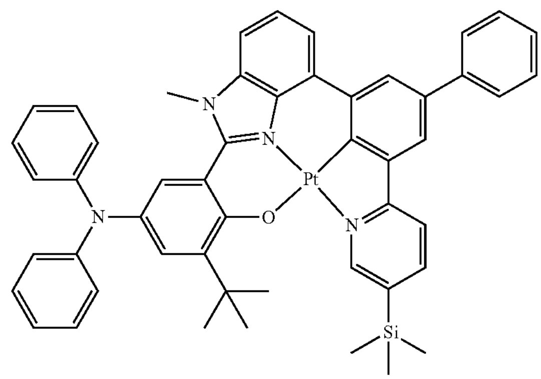
1-48
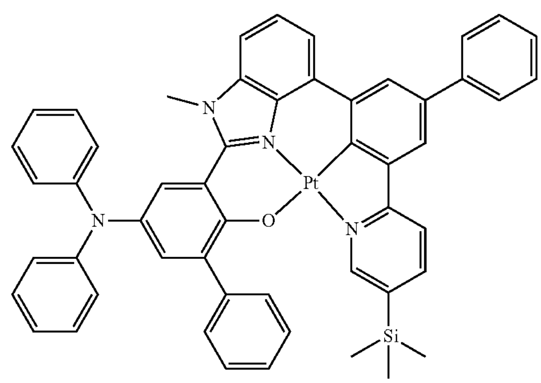
1-49
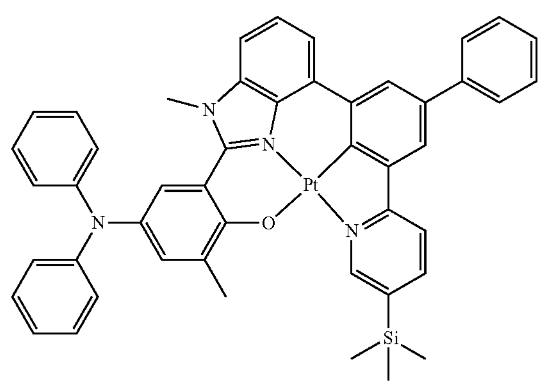
1-50
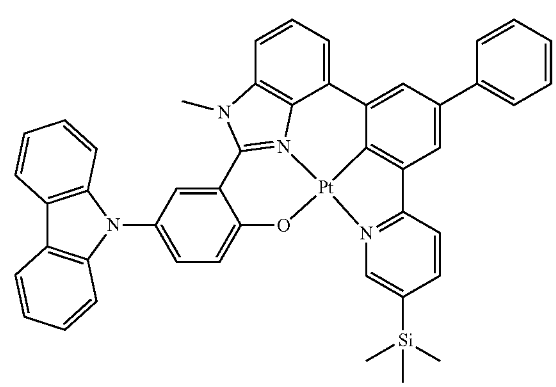

-continued
1-51
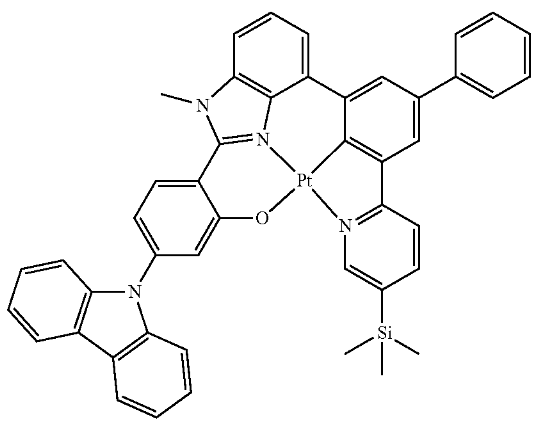
1-52
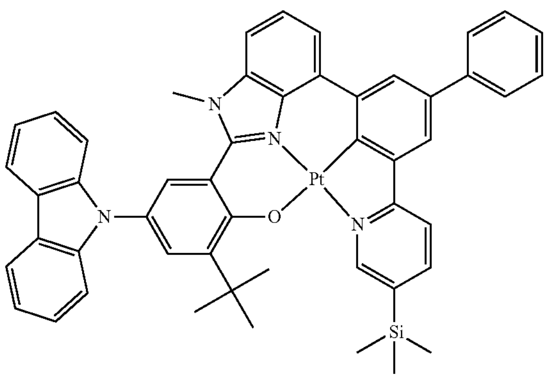
1-53
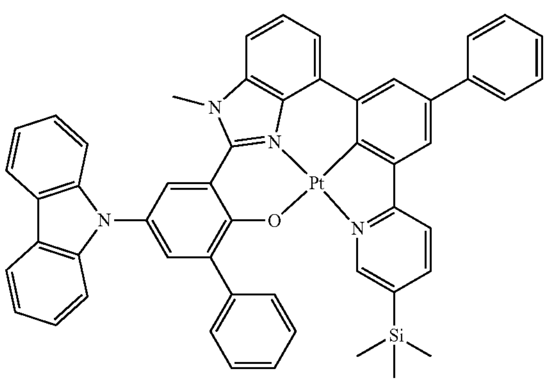
1-54
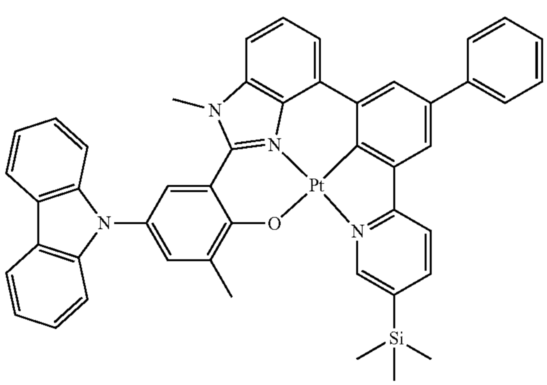
-continued
1-55
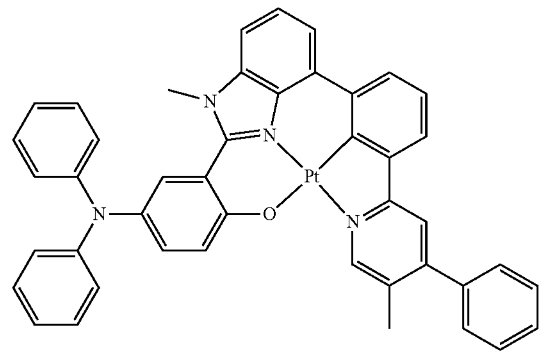
1-56
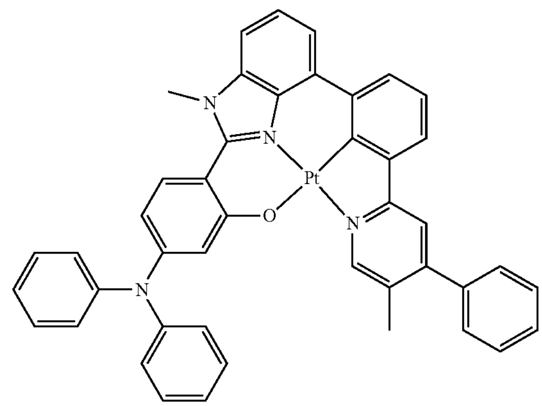
1-57
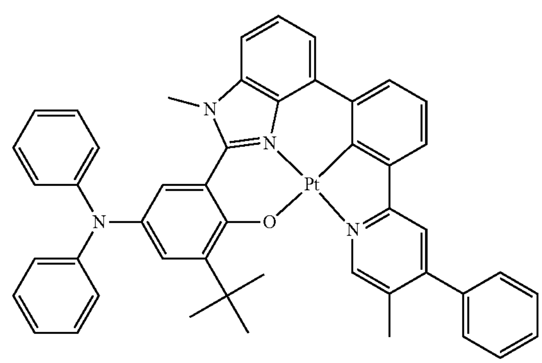
1-58
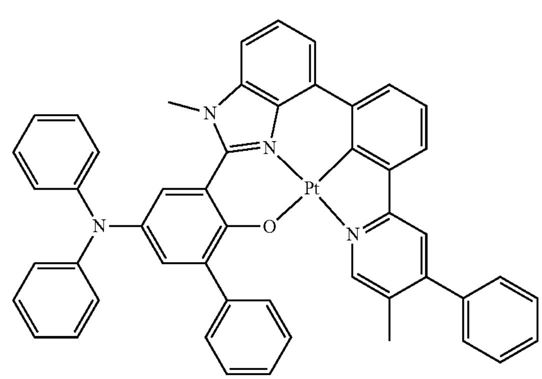

-continued
1-59
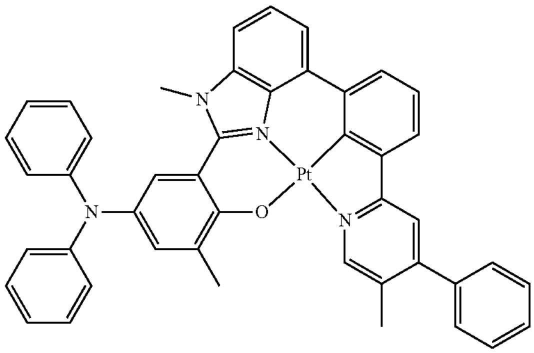
1-60
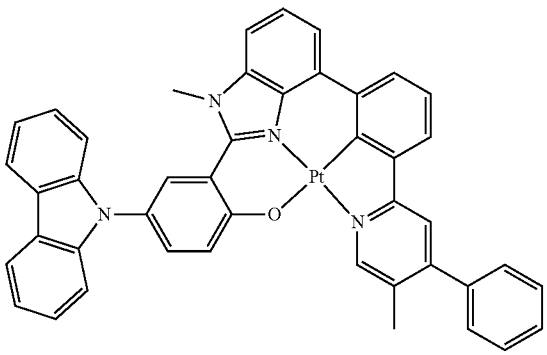
1-61
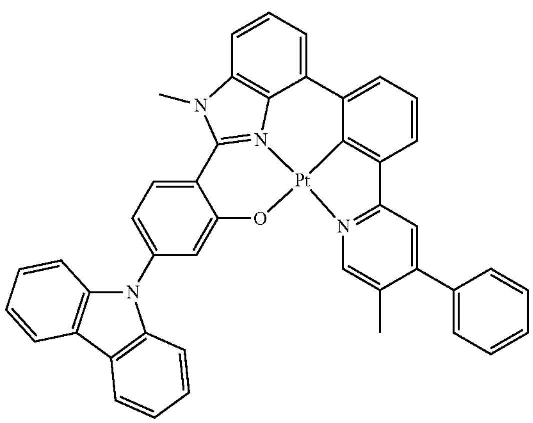
1-62
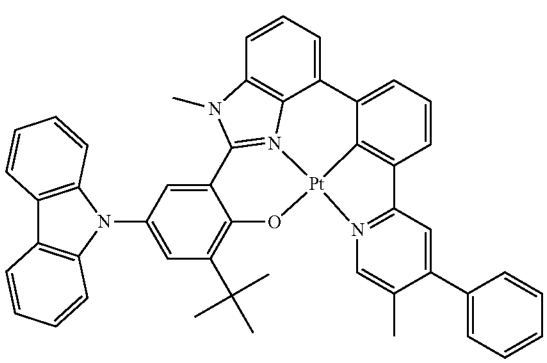
-continued
1-63
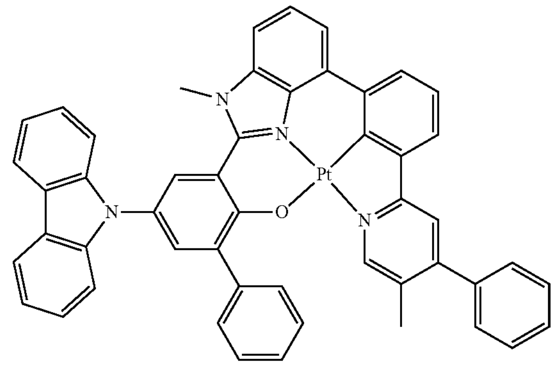
1-64
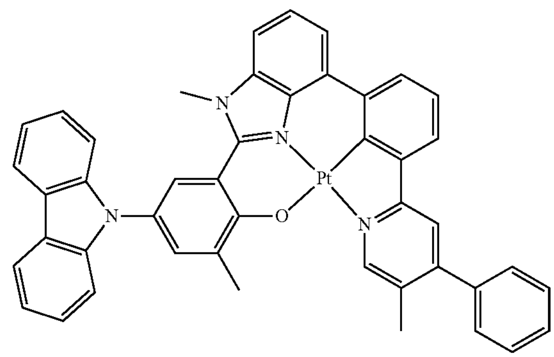
1-65
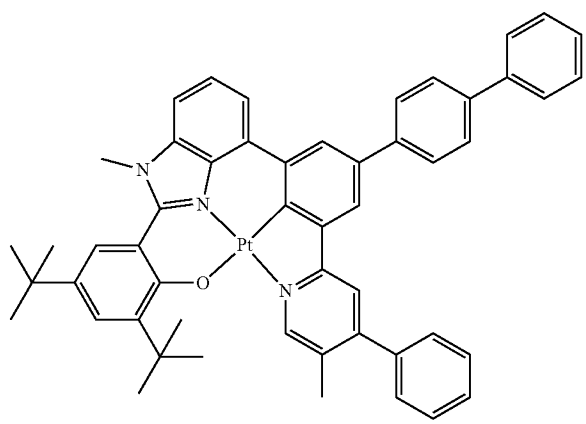
1-66
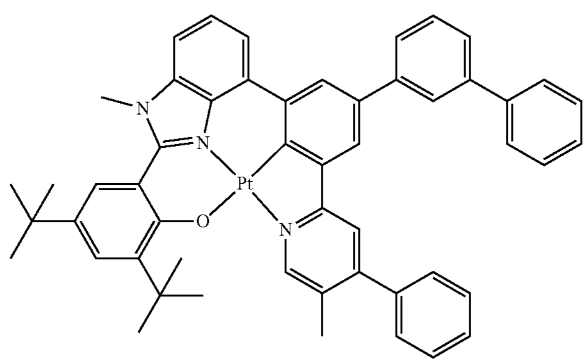

-continued
1-67
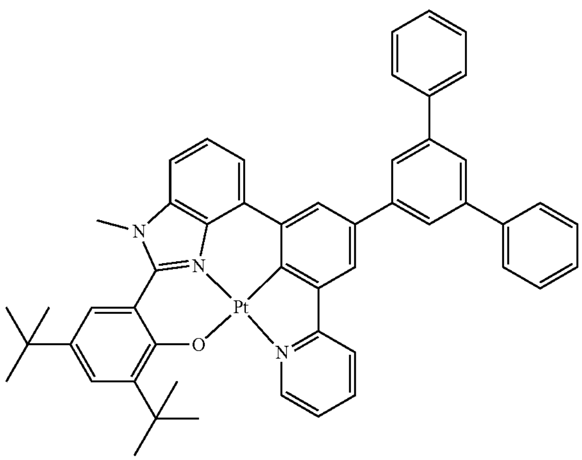
1-68
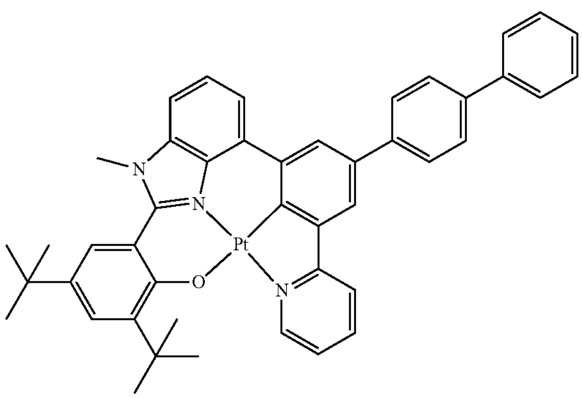
1-69
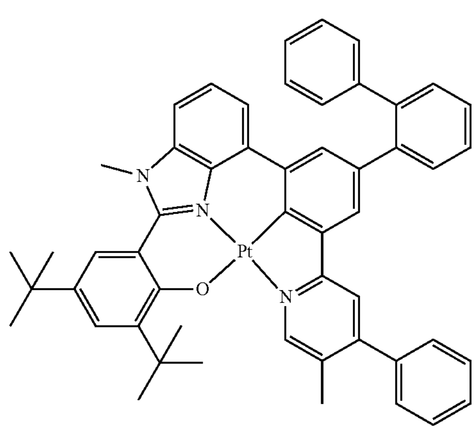
-continued
1-70
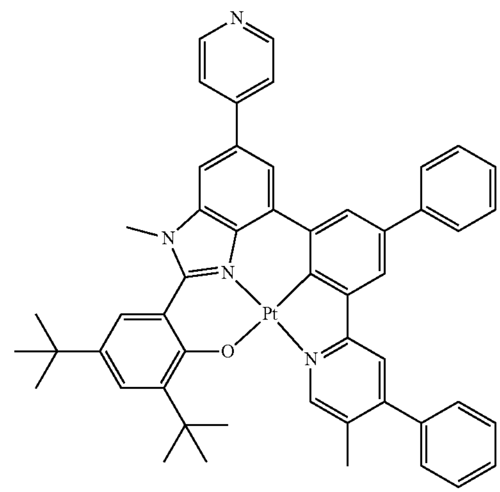
1-71
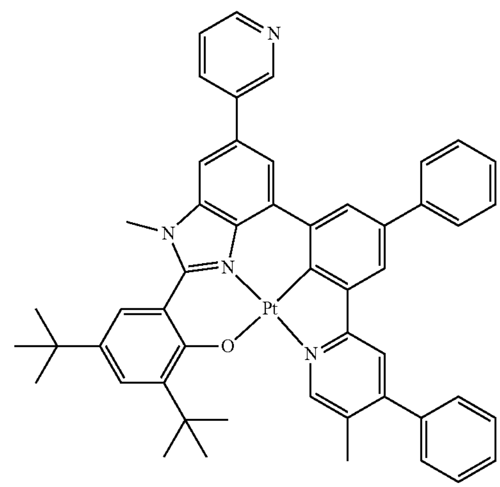
1-72
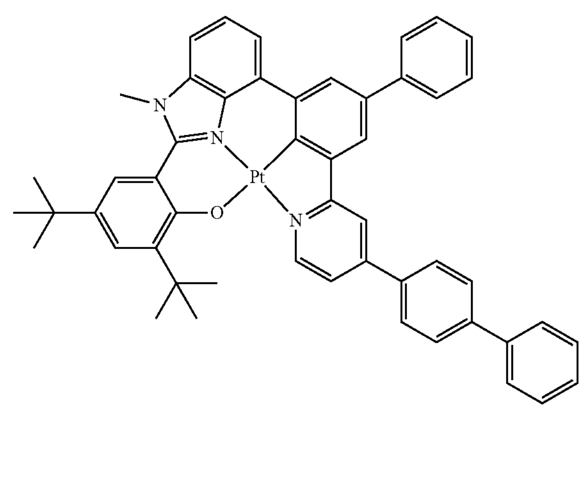

-continued
1-73
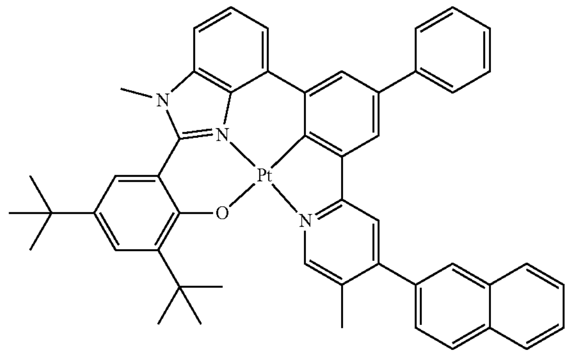
1-74
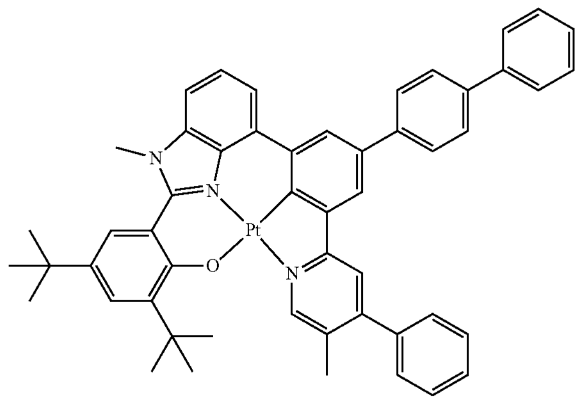
1-75
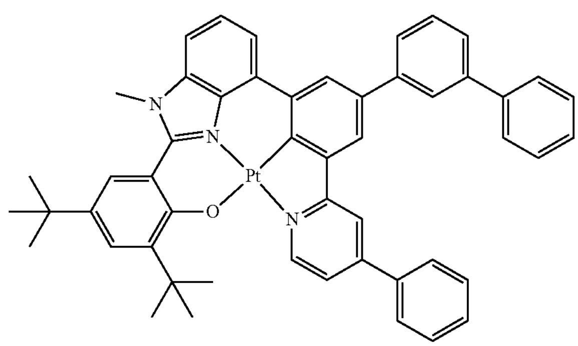
1-76
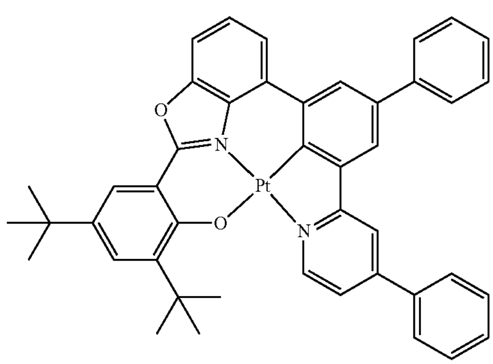
-continued
1-77
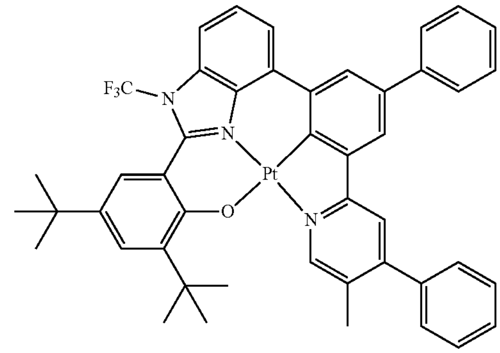
1-78
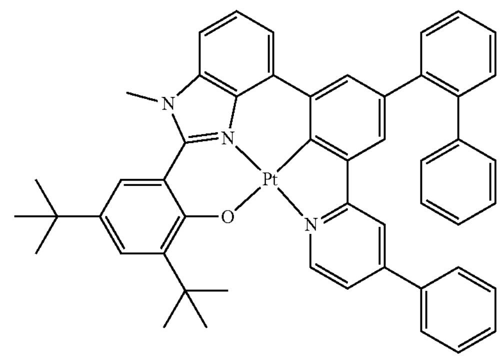
1-79
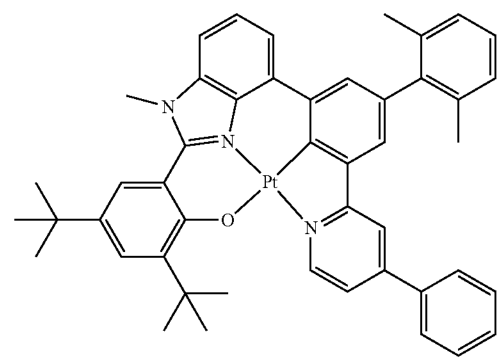
1-80
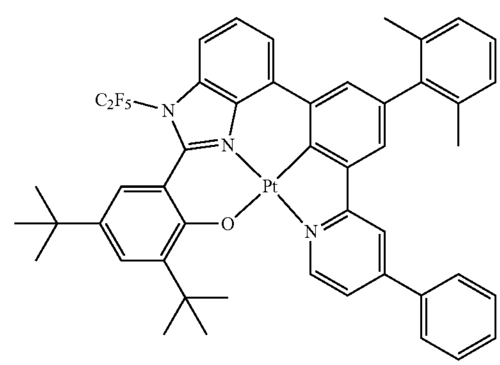

-continued
1-81
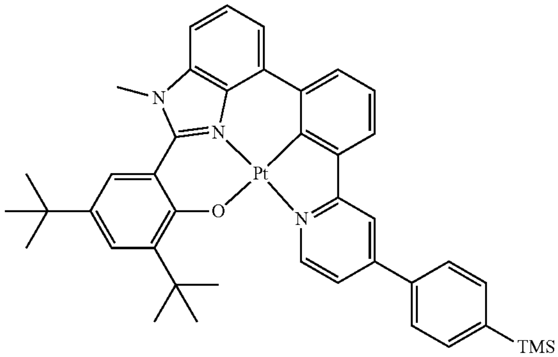
1-82
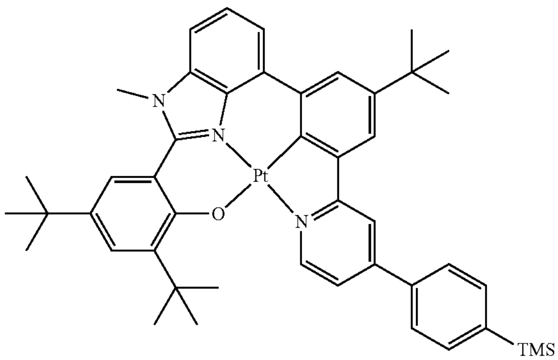
1-83
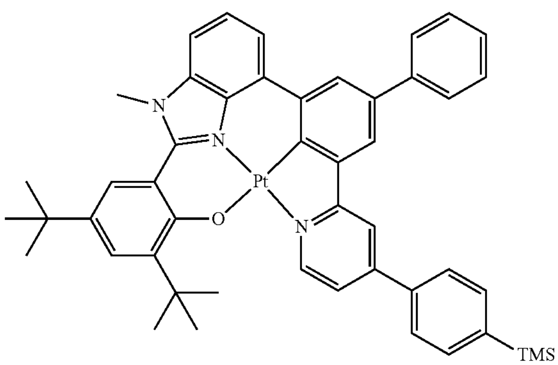
1-84
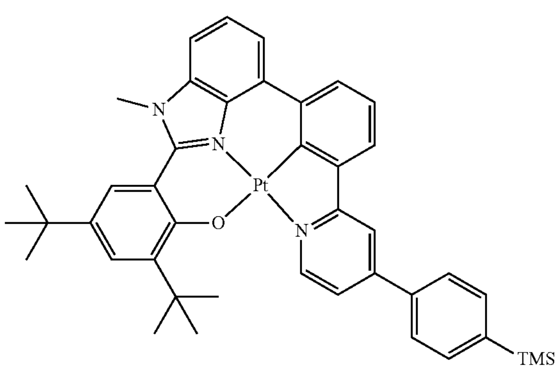
-continued
1-85
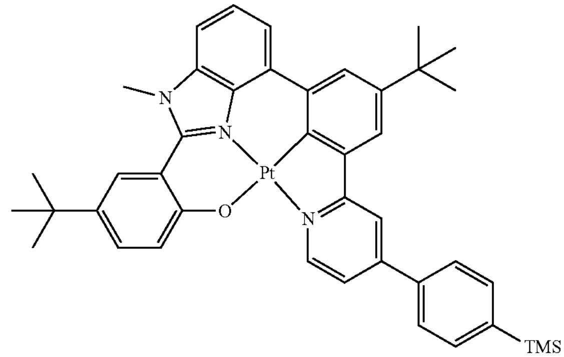
1-86
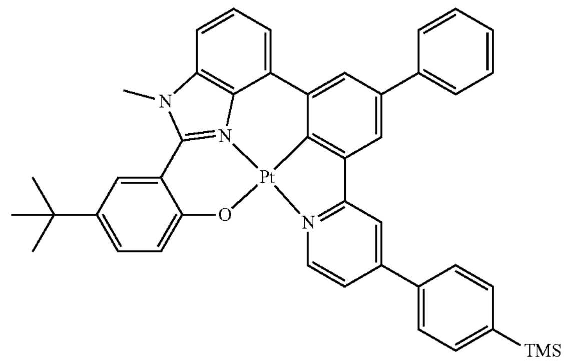
1-87
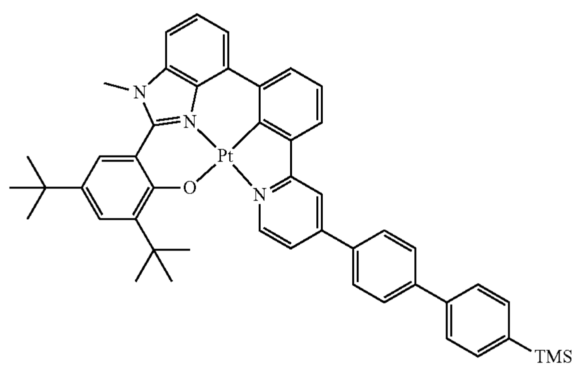
1-88
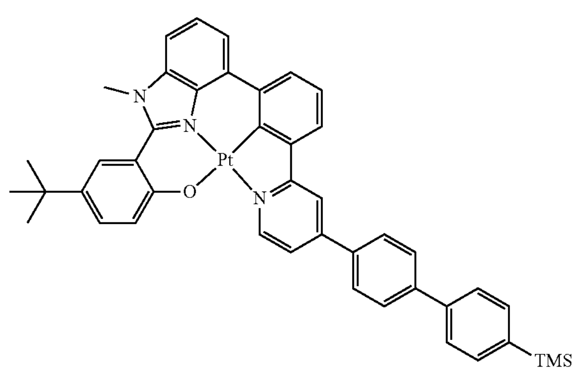

-continued
2-1
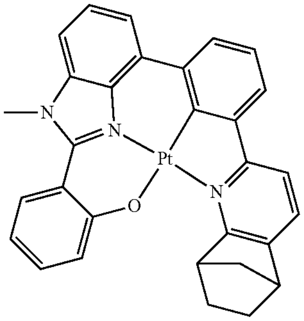
2-2
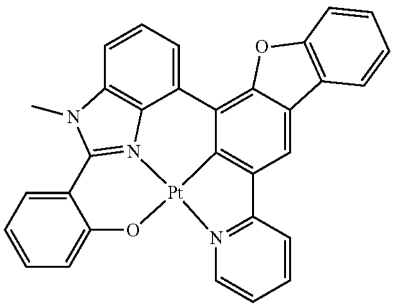
2-3
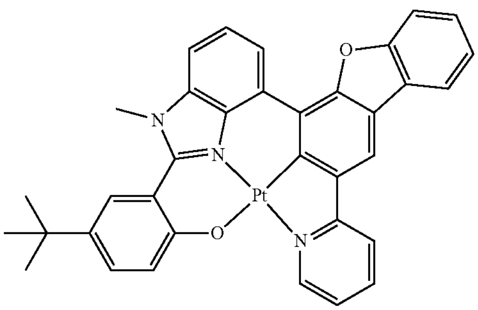
2-4
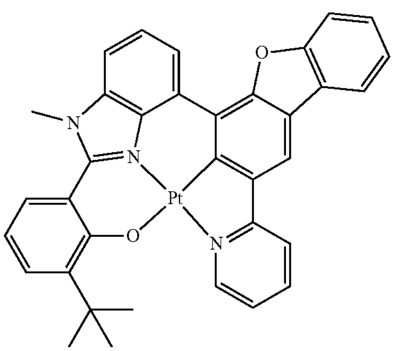
2-5
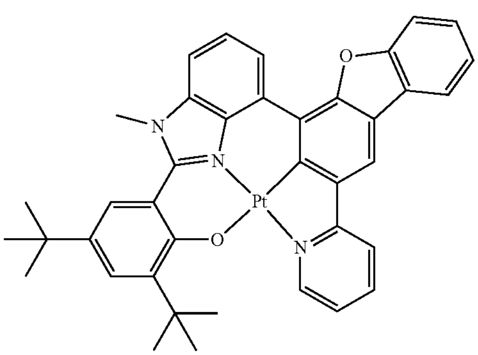
-continued
2-6
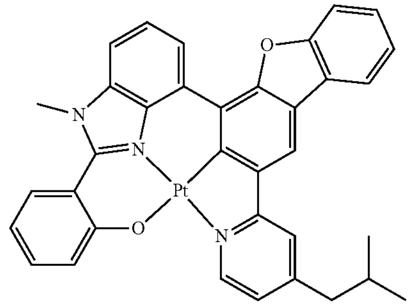
2-7
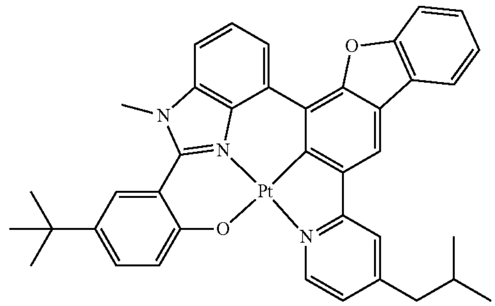
2-8
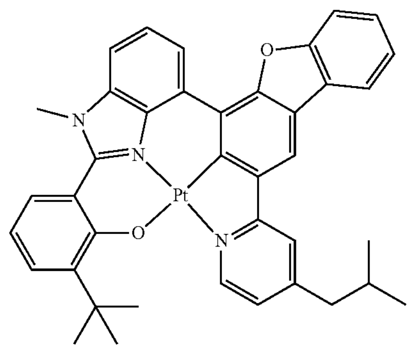
2-9
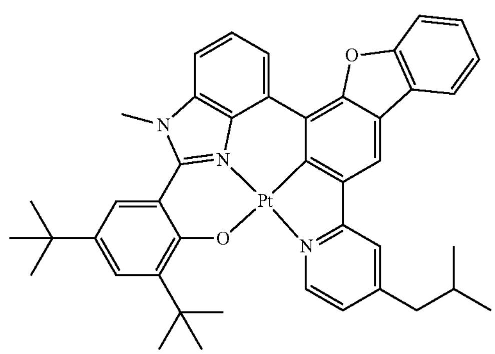

-continued
2-10
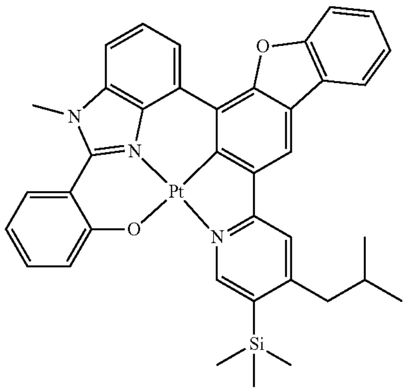
2-11
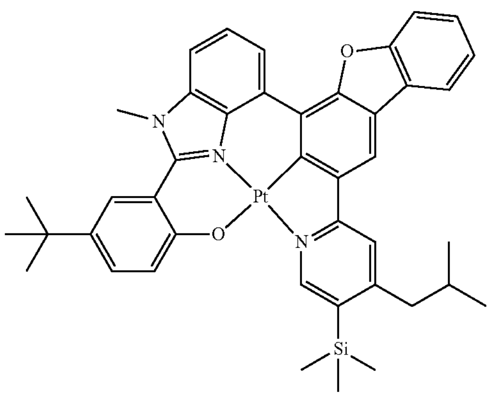
2-12
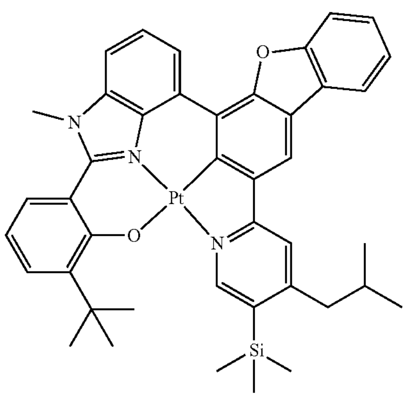
2-13
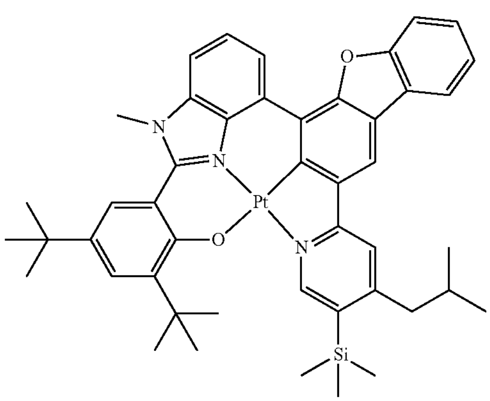
-continued
2-14
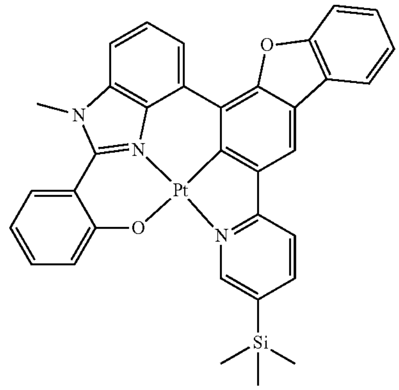
2-15
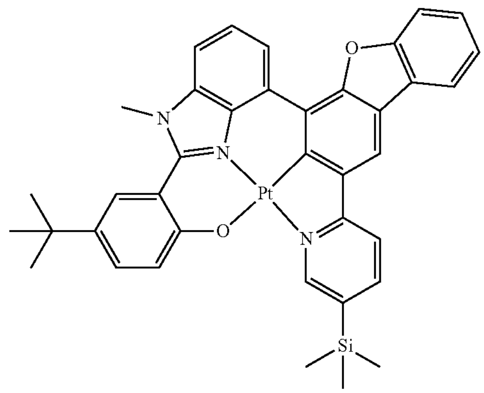
2-16
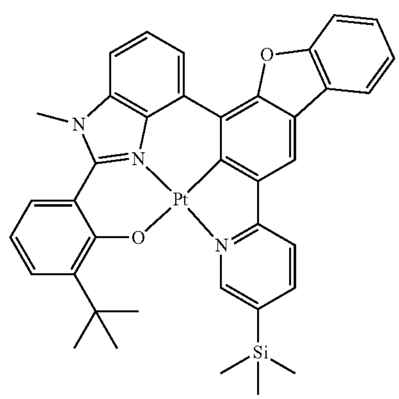
2-17
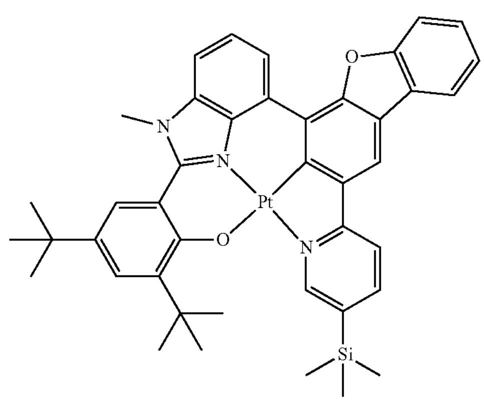

-continued
2-18
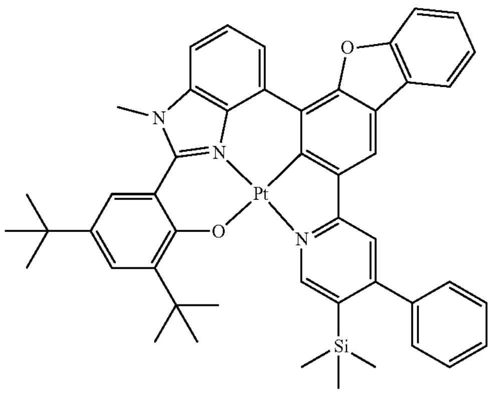
2-19
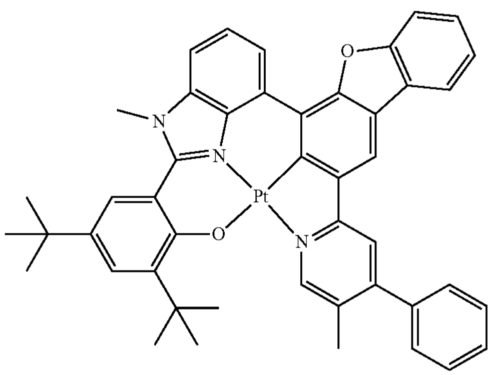
2-20
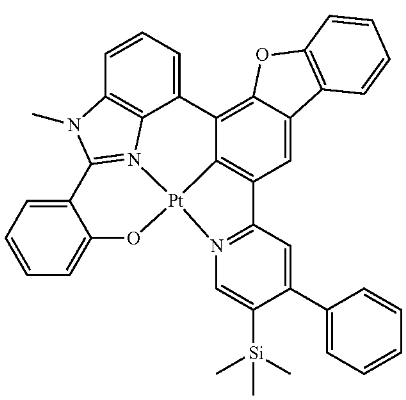
2-21
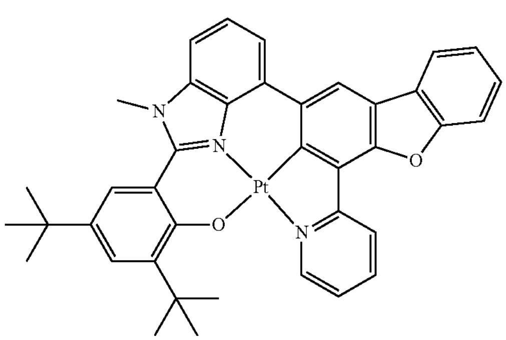
-continued
2-22
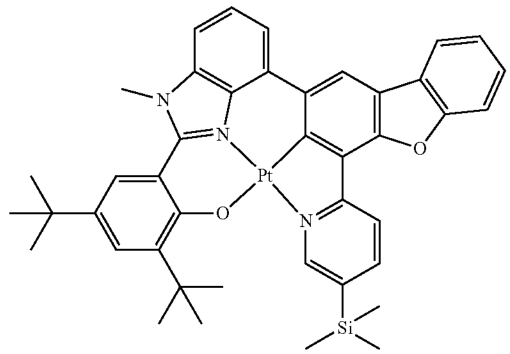
2-23
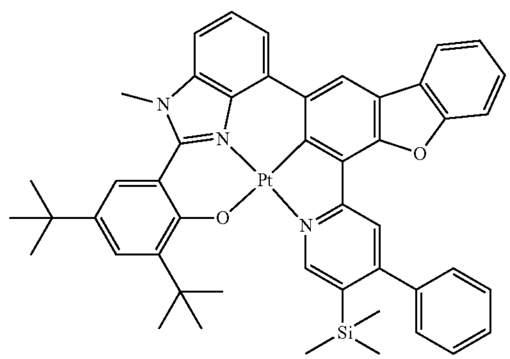
2-24
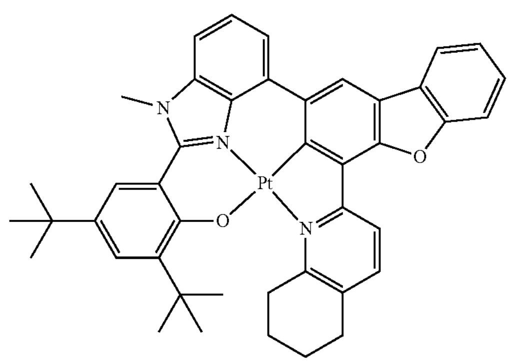
2-25
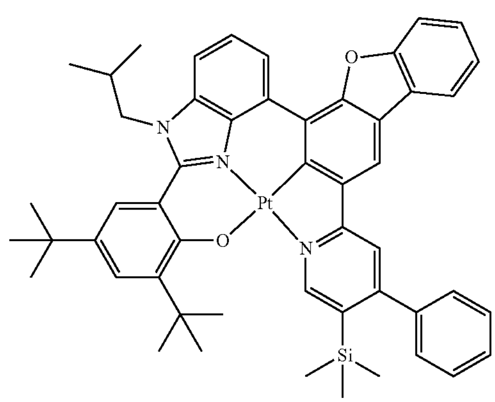

-continued
2-26
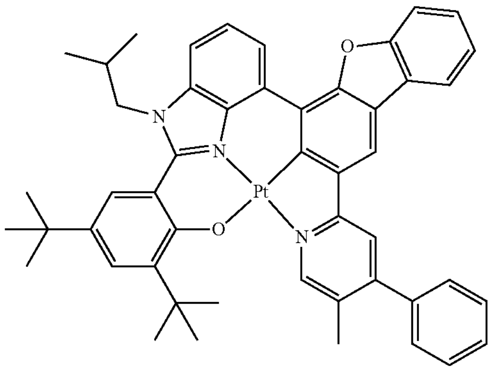
2-27
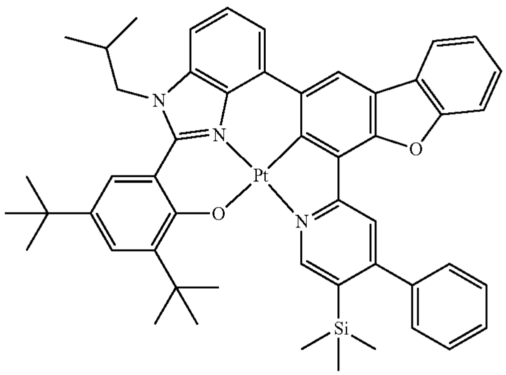
2-28
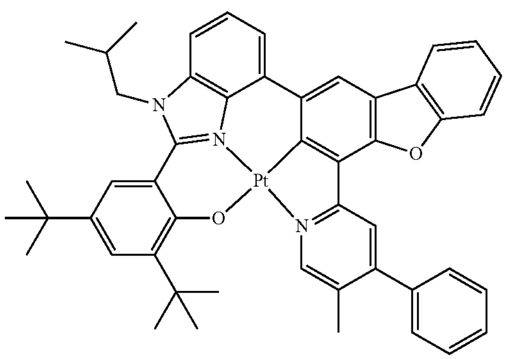
2-29
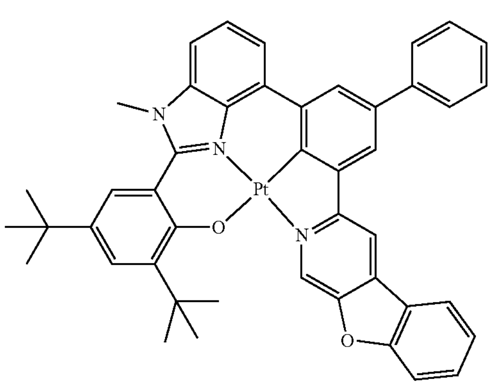
-continued
2-30
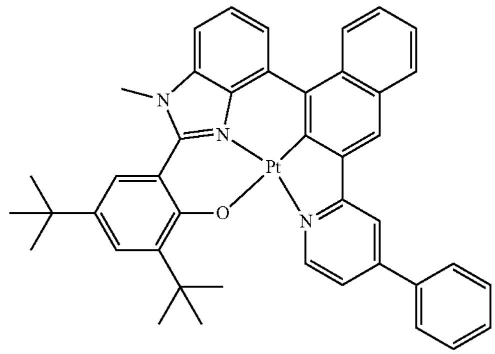
2-31
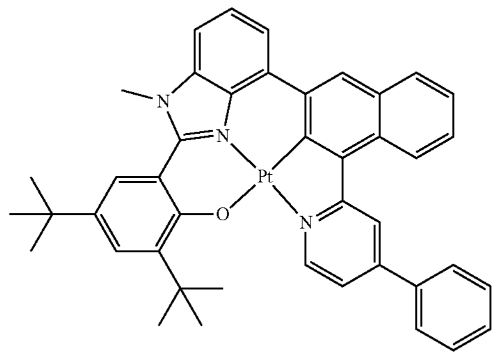
2-32
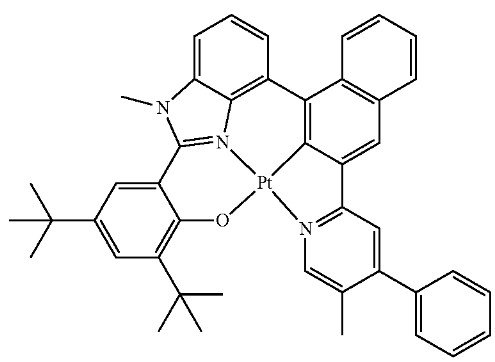
2-33
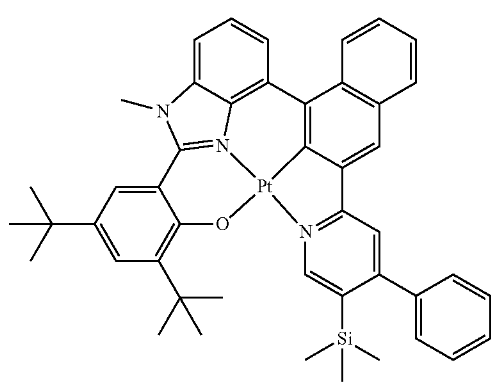

-continued
2-34
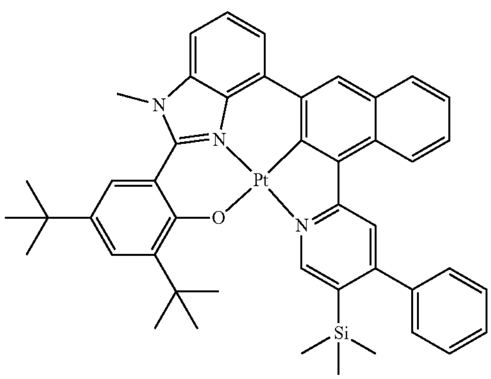
2-35
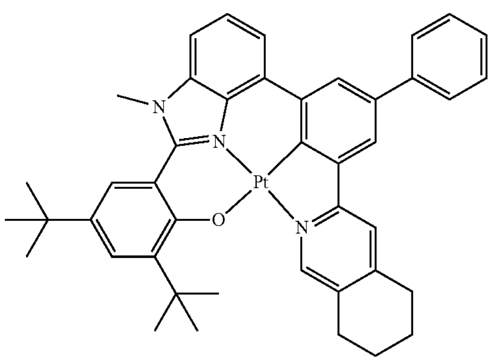
2-36
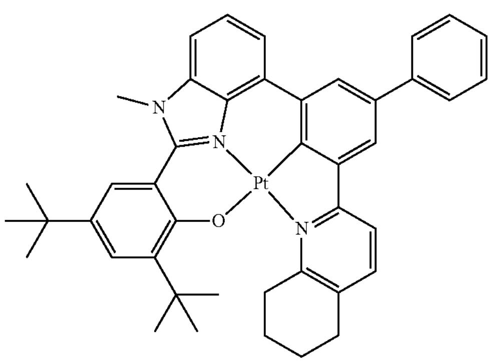
2-37
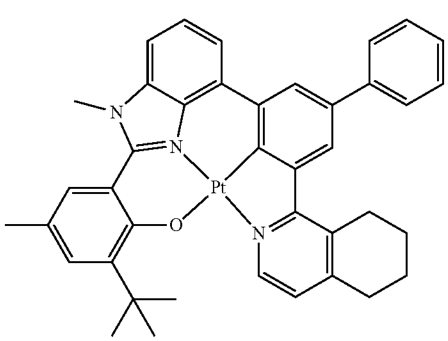
-continued
2-38
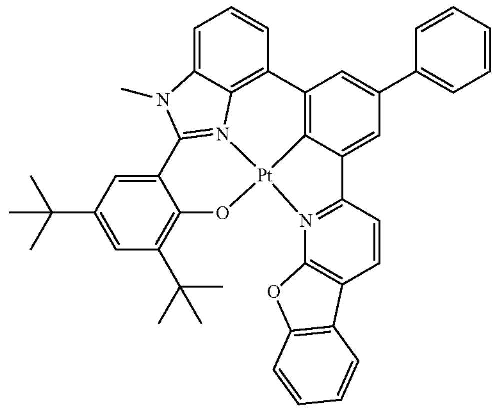
2-39
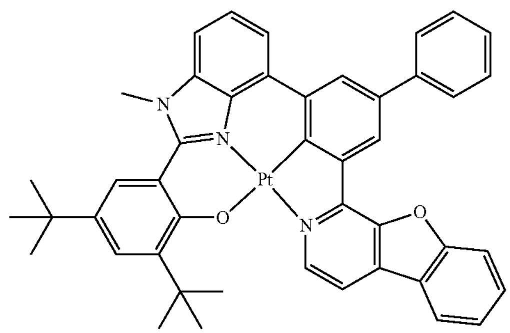
2-40
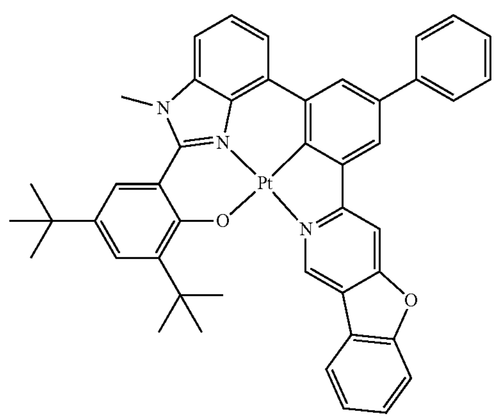
2-41
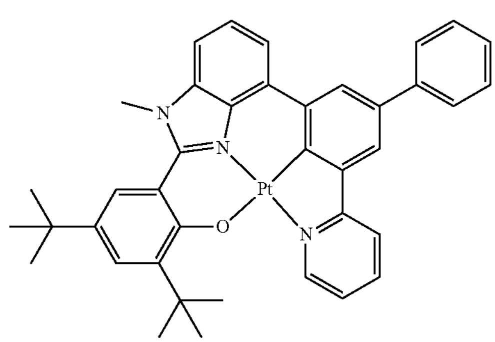

-continued
2-42
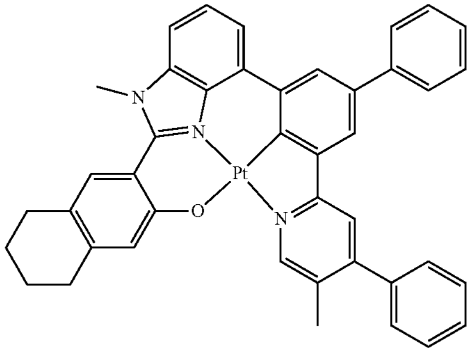
2-43
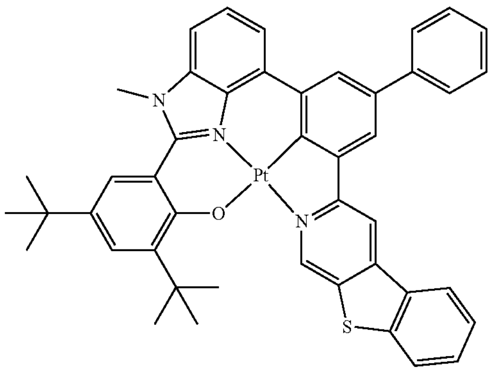
2-44
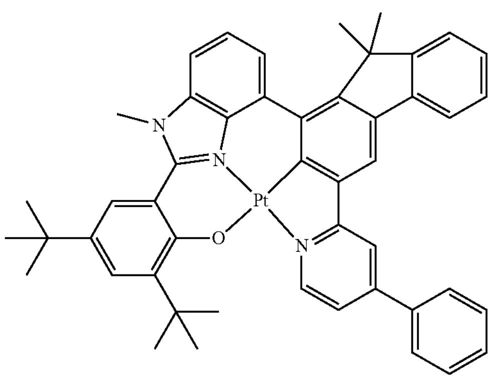
2-45
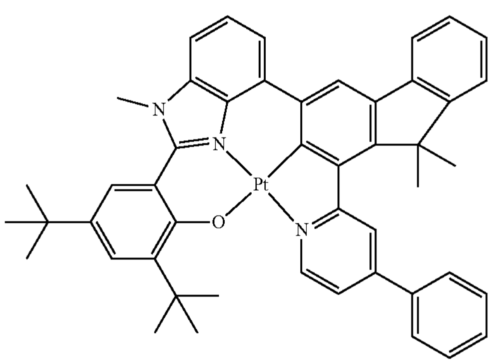
-continued
2-46
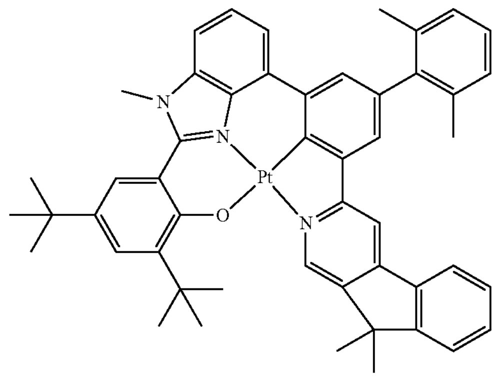
2-47
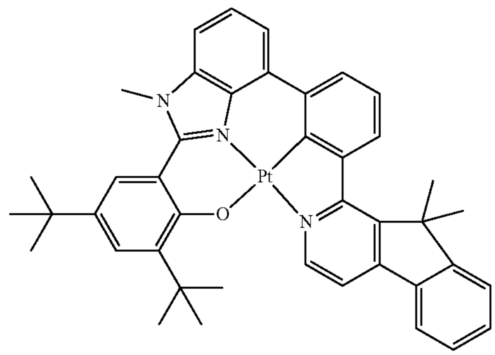
3-1
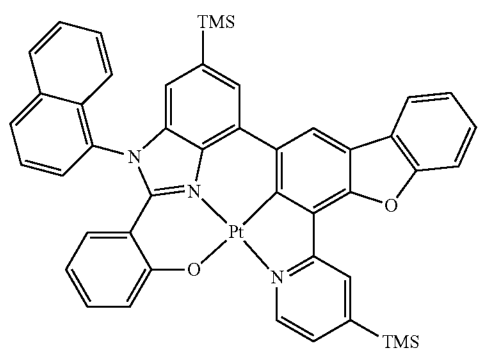
3-2
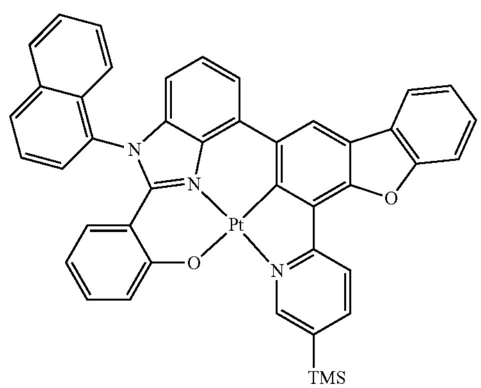

-continued
3-3
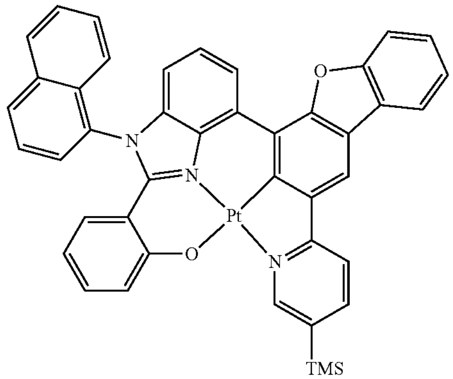
3-4
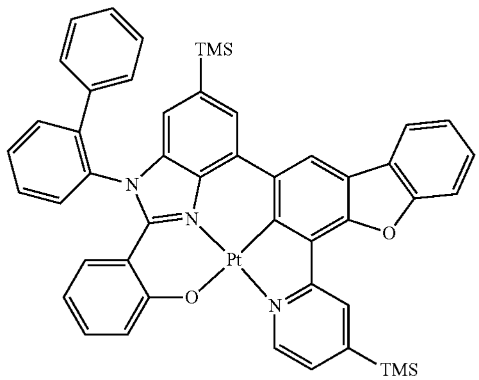
3-5
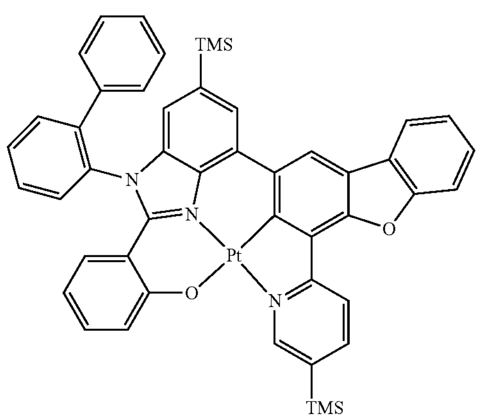
3-6
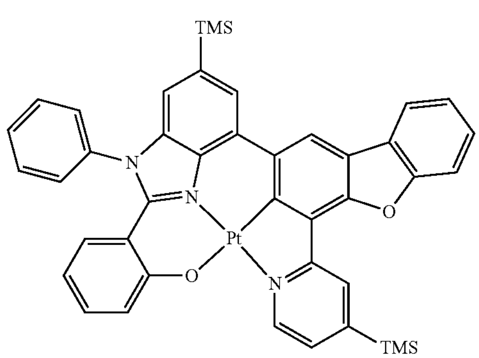
-continued
3-7
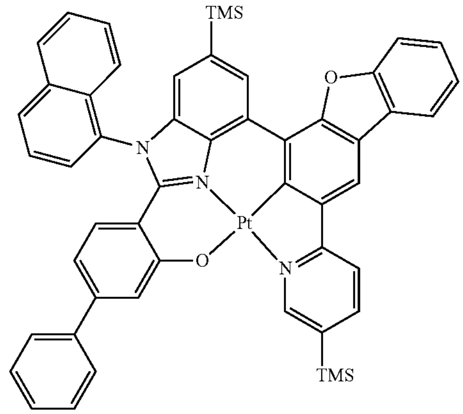
3-8
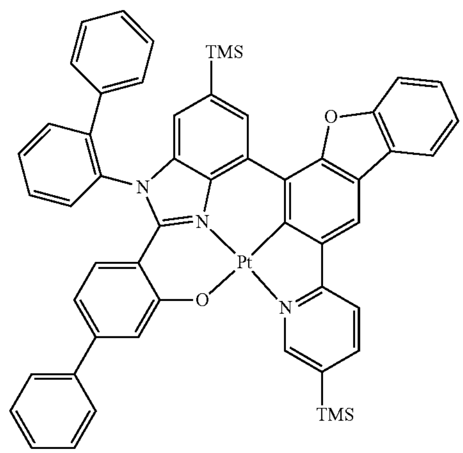
3-9
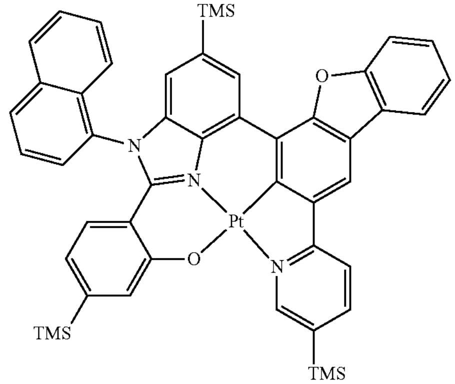

-continued
3-10
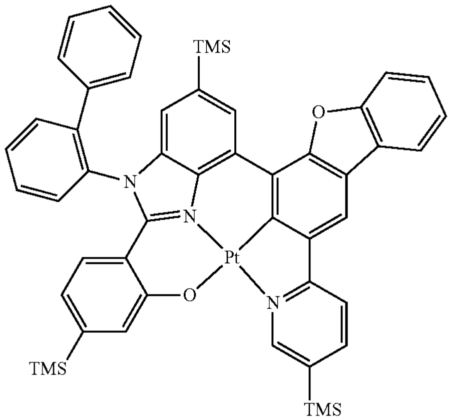
3-11
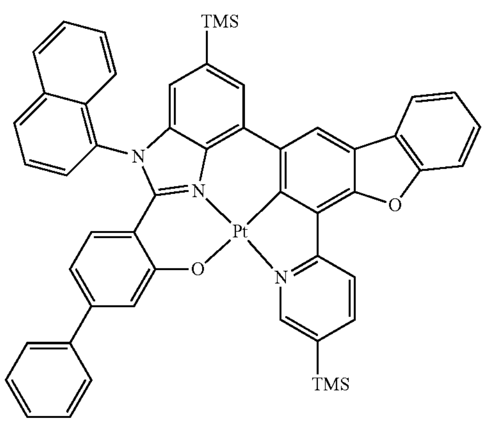
3-12
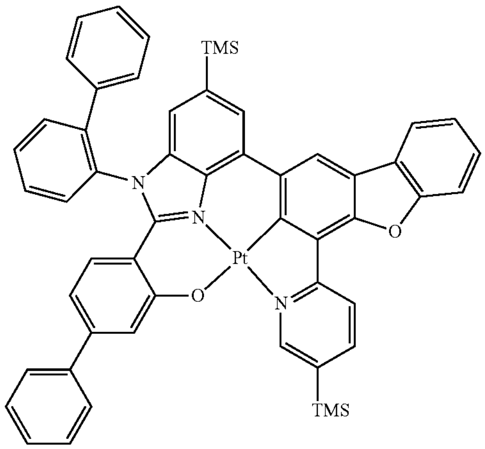
-continued
3-13
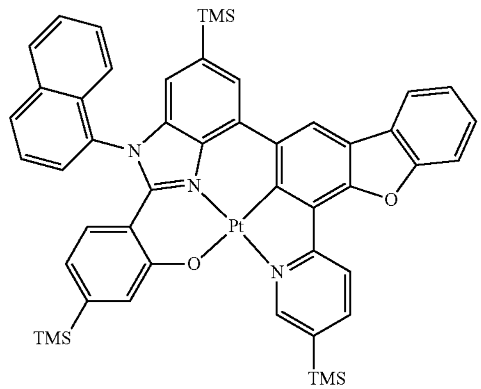
3-14
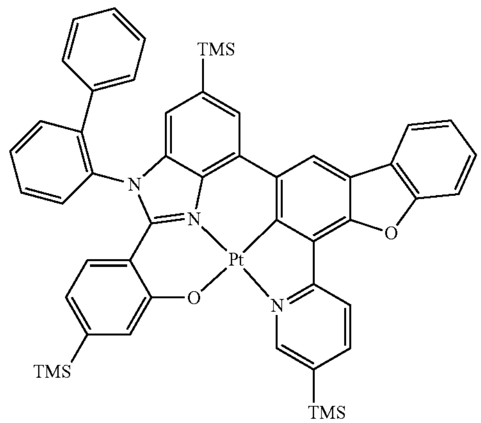
3-15
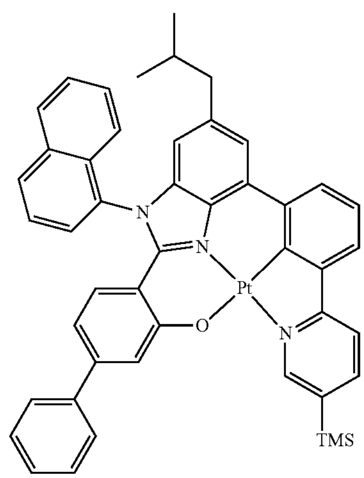

-continued
3-16
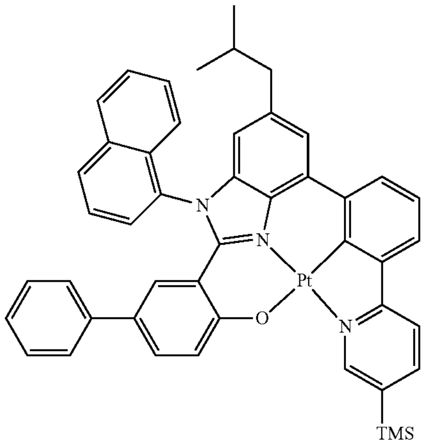
3-17
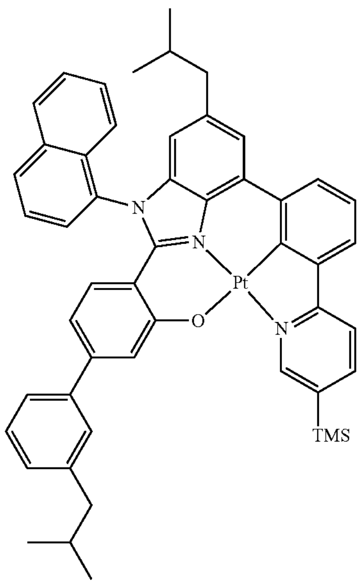
3-18
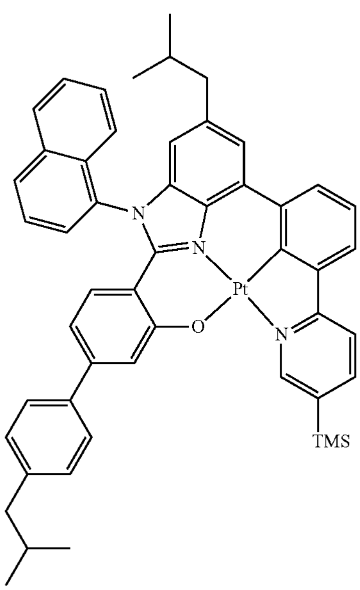
-continued
3-19
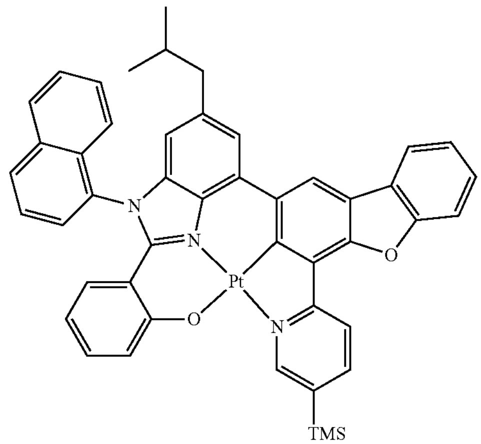
3-20
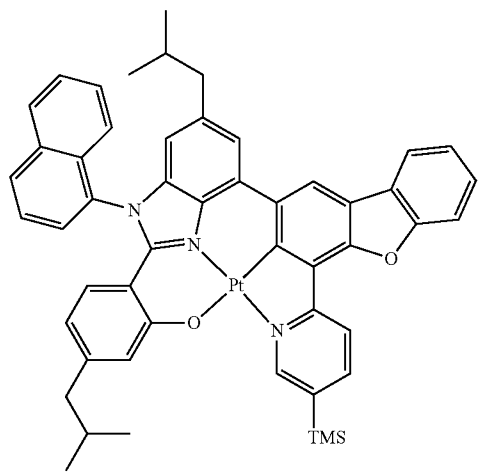
3-21
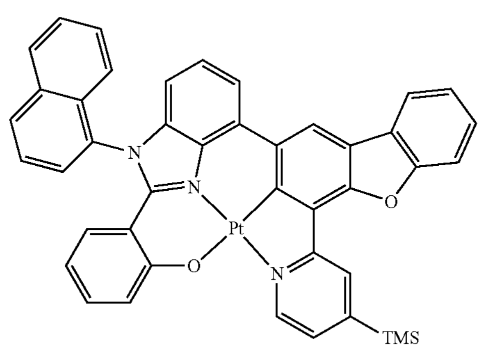

-continued
3-22
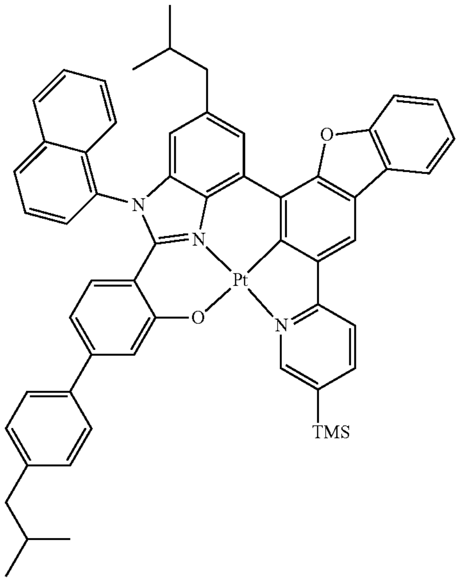
3-23
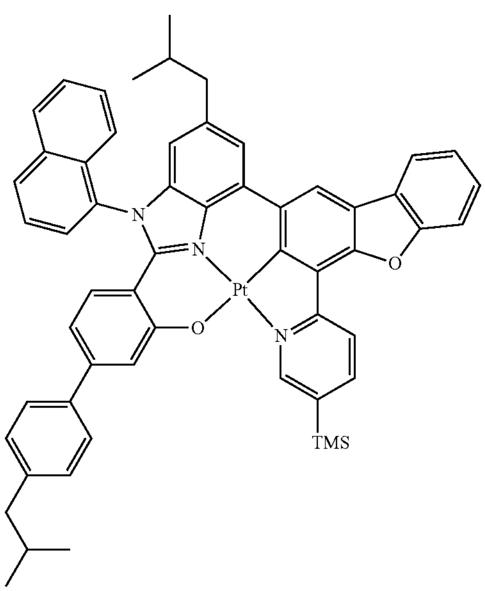
-continued
3-24
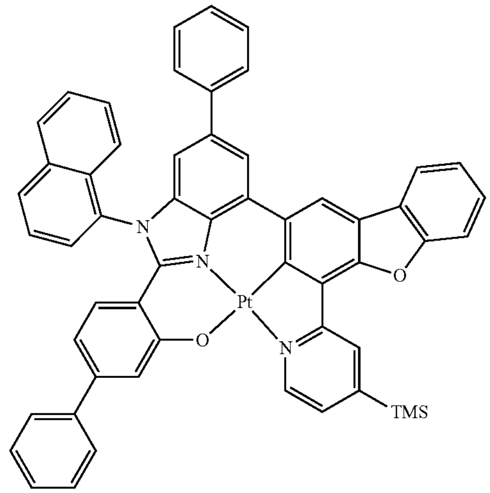
3-25
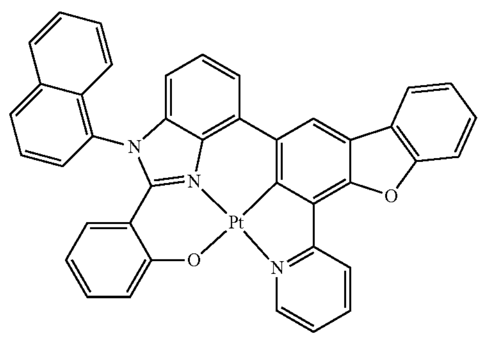
3-26
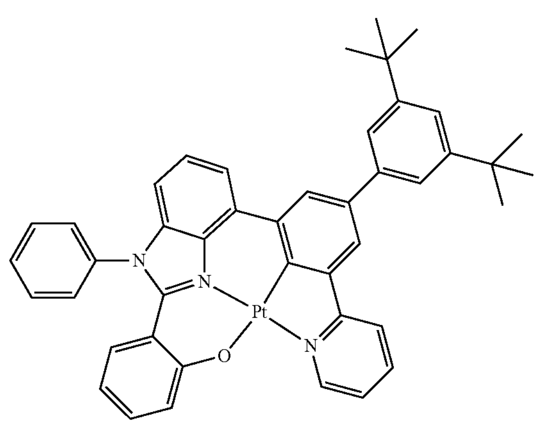

-continued
3-27
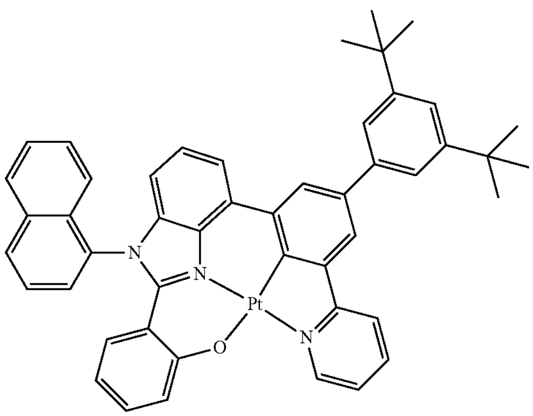
3-28
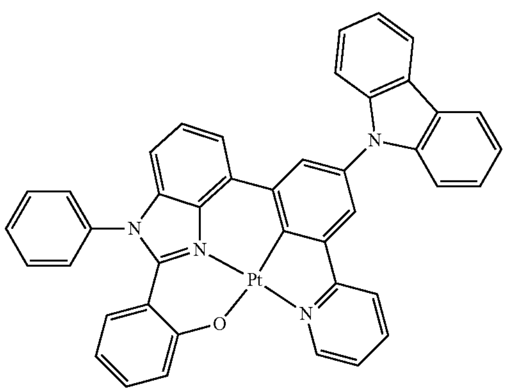
3-29
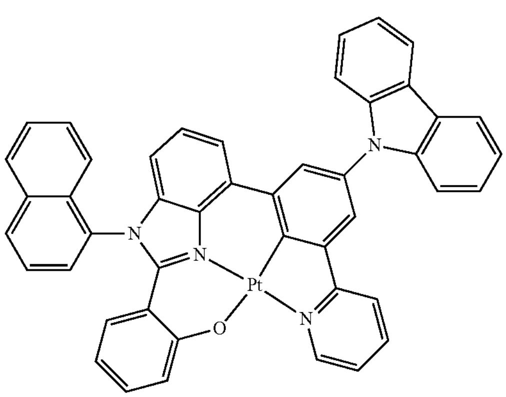
-continued
3-30
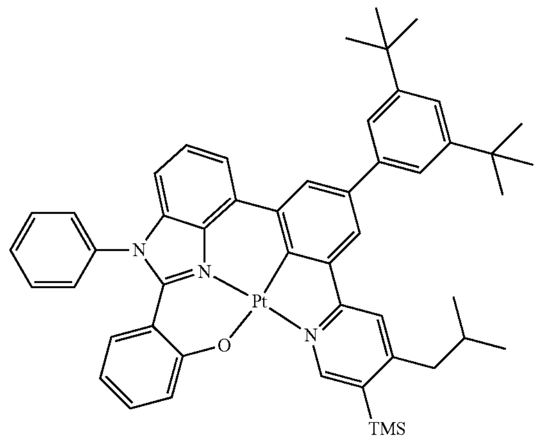
3-31
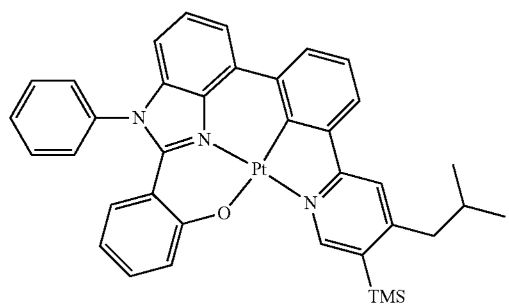
3-32
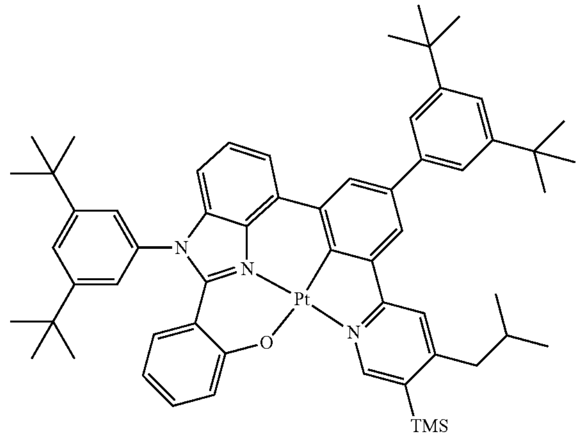
3-33
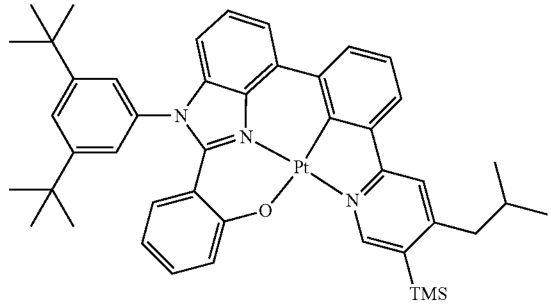

-continued
3-34
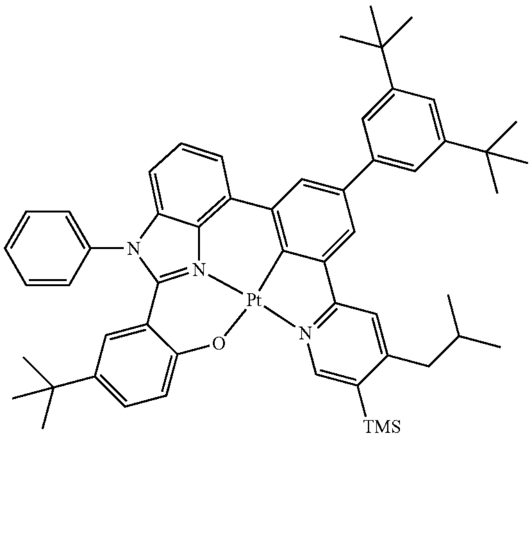
3-35
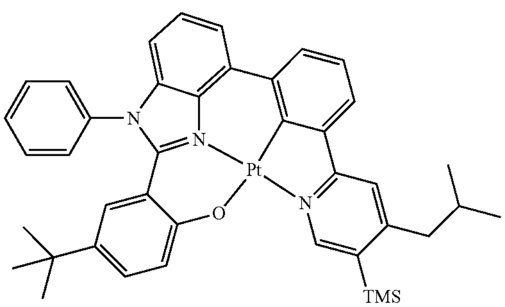
3-36
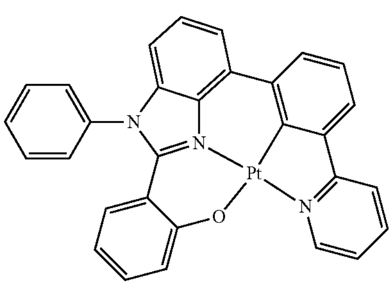
3-37
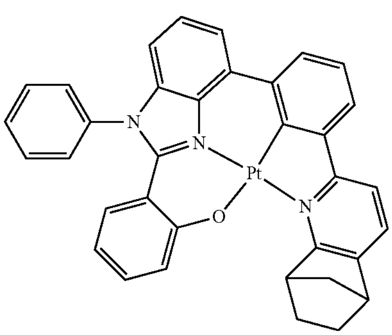
-continued
3-38
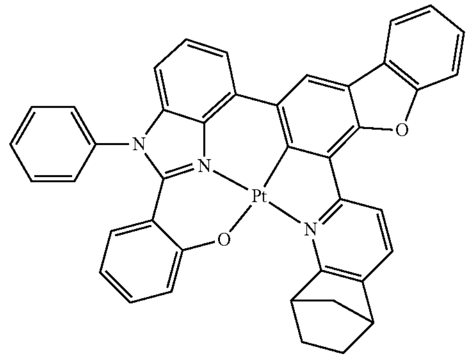
3-39
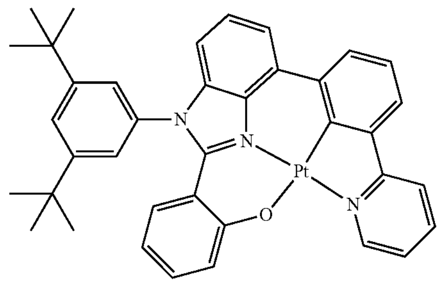
3-40
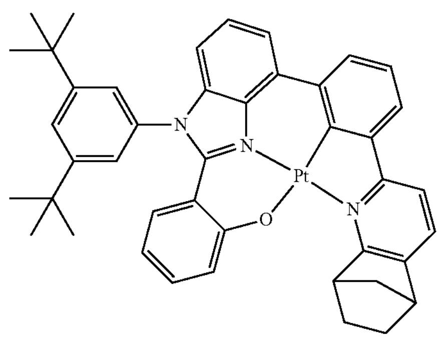
3-41
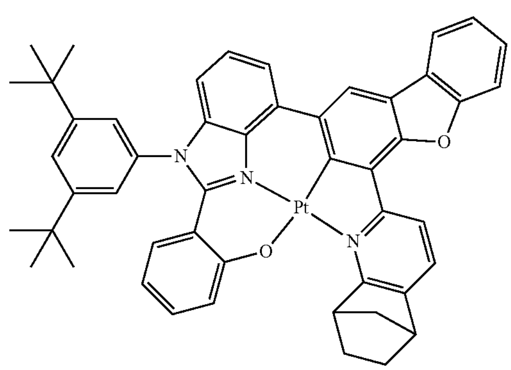

-continued
3-42
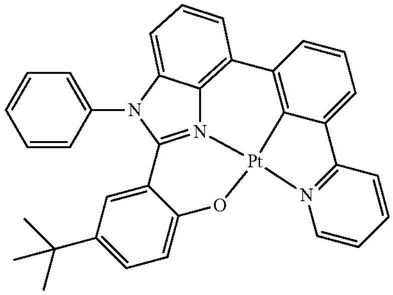
3-43
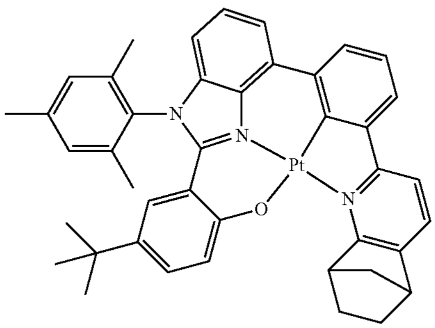
3-44
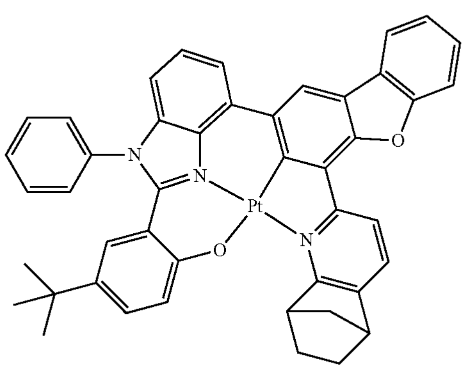
3-45
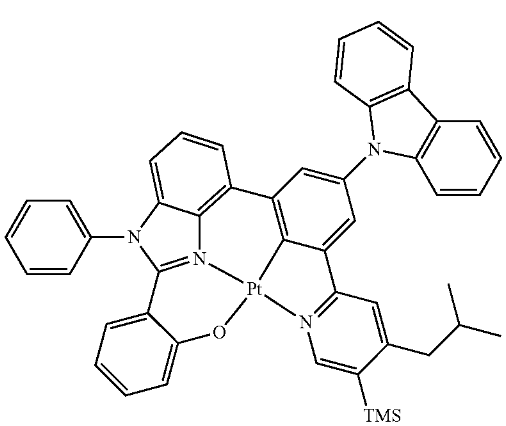
-continued
3-46
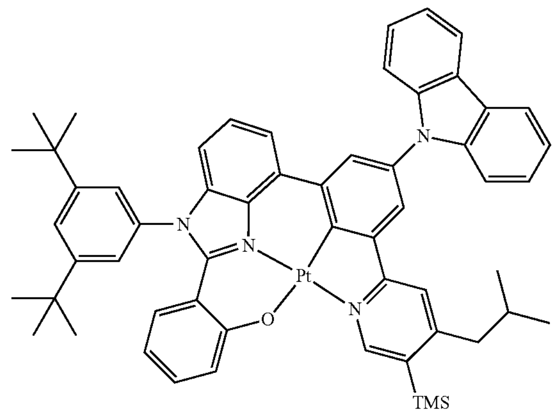
3-47
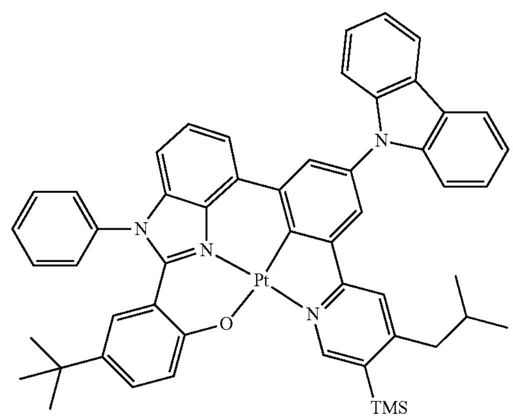
3-48
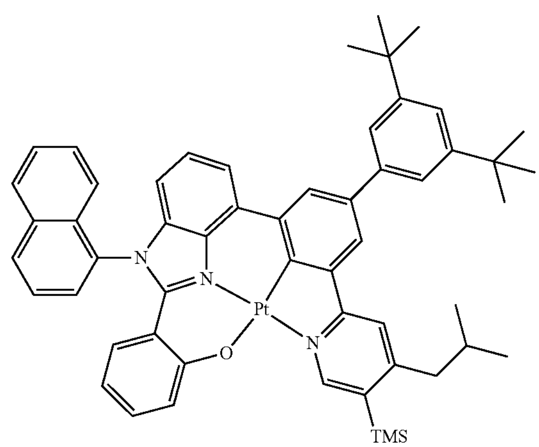
3-49
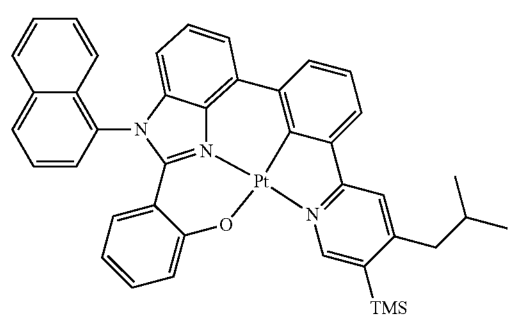

-continued
3-50
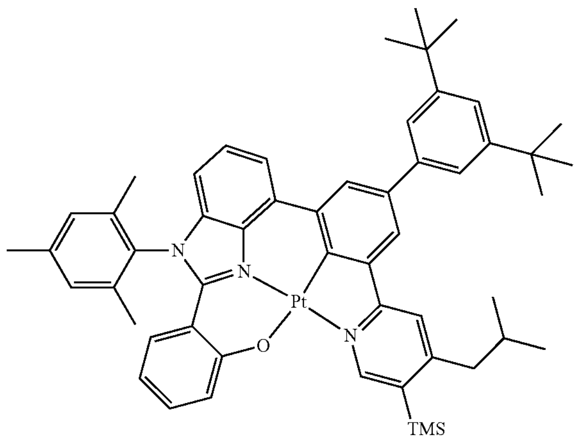
3-51
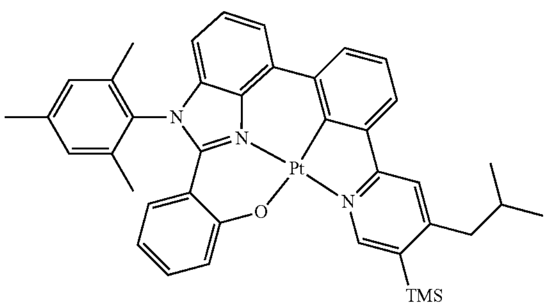
3-52
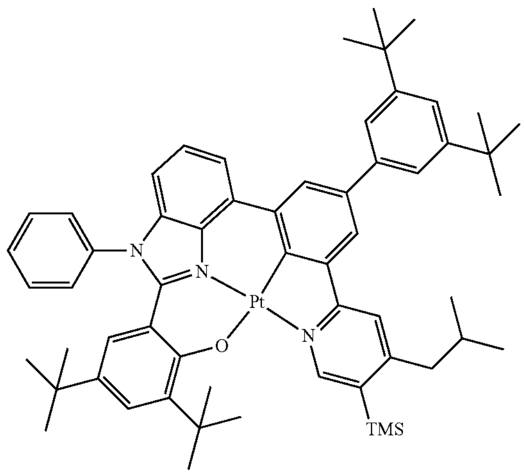
3-53
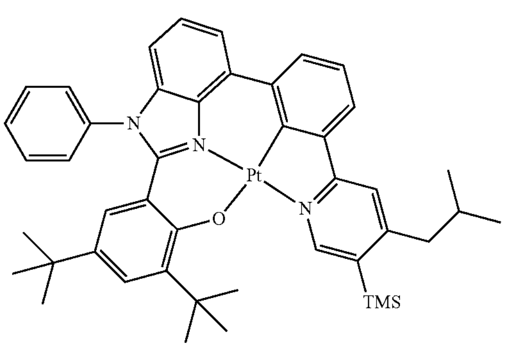
-continued
3-54
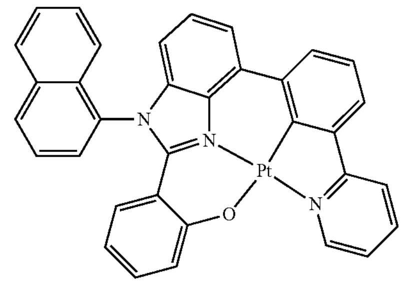
3-55
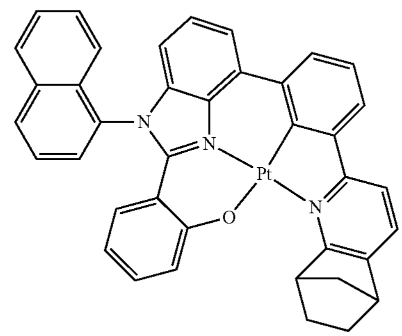
3-56
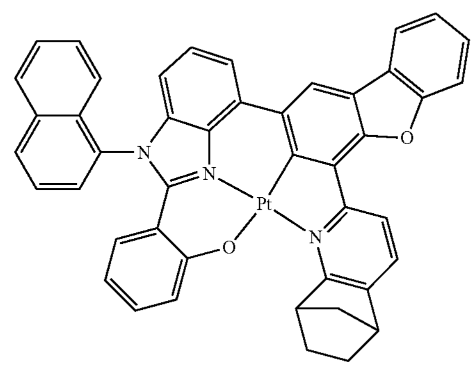
3-57
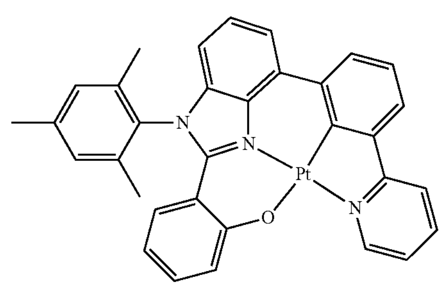
3-58
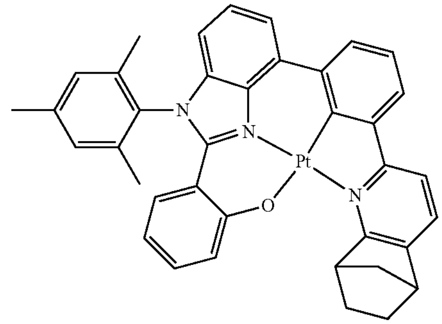

-continued
3-59
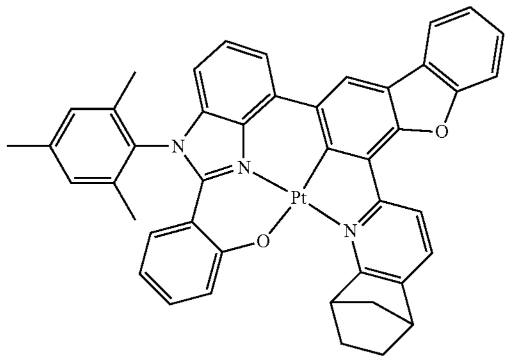
3-60
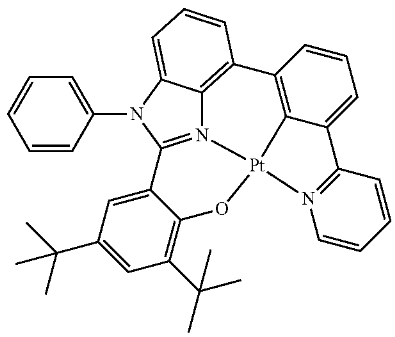
3-61
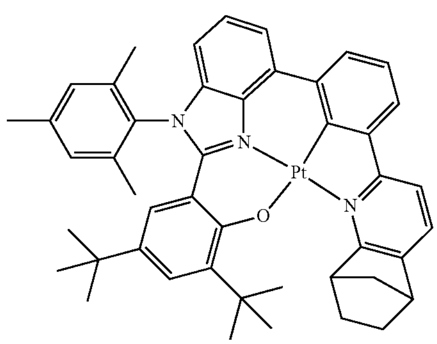
3-62
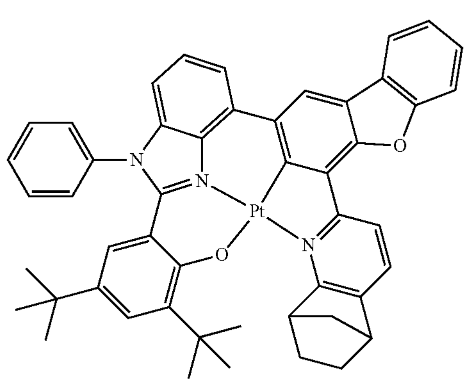
-continued
3-63
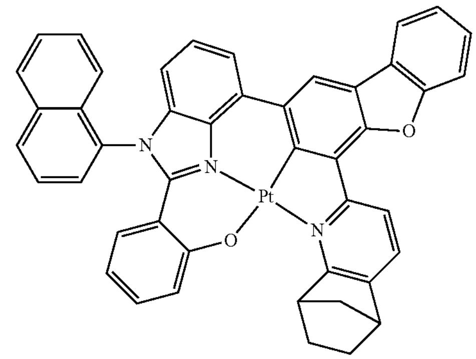
3-64
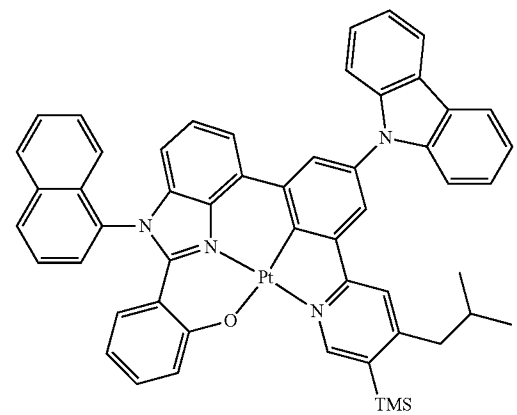
3-65
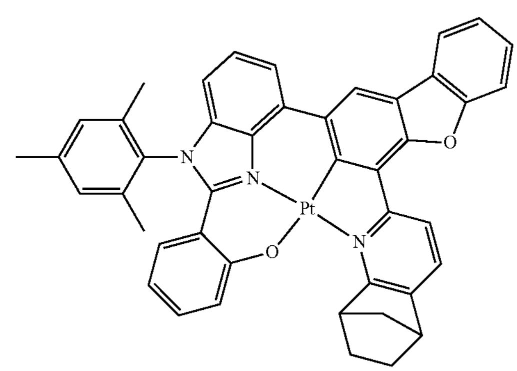
3-66
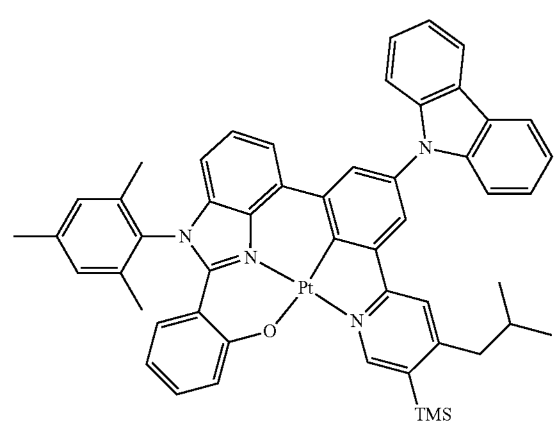

-continued
3-67
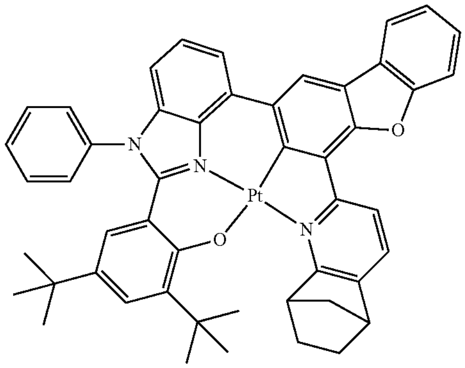
3-68
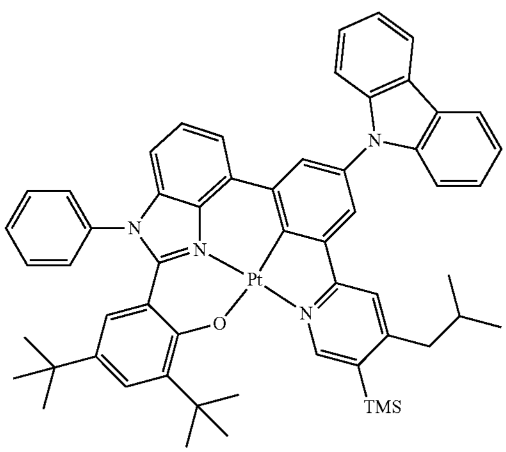
3-69
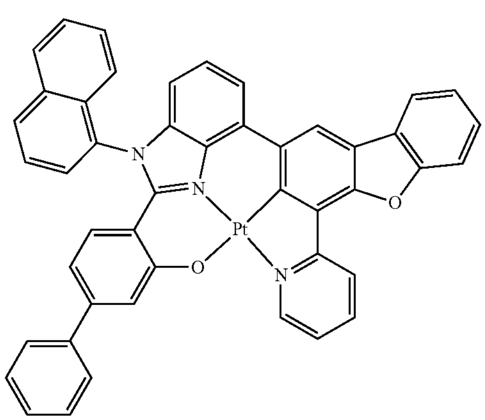
-continued
3-70
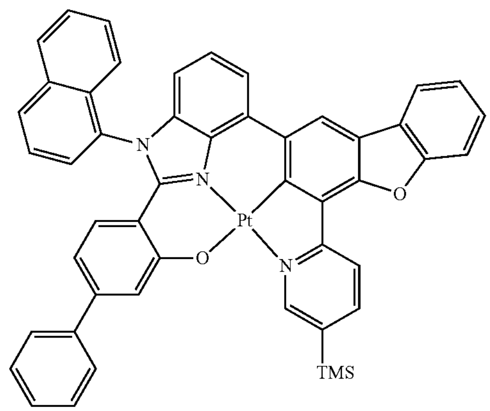
3-71
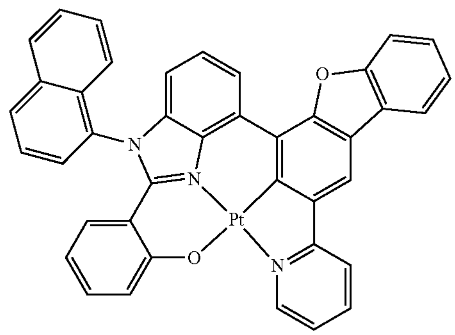
3-72
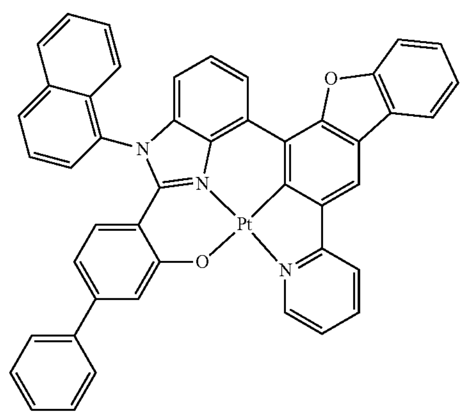
3-73
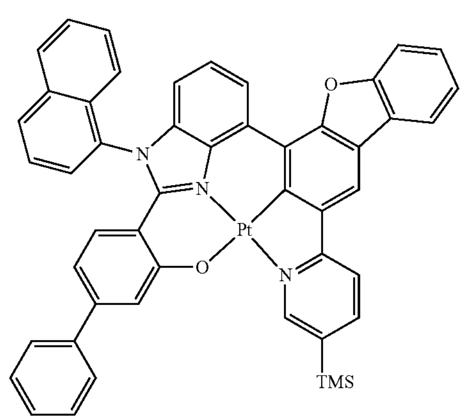

-continued
3-74
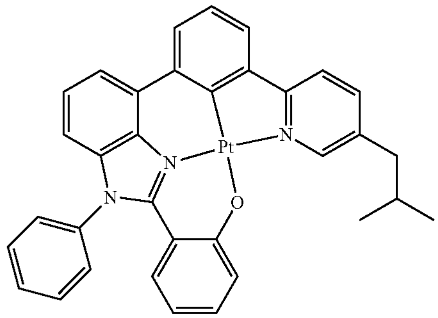
3-75
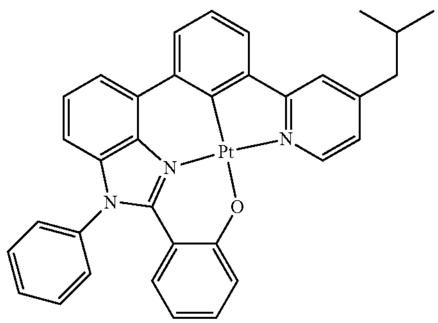
3-76
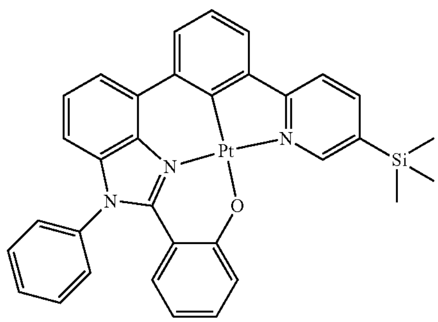
3-77
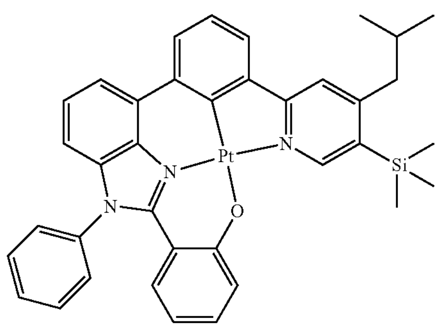
3-78
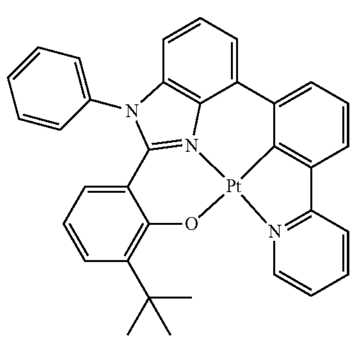
-continued
3-79
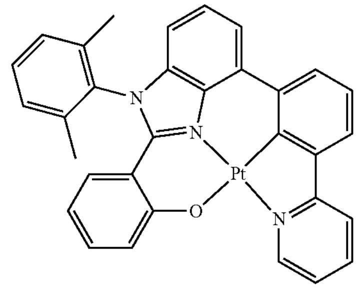
3-80
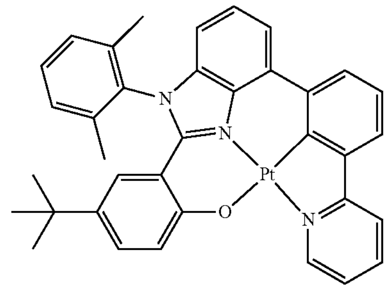
3-81
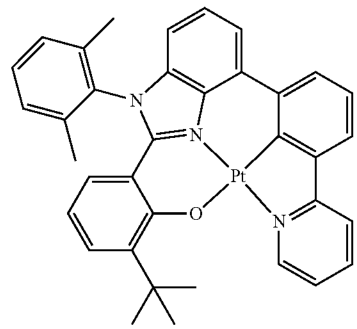
3-82
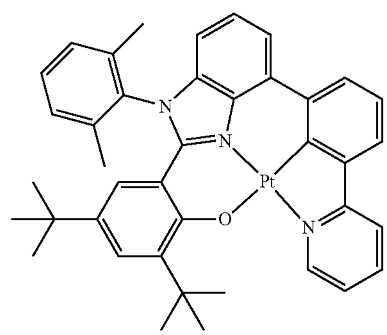
3-83
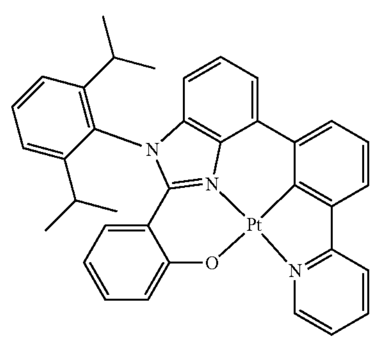

-continued
3-84
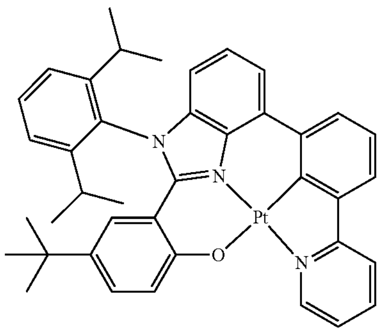
3-85
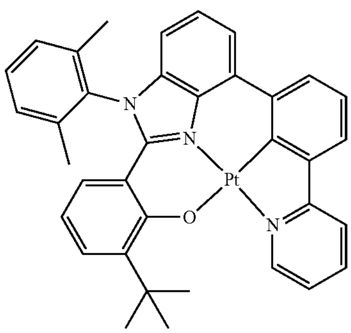
3-86
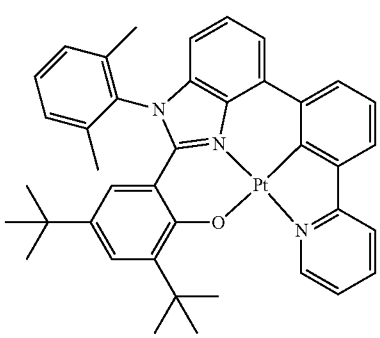
3-87
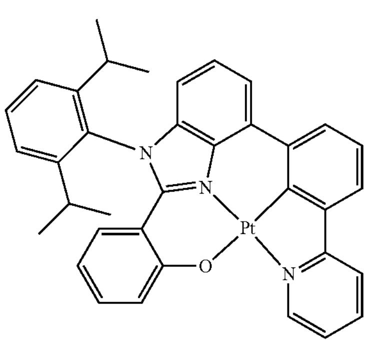
-continued
3-88
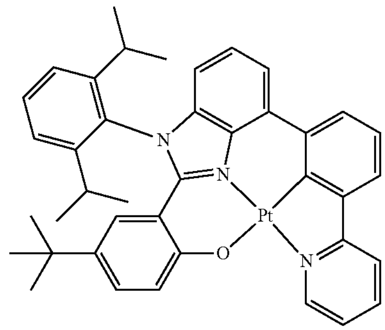
3-89
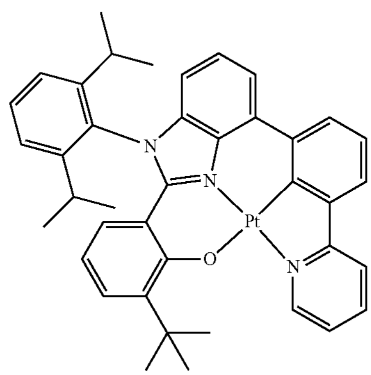
3-90
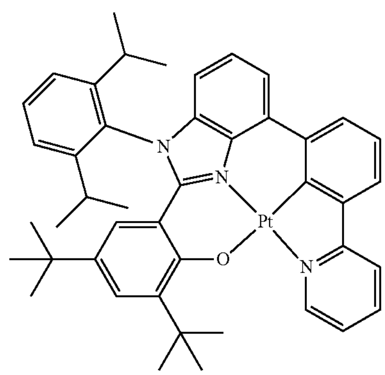
3-91
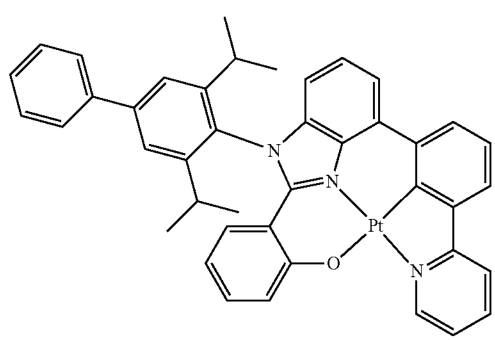

-continued
3-92
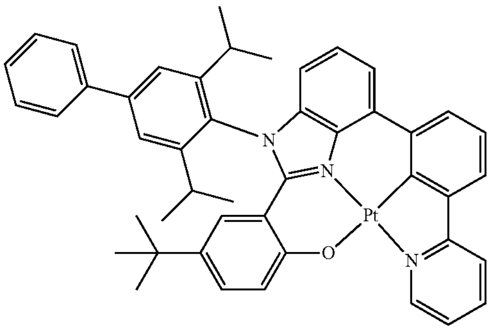
3-93
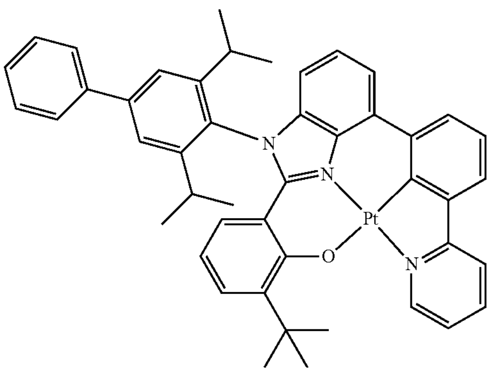
3-94
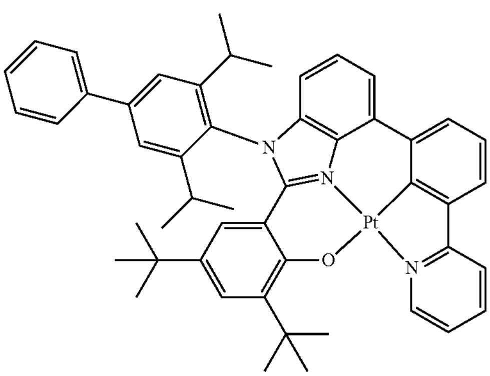
3-95
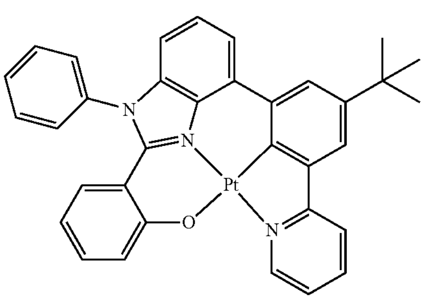
-continued
3-96
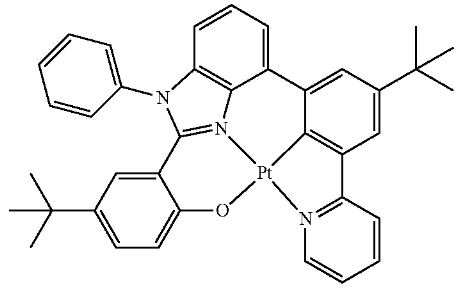
3-97
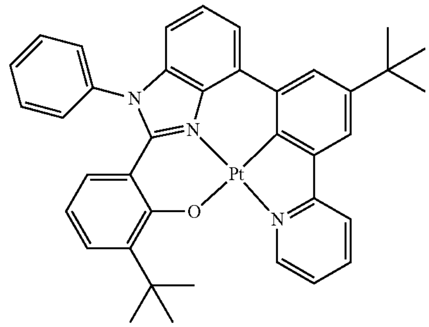
3-98
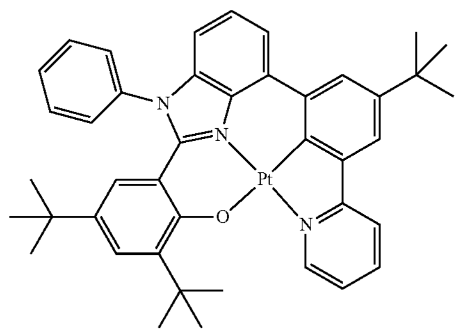
3-99
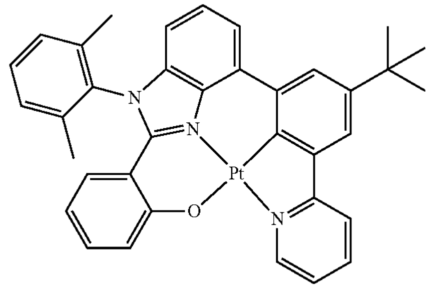
3-100
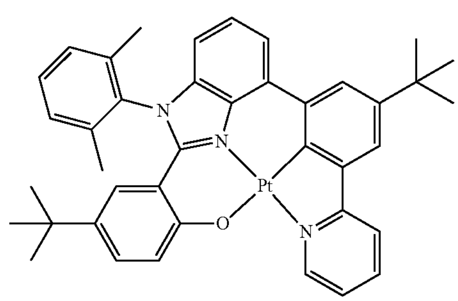

-continued
3-101
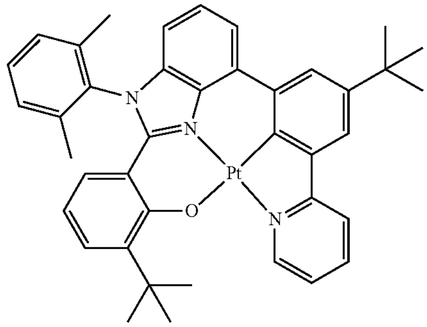
3-10
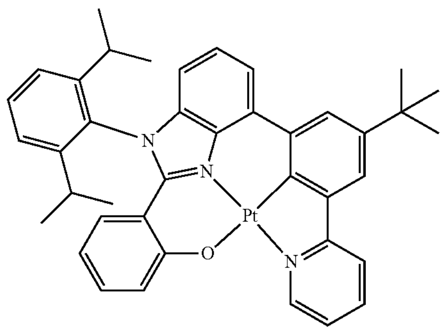
3-103
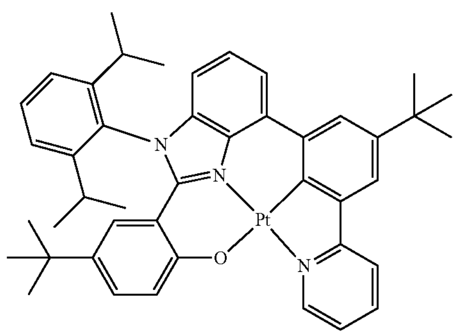
3-104
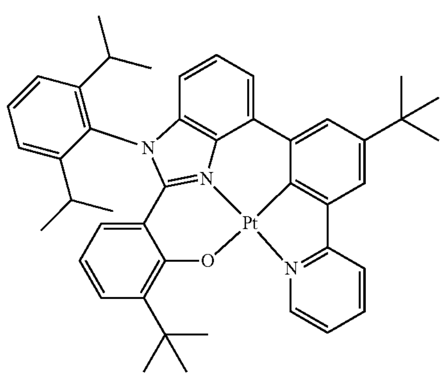
-continued
3-105
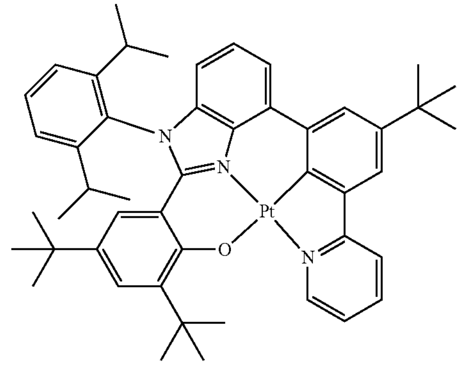
3-106
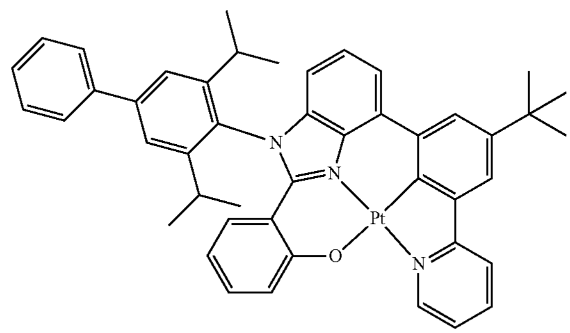
3-107
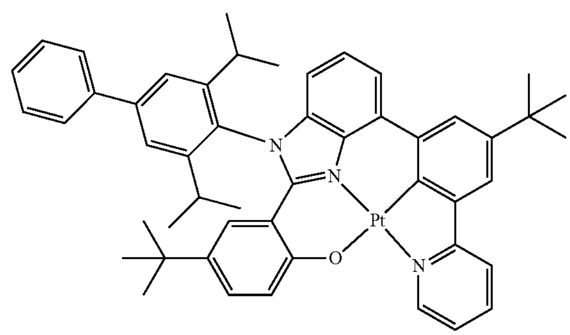
3-108
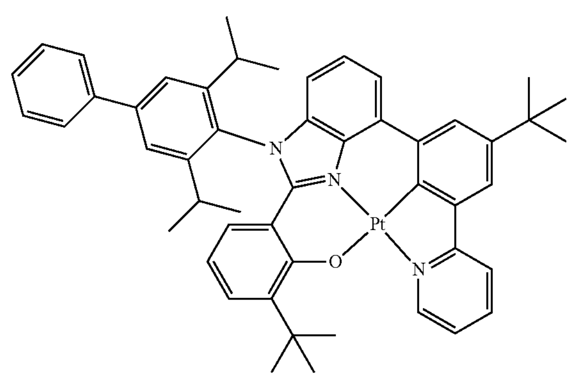

-continued
3-109
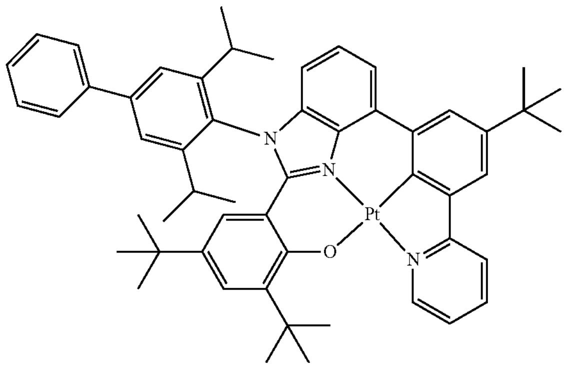
3-110
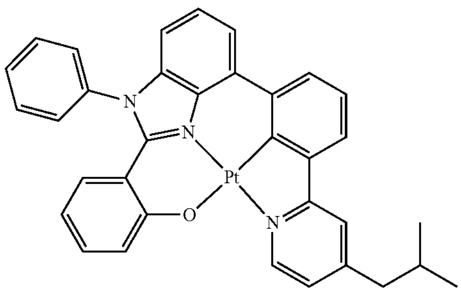
3-111
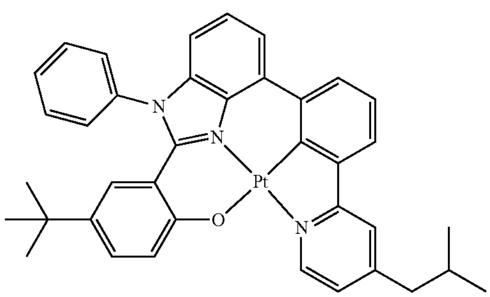
3-112
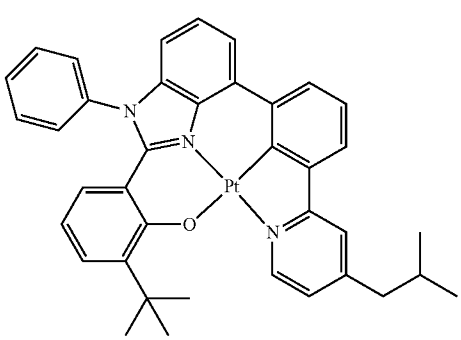
-continued
3-113
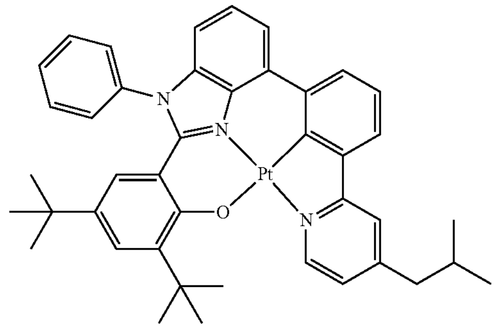
3-114
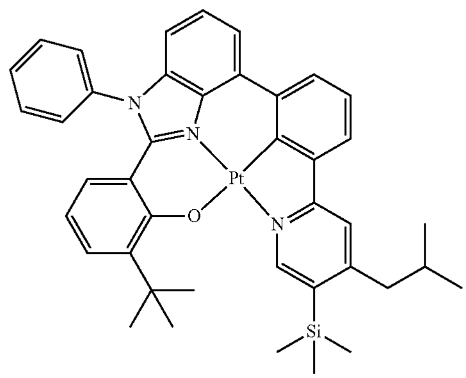
3-115
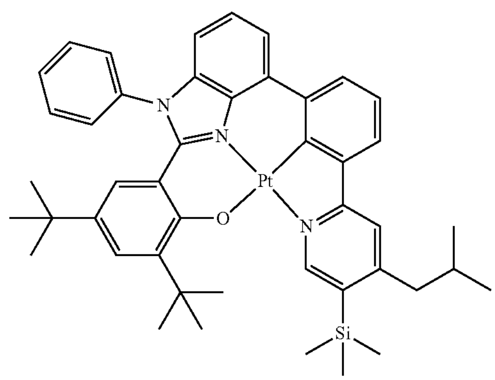
3-116
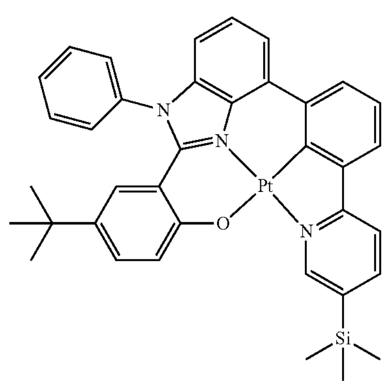

-continued
3-117
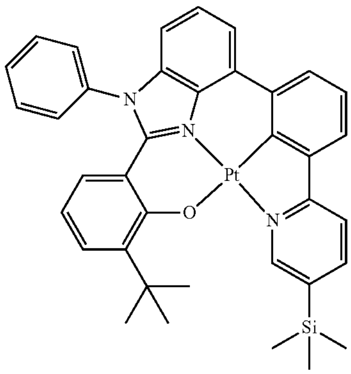
3-118
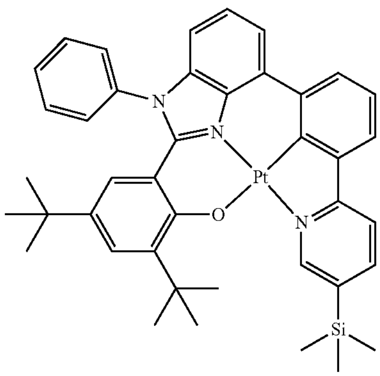
3-119
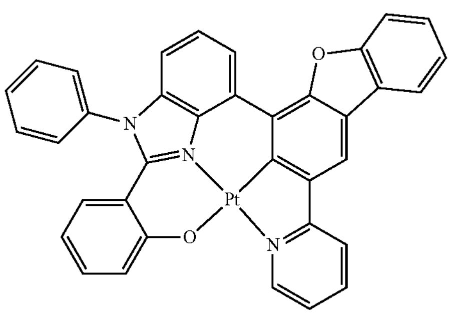
3-120
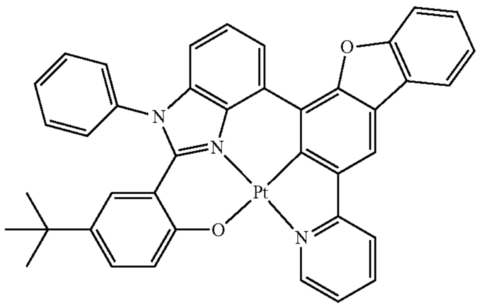
-continued
3-121
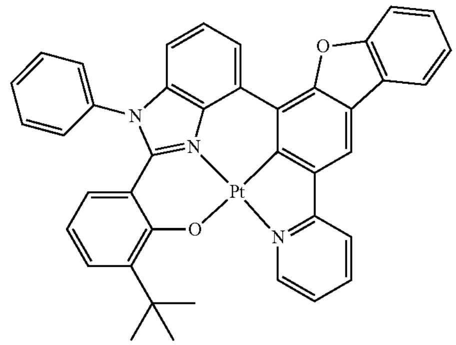
3-122
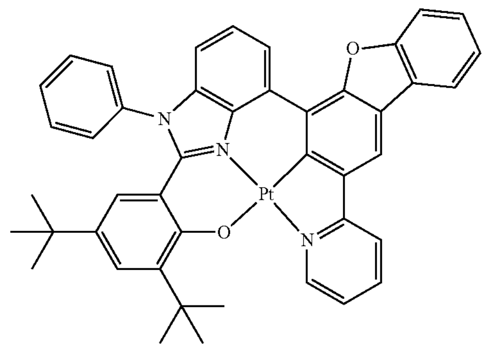
3-123
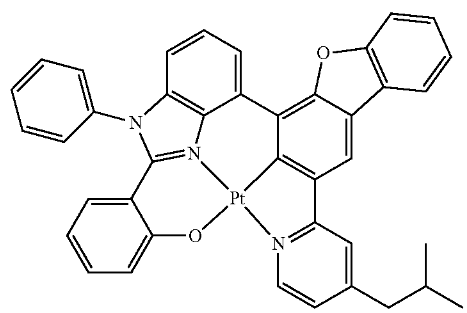
3-124
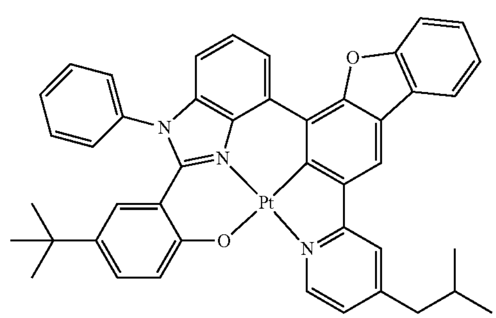

3-125
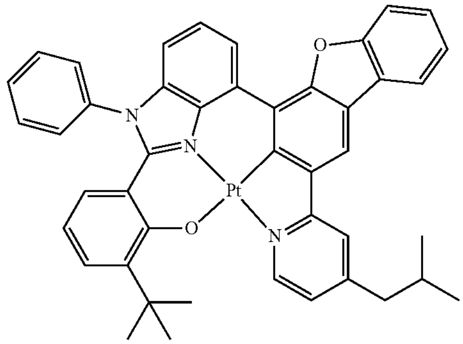
3-126
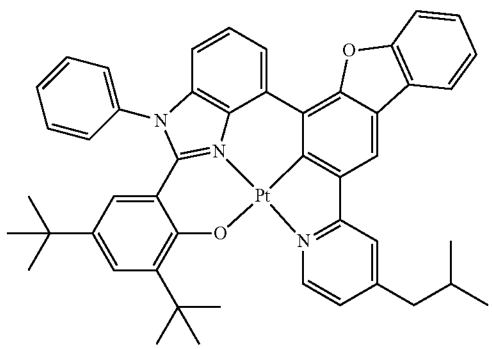
3-127
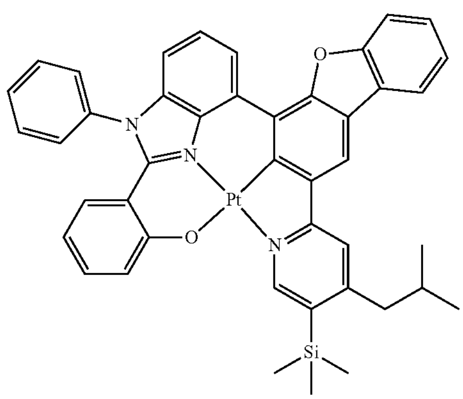
3-128
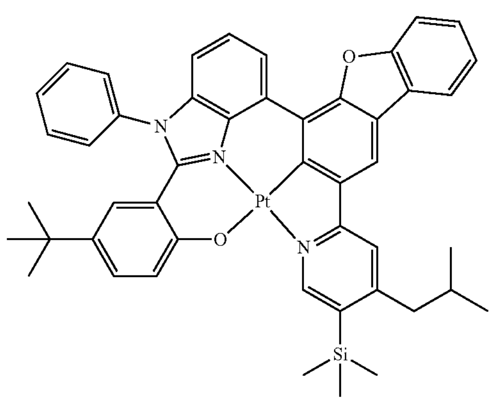
3-129
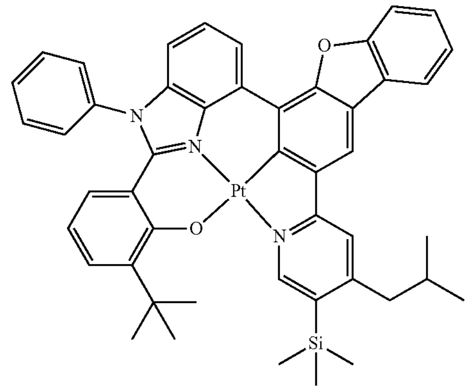
3-130
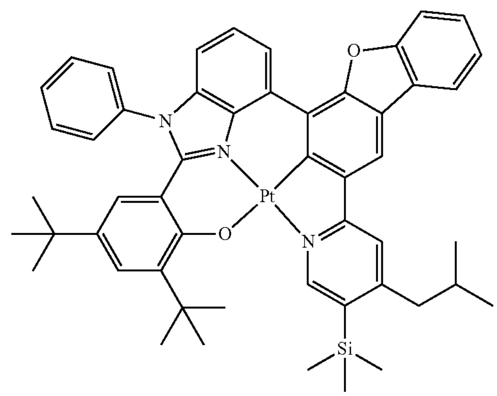
3-131
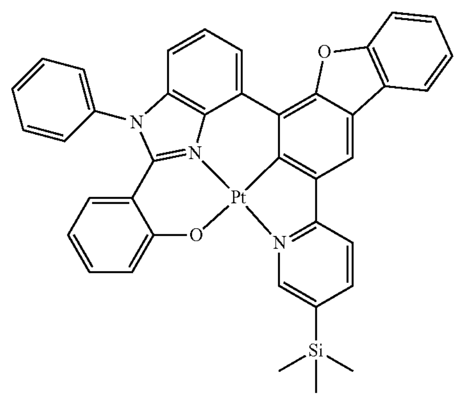
3-132
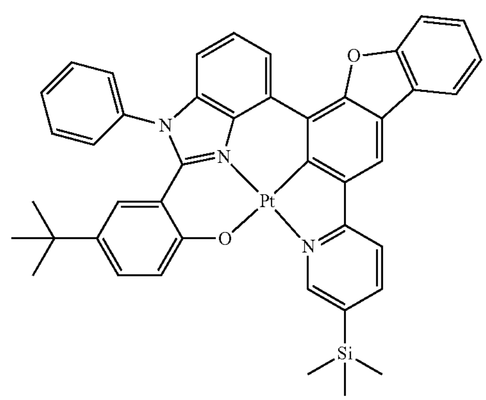

-continued
3-133
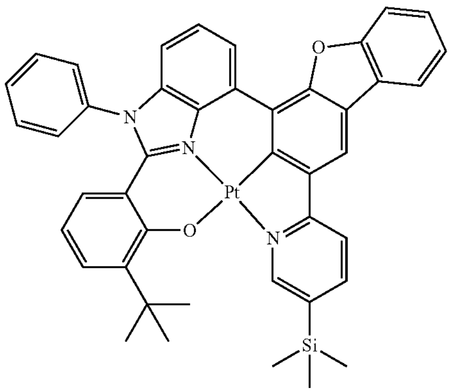
3-134
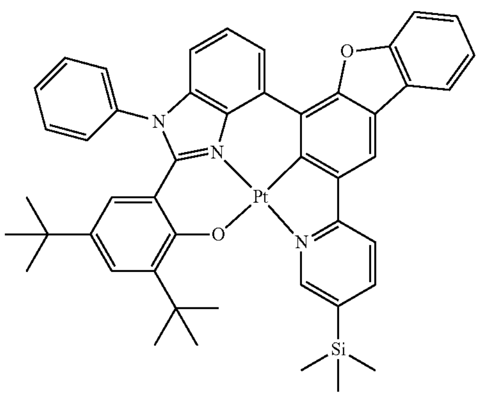
3-135
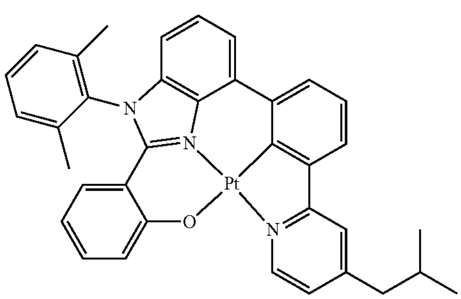
3-136
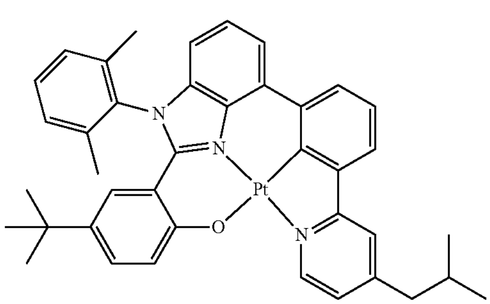
-continued
3-137
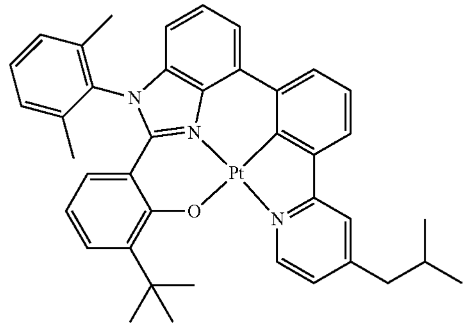
3-138
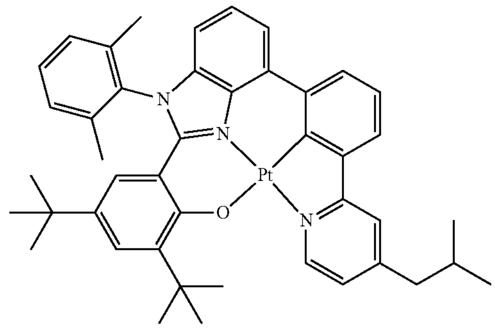
3-139
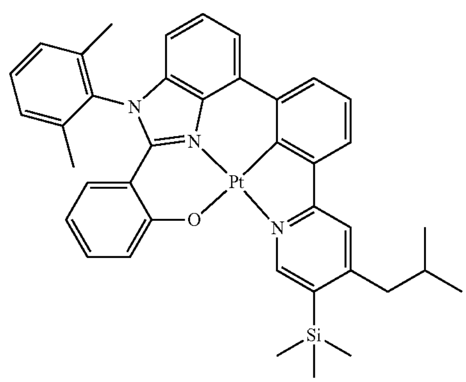
3-140
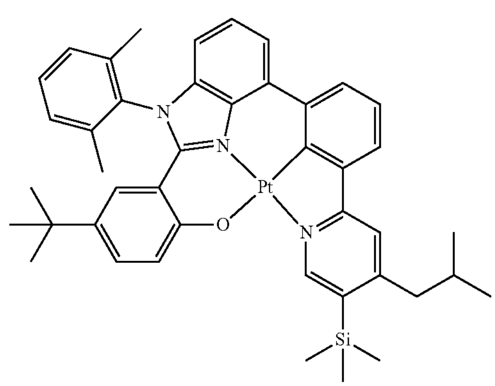

-continued
3-141
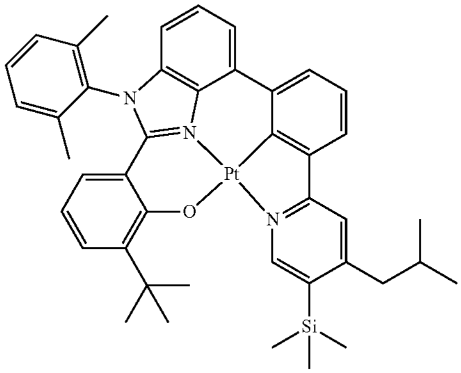
3-142
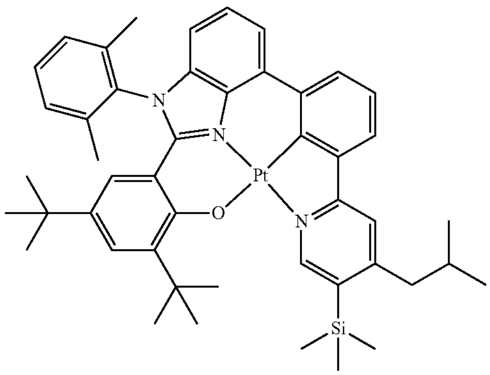
3-143
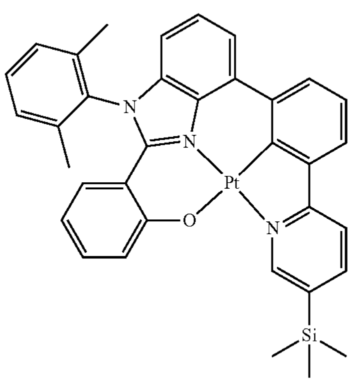
3-144
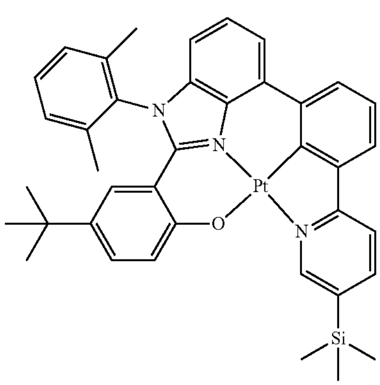
-continued
3-145
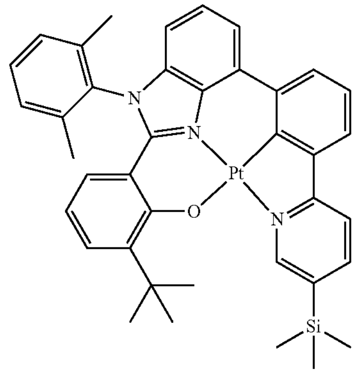
3-146
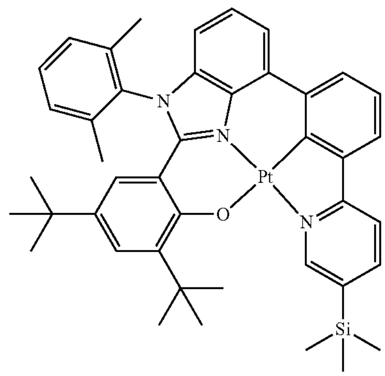
3-147
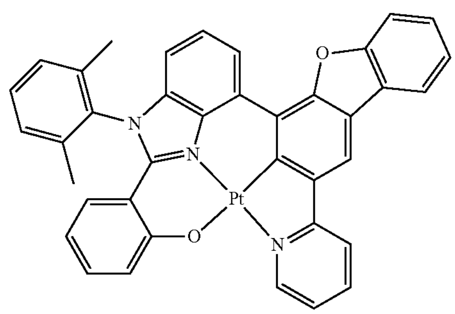
3-148
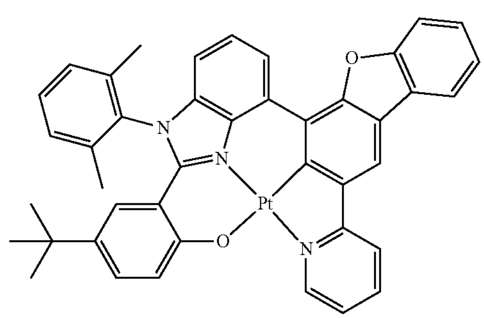

3-149
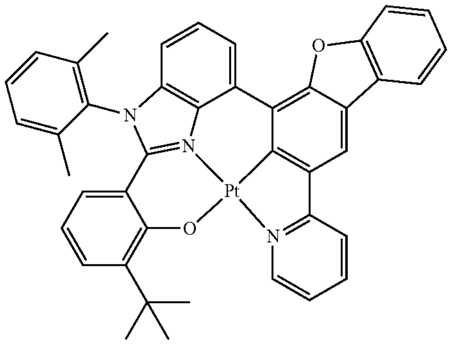
3-150
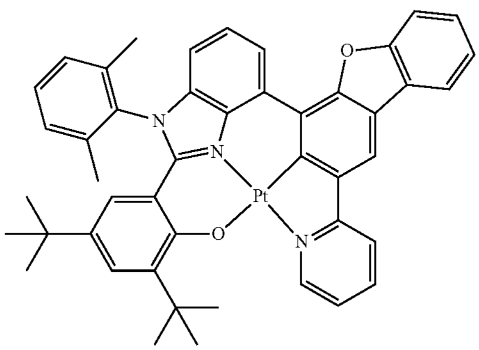
3-151
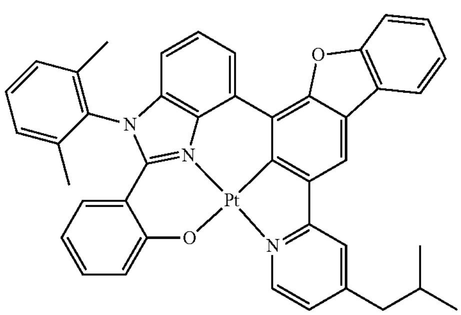
3-152
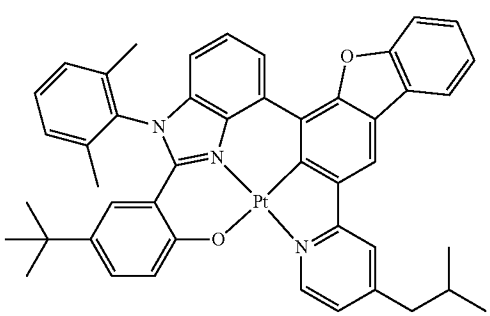
3-153
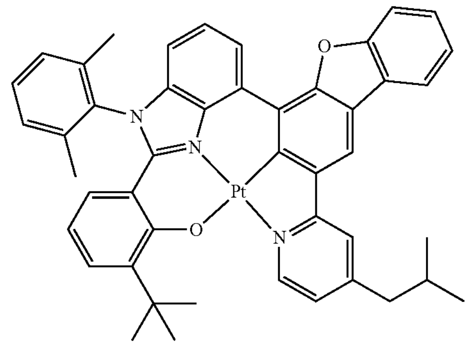
3-154
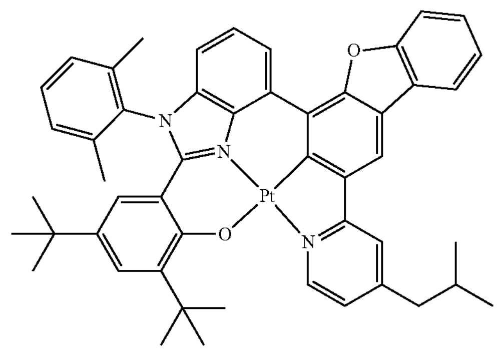
3-155
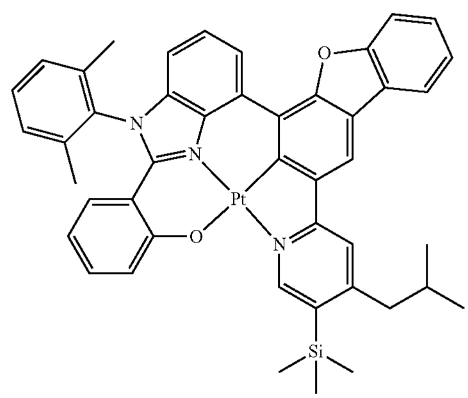
3-156
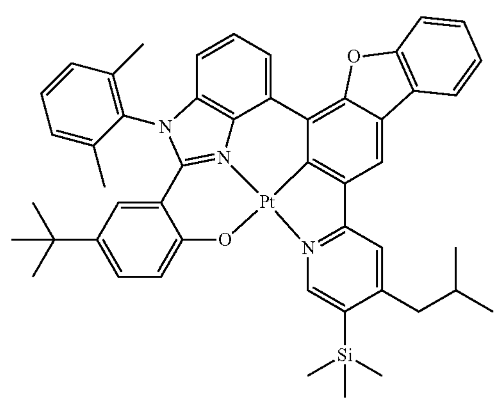

3-157
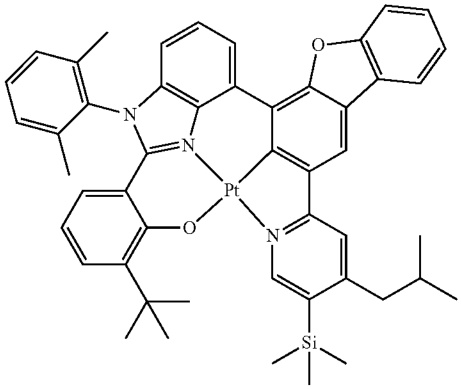
3-158
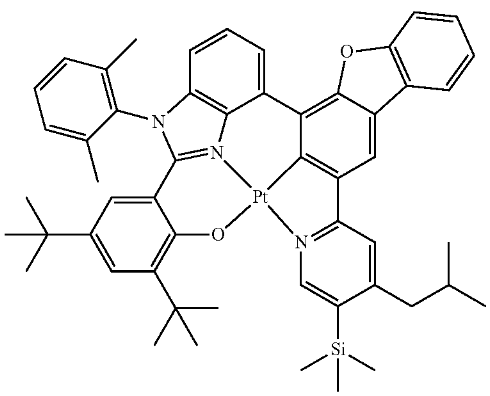
3-159
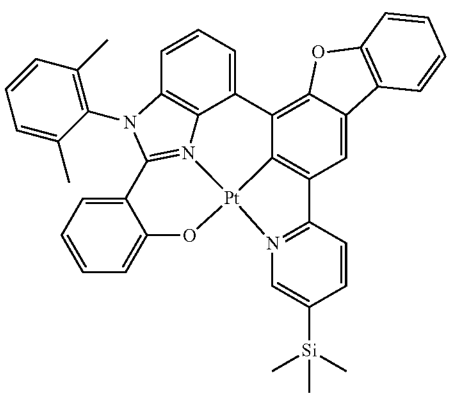
3-160
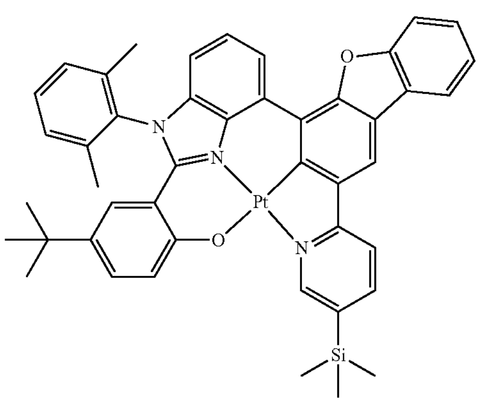
3-161
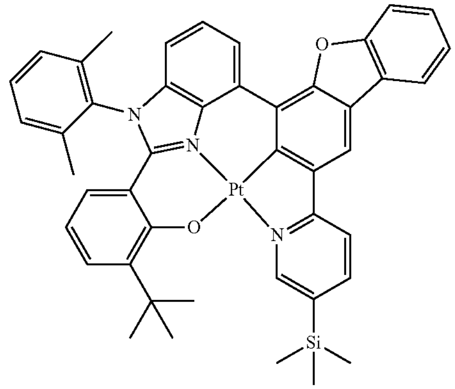
3-162
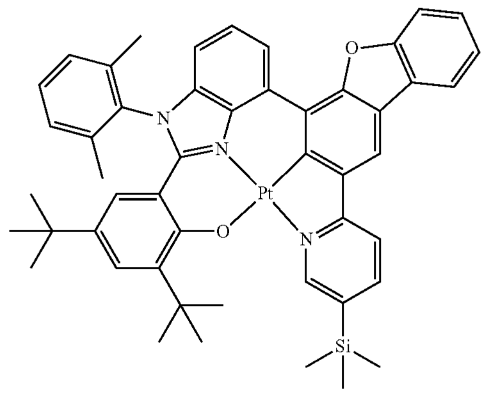
3-163
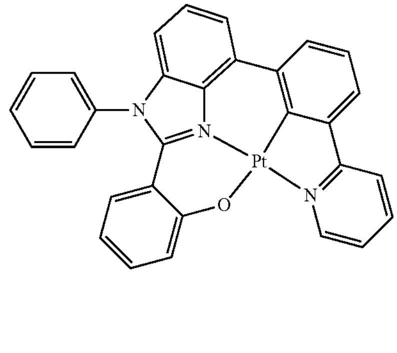
3-164
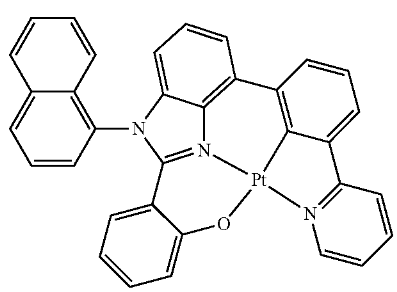

-continued
3-165
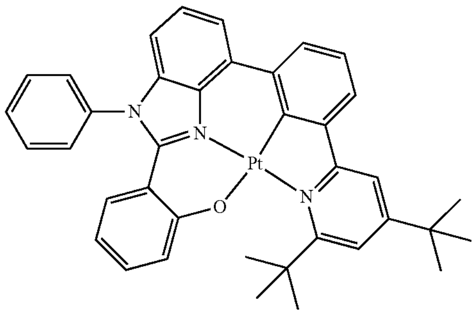
3-166
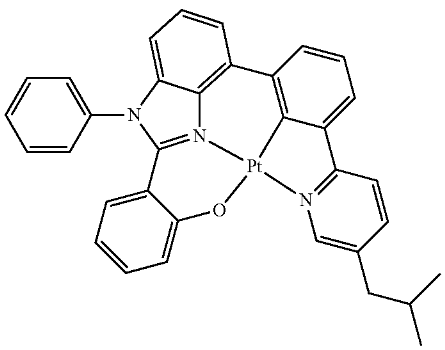
3-167
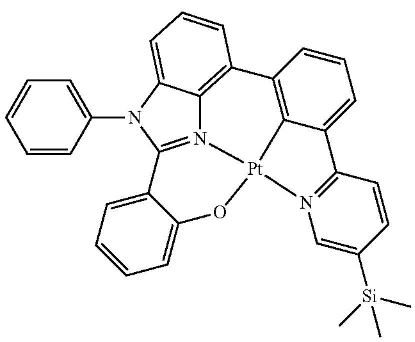
3-168
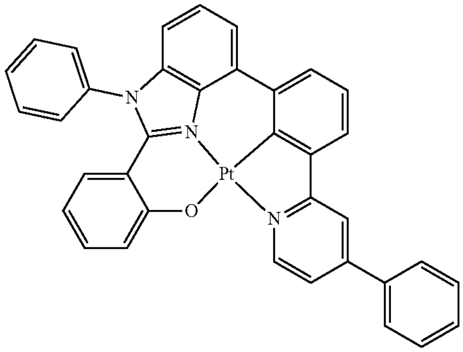
-continued
3-169
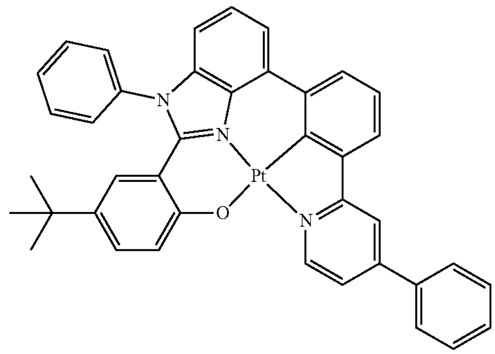
3-170
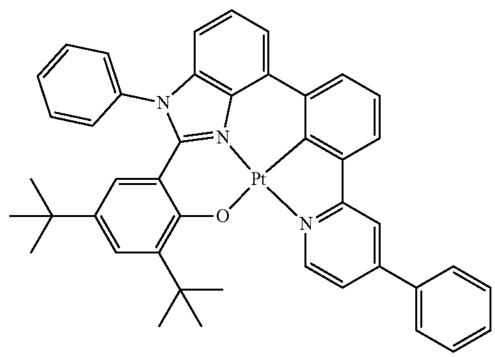
3-171
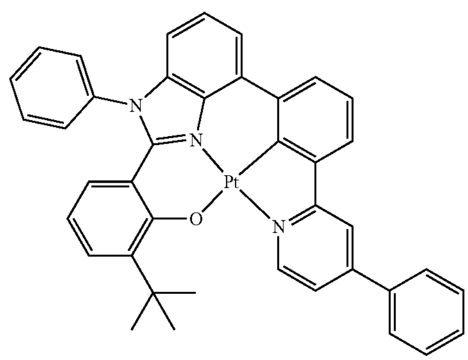
3-172
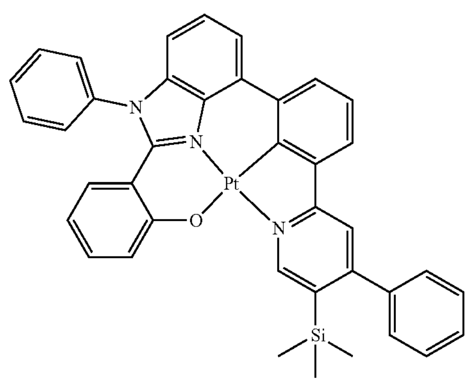

3-173
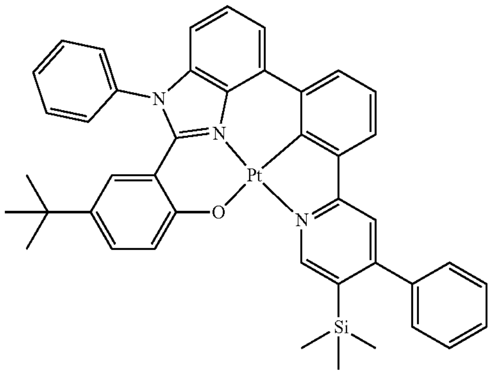
3-174
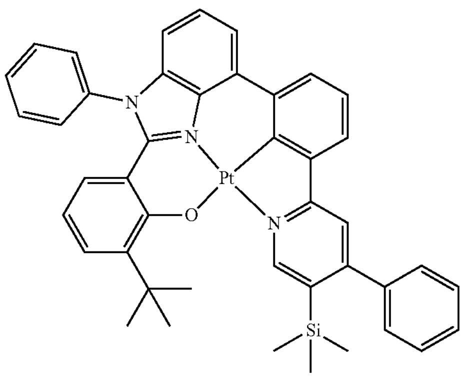
3-175
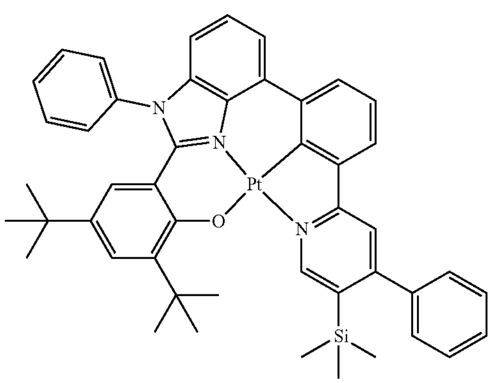
3-176
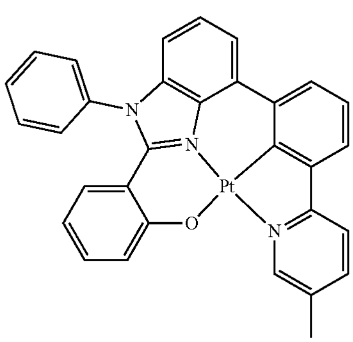
3-177
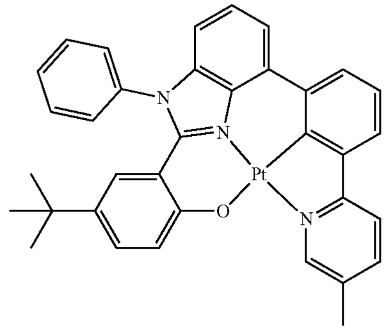
3-178
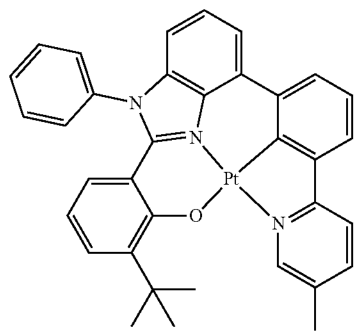
3-179
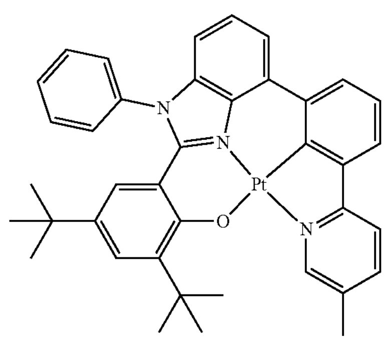
3-180
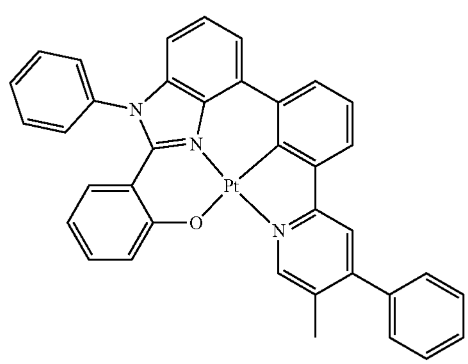

-continued
3-181
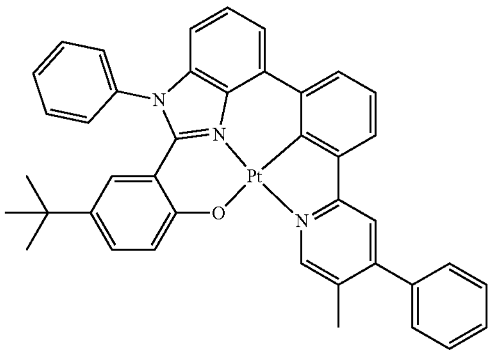
3-182
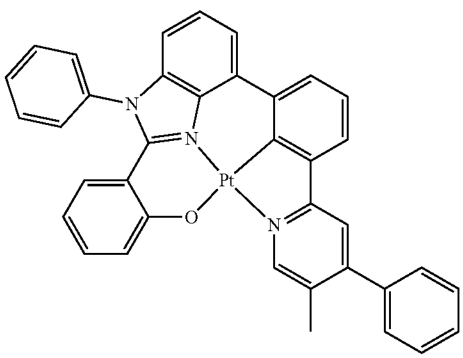
3-183
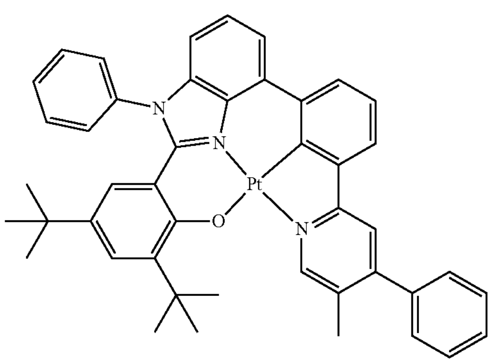
3-184
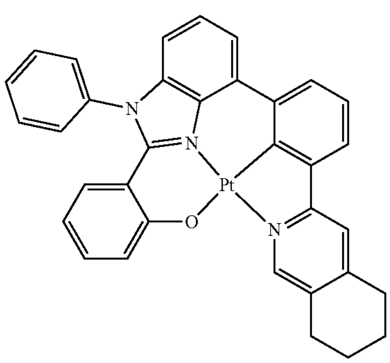
-continued
3-185
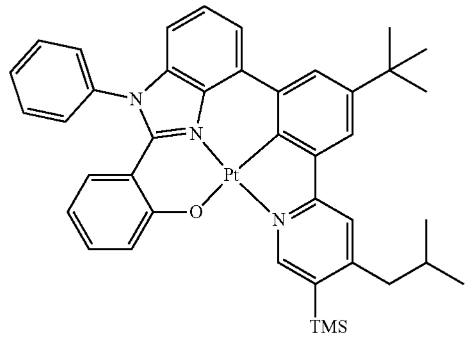
3-186
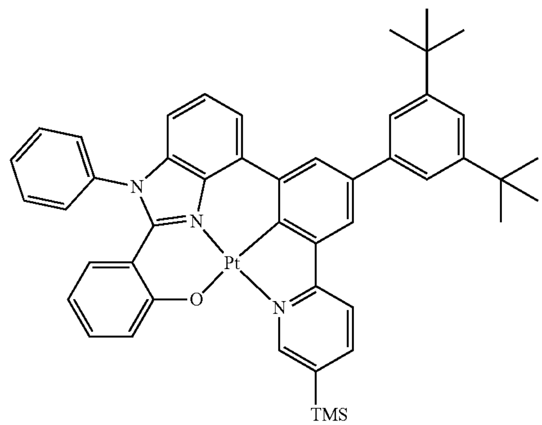
3-187
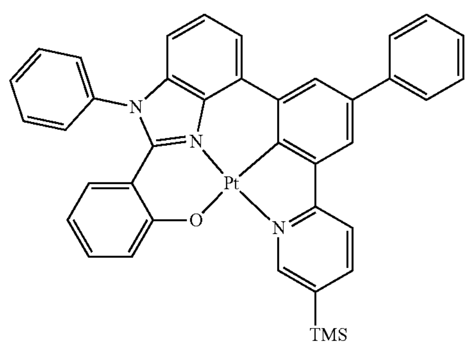
3-188
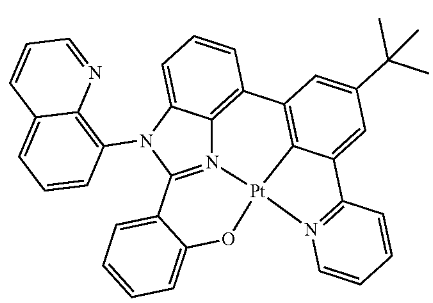

-continued
3-189
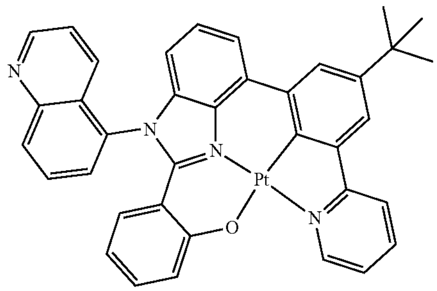
3-190
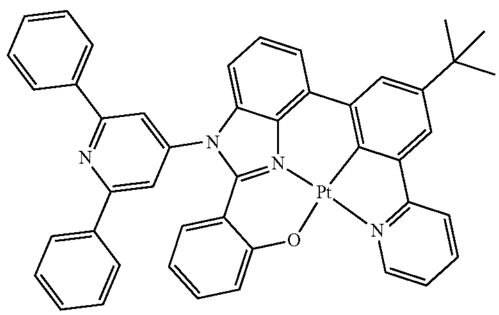
3-191
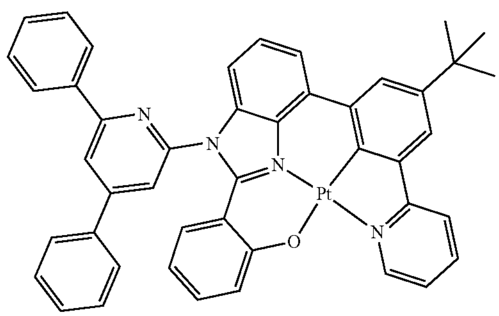
3-192
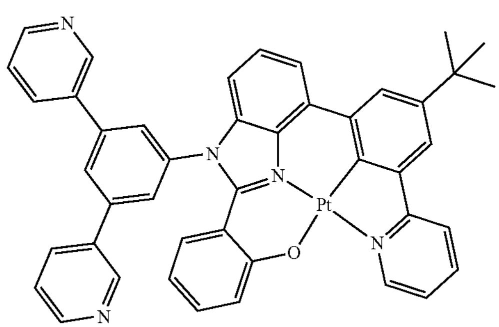
3-193
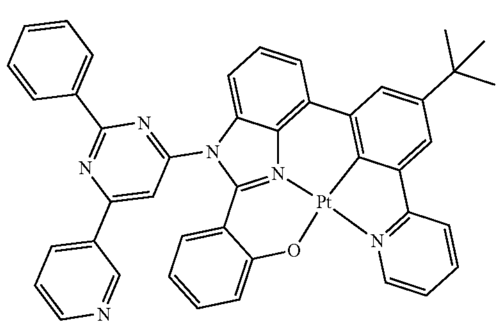
-continued
3-194
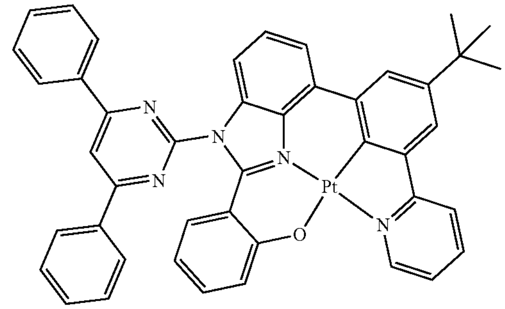
3-195
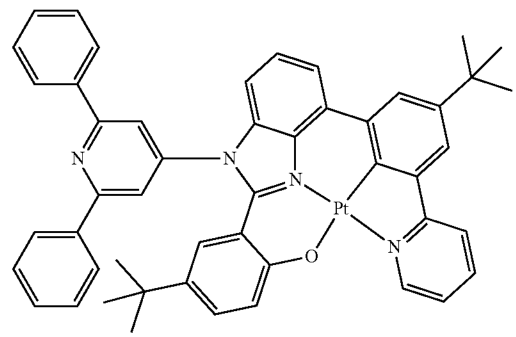
3-196
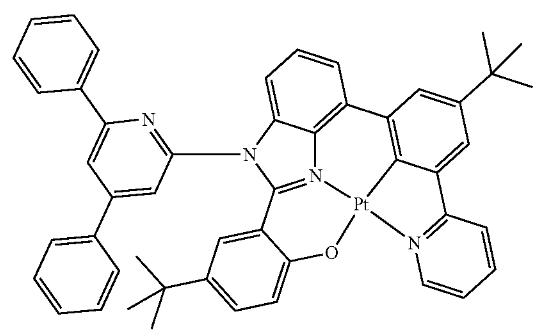
3-197
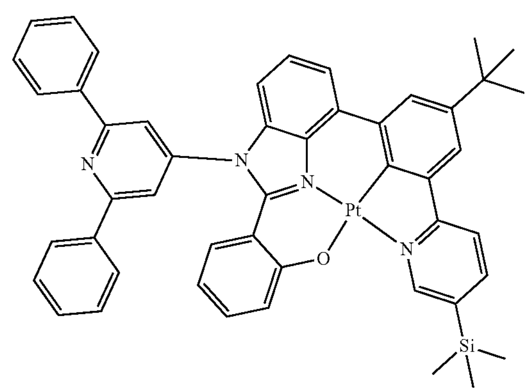

-continued
3-198
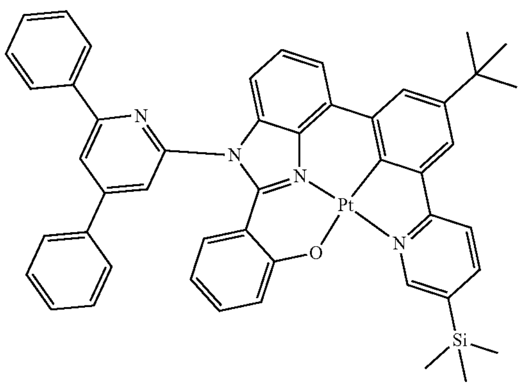
3-199
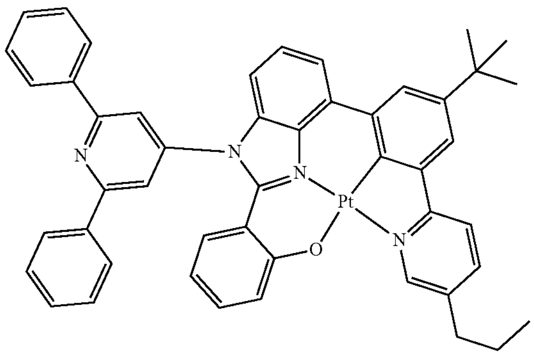
3-200
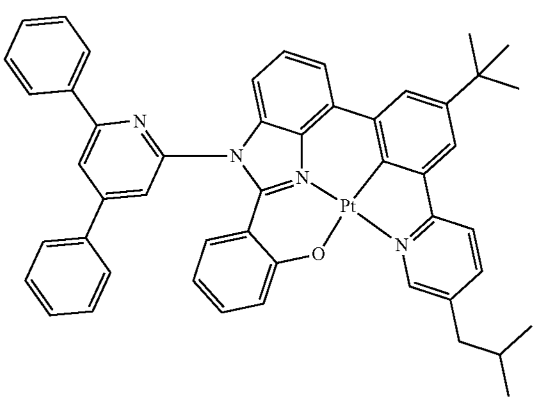
3-201
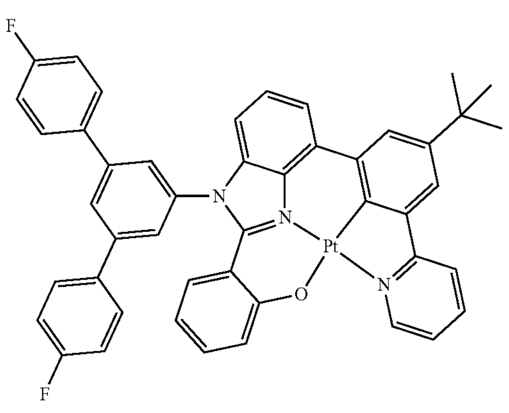
-continued
3-202
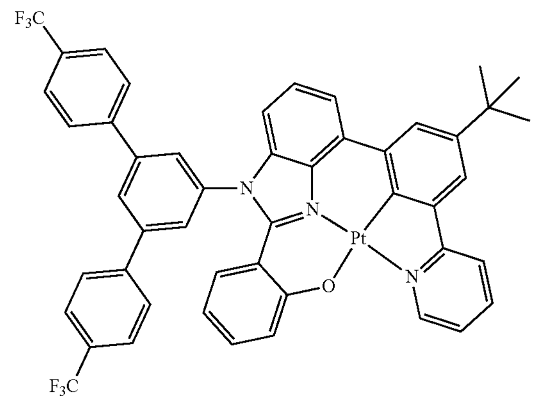
3-203
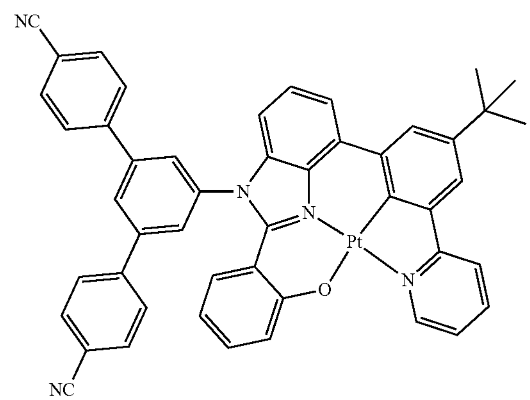
3-204
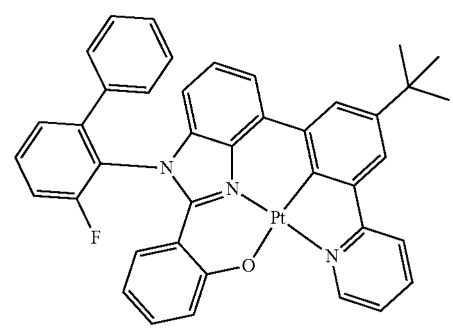
3-205
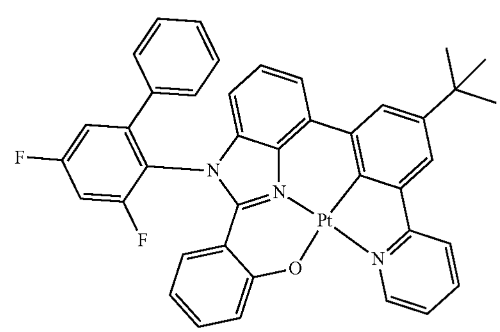

-continued
3-206
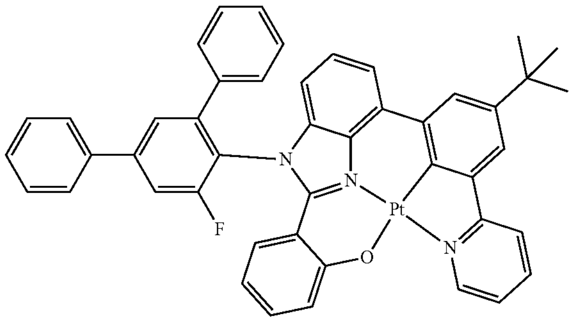
3-207
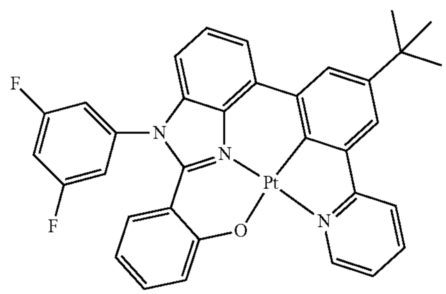
3-208
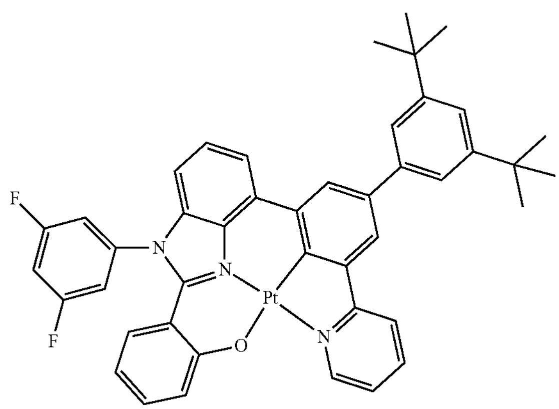
3-209
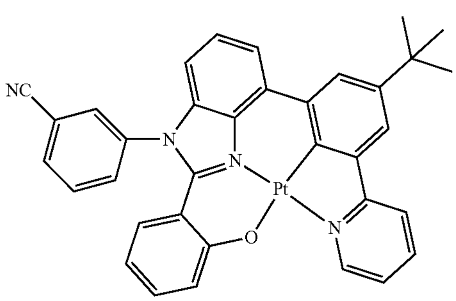
-continued
3-210
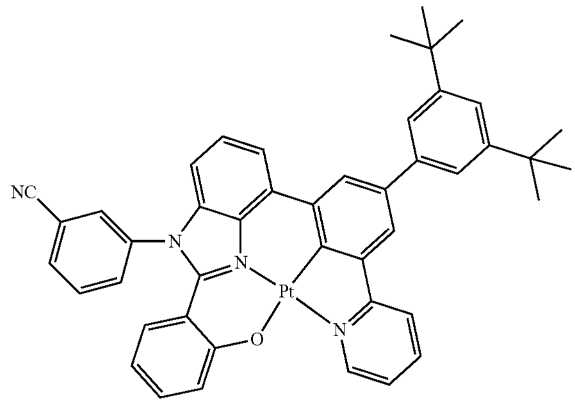
3-211
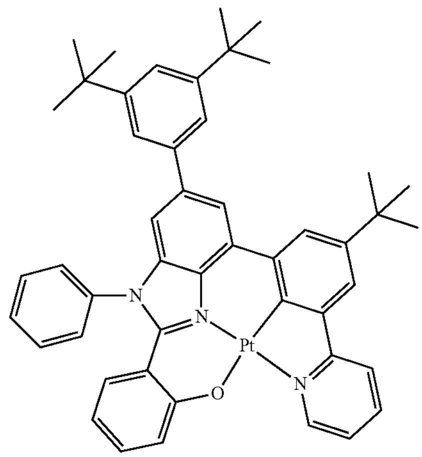
3-212
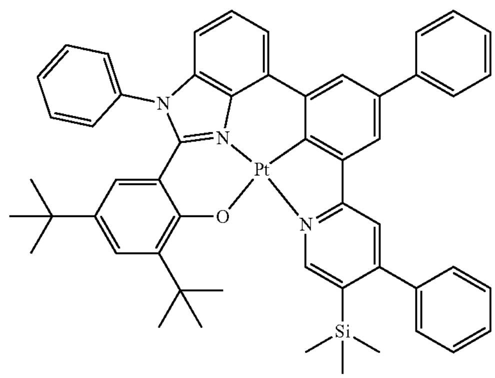
3-213
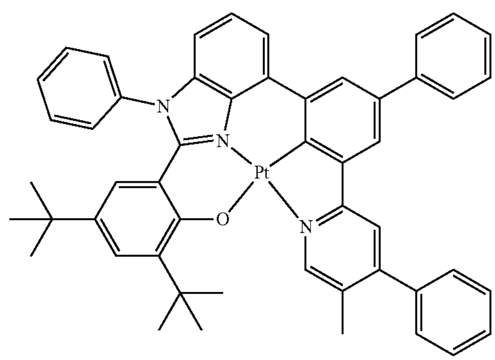

3-214
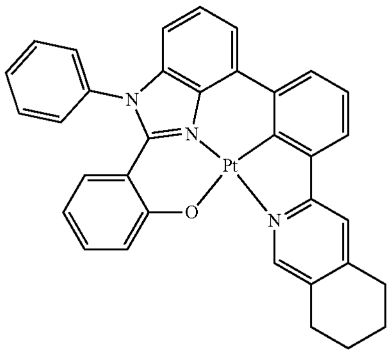
3-215
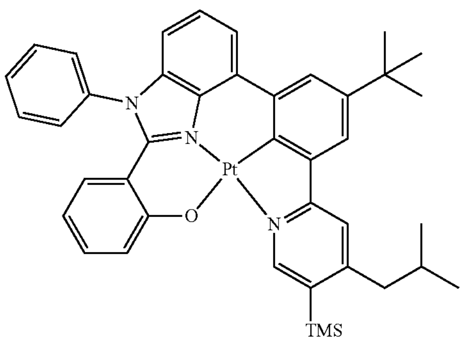
3-216
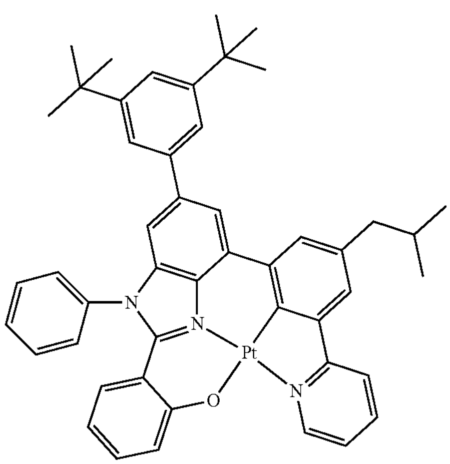
3-217
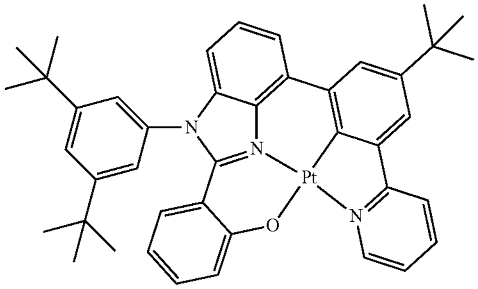
3-218
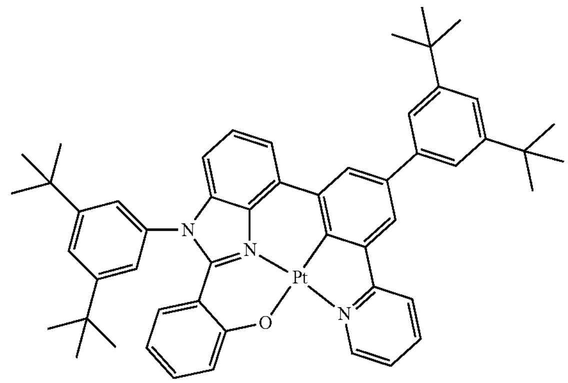
3-219
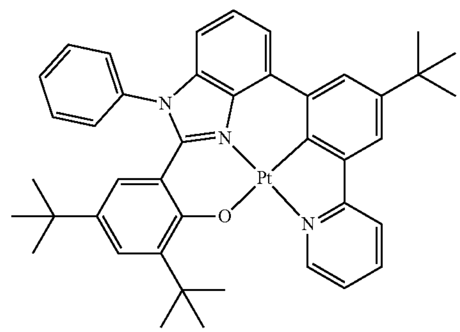
3-220
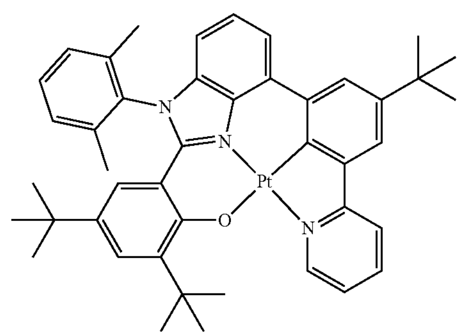
3-221
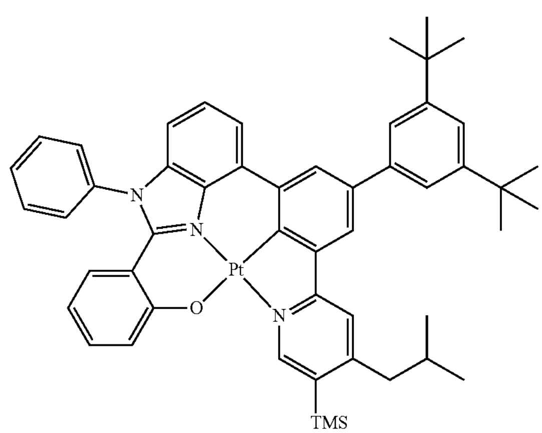

-continued
3-222
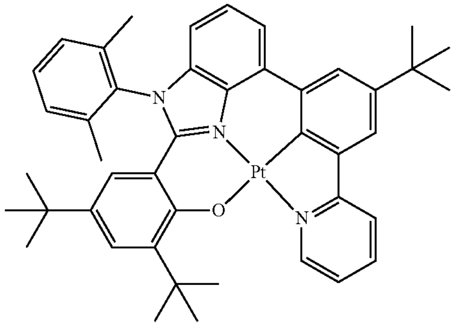
3-223
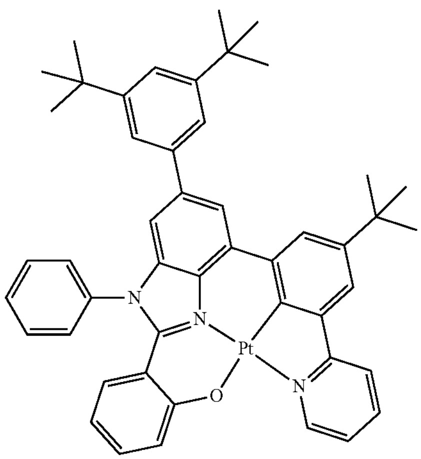
3-224
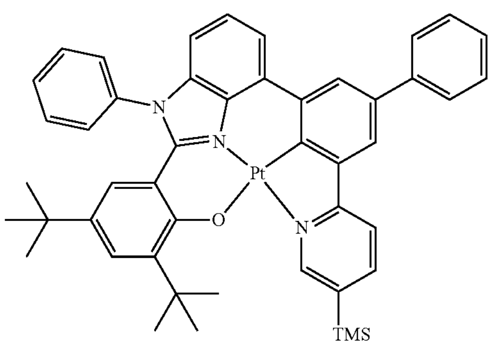
3-225
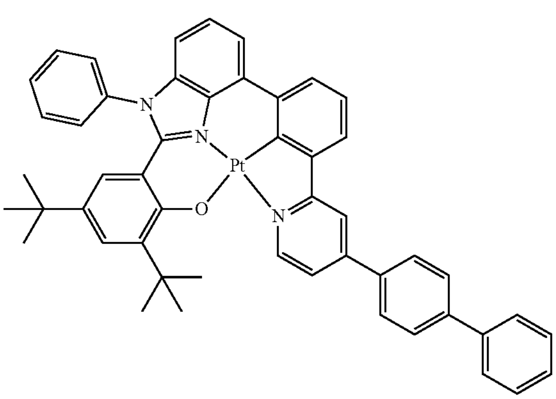
-continued
3-226
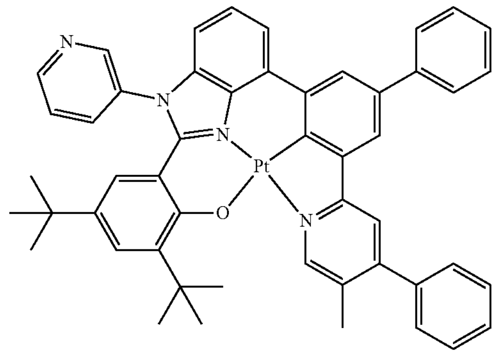
3-227
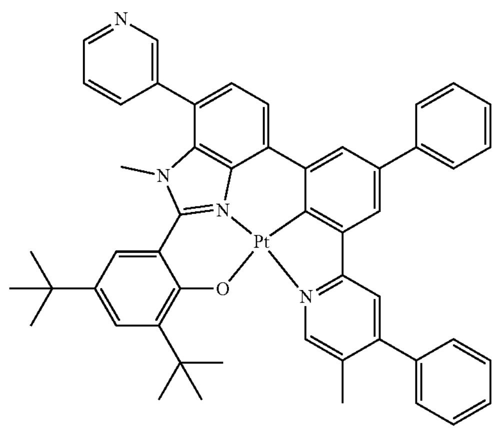
3-228
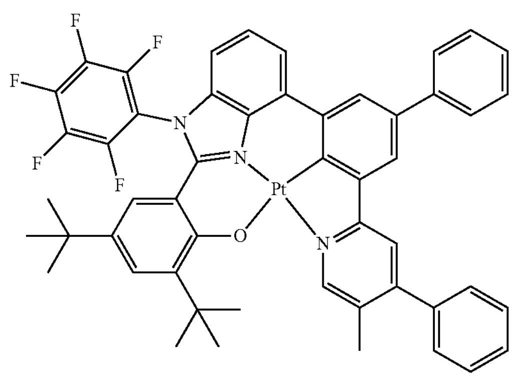
3-229
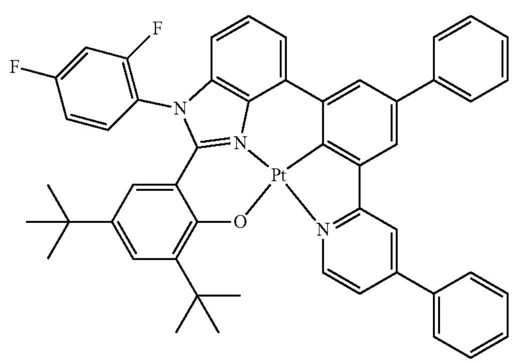

3-230
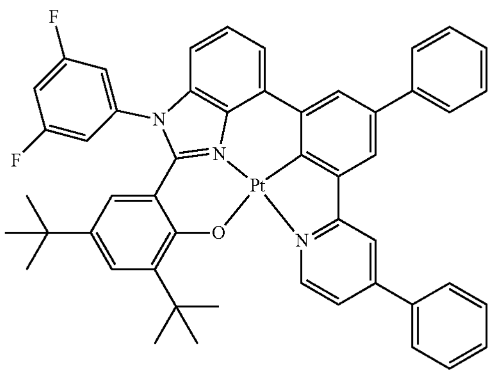
3-231
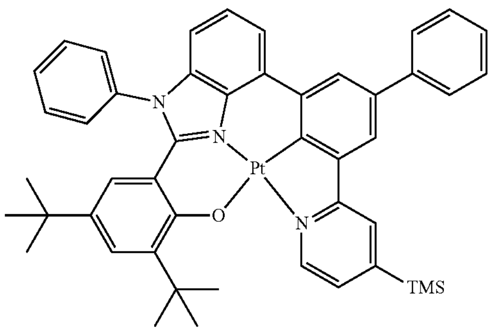
3-232
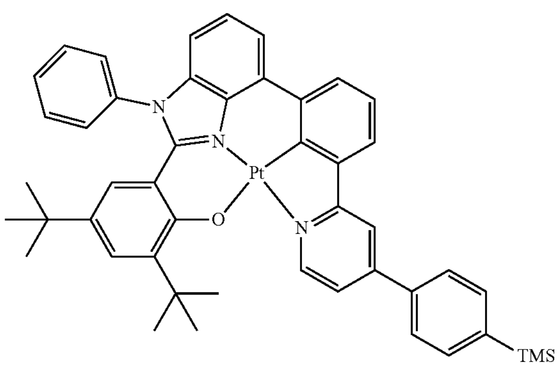
3-233
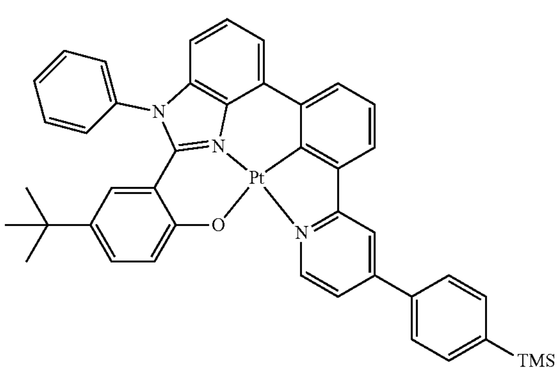
3-234
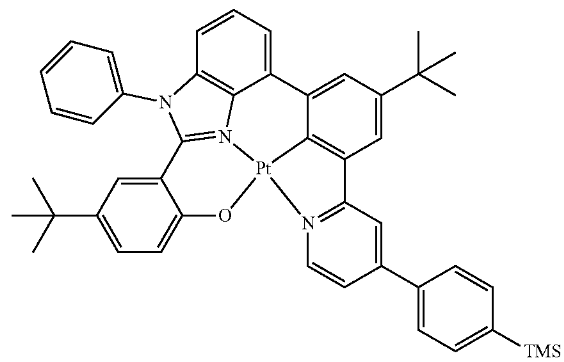
3-235
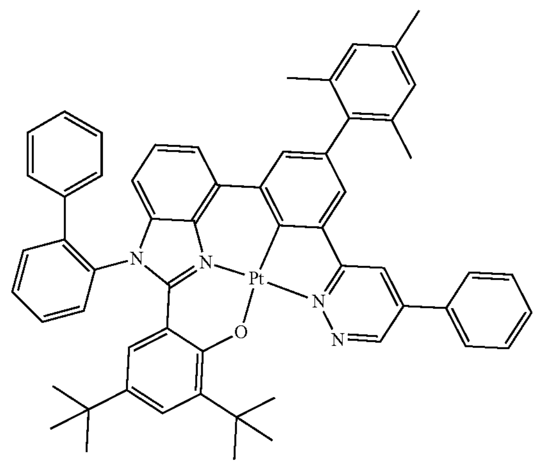
3-236
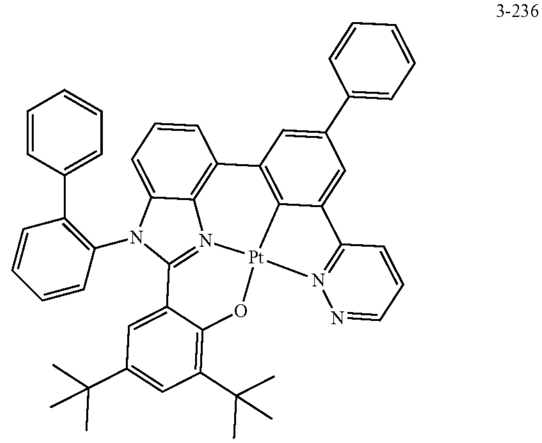

-continued
3-237
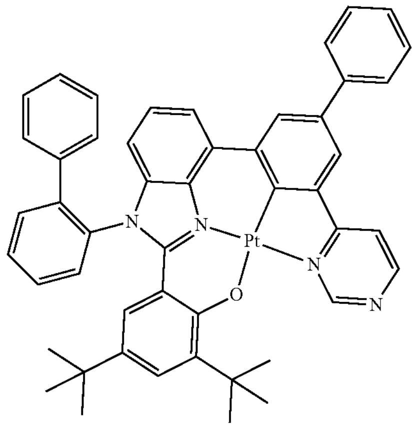
3-238
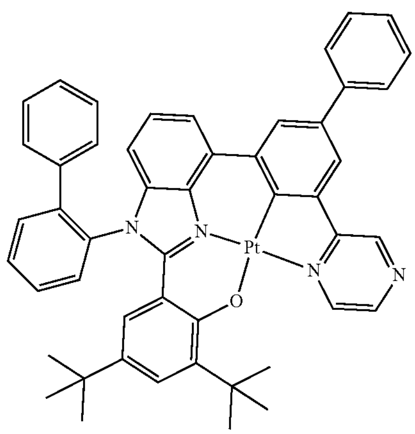
3-239
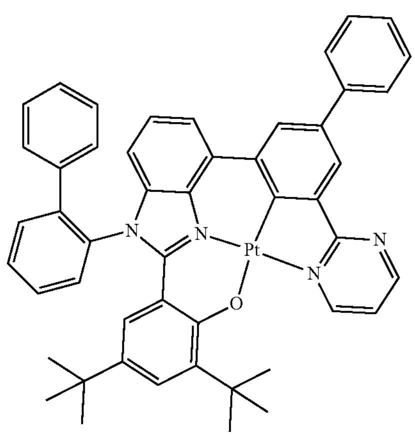
-continued
3-240
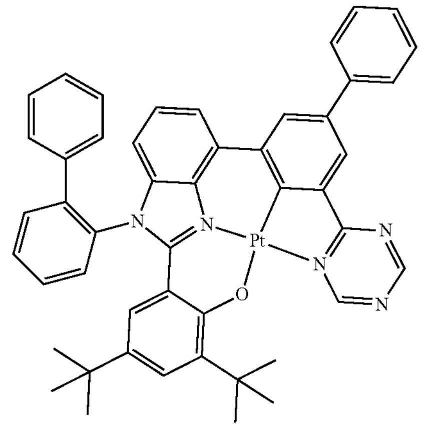
3-241
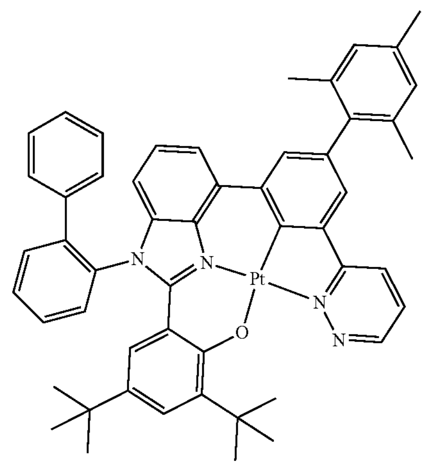
3-242
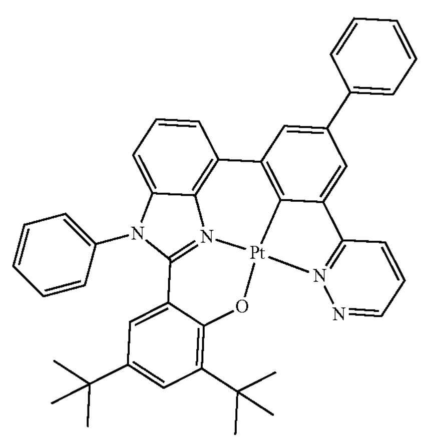

3-243
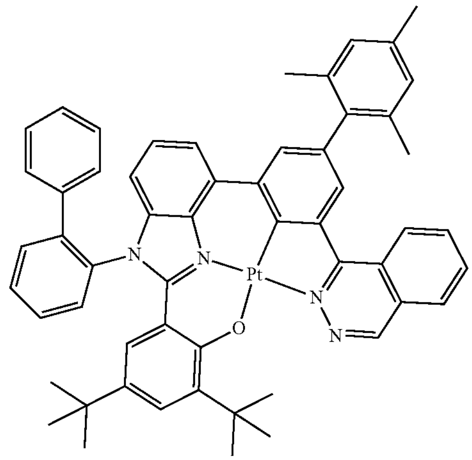
3-244
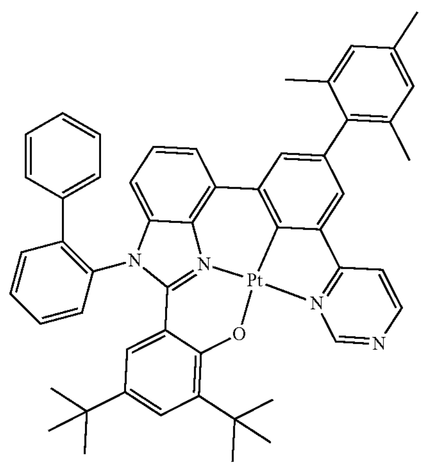
3-245
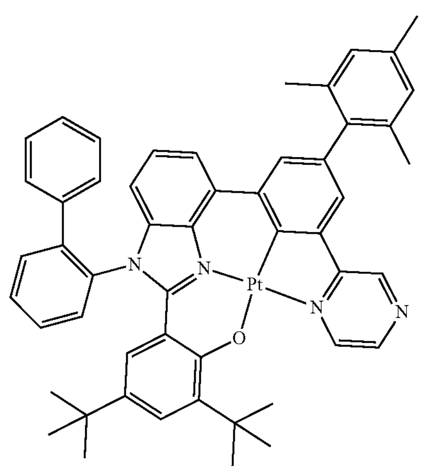
3-246
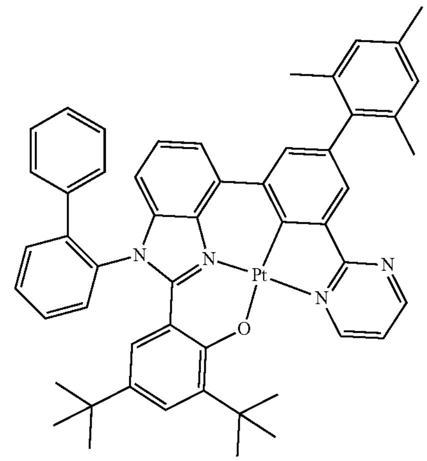
3-247
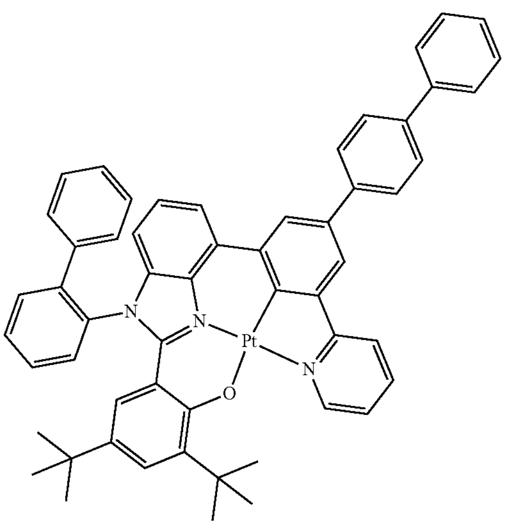
3-248
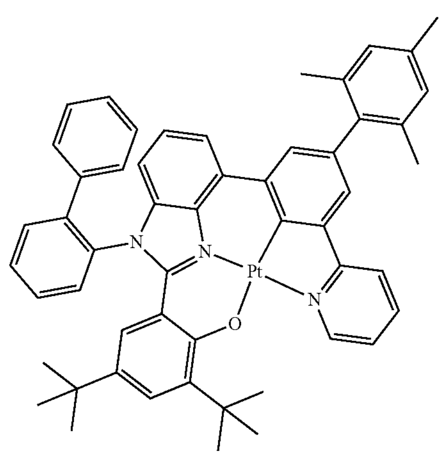

-continued
3-249
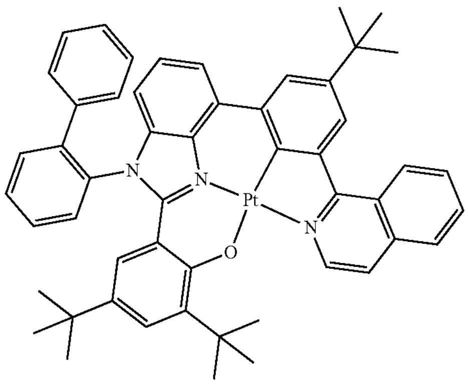
3-250
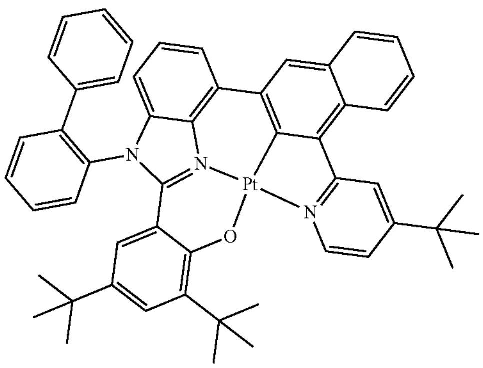
3-251
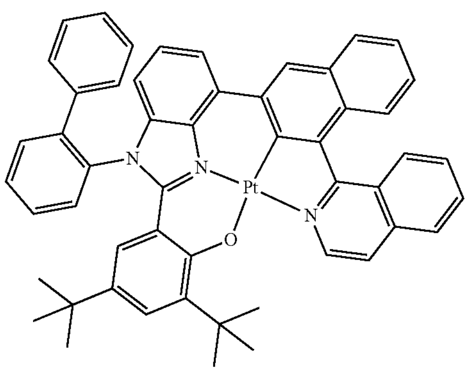
3-252
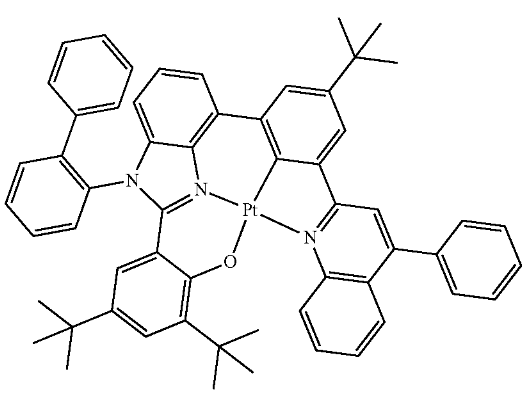
-continued
3-253
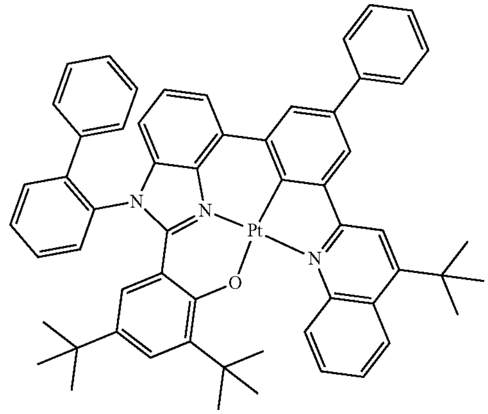
3-254
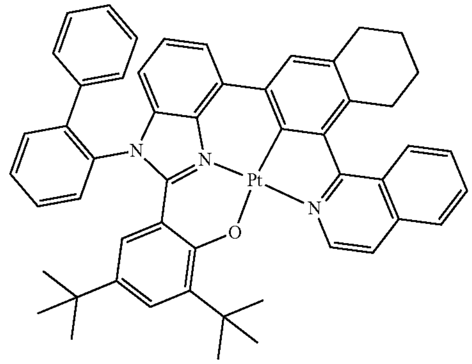
3-255
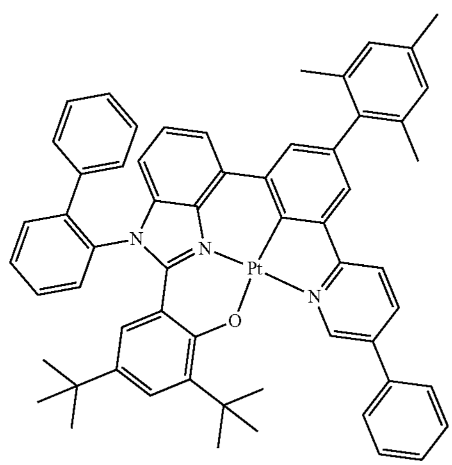

-continued
3-256
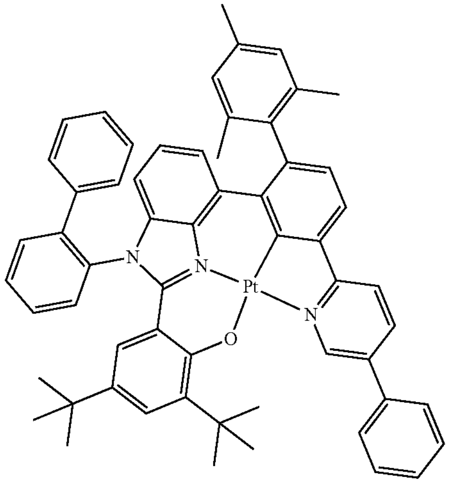
3-257
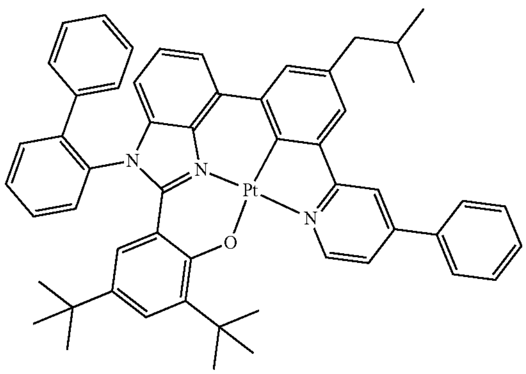
3-258
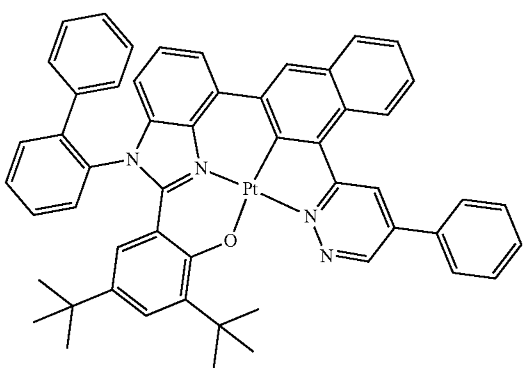
3-259
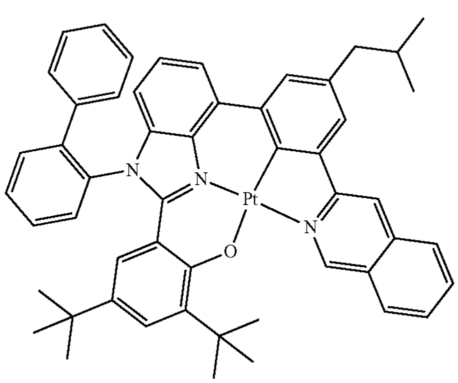
-continued
3-260
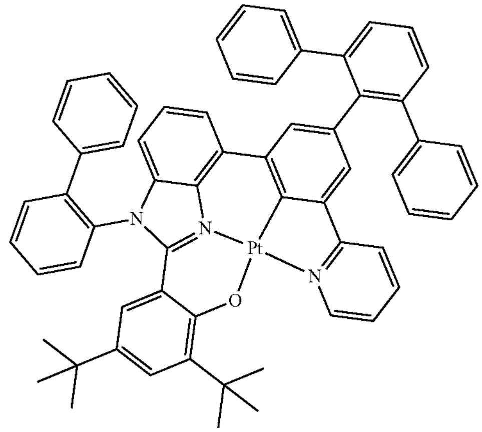
3-261
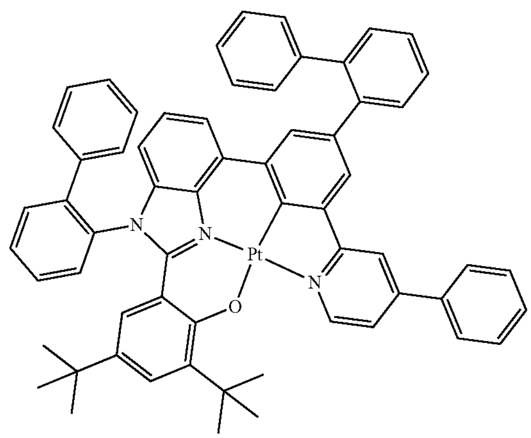
3-262
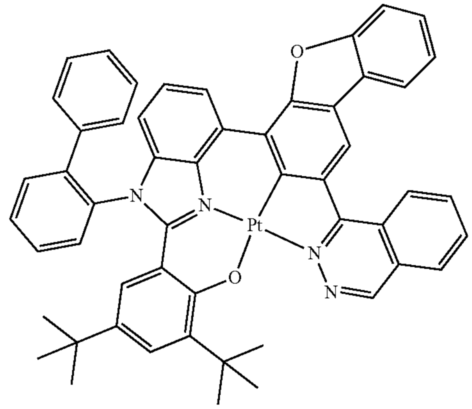

-continued
3-263
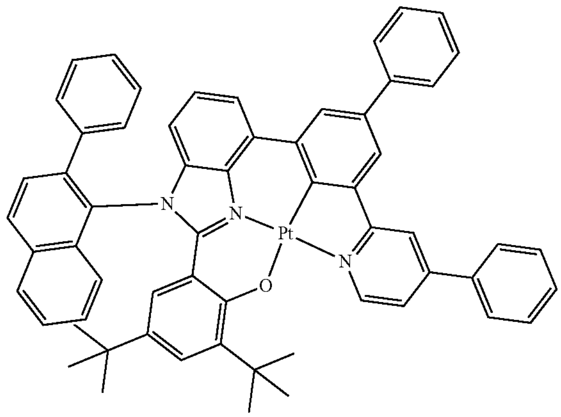
3-264
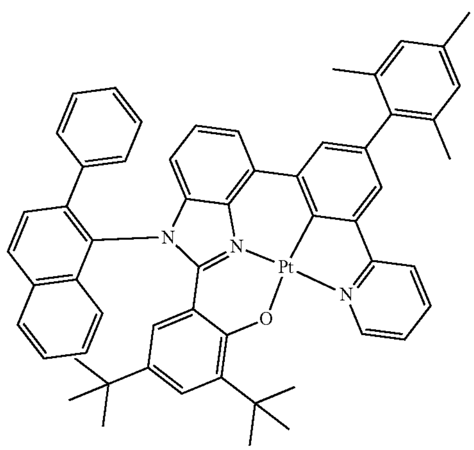
3-265
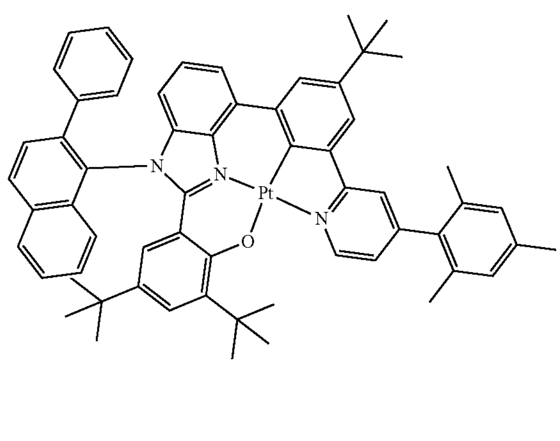
-continued
3-266
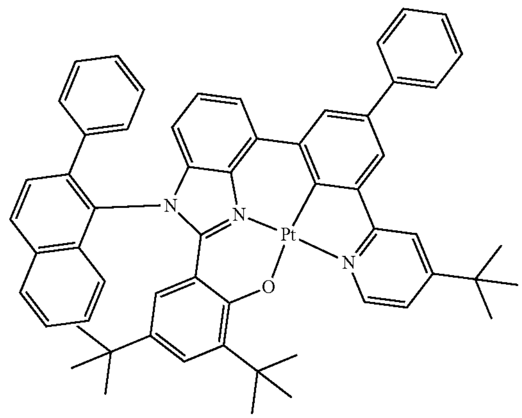
3-267
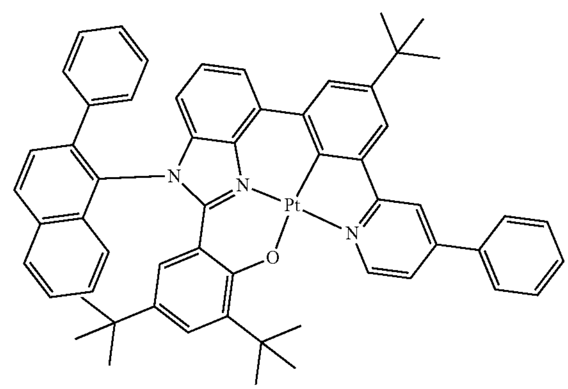
3-268
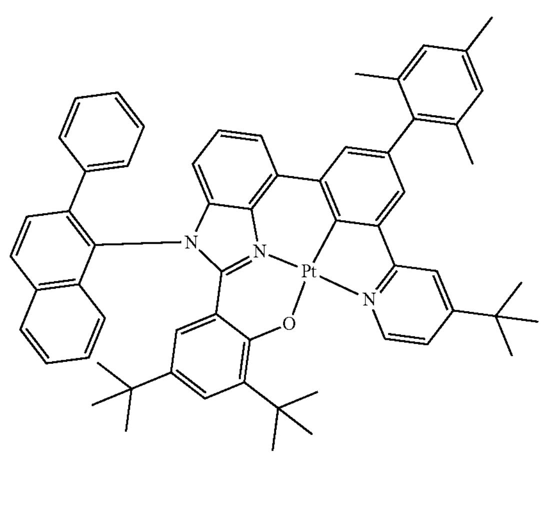

-continued
3-269
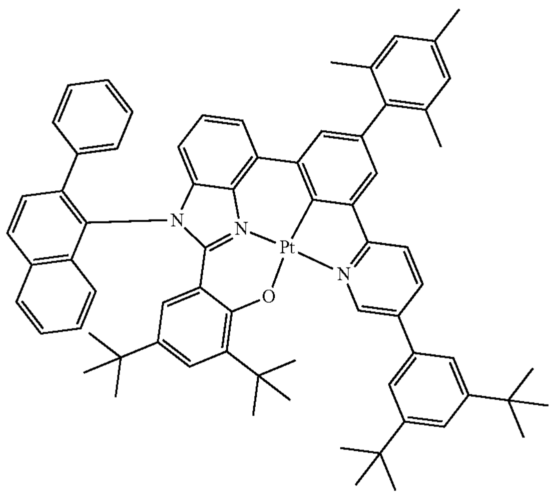
3-270
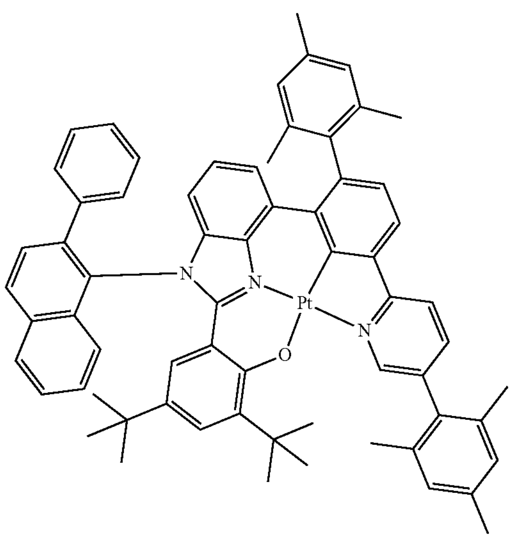
3-271
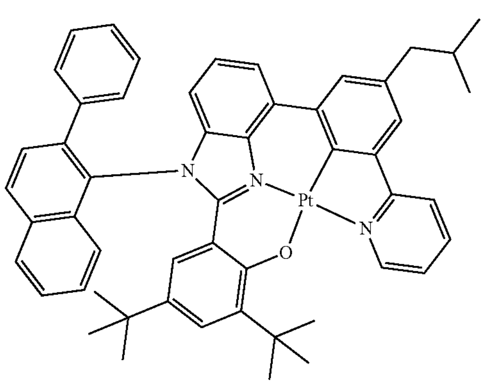
-continued
3-272
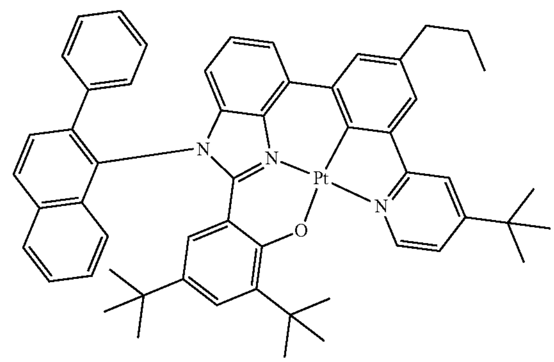
3-273
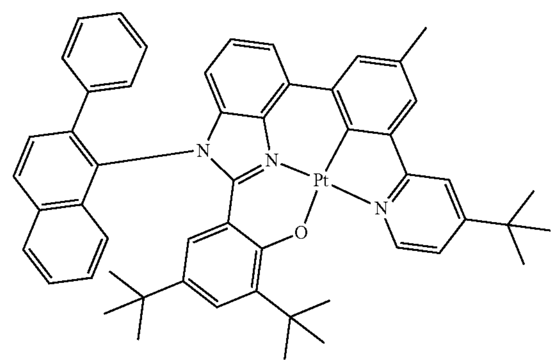
3-274
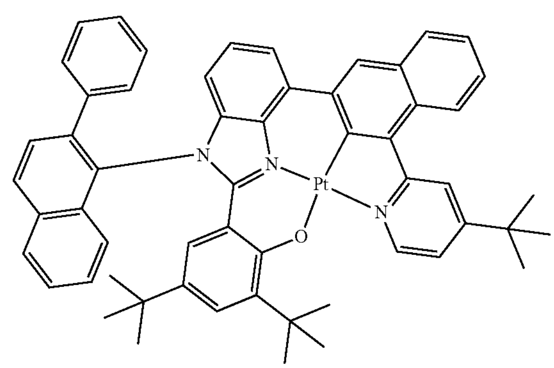
3-275
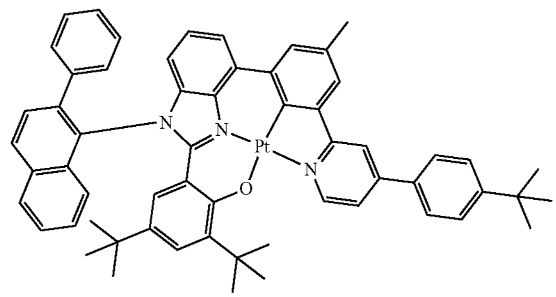

-continued
3-276
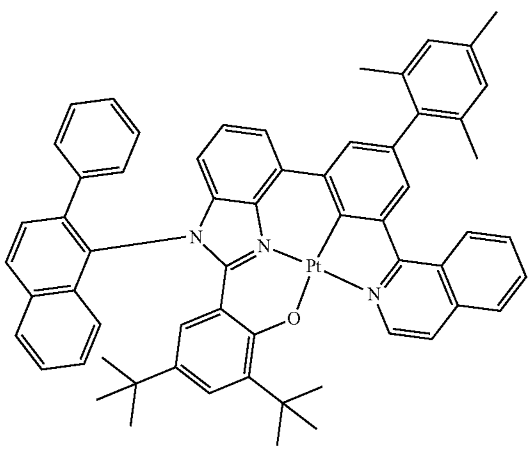
3-277
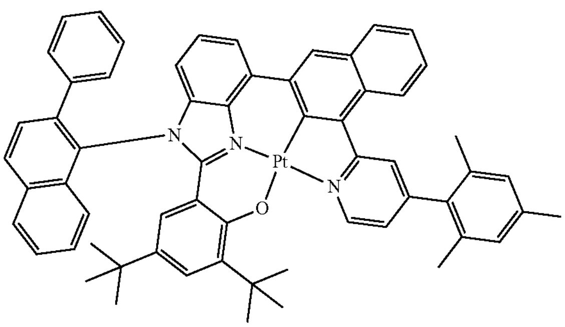
3-278
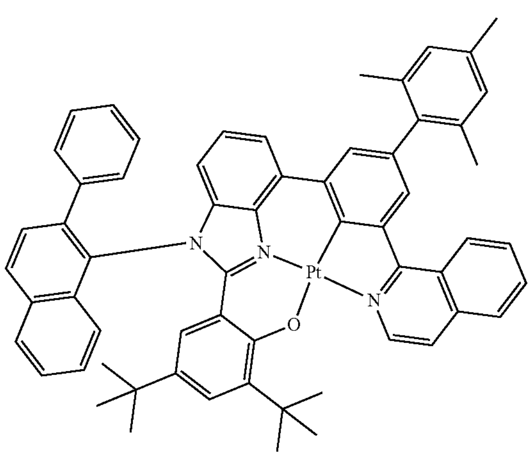
-continued
3-279
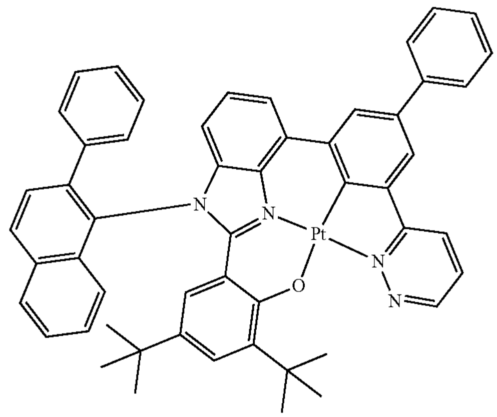
3-280
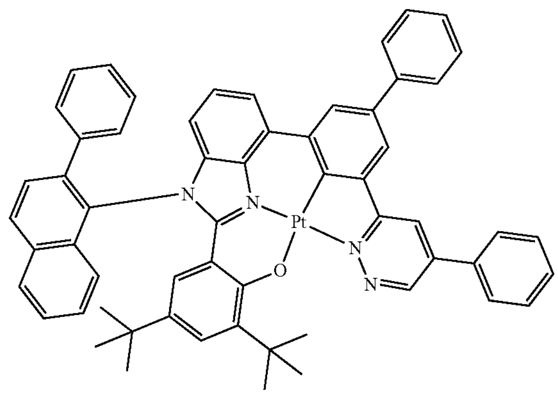
3-281
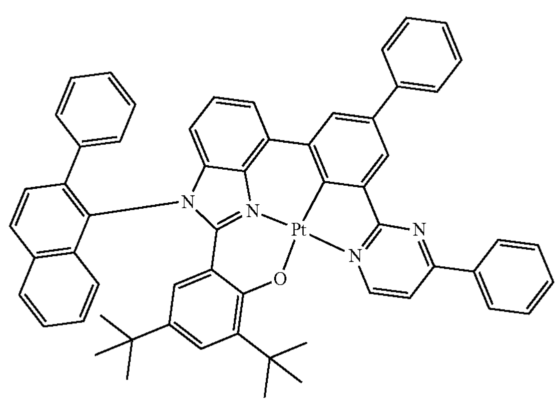

-continued
3-282
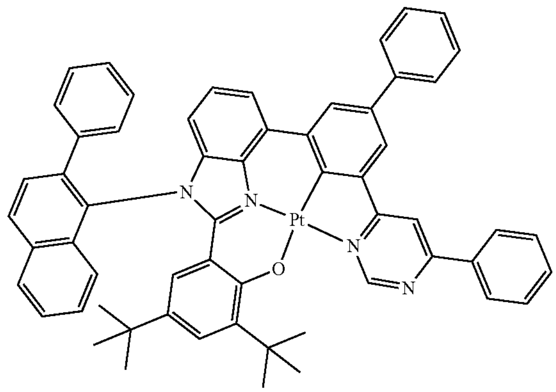
3-283
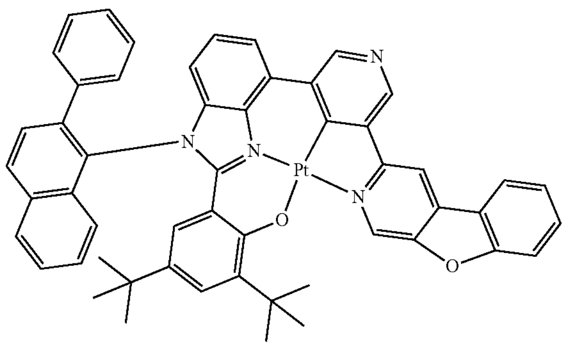
3-284
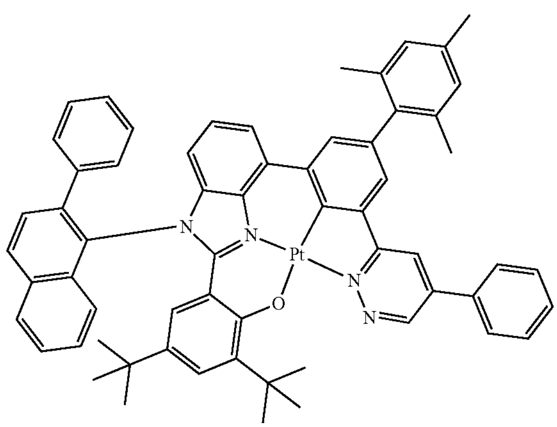
3-285
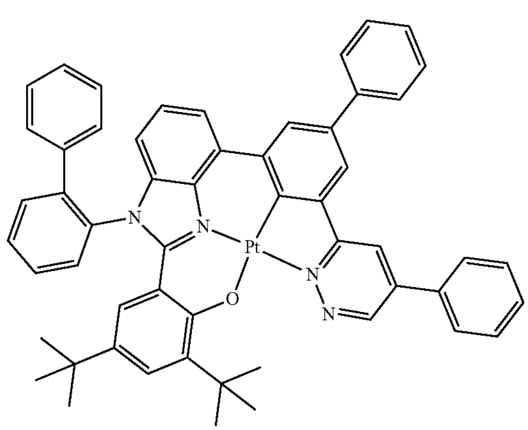
-continued
3-286
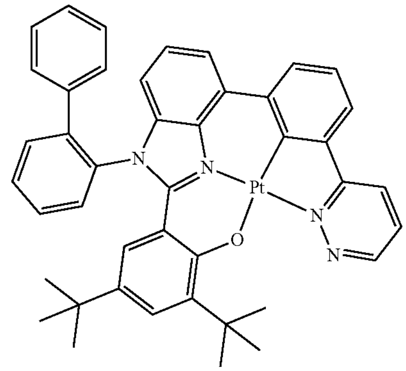
3-287
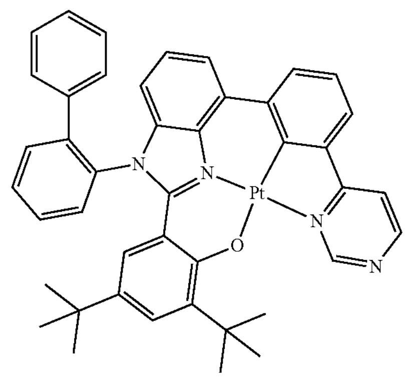
3-288
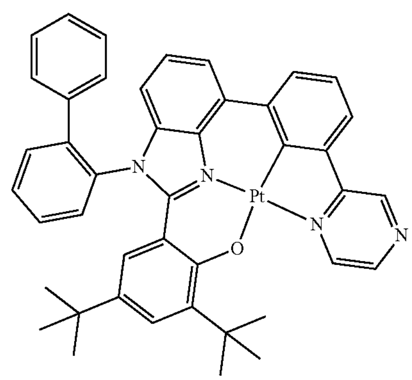
3-289
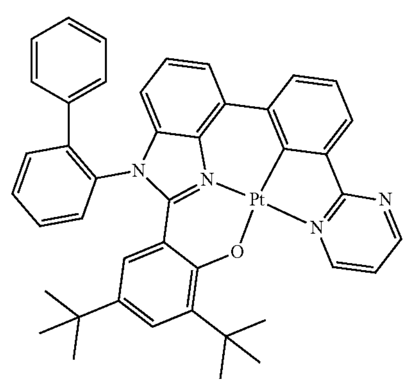

3-290
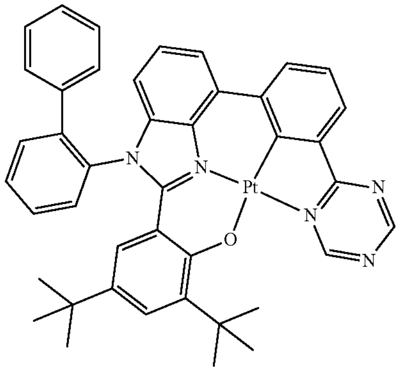
3-291
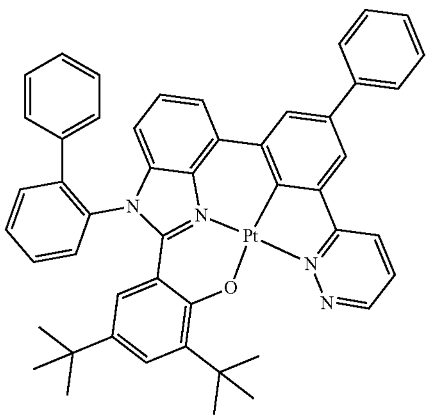
3-292
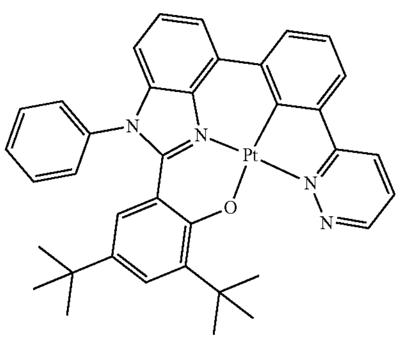
3-293
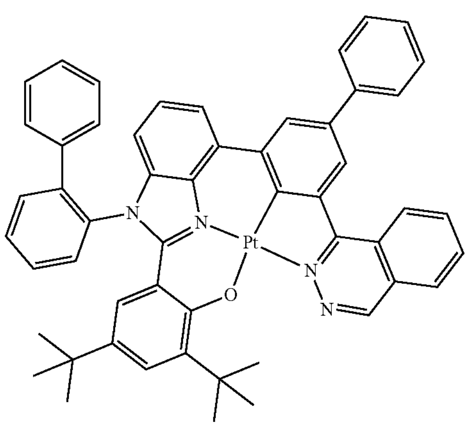
3-294
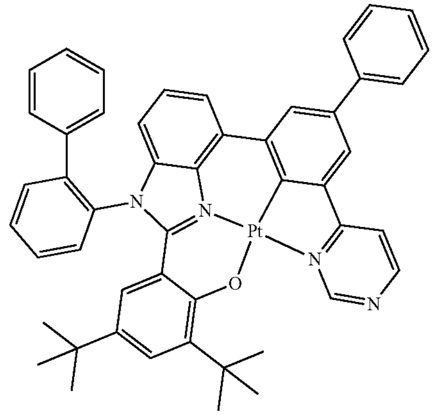
3-295
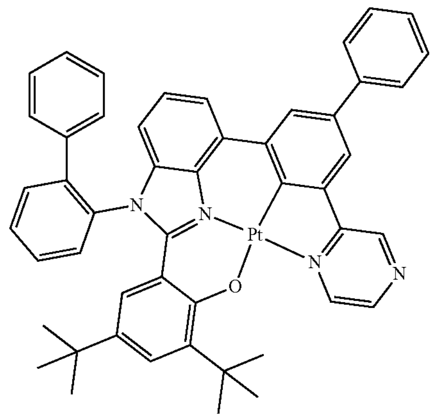
3-296
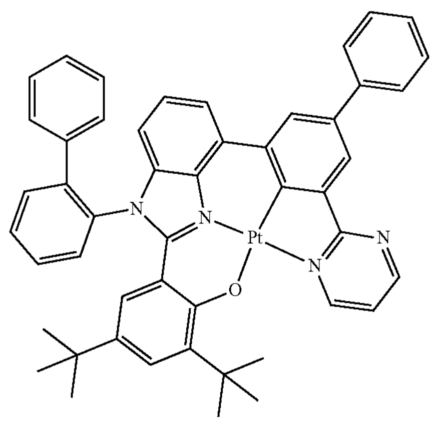
3-297
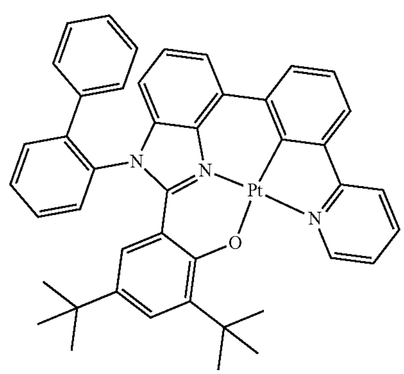

-continued
3-298
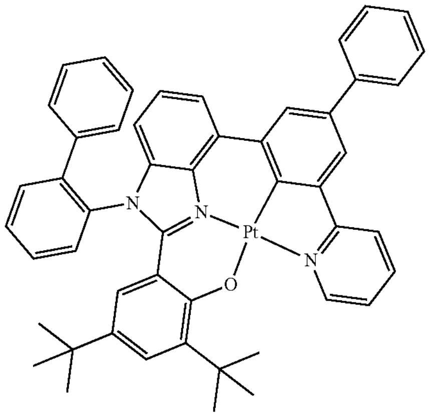
3-299
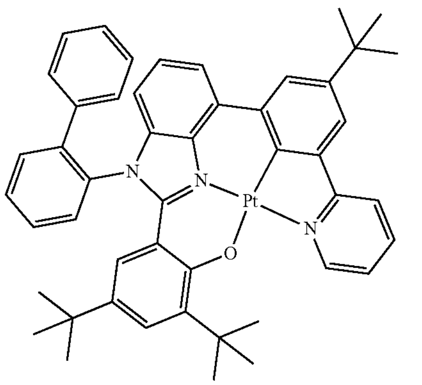
3-300
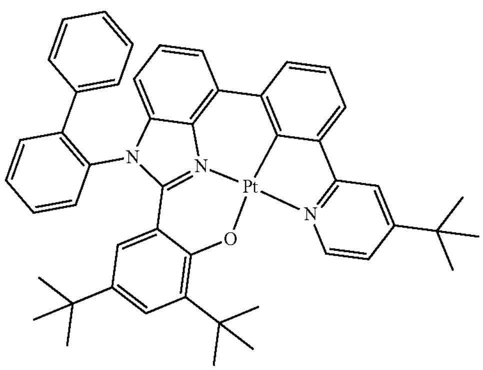
3-301
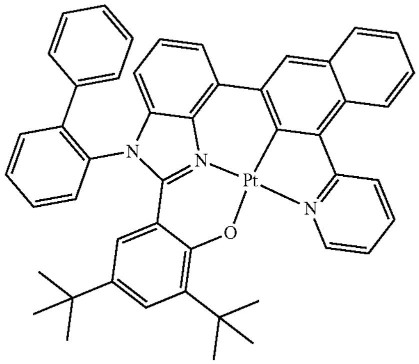
-continued
3-302
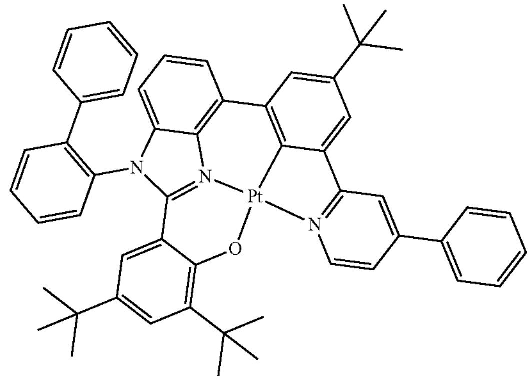
3-303
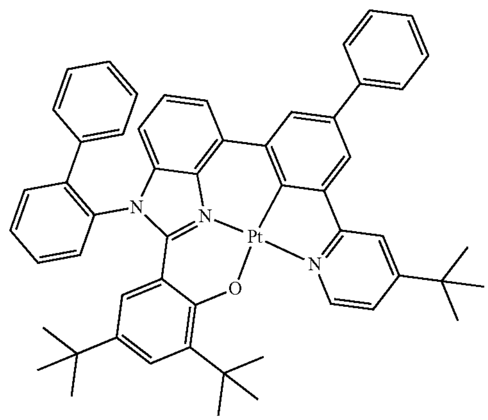
3-304
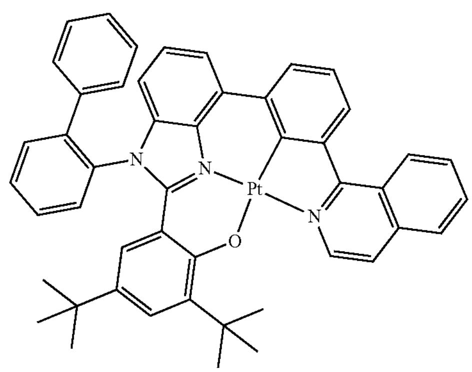
3-305
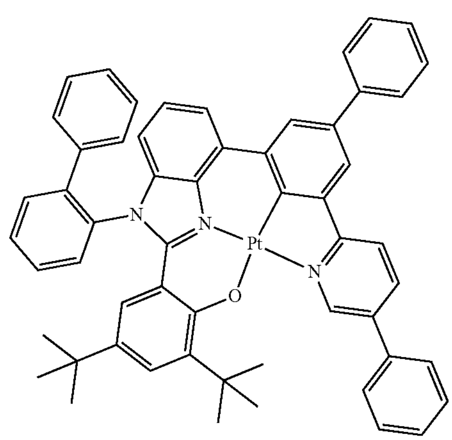

3-306
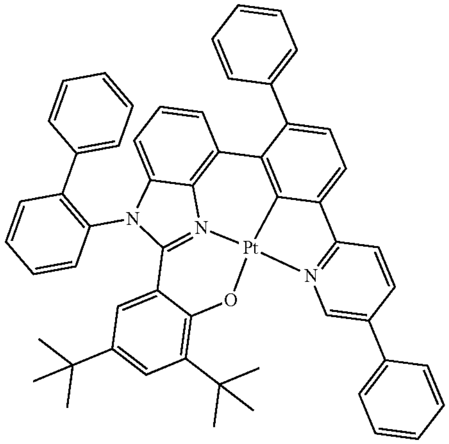
3-307
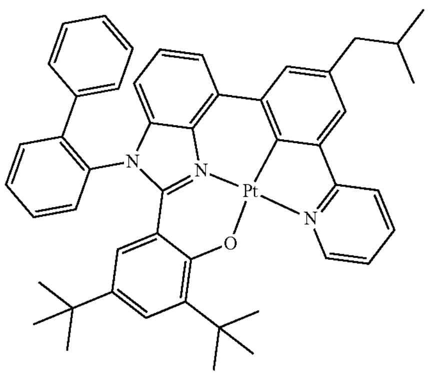
3-308
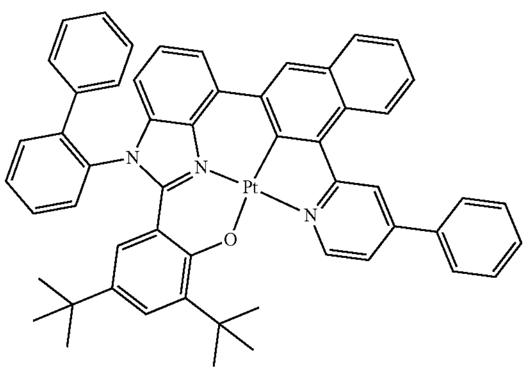
3-309
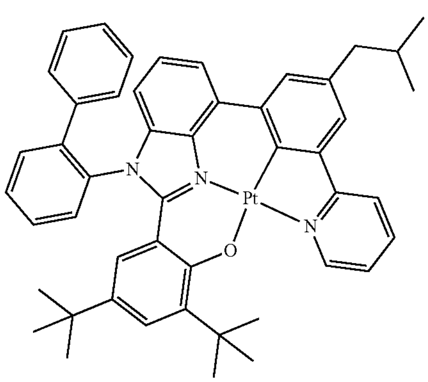
3-310
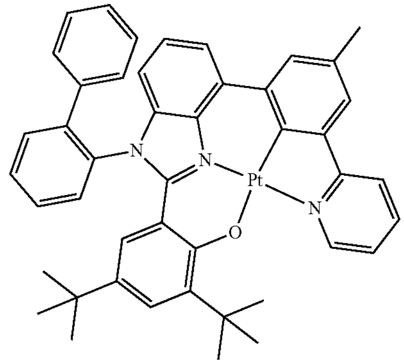
3-311
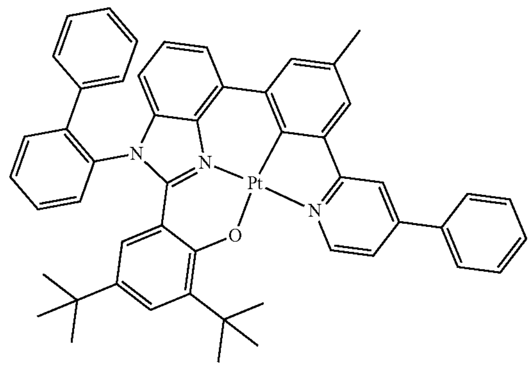
3-312
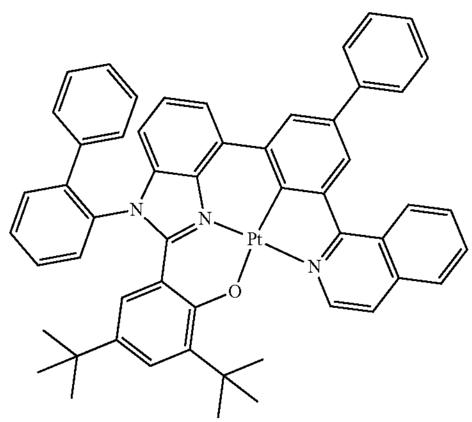
3-313
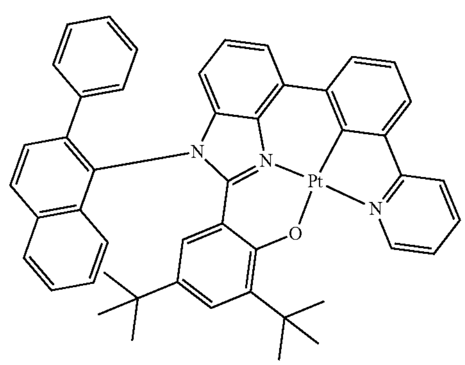

3-314
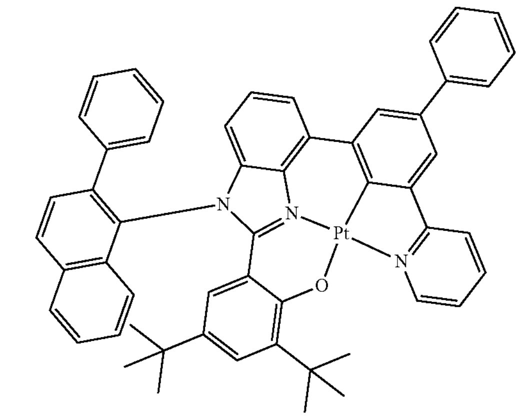
3-315
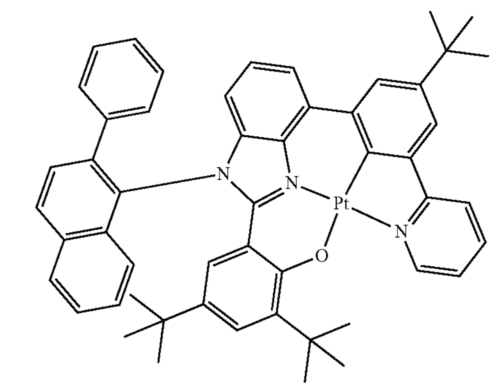
3-316
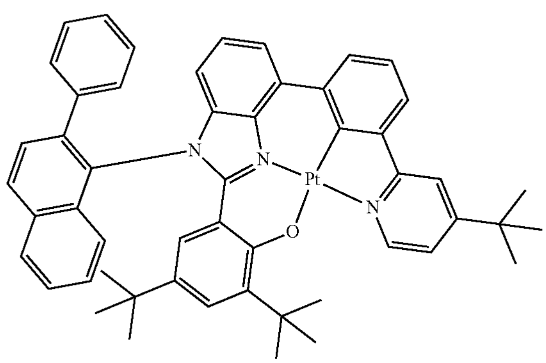
3-317
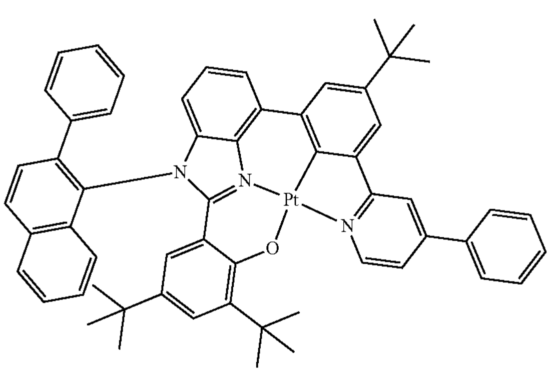
3-318
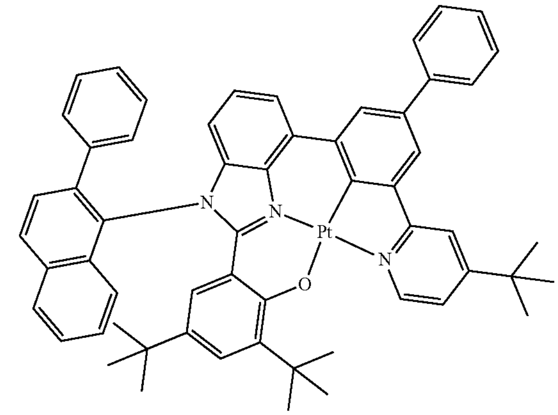
3-319
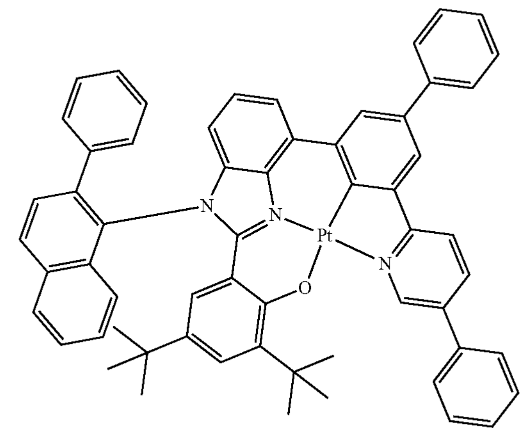
3-320
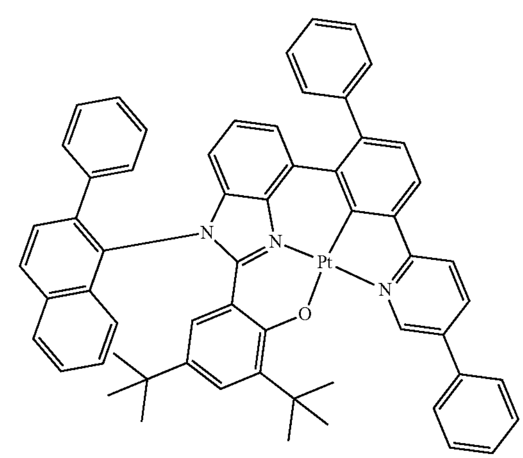

-continued
3-321
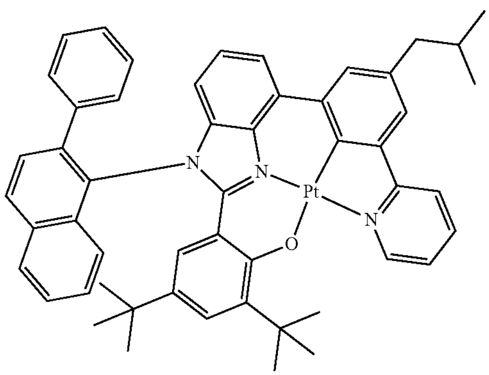
3-322
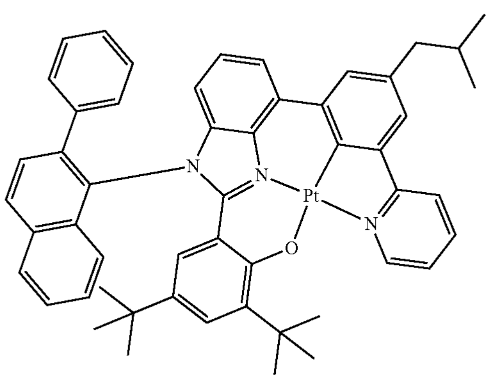
3-323
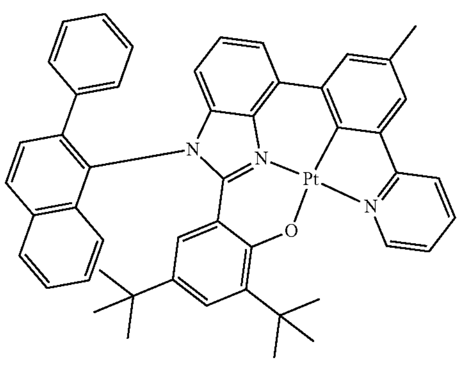
3-324
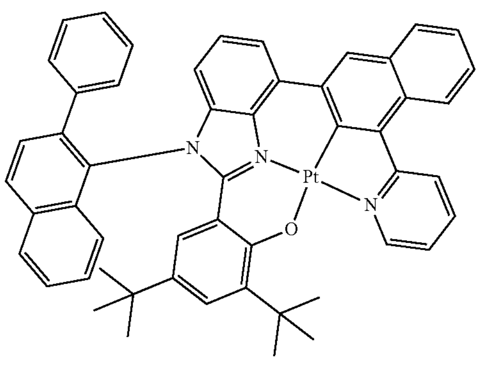
-continued
3-325
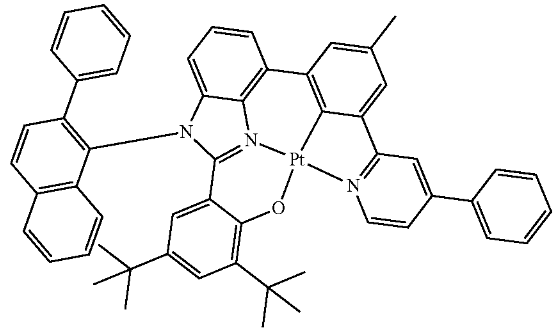
3-326
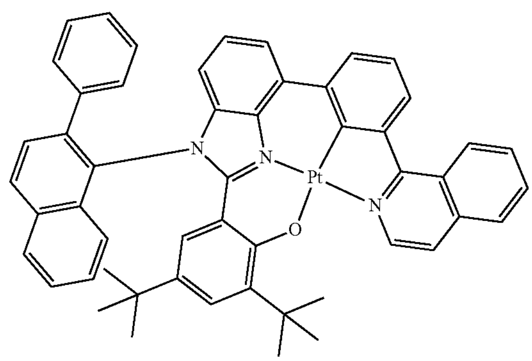
3-327
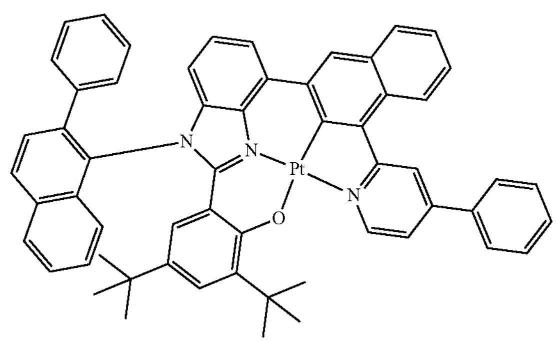
3-328
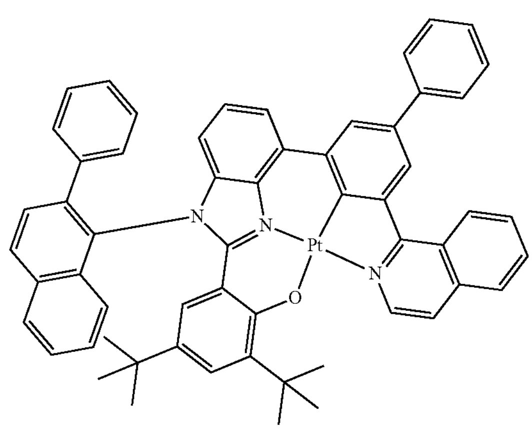

-continued
3-329
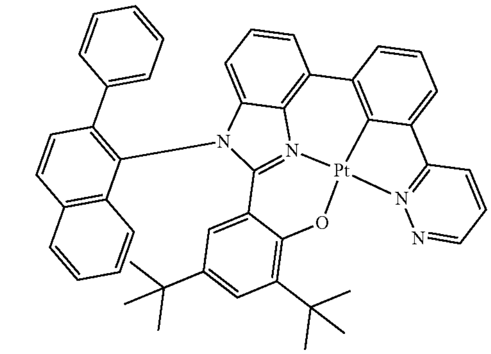
3-330
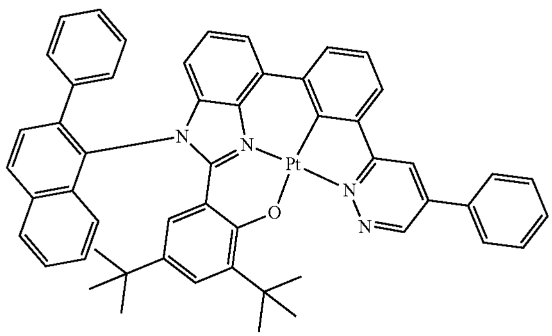
3-331
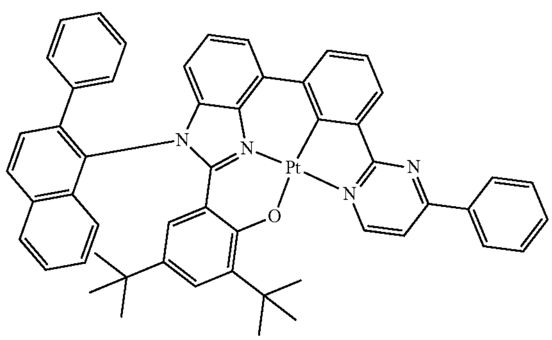
3-332
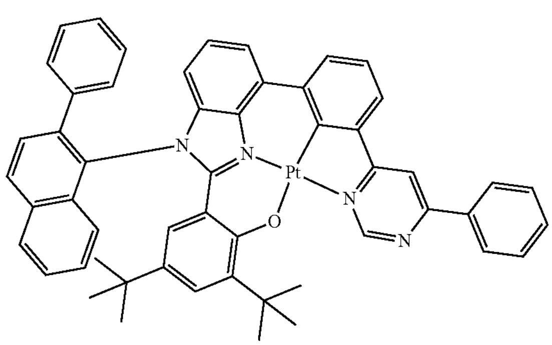
-continued
3-333
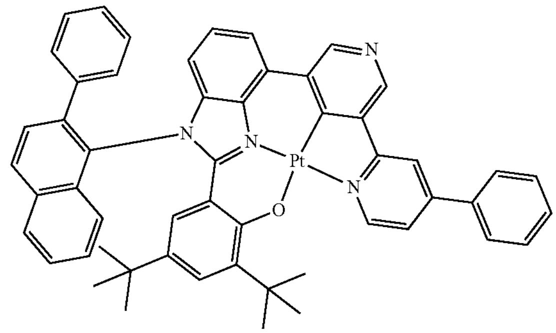
3-334
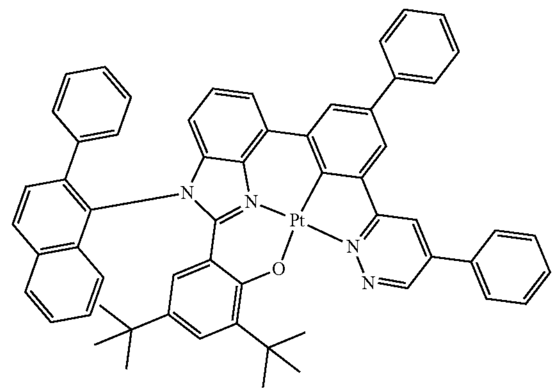
3-335
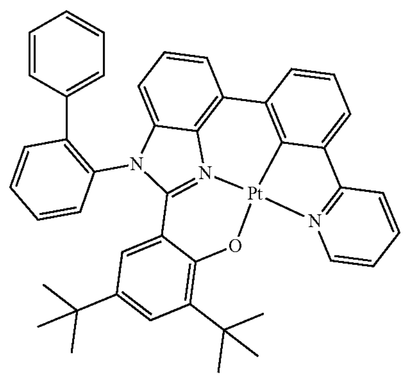
3-336
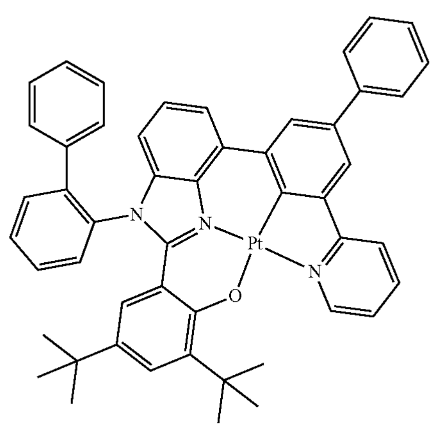

-continued
3-337
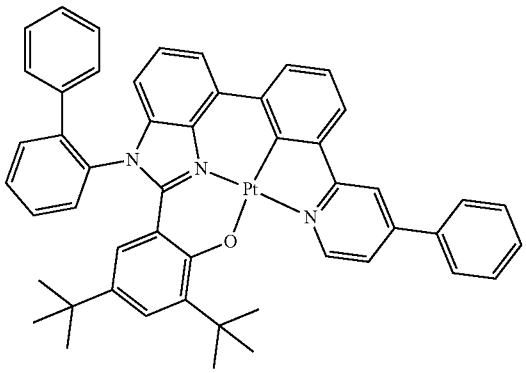
3-338
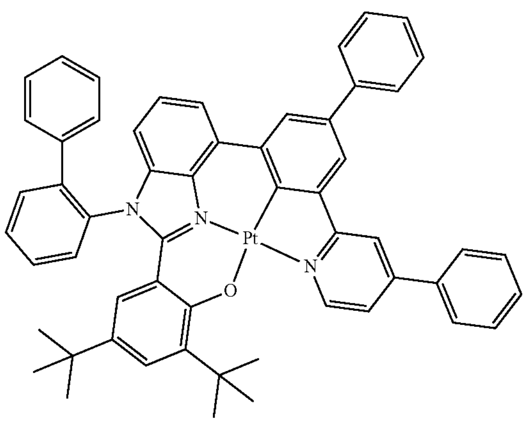
3-339
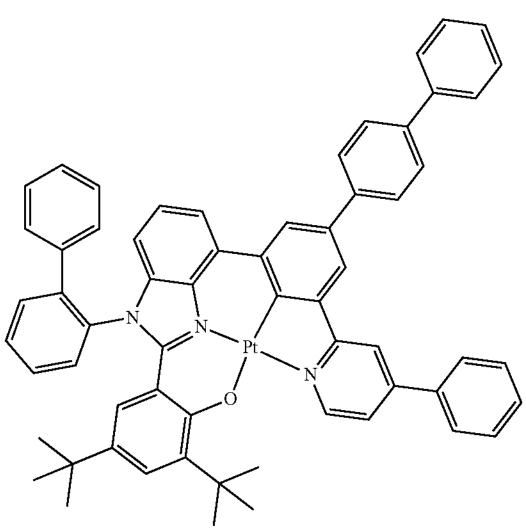
-continued
3-340
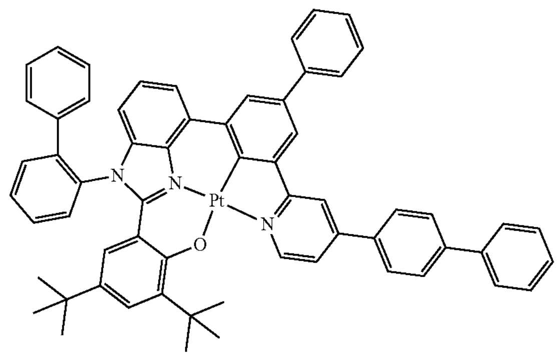
3-341
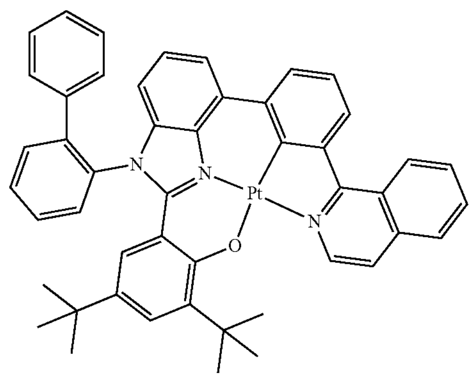
3-342
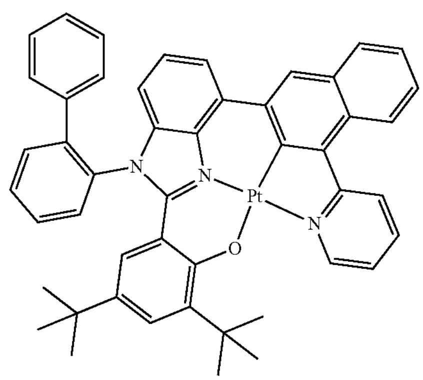
3-343
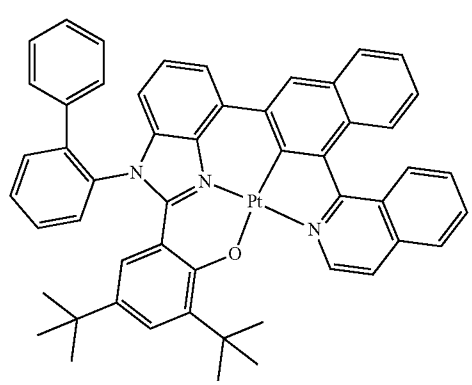

-continued
3-344
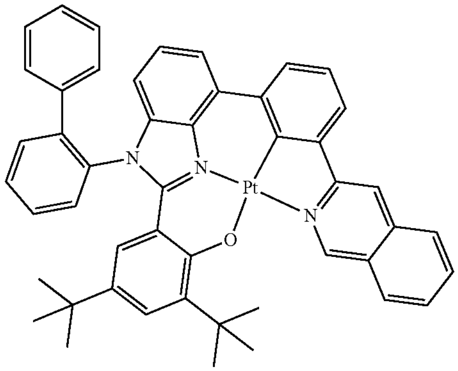
3-345
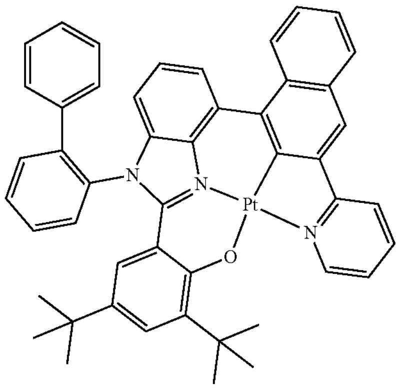
3-346
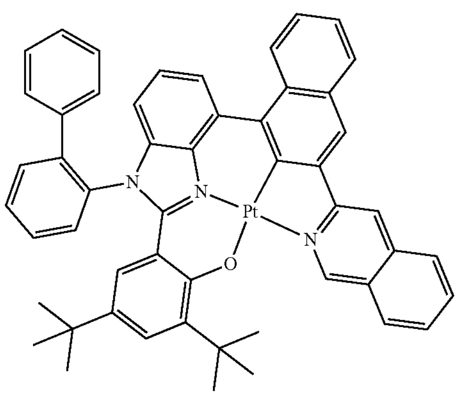
3-347
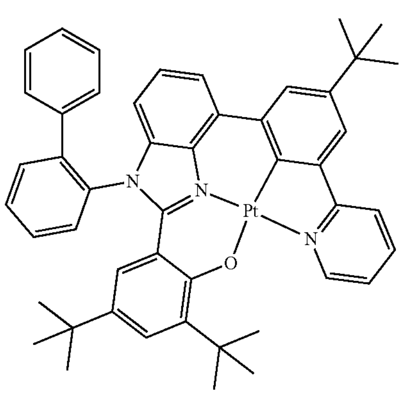
-continued
3-348
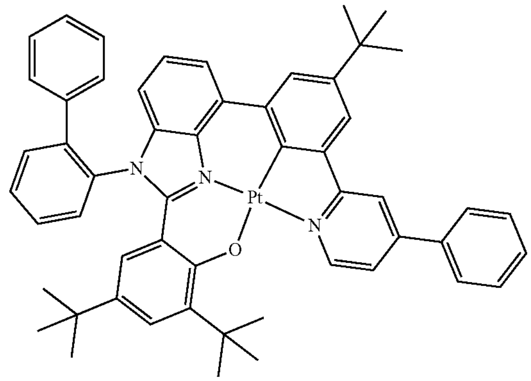
3-349
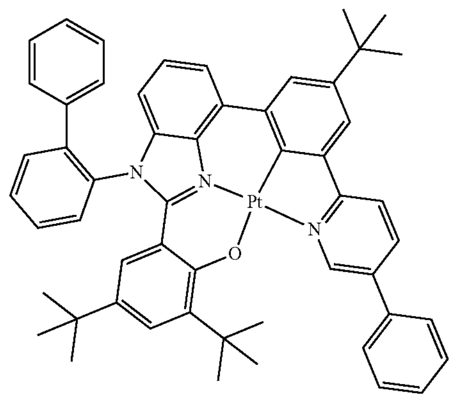
3-350
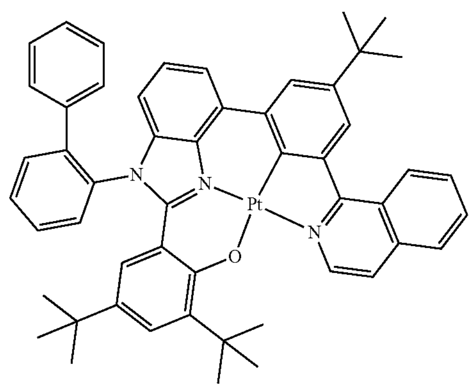
3-351
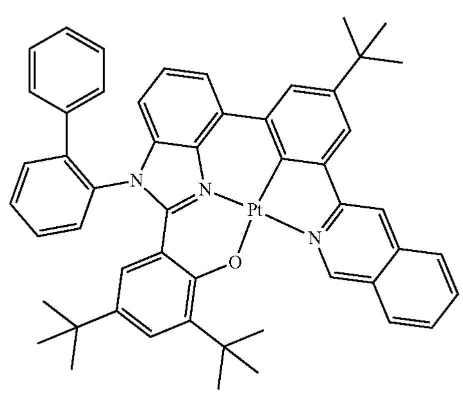

-continued
3-352
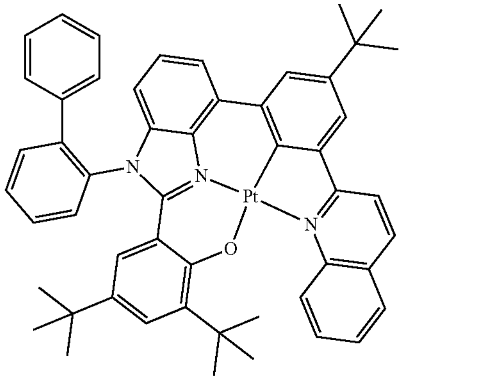
3-353
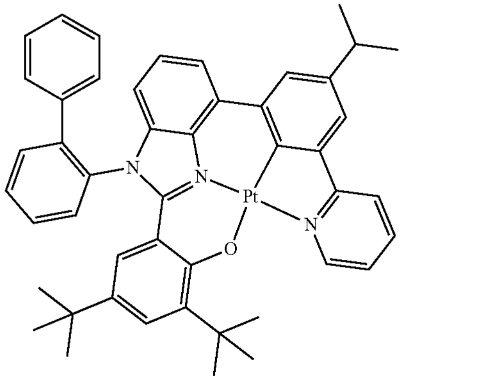
3-354
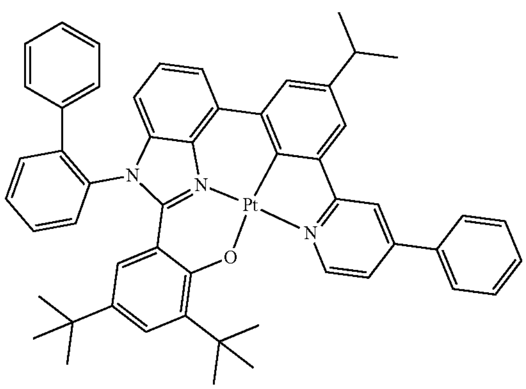
3-355
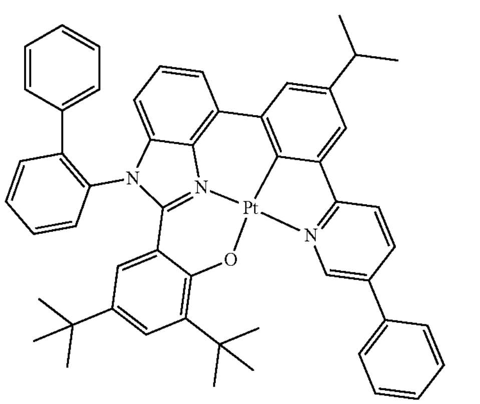
-continued
3-356
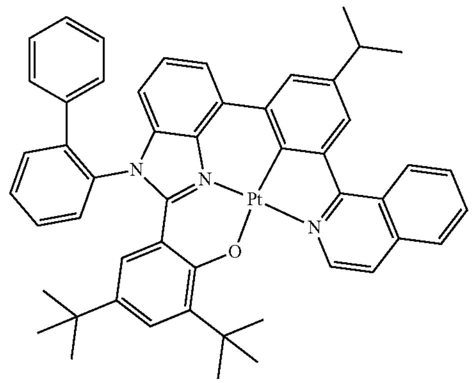
3-357
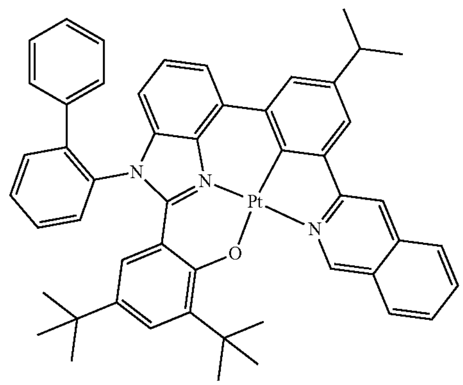
3-358
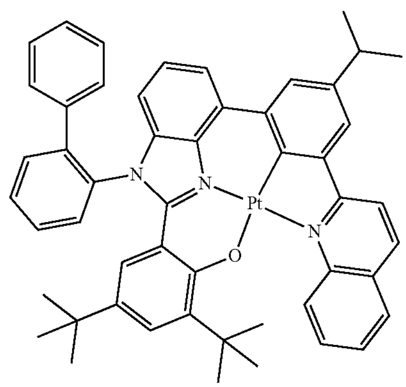
3-359
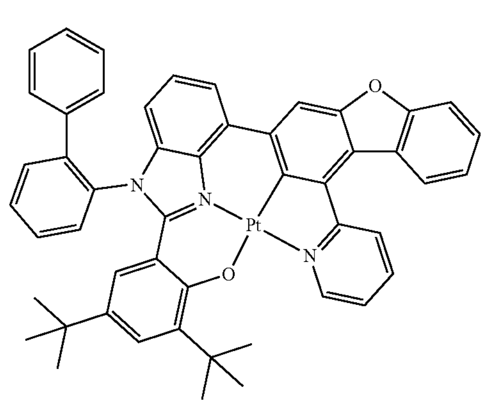

-continued
3-360
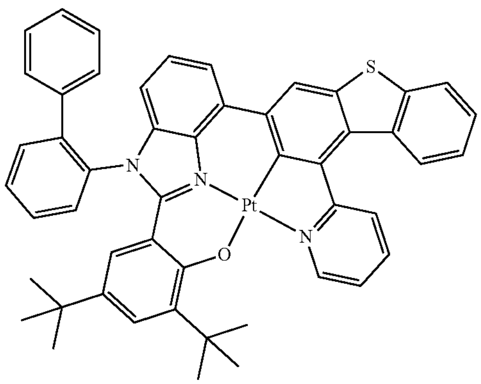
3-361
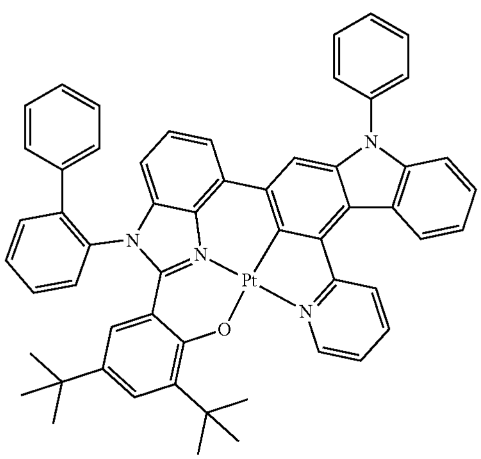
3-362
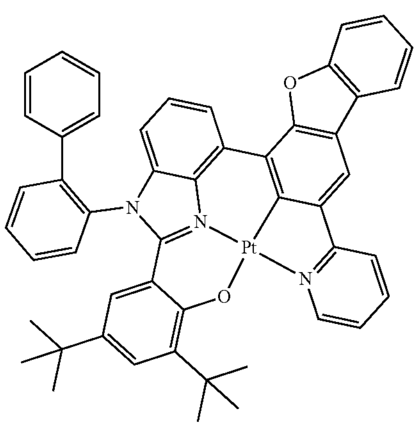
-continued
3-363
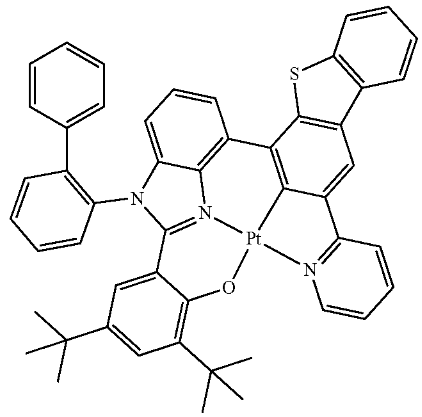
3-364
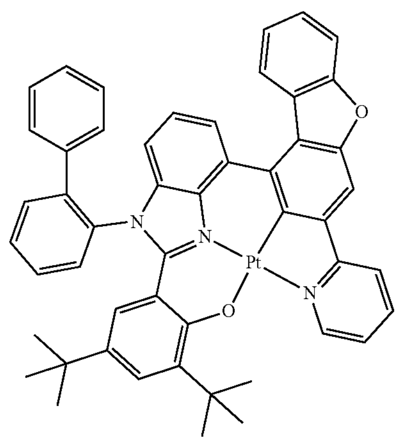
3-365
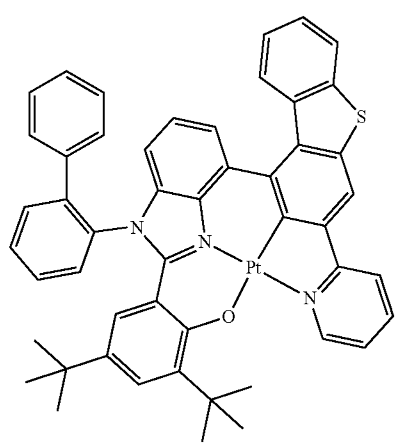

-continued
3-366
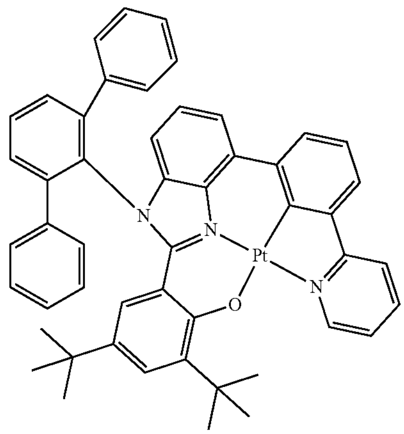
3-367
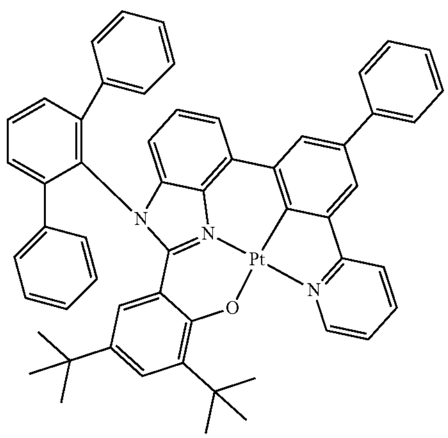
3-368
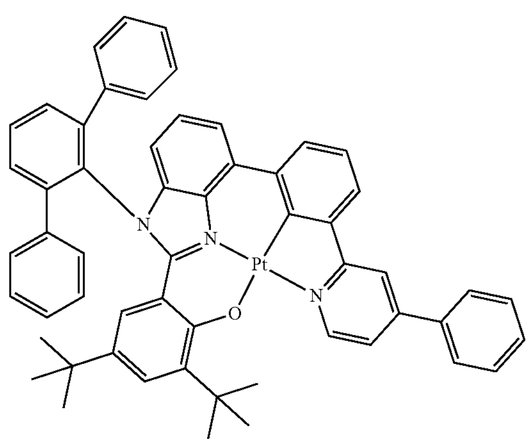
-continued
3-369
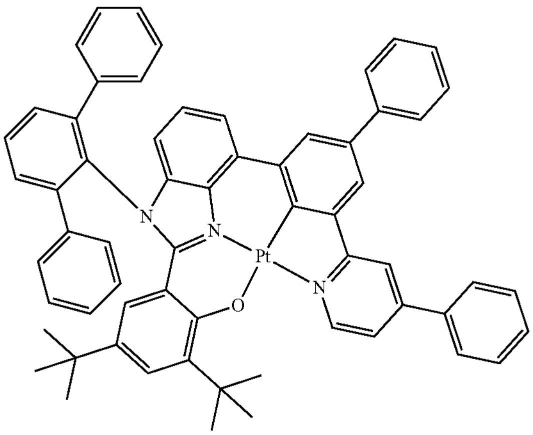
3-370
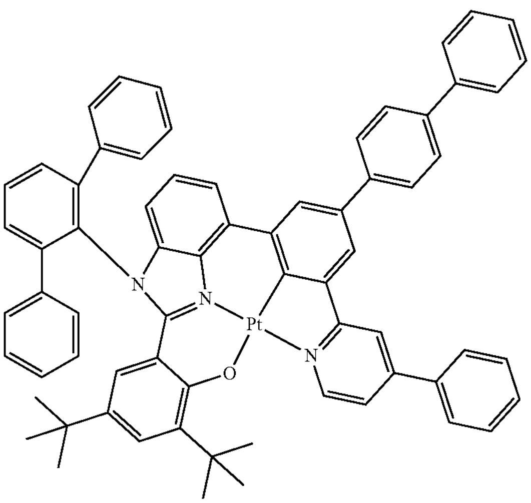
3-371
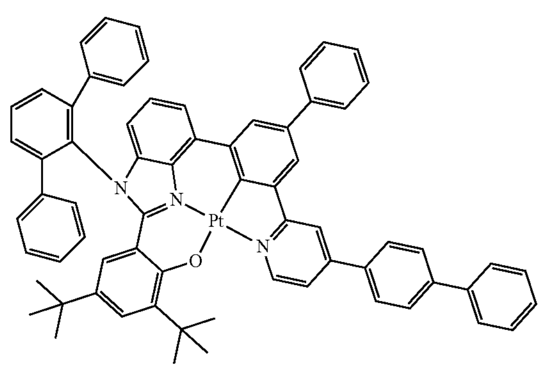

-continued
3-372
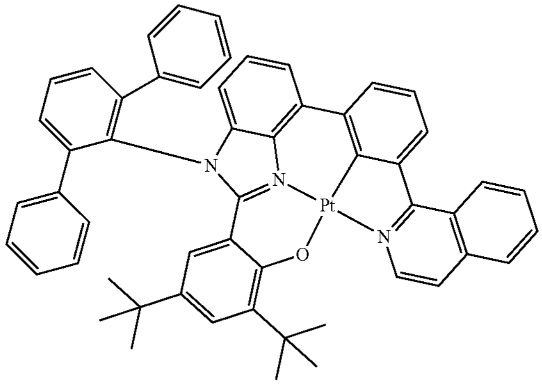
3-373
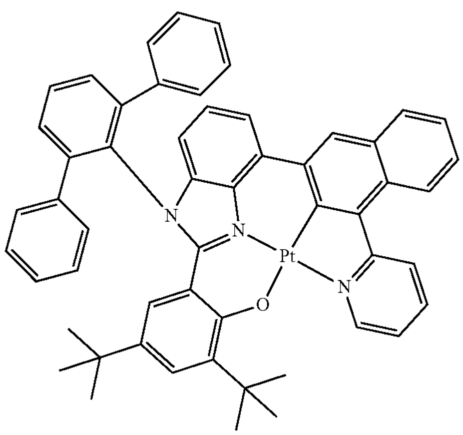
3-374
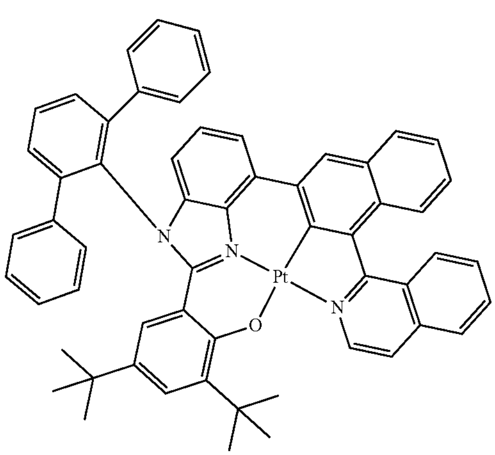
-continued
3-375
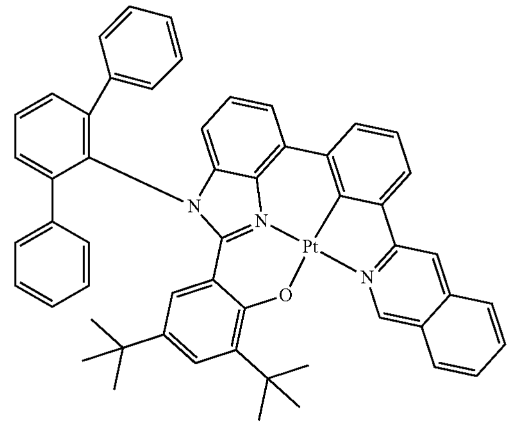
3-376
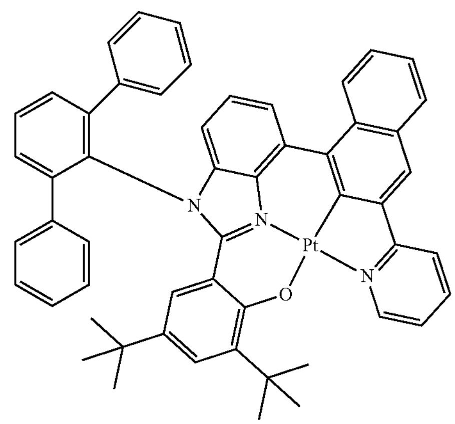
3-377
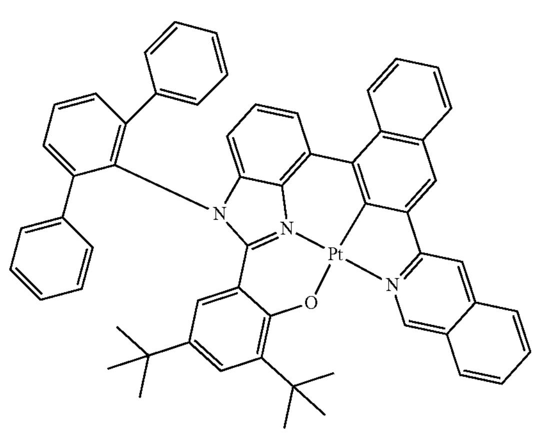

-continued
3-378
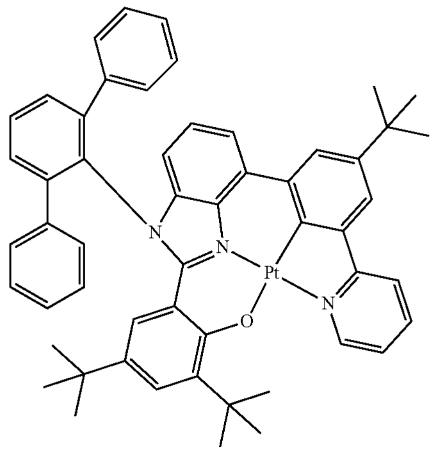
3-379
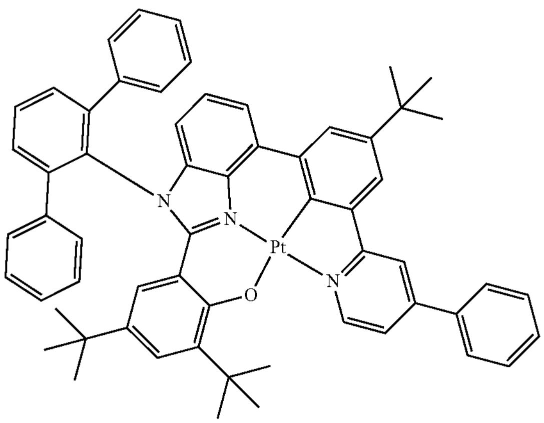
3-380
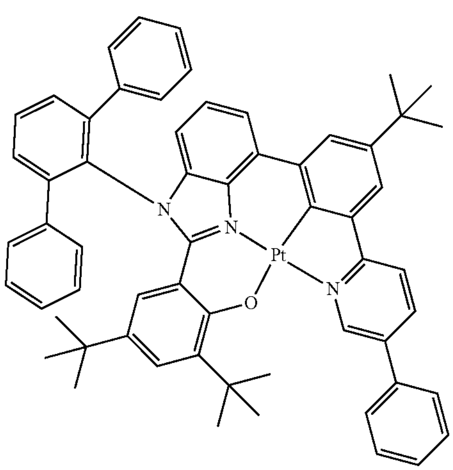
-continued
3-381
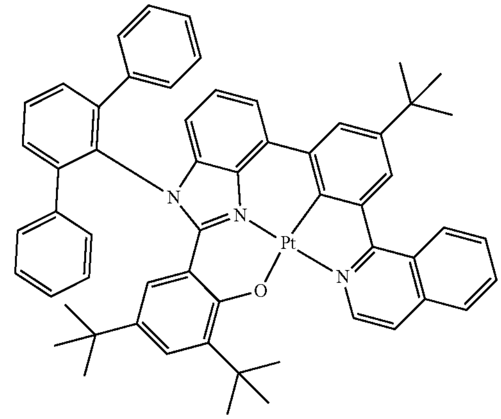
3-382
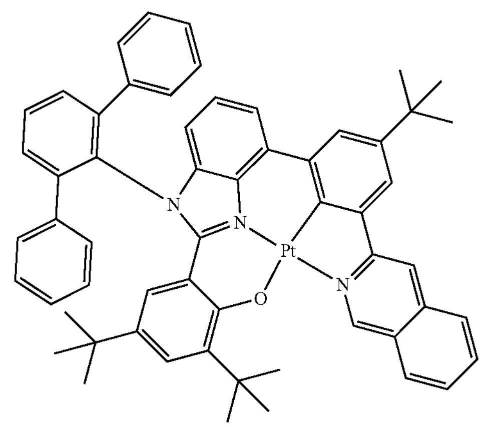
3-383
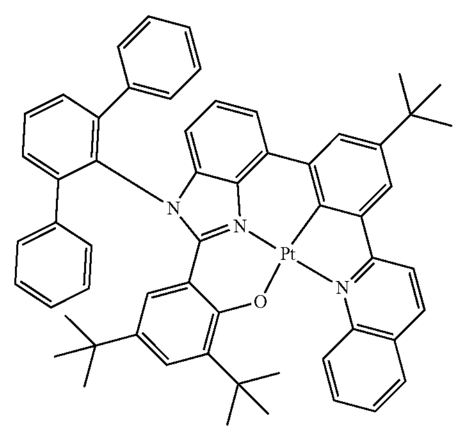

-continued
3-384
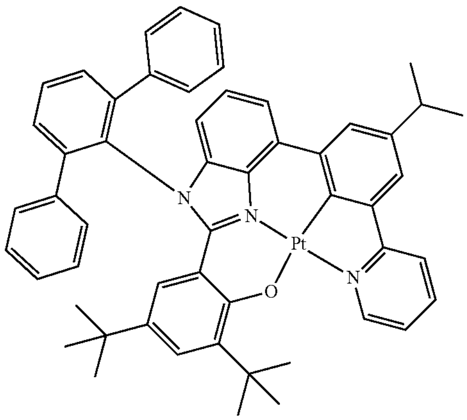
3-385
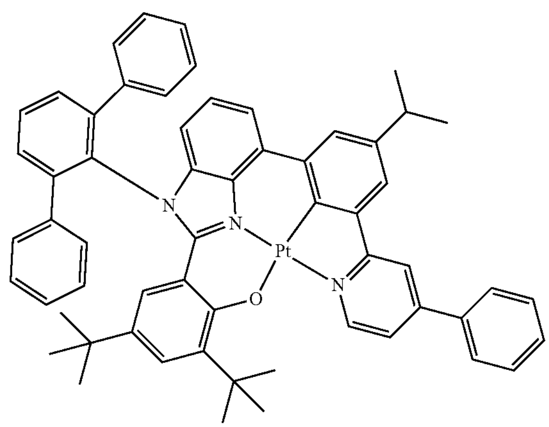
3-386
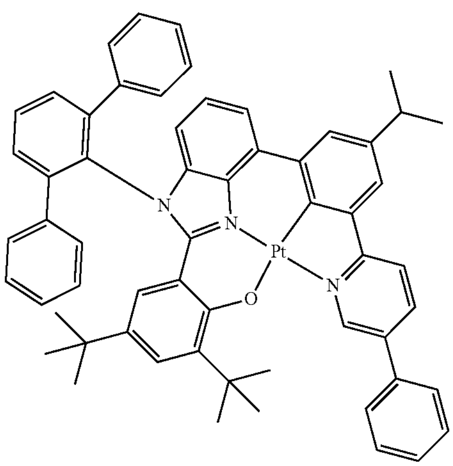
-continued
3-387
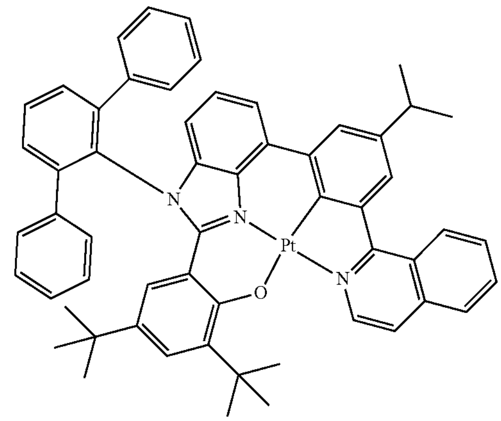
3-388
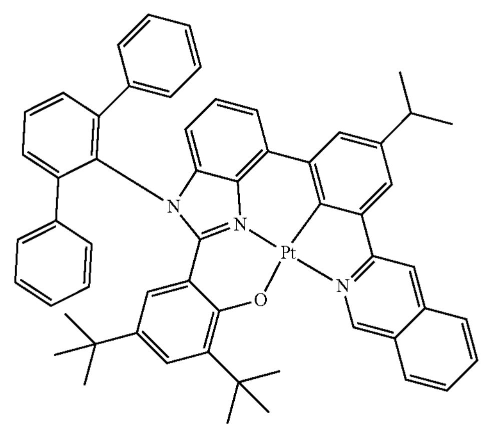
3-389
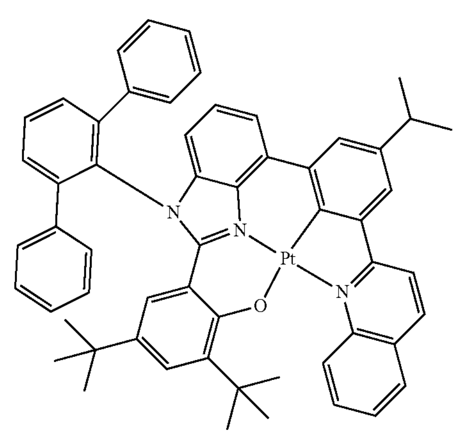

-continued
3-390
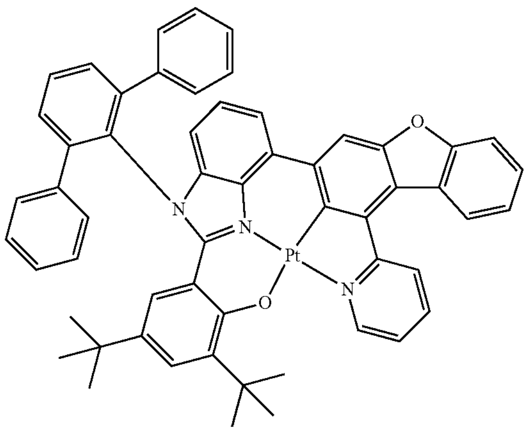
3-391
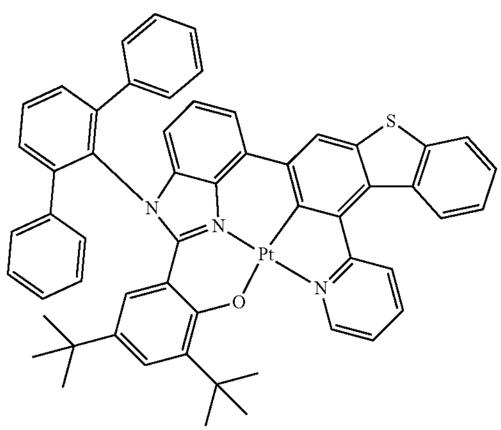
3-392
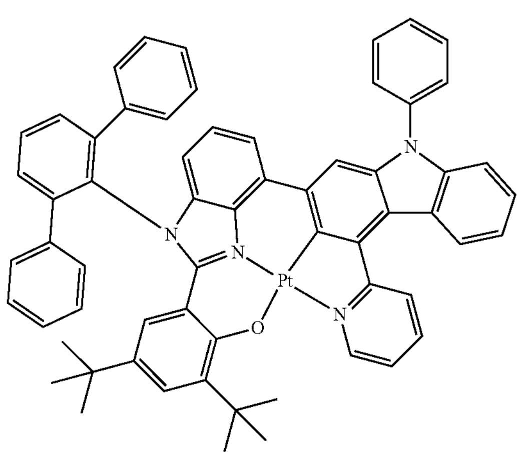
-continued
3-393
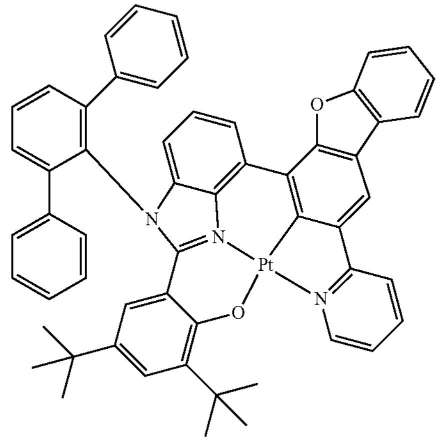
3-394
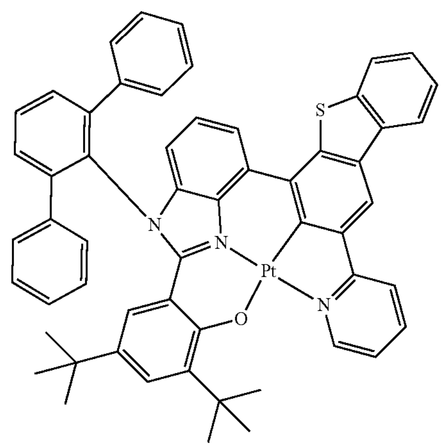
3-395
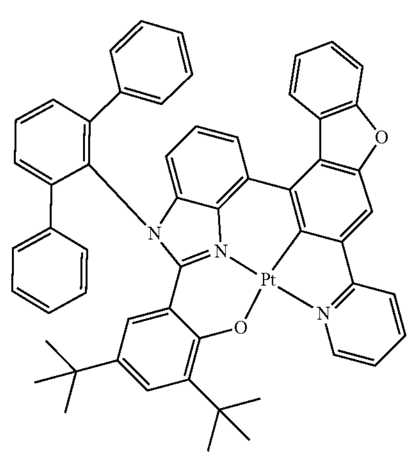

-continued
3-396
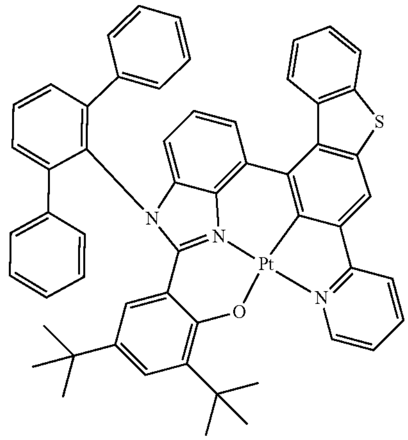
3-397
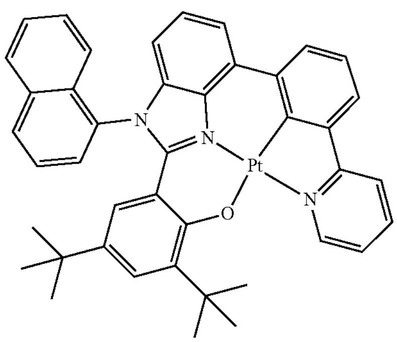
3-398
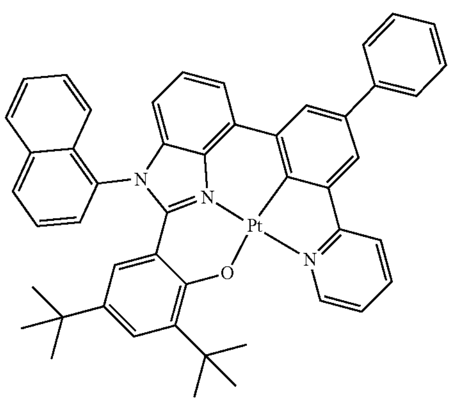
3-399
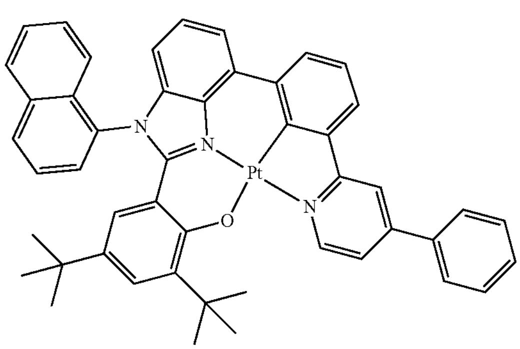
-continued
3-400
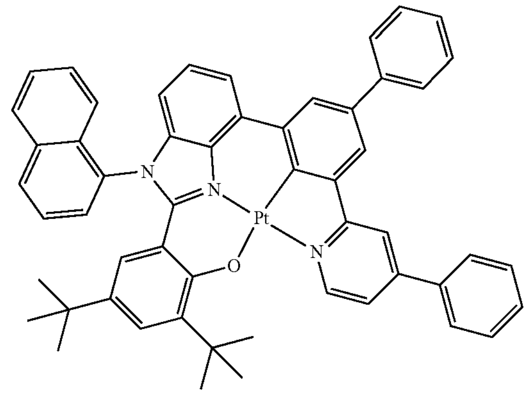
3-401
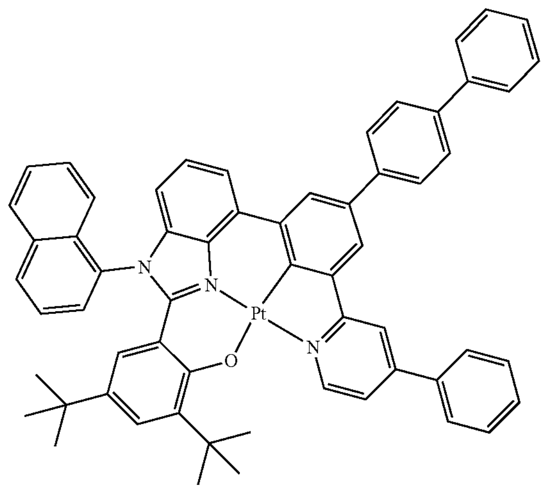
3-402
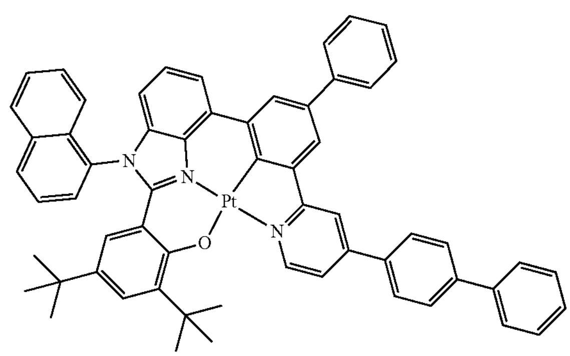
3-403
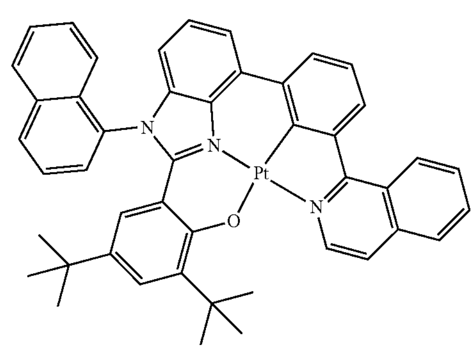

3-404
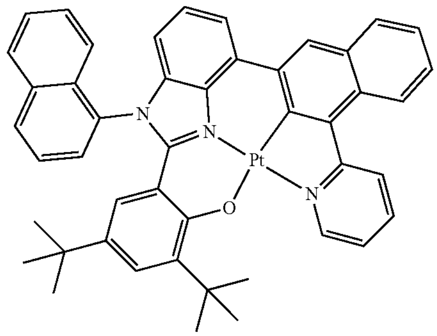
3-405
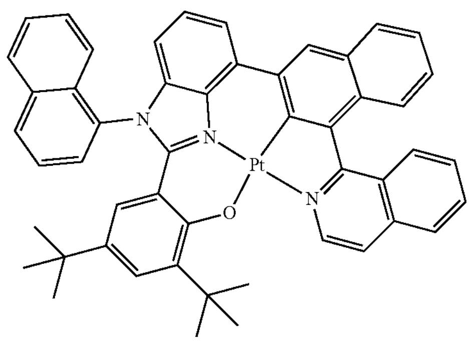
3-406
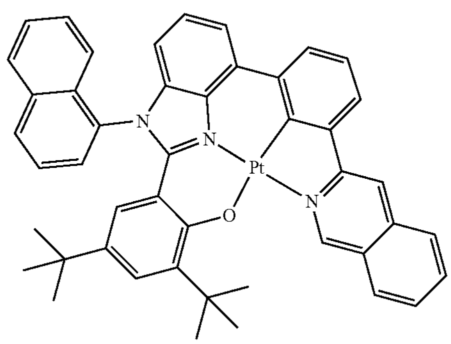
3-407
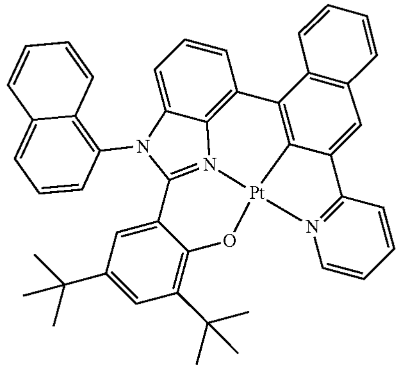
3-408
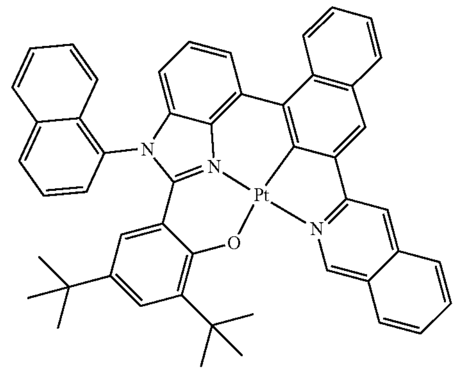
3-409
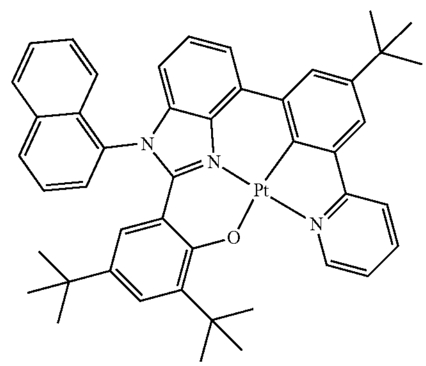
3-410
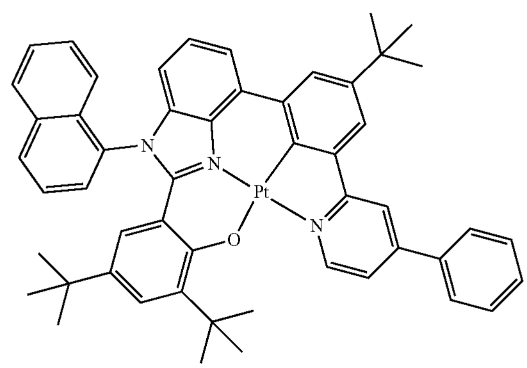
3-411
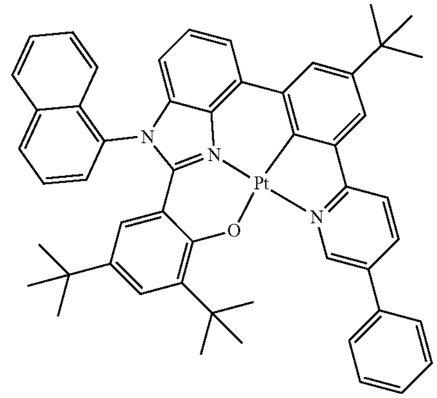

-continued
3-412
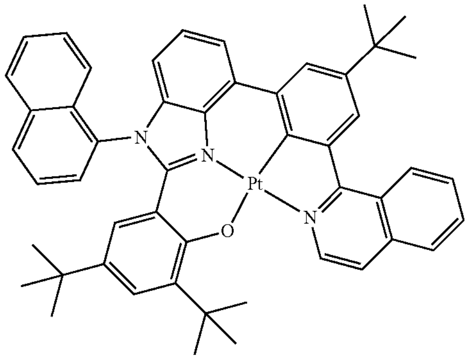
3-413
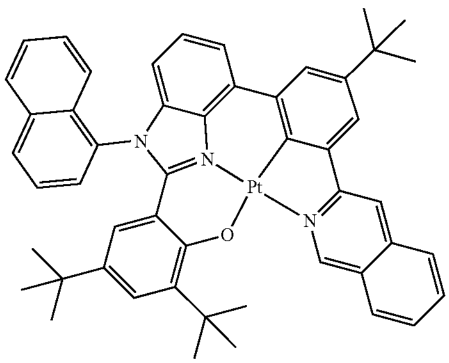
3-414
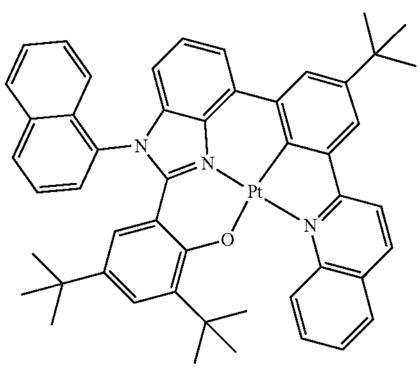
3-415
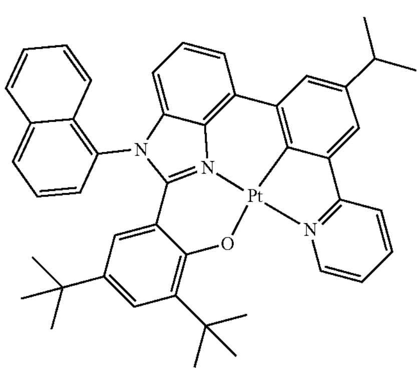
-continued
3-416
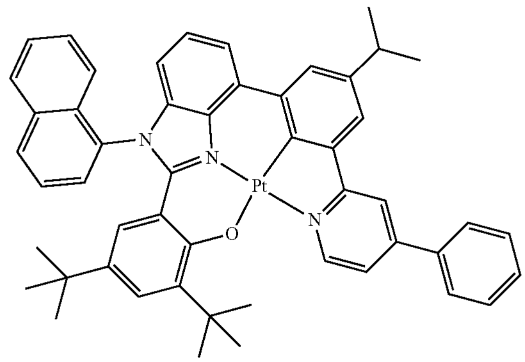
3-417
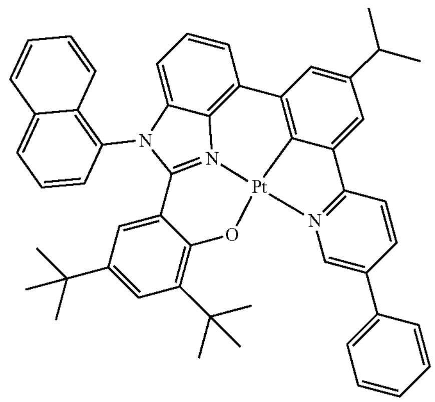
3-418
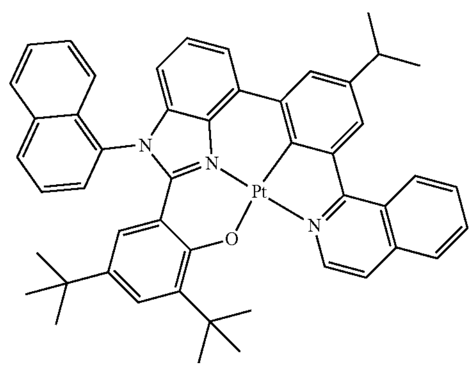
3-419
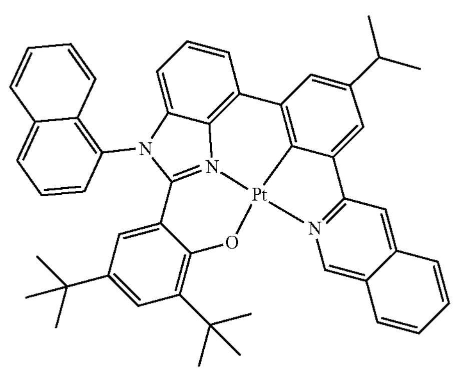

-continued
3-420
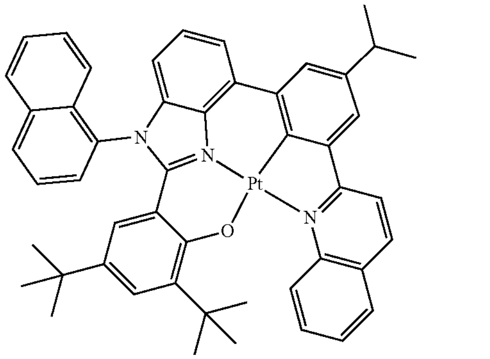
3-421
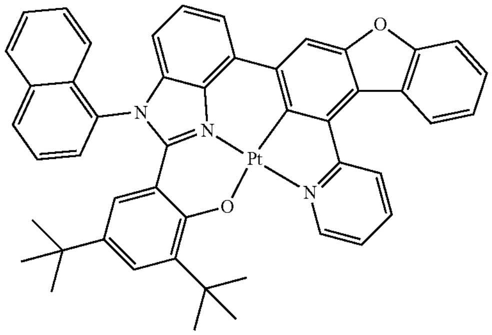
3-422
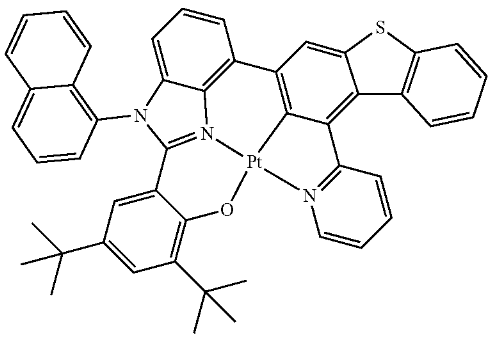
3-423
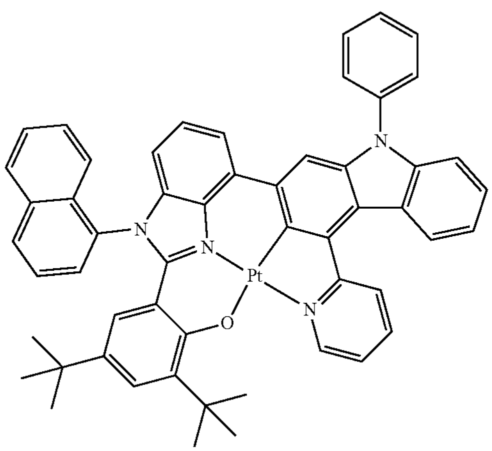
-continued
3-424
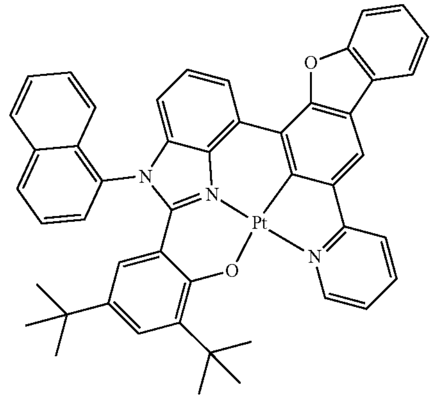
3-425
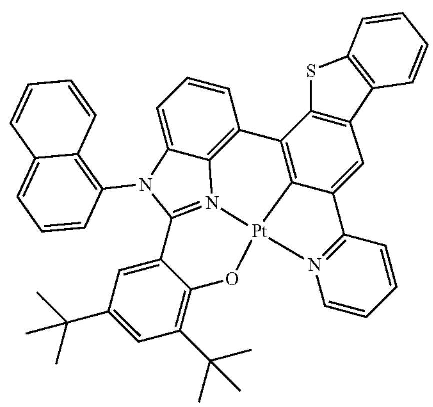
3-426
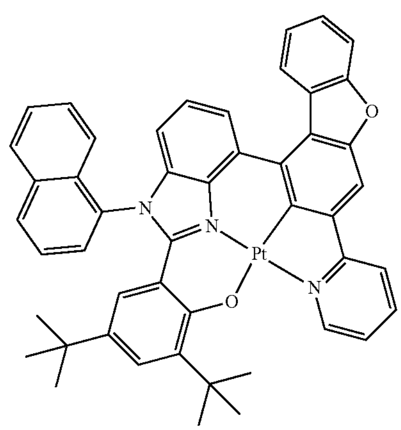
3-427
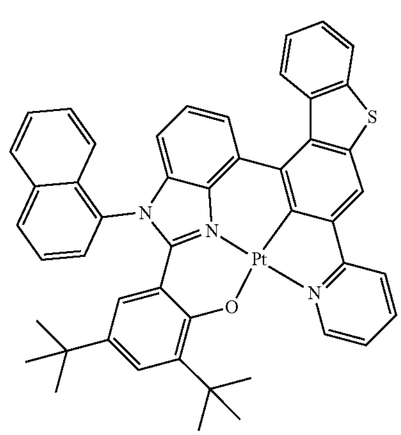

-continued
3-428
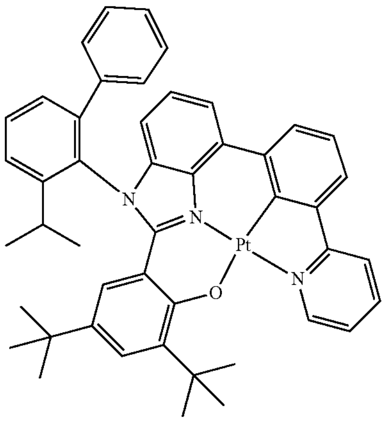
3-429
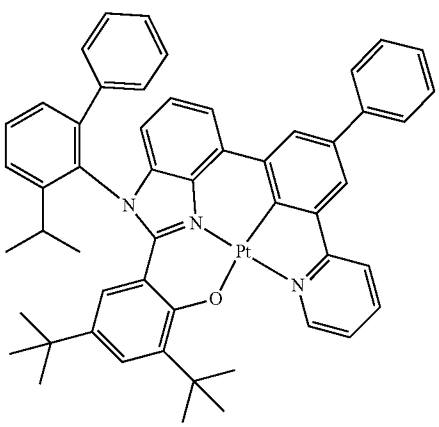
3-430
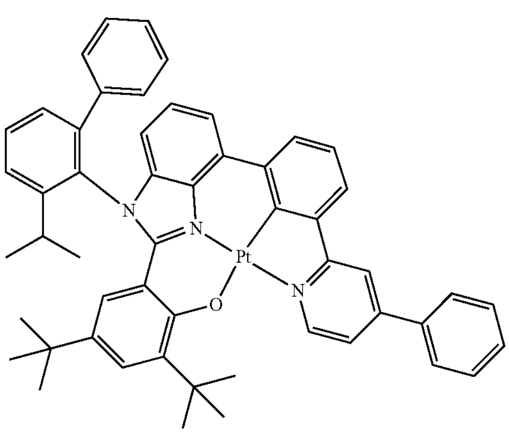
-continued
3-431
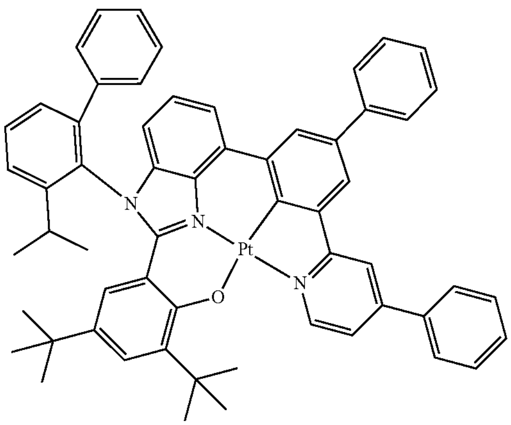
3-432
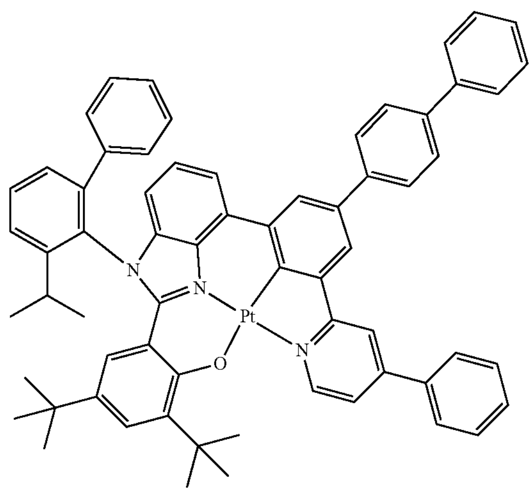
3-433
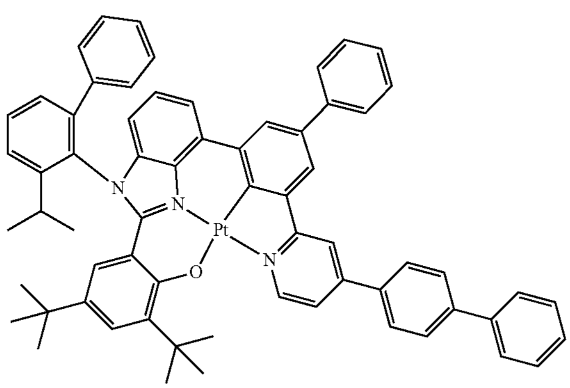

-continued
3-434
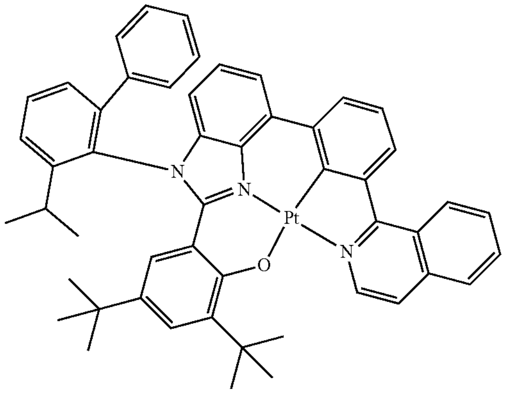
3-435
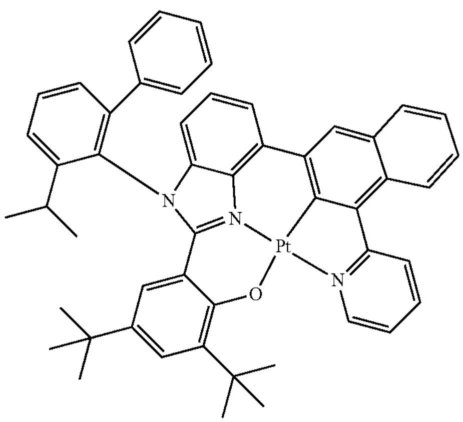
3-436
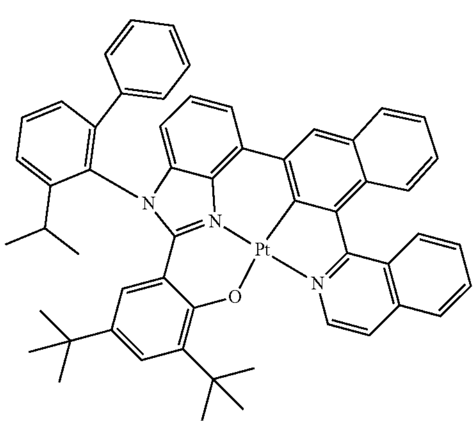
-continued
3-437
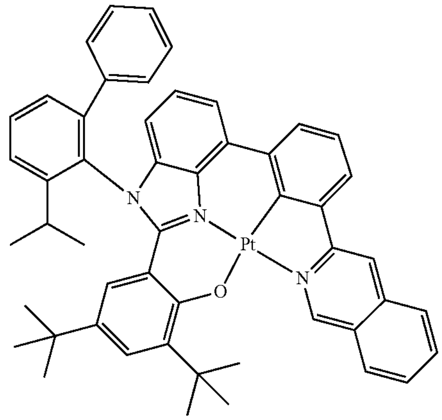
3-438
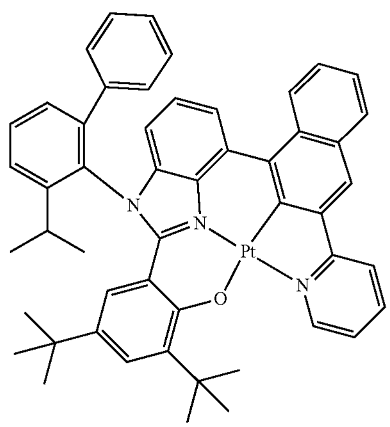
3-439
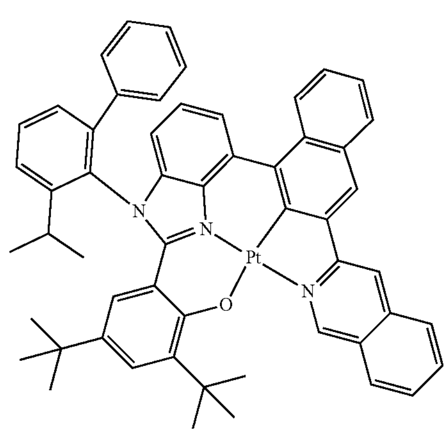

3-440
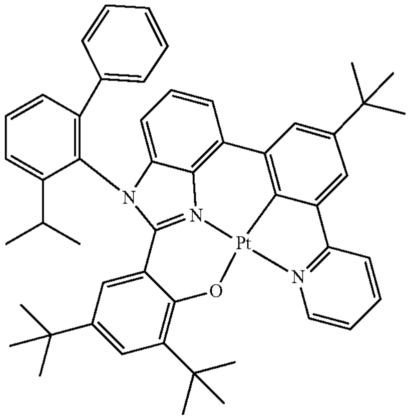
3-441
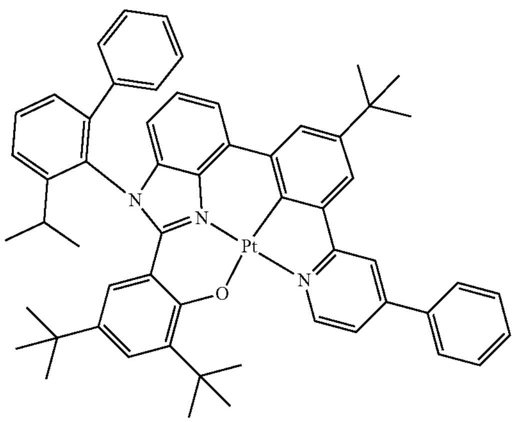
3-442
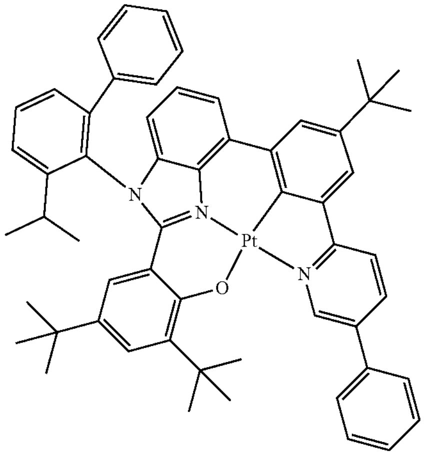
3-443
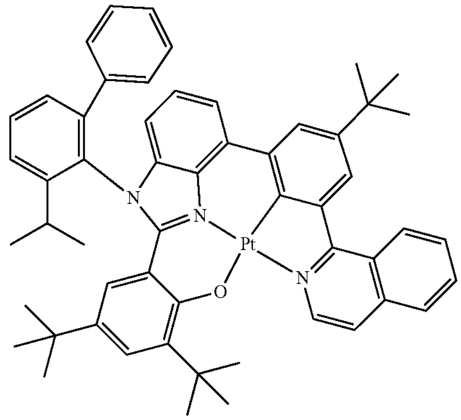
3-444
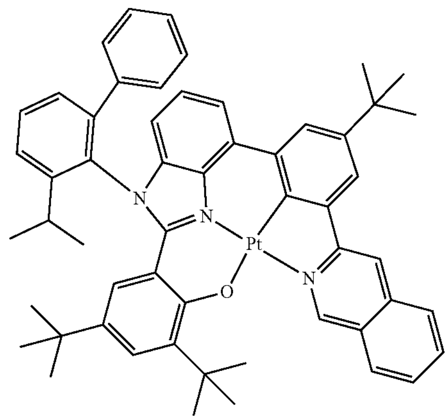
3-445
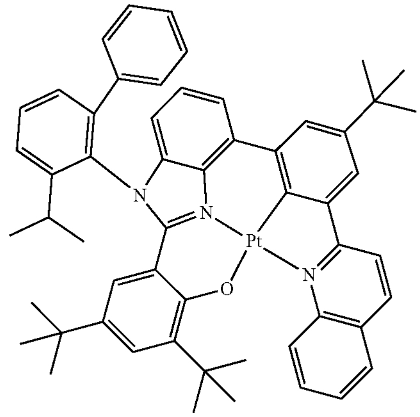

-continued
3-446
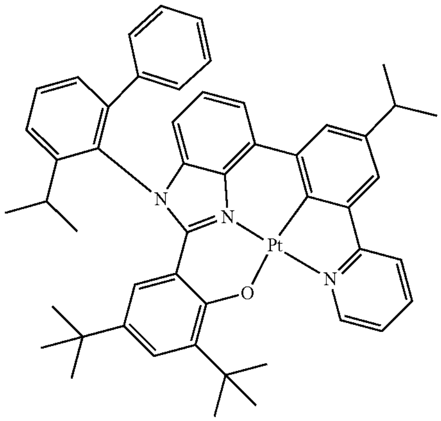
3-447
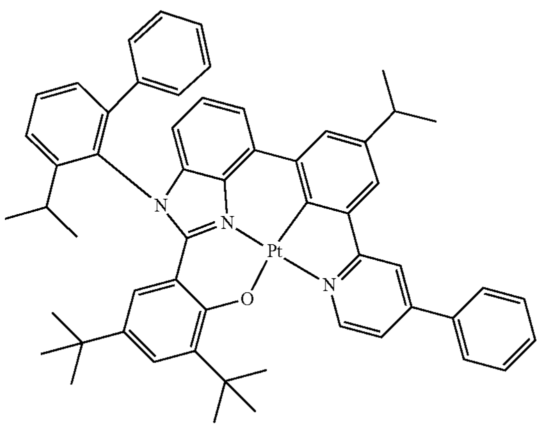
3-448
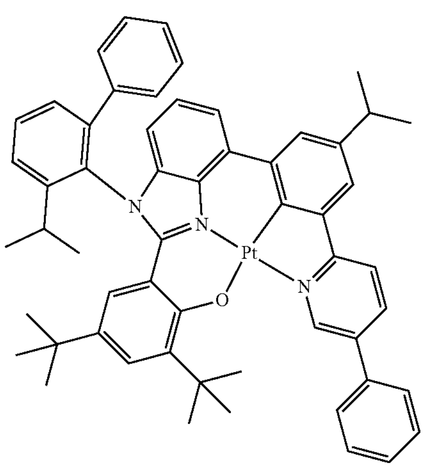
-continued
3-449
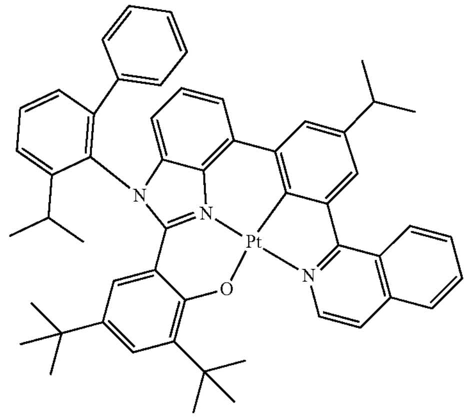
3-450
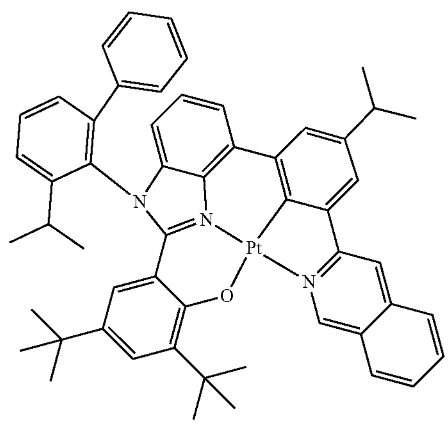
3-451
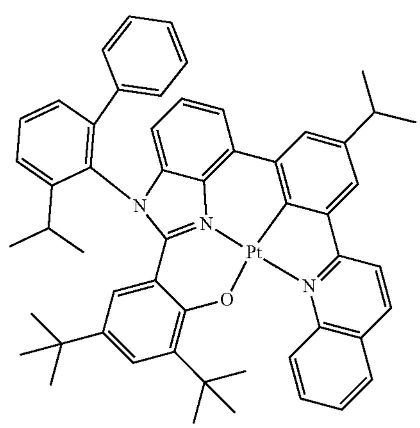

3-452
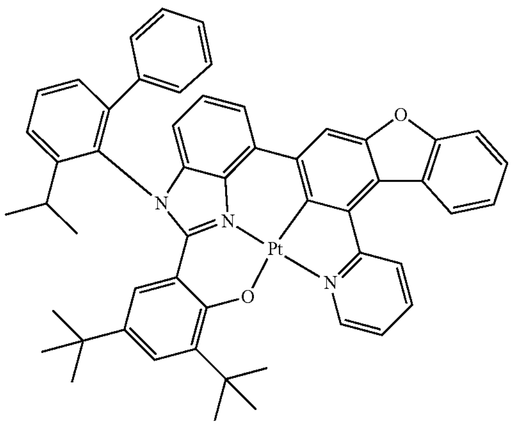
3-453
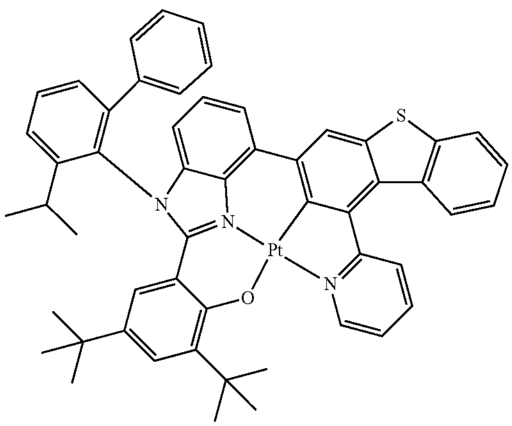
3-454
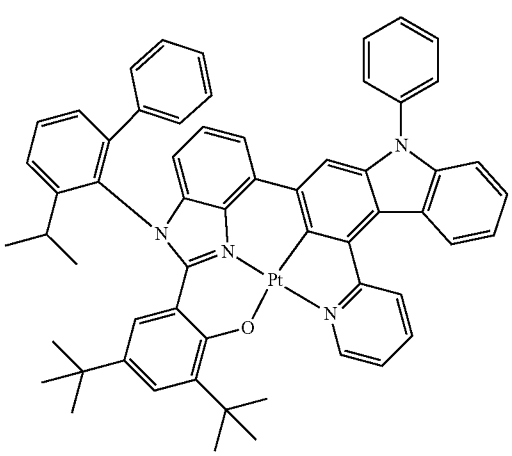
3-455
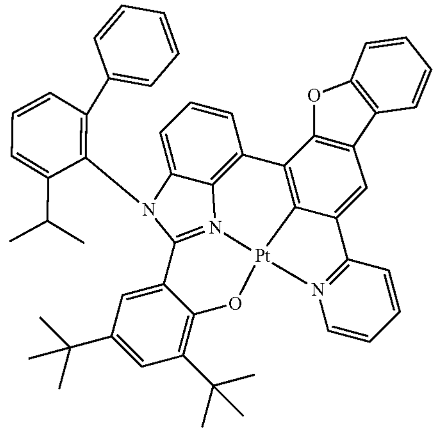
3-456
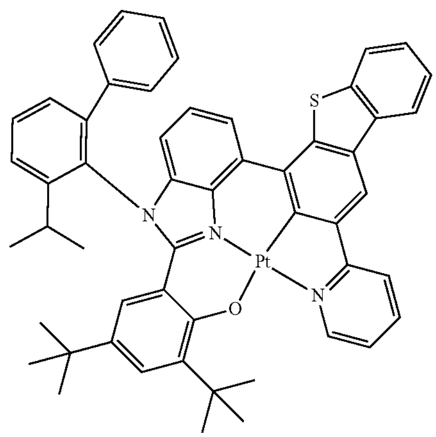
3-457
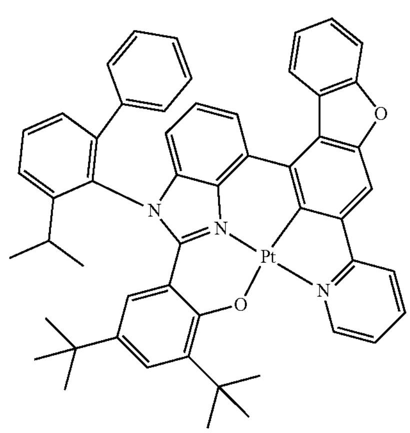

-continued
3-458
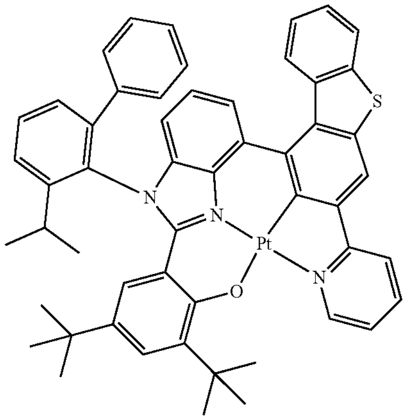
3-459
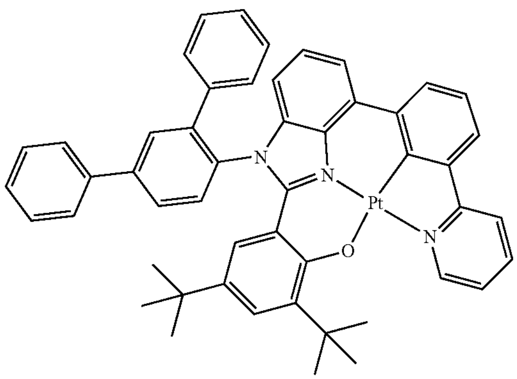
3-460
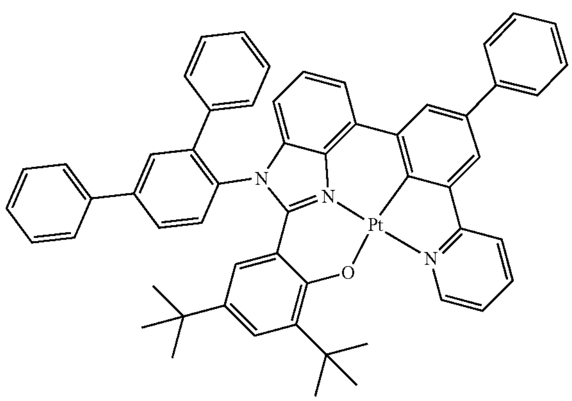
3-461
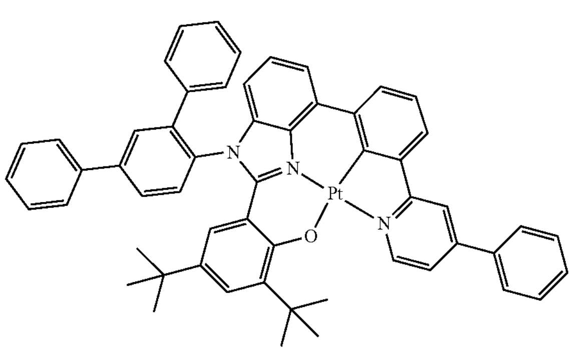
-continued
3-462
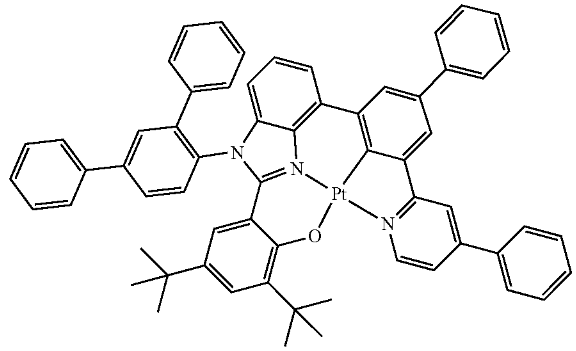
3-463
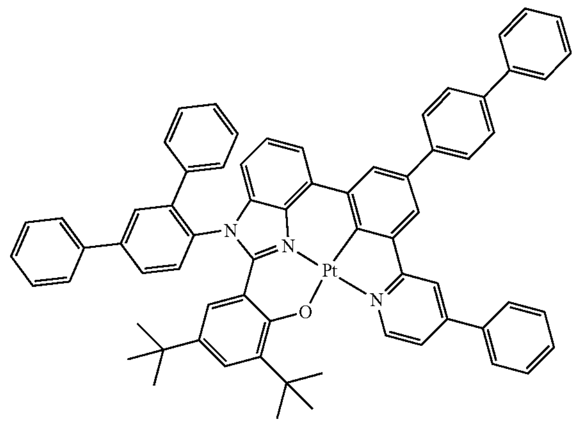
3-464
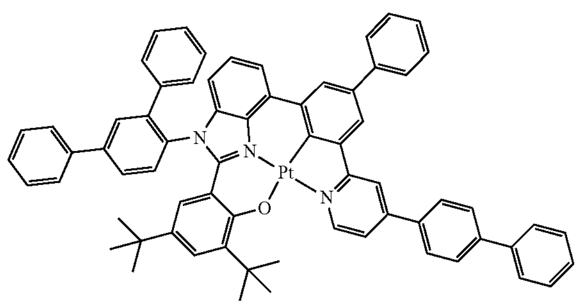
3-465
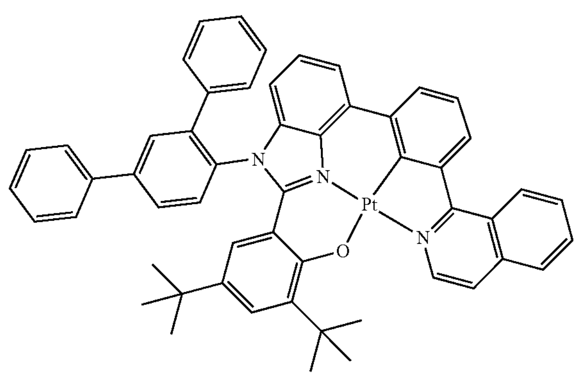

3-466
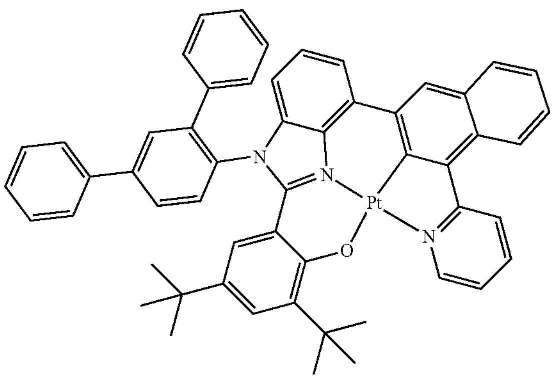
3-467
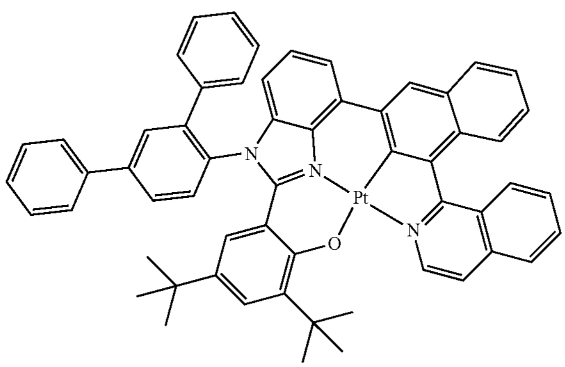
3-468
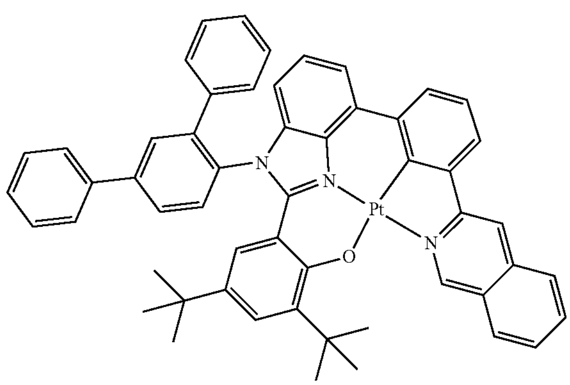
3-469
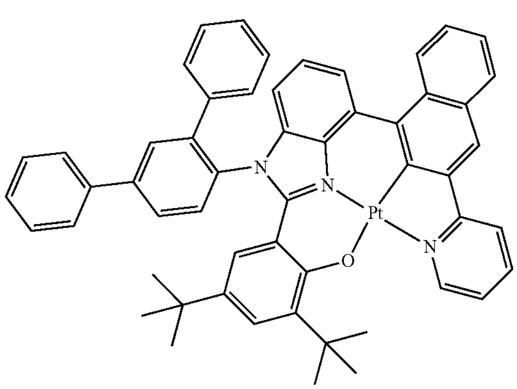
3-470
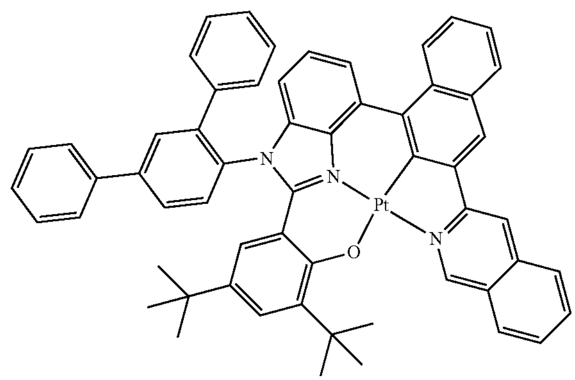
3-471
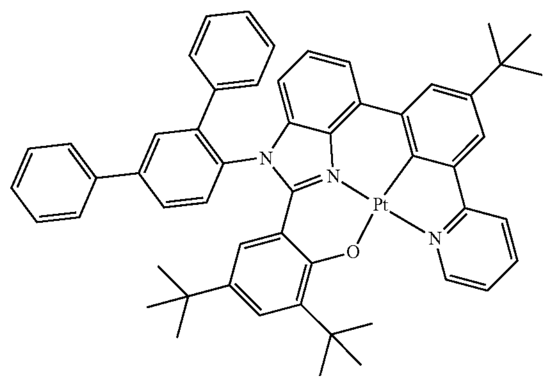
3-472
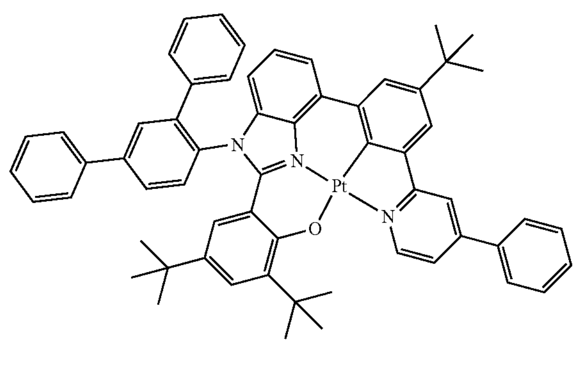
3-473
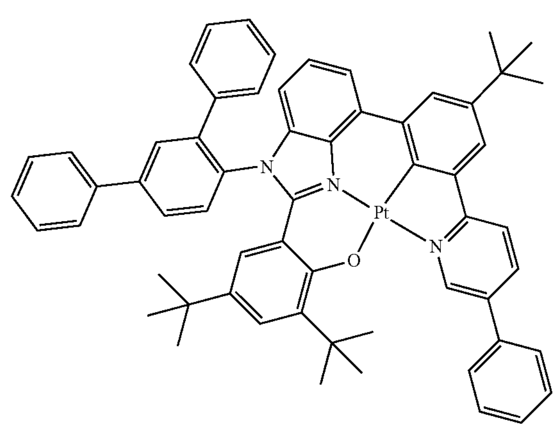

3-474
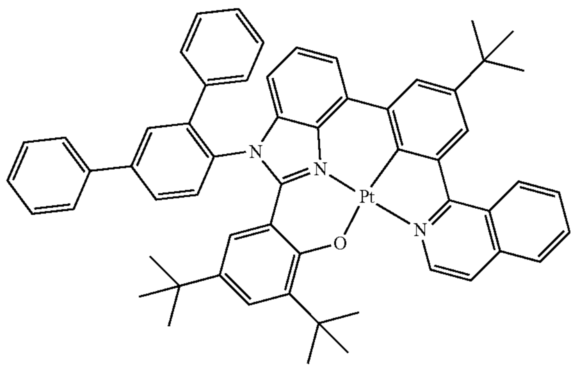
3-475
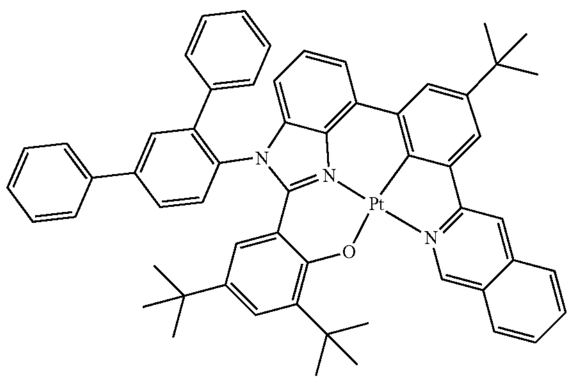
3-476
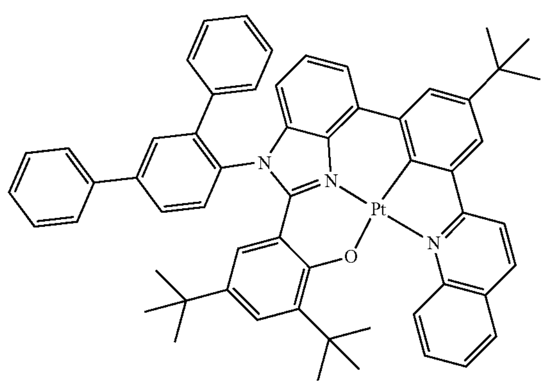
3-477
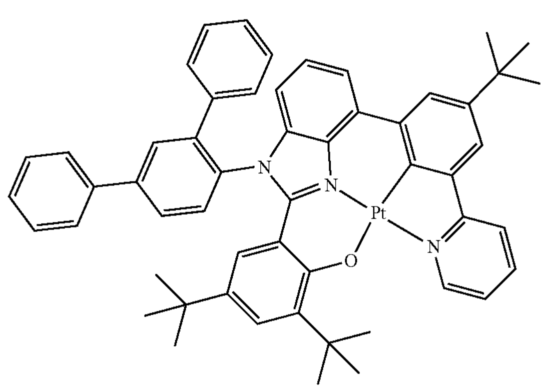
3-478
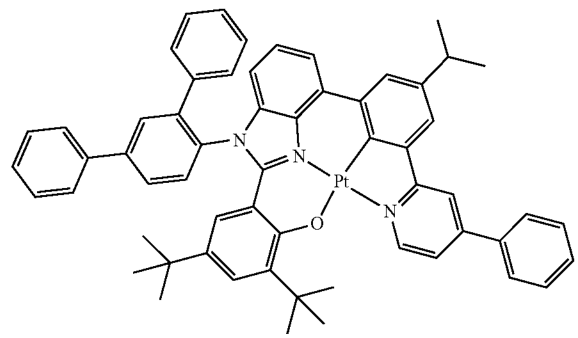
3-479
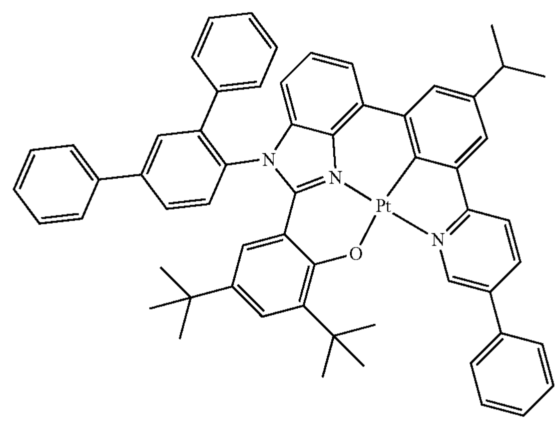
3-480
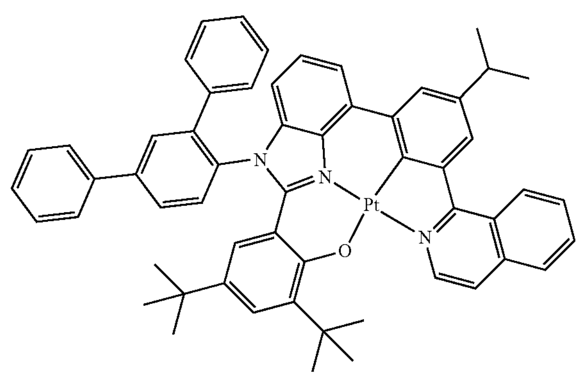
3-481
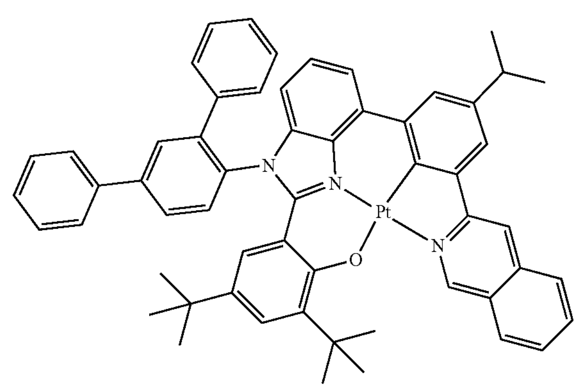

-continued
3-482
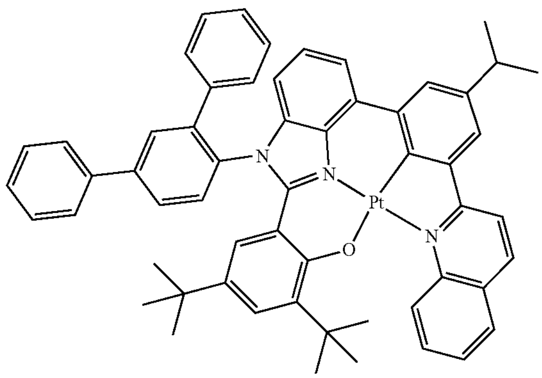
3-483
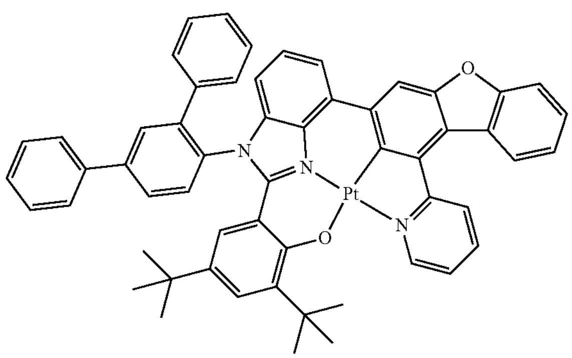
3-484
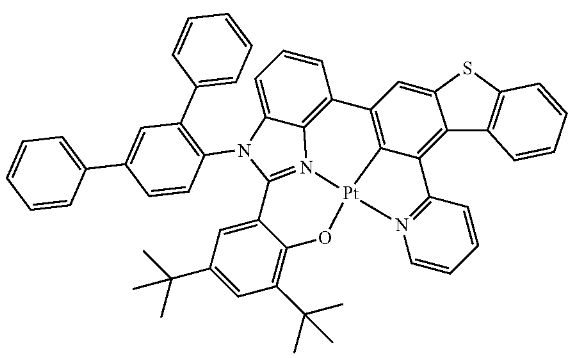
3-485
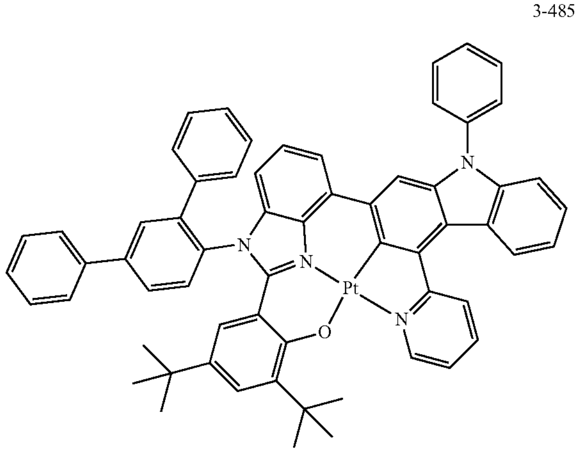
-continued
3-486
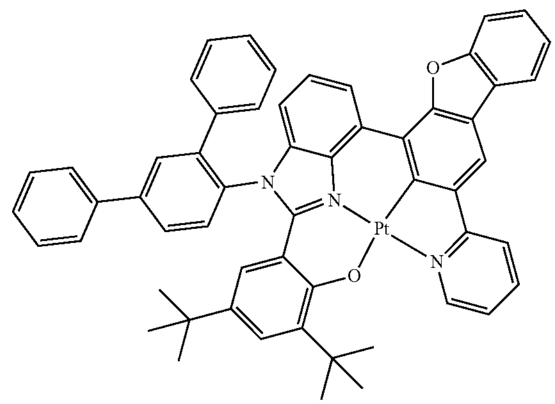
3-487
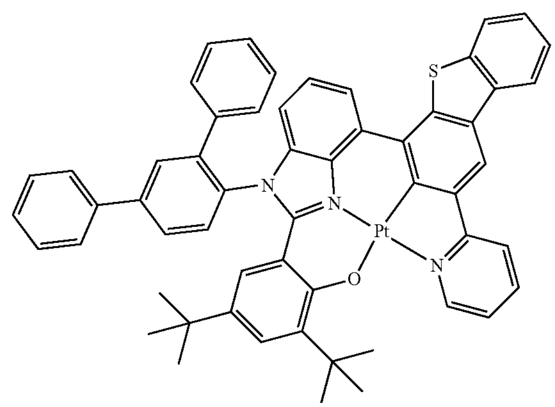
3-488
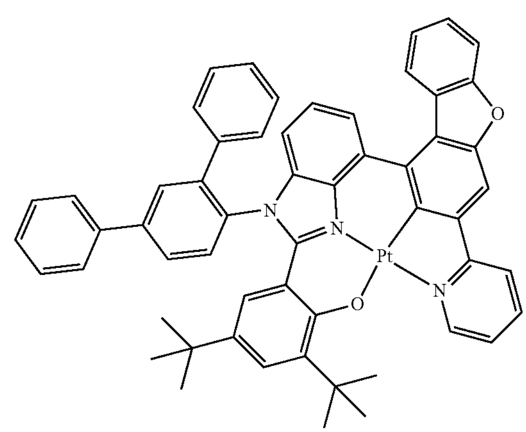

-continued
3-489
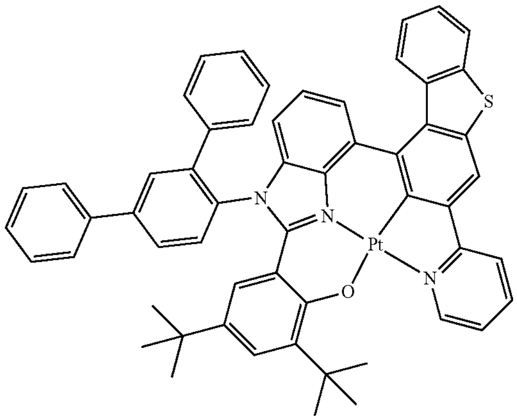
3-490
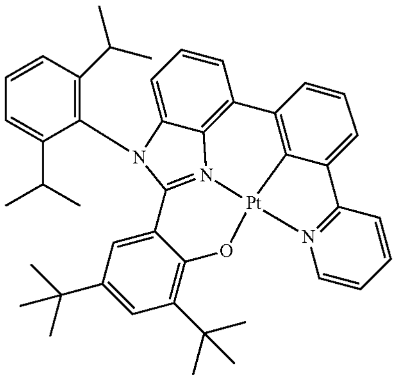
3-491
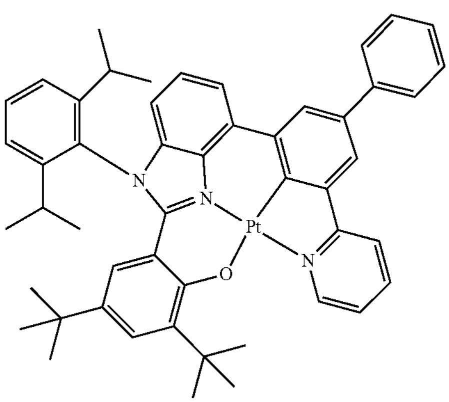
3-492
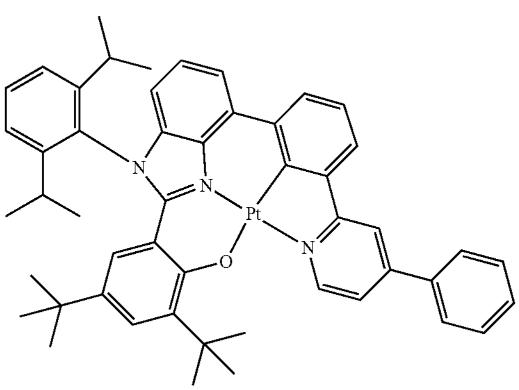
-continued
3-493
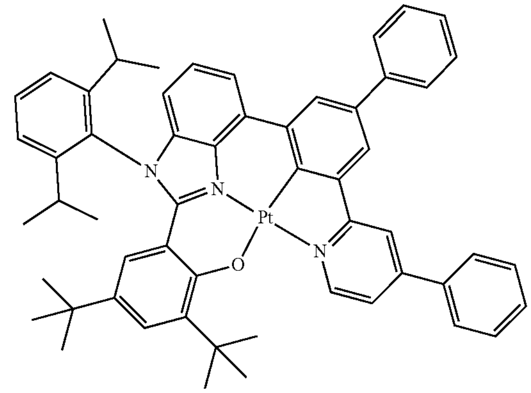
3-494
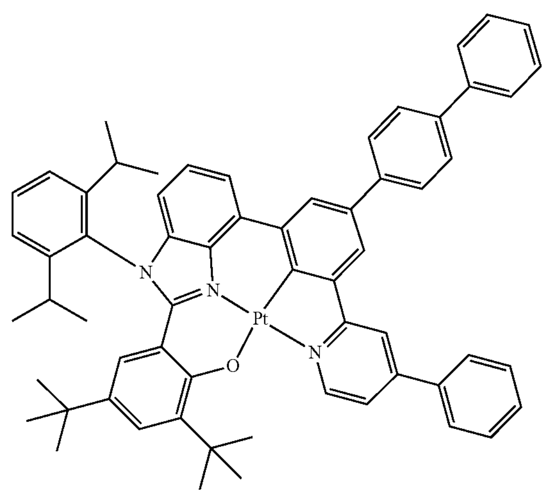
3-495
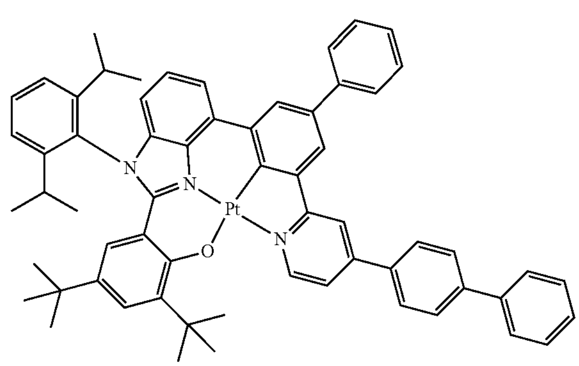

-continued
3-496
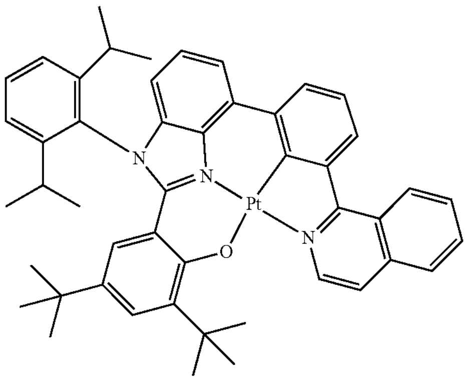
3-497
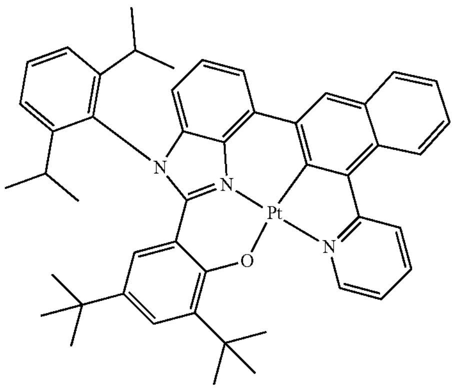
3-498
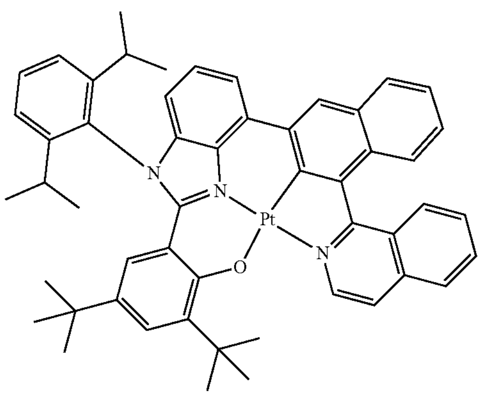
3-499
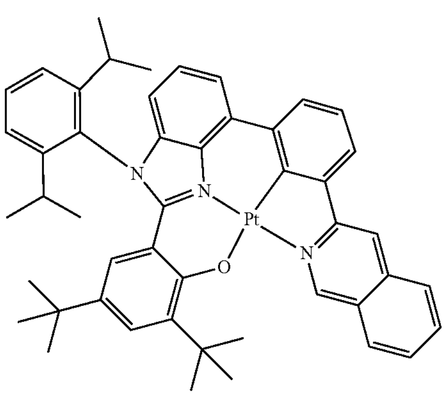
-continued
3-500
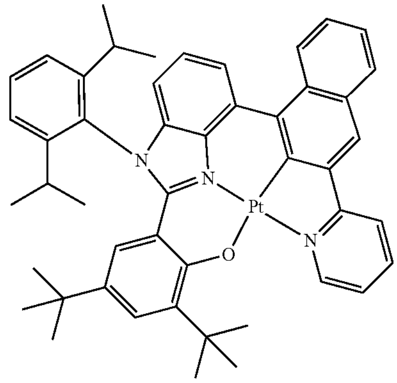
3-501
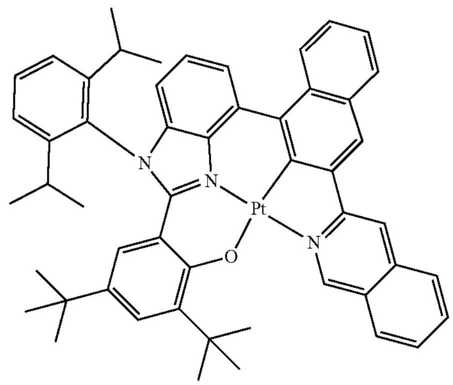
3-502
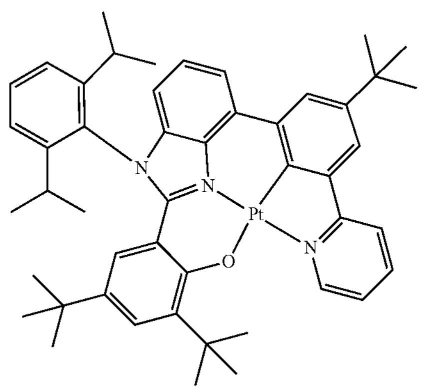
3-503
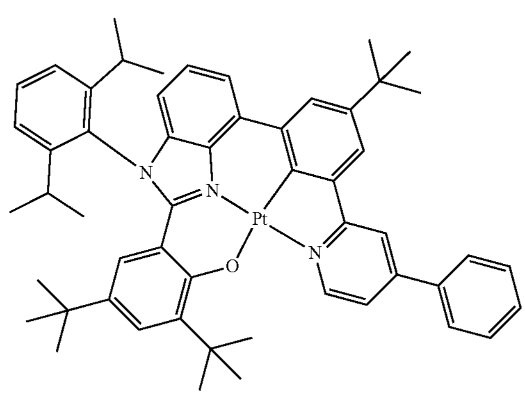

3-504
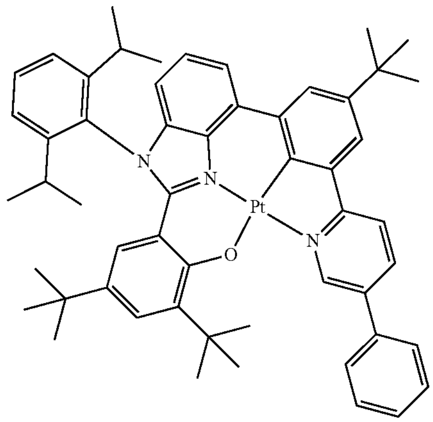
3-505
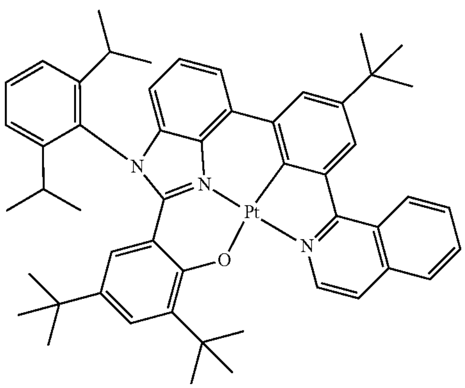
3-506
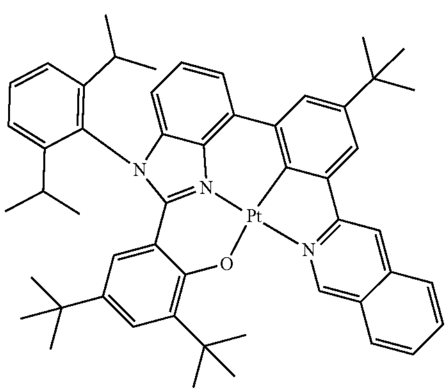
3-507
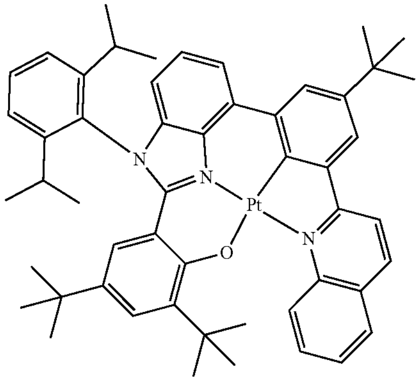
3-508
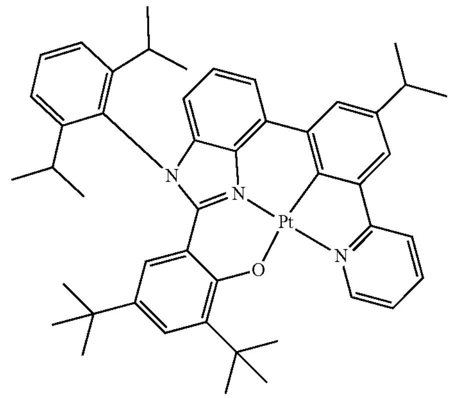
3-509
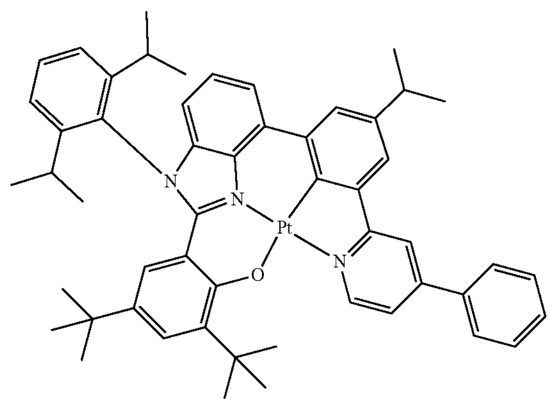
3-510
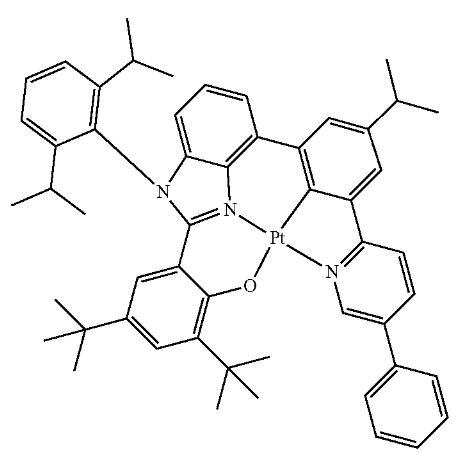

-continued
3-511
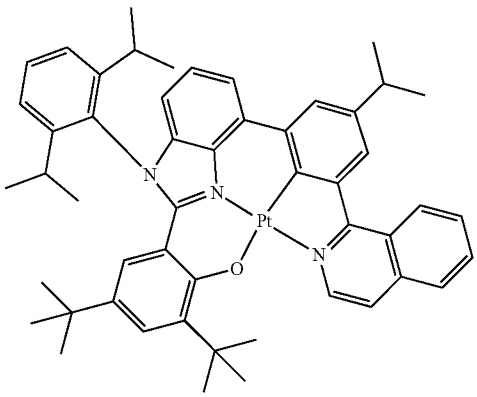
3-512
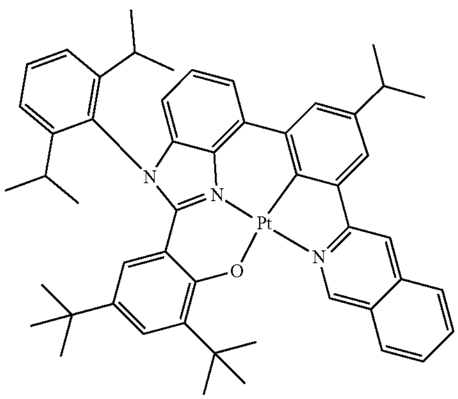
3-513
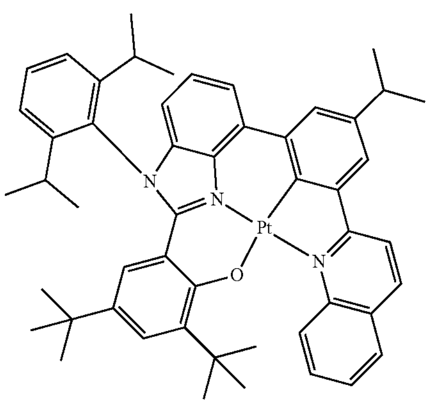
3-514
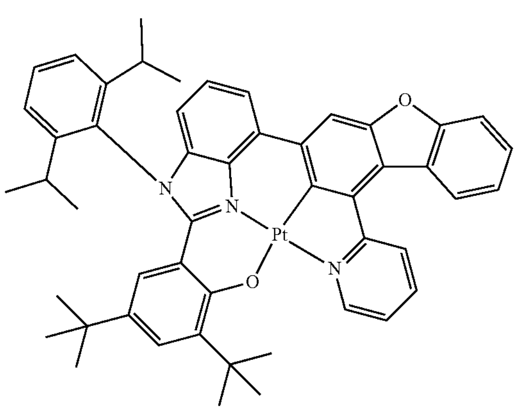
-continued
3-515
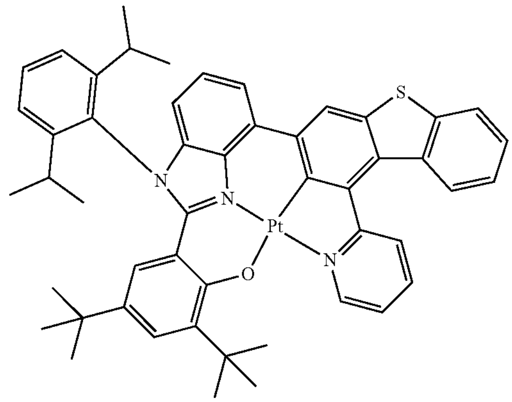
3-516
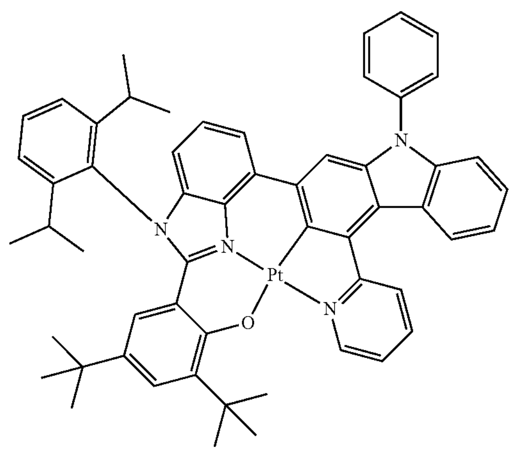
3-517
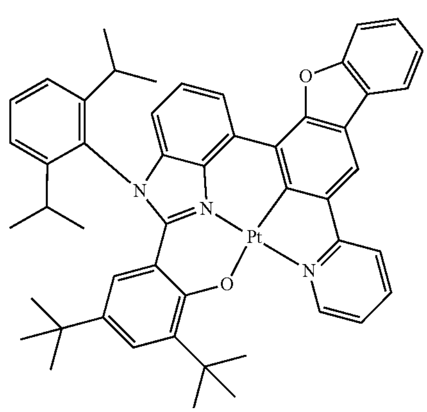

3-518
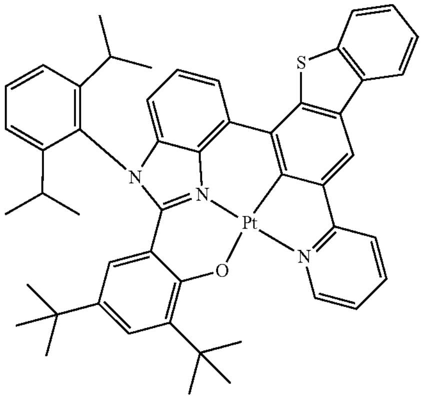
3-519
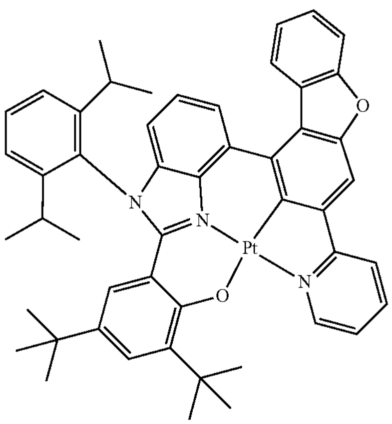
3-520
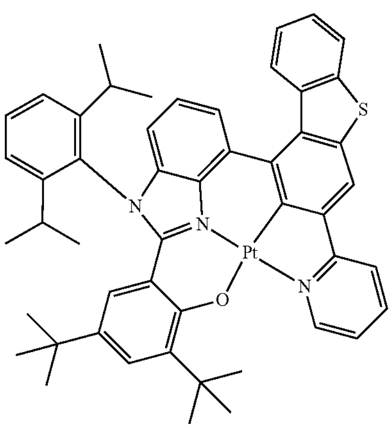
3-521
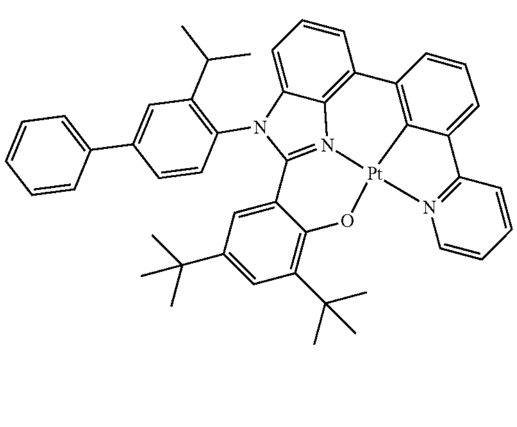
3-522
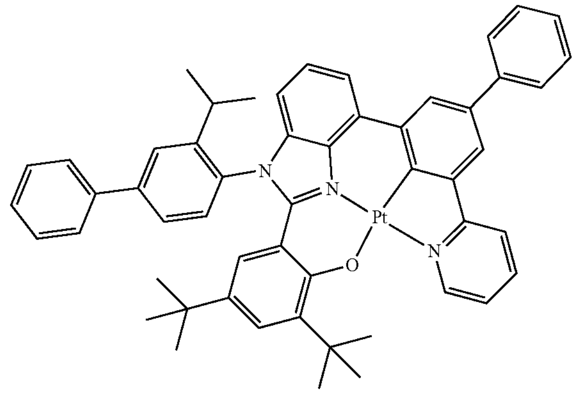
3-523
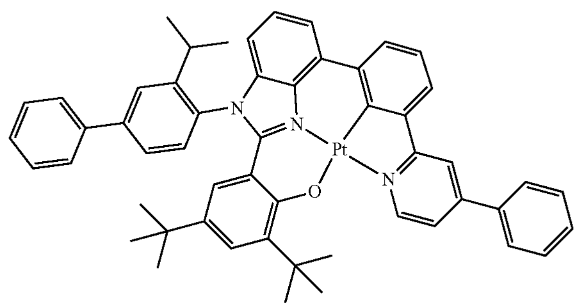
3-524
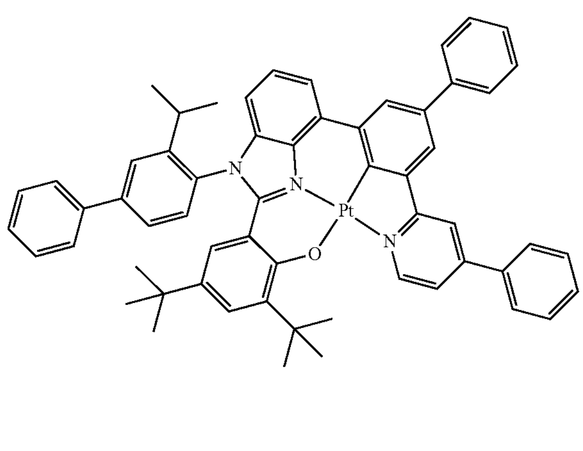

-continued
3-525
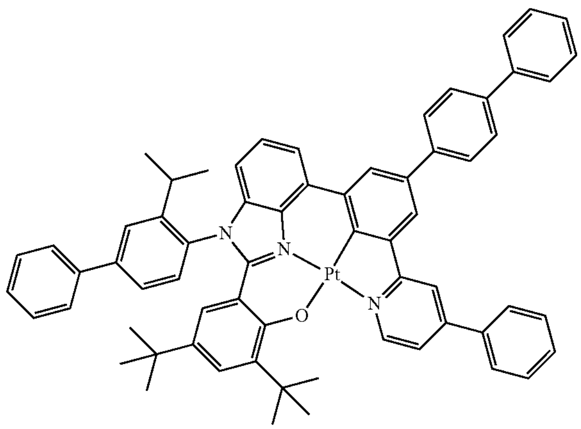
3-526
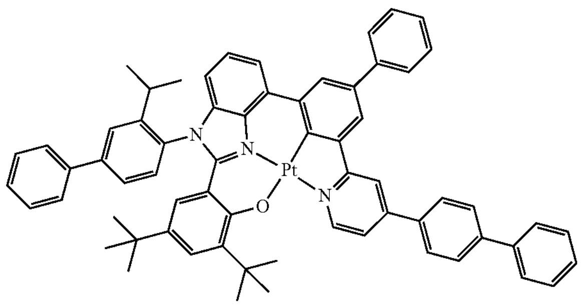
3-527
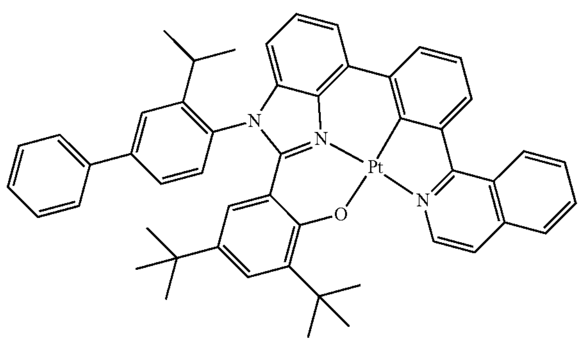
3-528
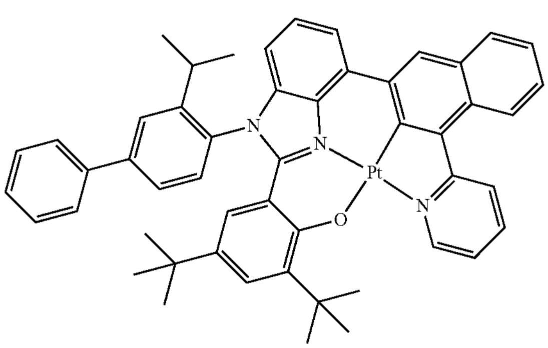
-continued
3-529
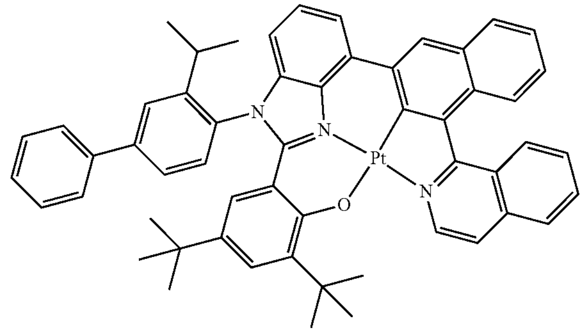
3-530
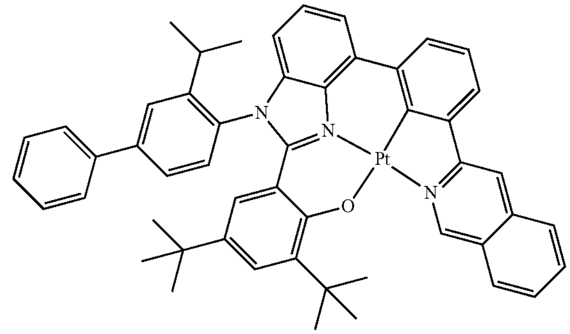
3-531
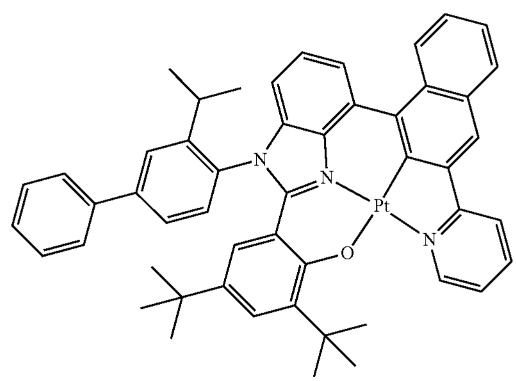
3-532
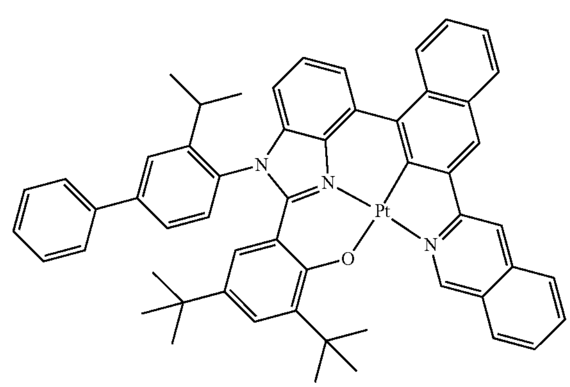

-continued
3-533
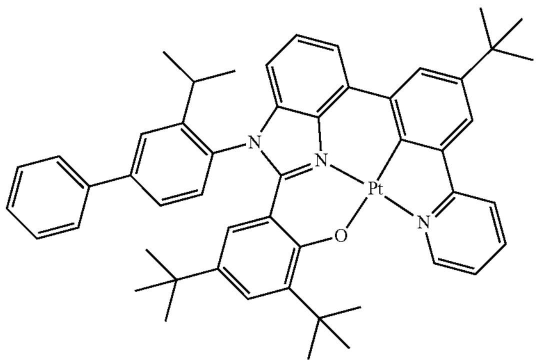
3-534
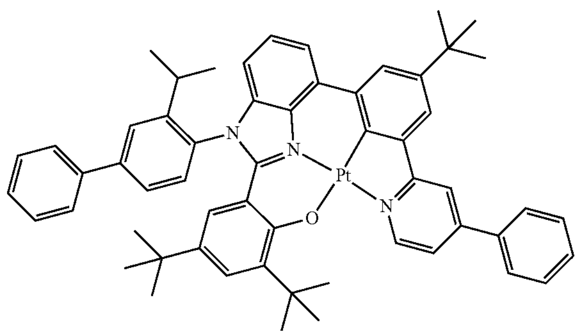
3-535
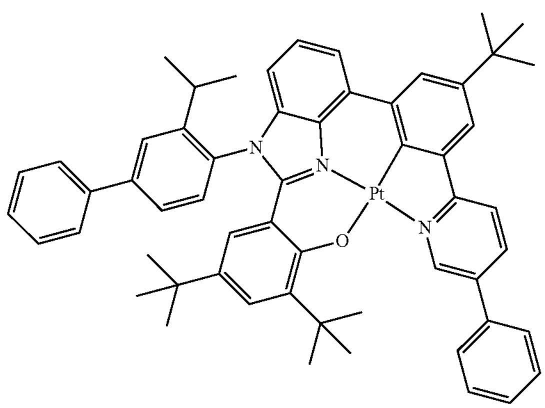
3-536
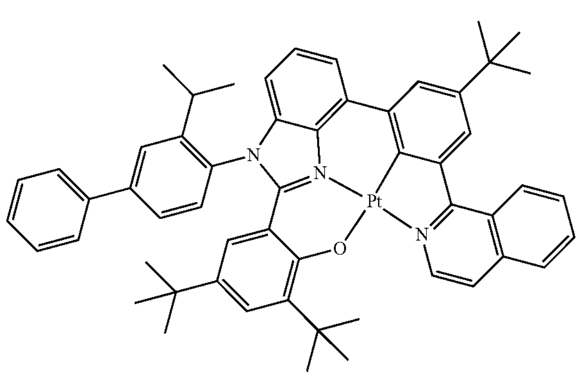
-continued
3-537
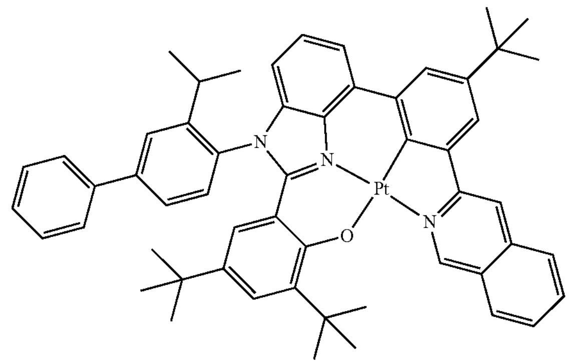
3-538
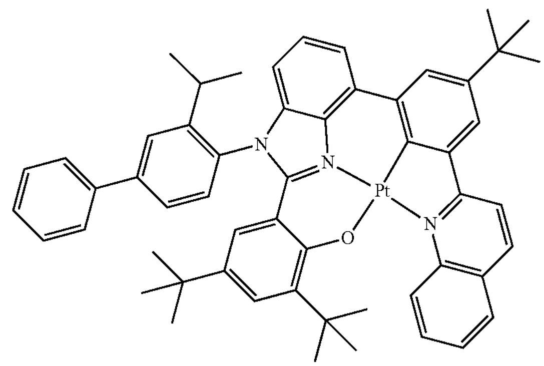
3-539
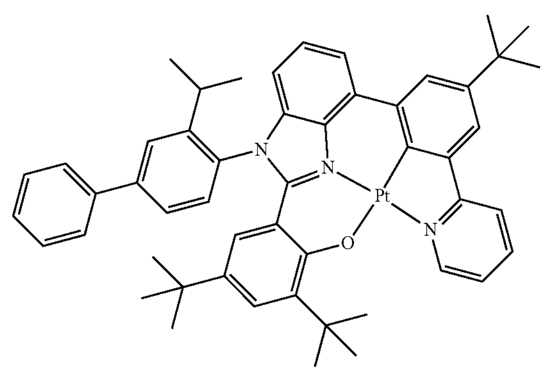
3-540
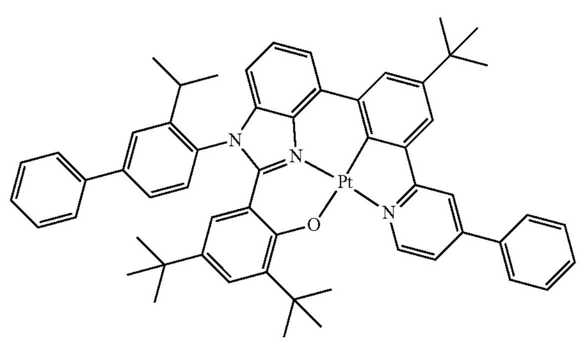

3-541
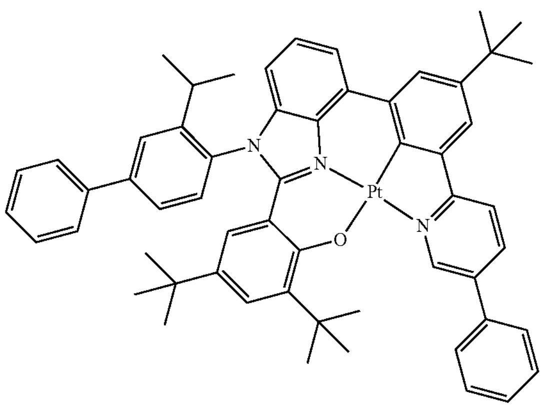
3-542
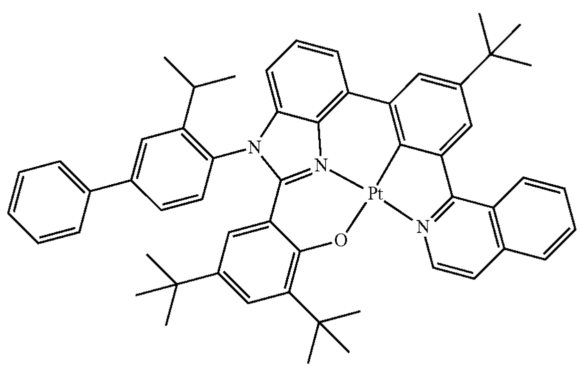
3-543
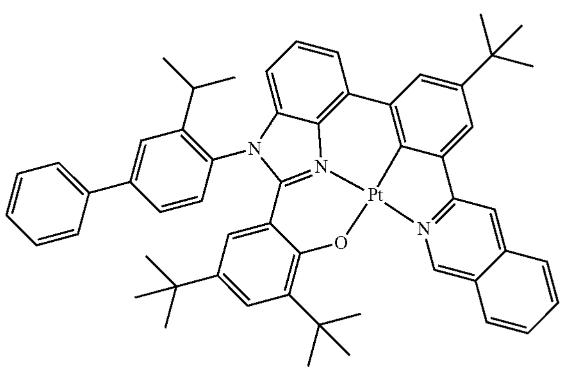
3-544
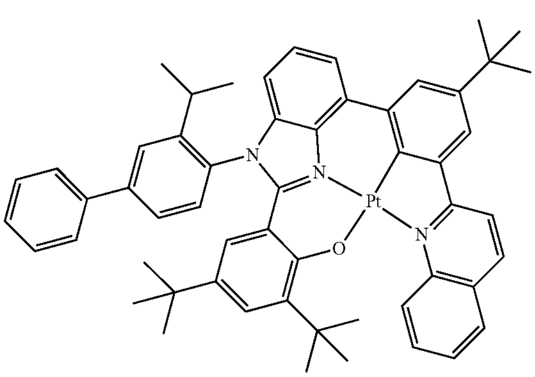
3-545
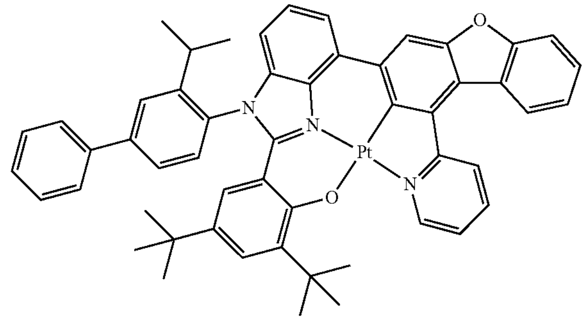
3-546
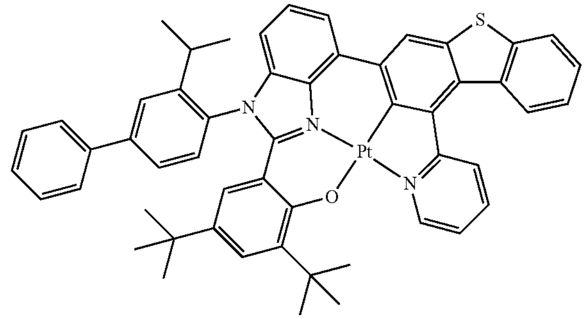
3-547
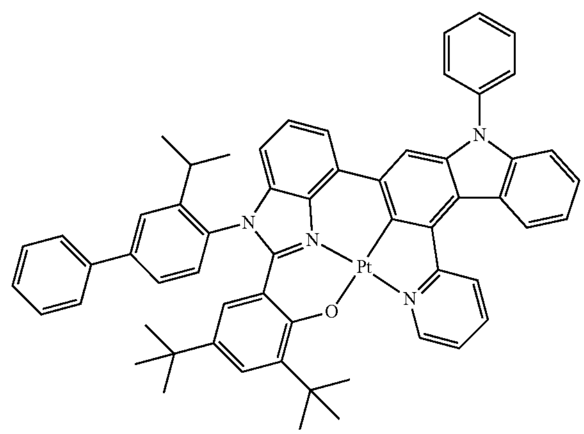
3-548
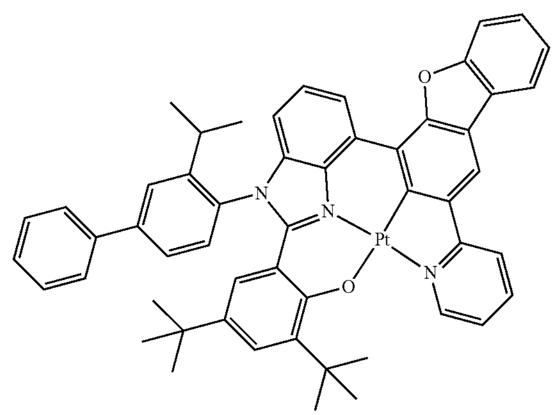

-continued
3-549
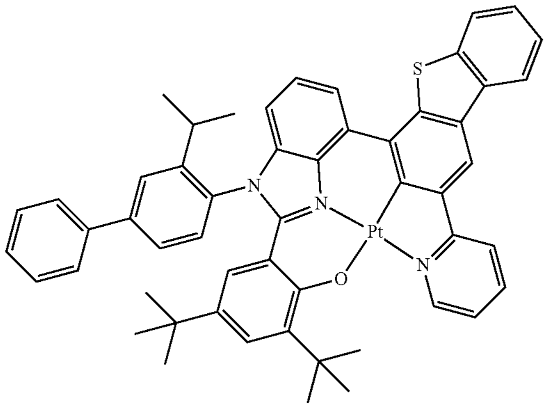
3-550
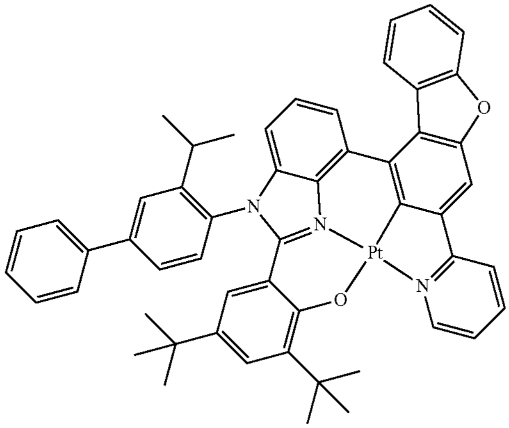
3-551
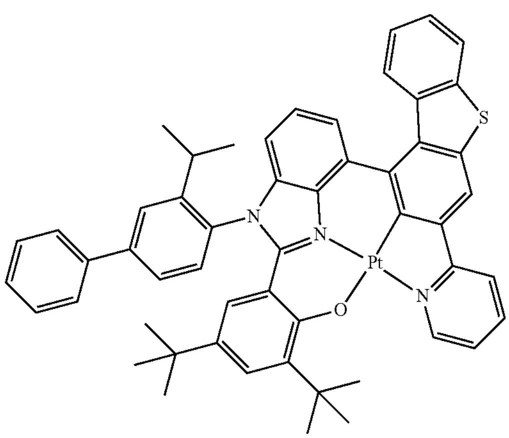
-continued
3-552
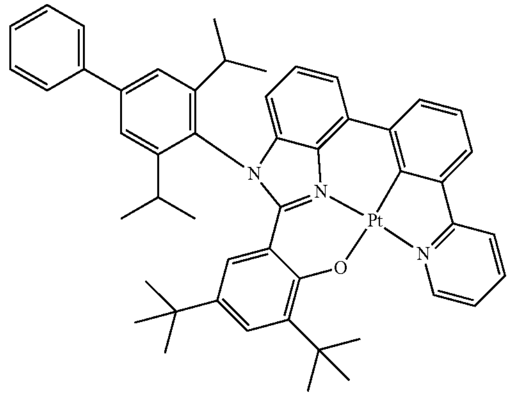
3-553
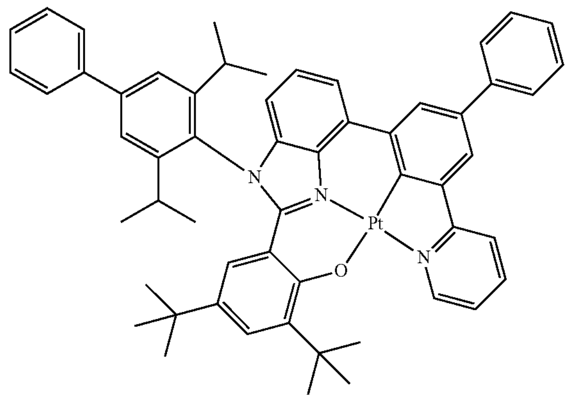
3-554
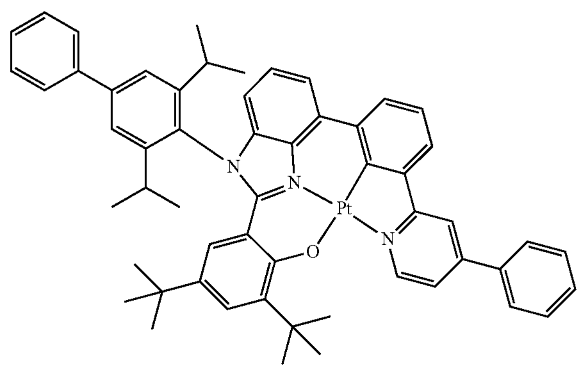
3-555
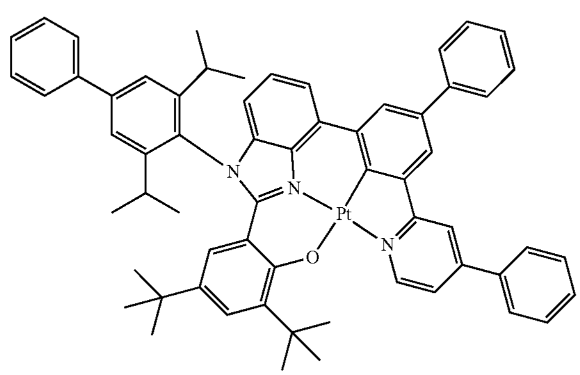

-continued
3-556
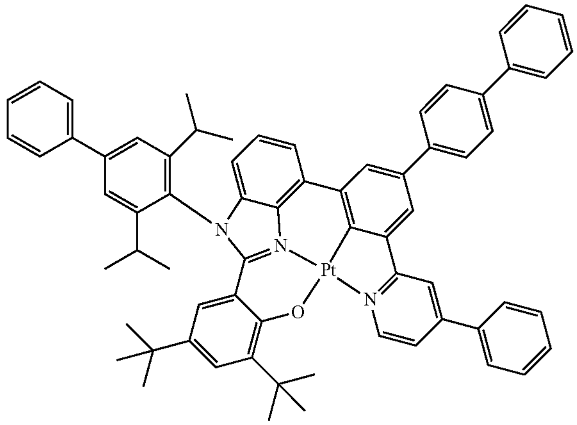
3-557
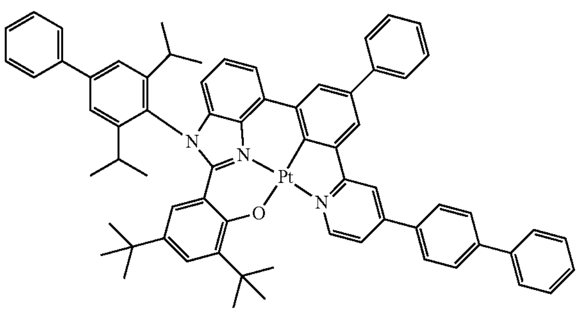
3-558
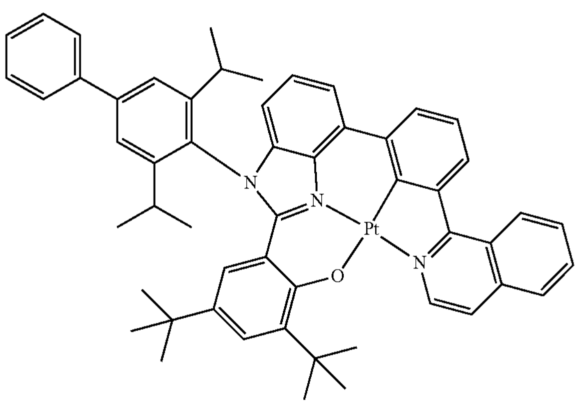
3-559
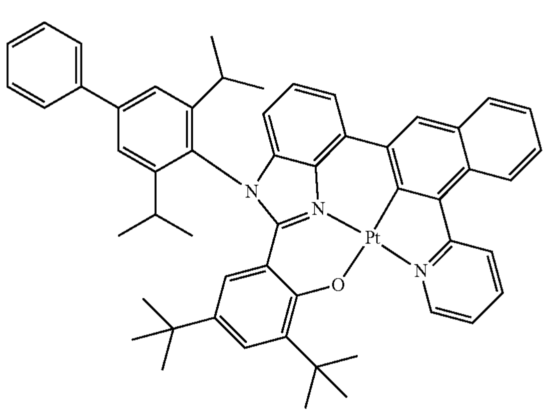
-continued
3-560
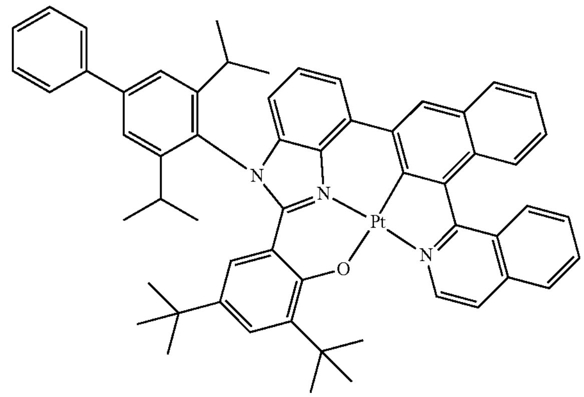
3-561
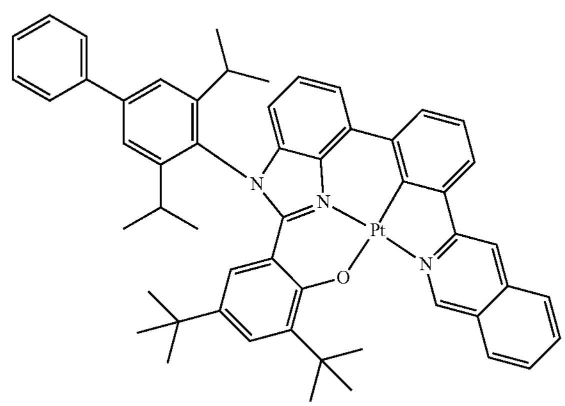
3-562
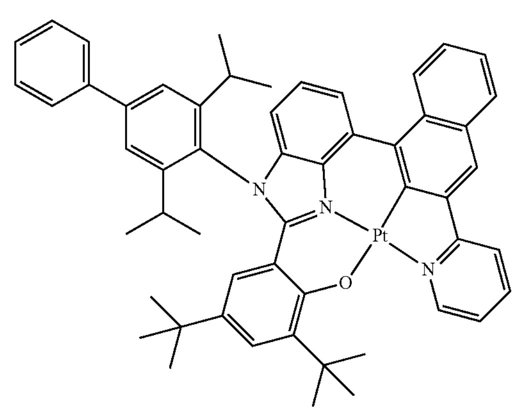

-continued
3-563
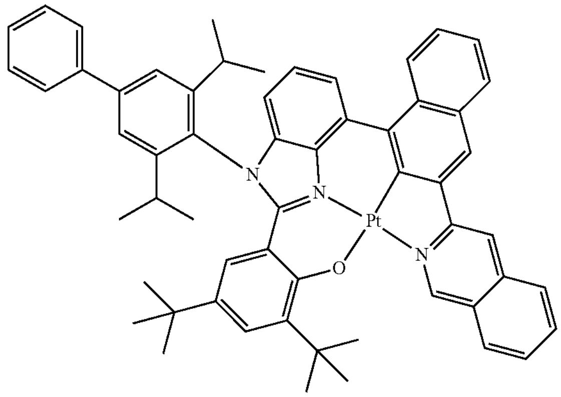
3-564
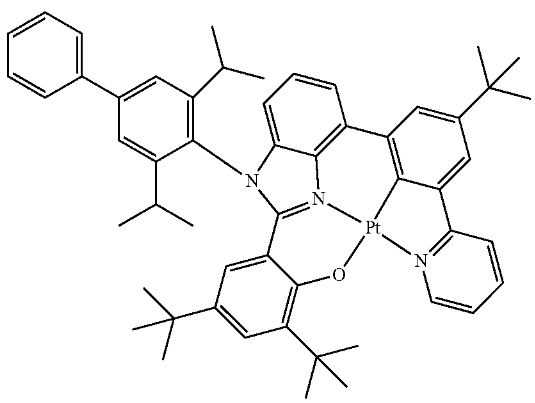
3-565
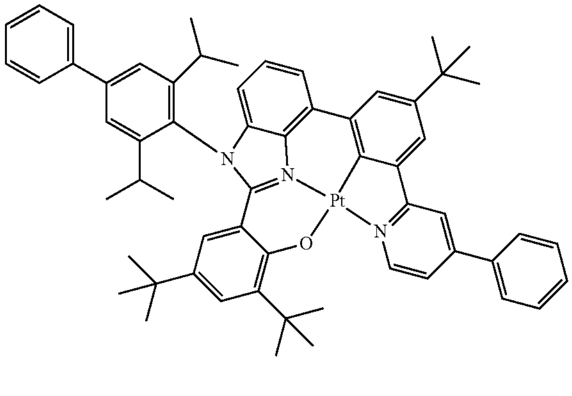
-continued
3-566
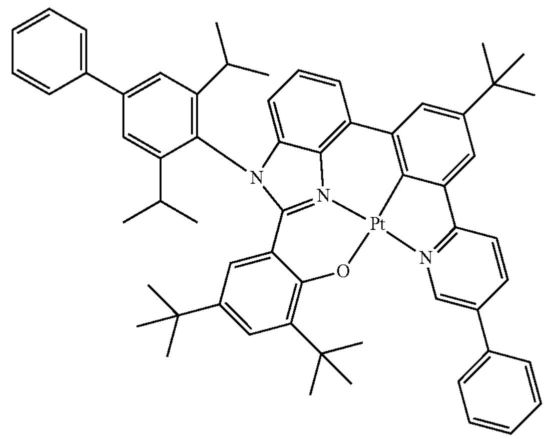
3-567
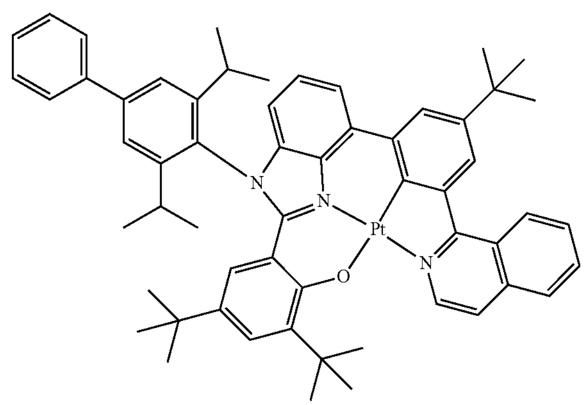
3-568
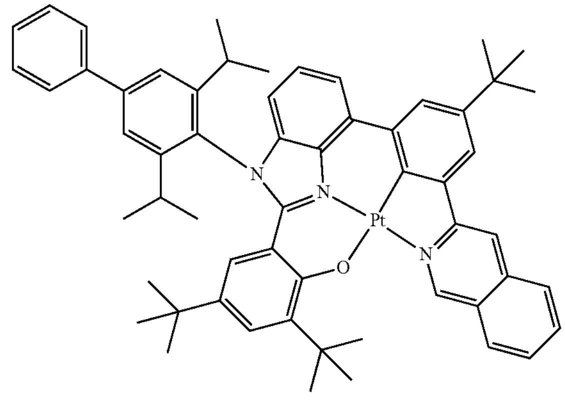

-continued
3-569
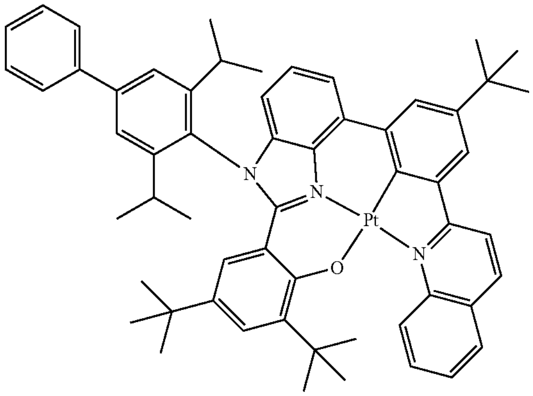
3-570
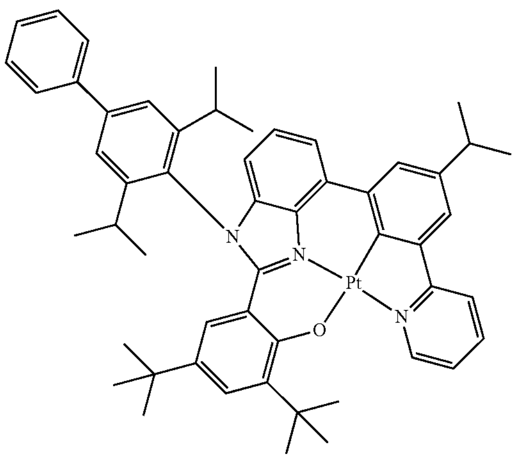
3-571
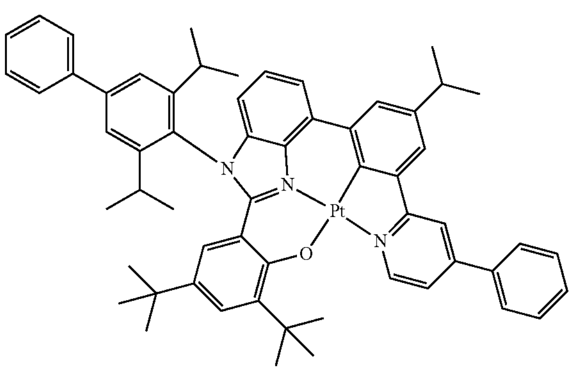
-continued
3-572
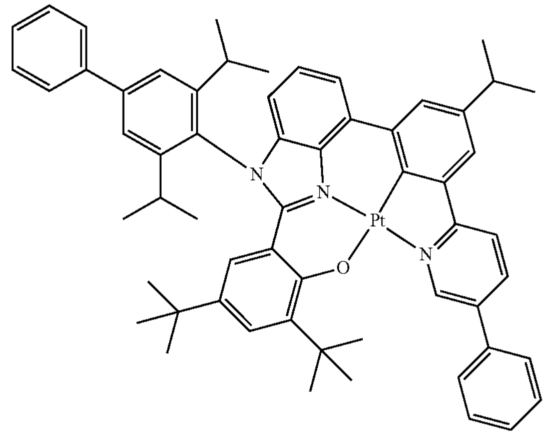
3-573
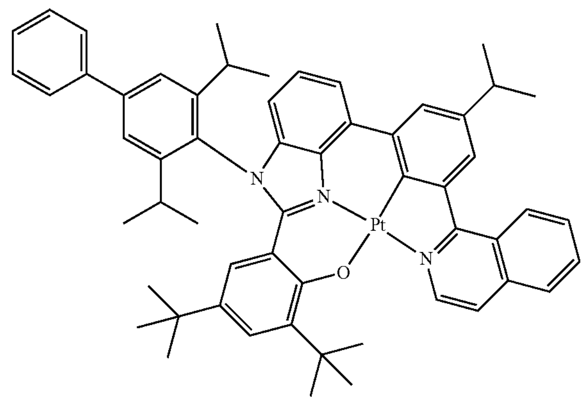
3-574
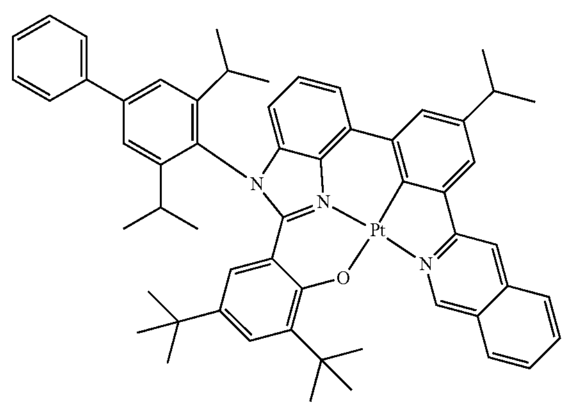

-continued
3-575
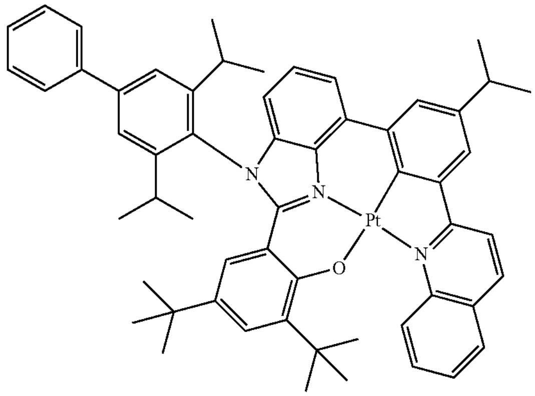
3-576
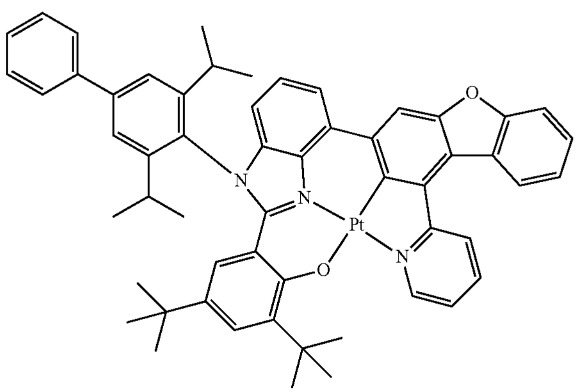
3-577
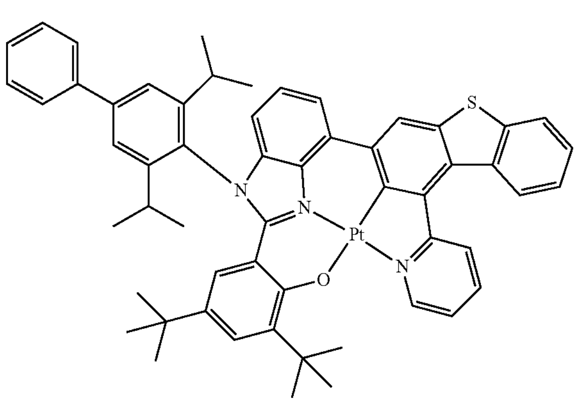
-continued
3-578
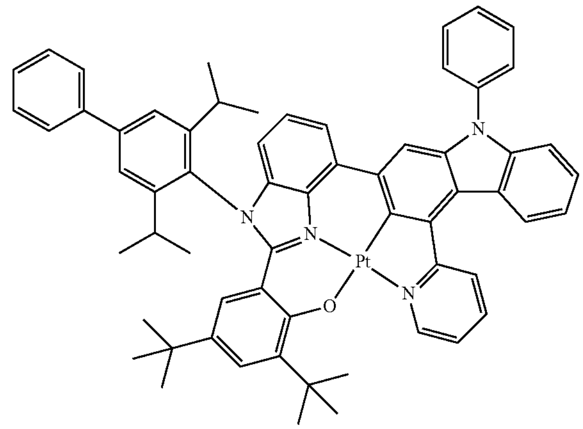
3-579
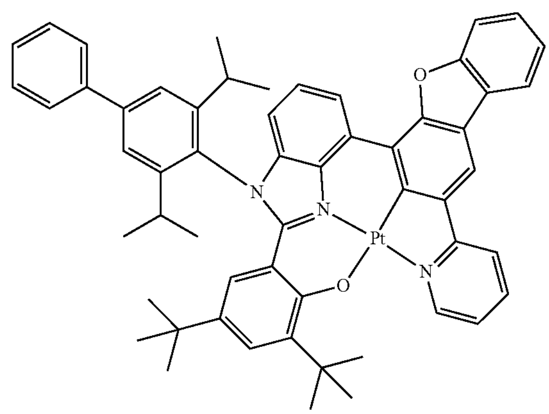
3-580
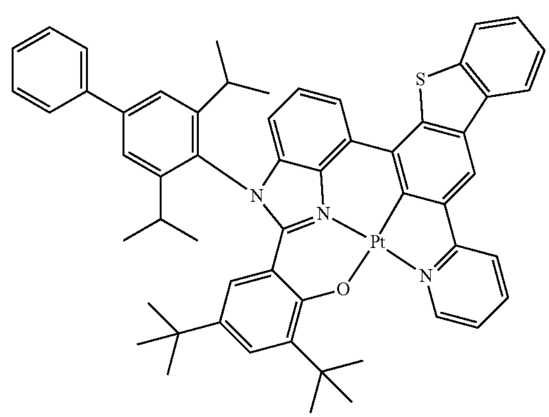

-continued
3-581
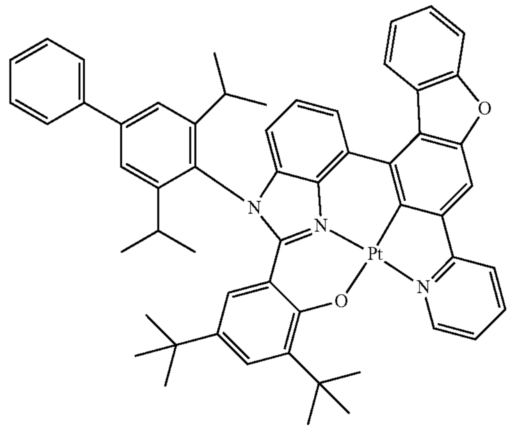
3-582
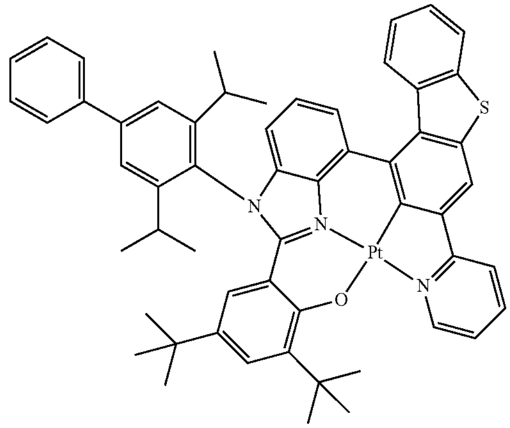
3-583
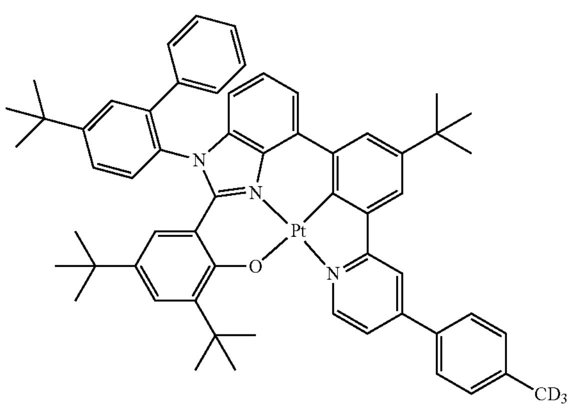
-continued
3-584
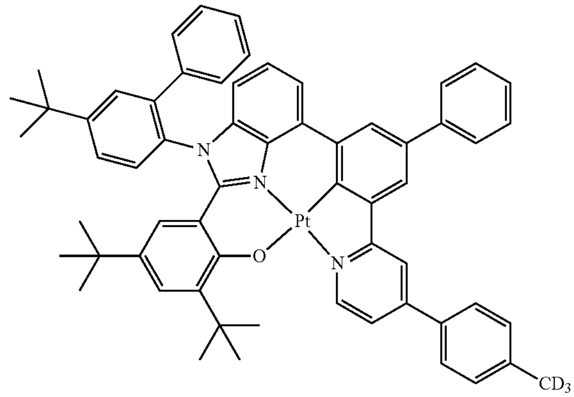
3-585
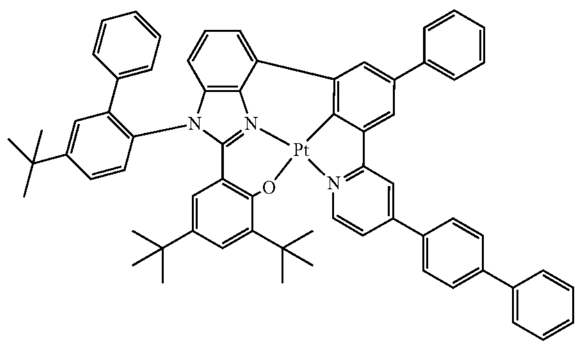
3-586
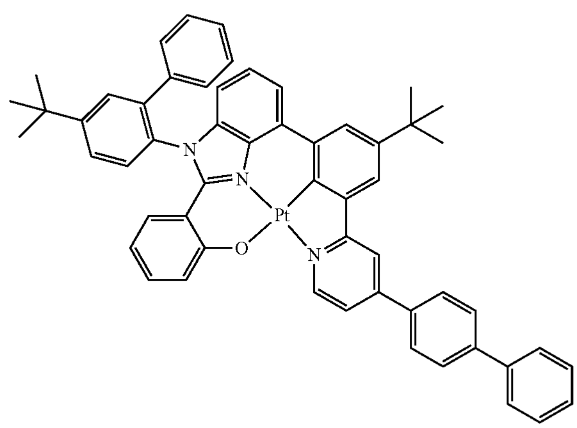
3-587
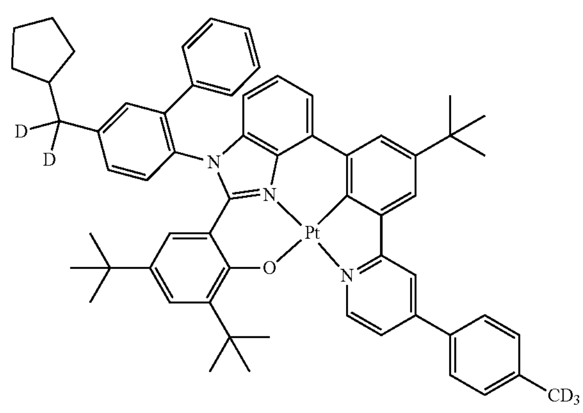

-continued
3-588
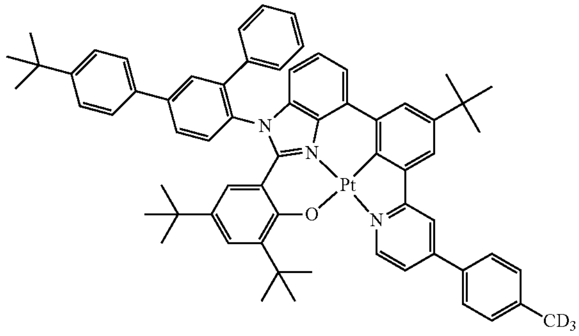
3-589
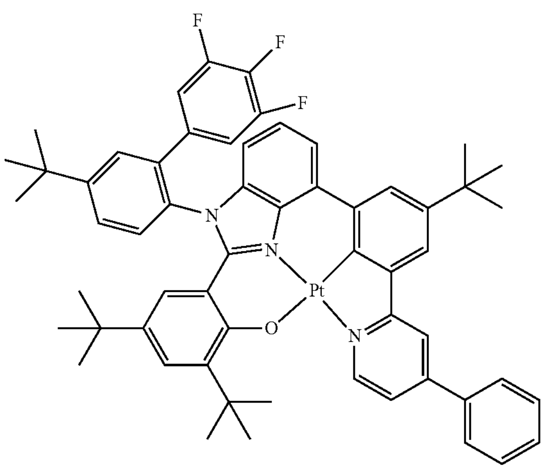
3-590
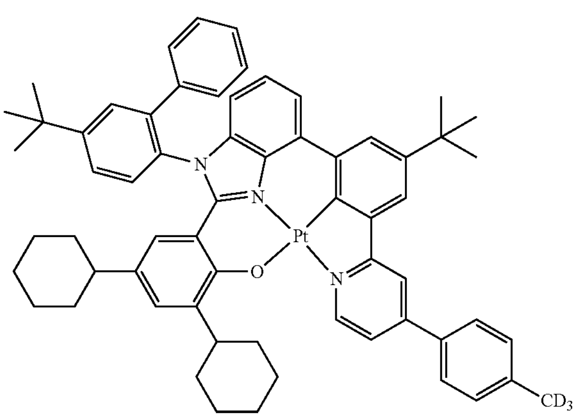
-continued
3-591
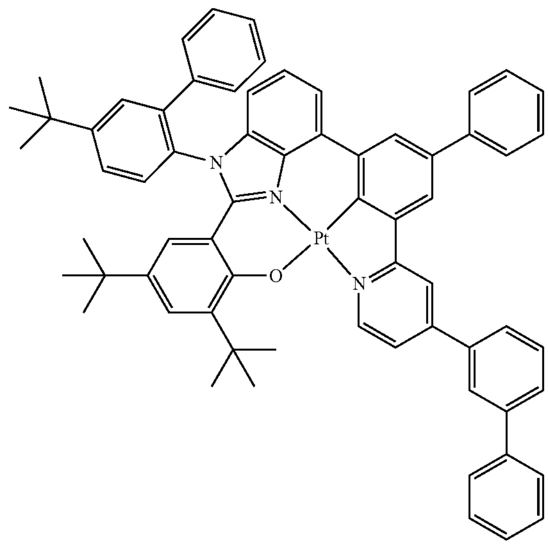
D1
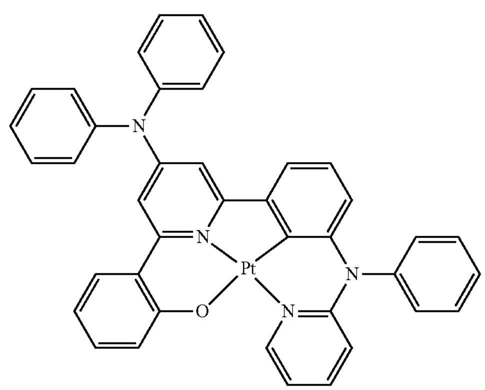
D2
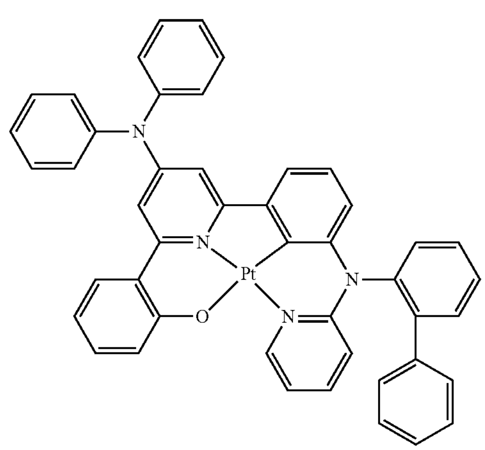

-continued
D3
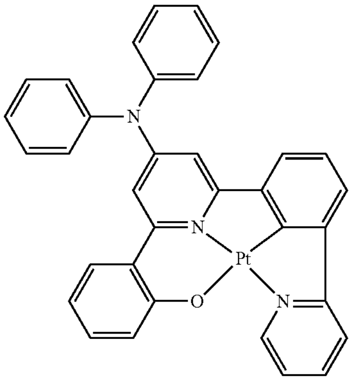
D4
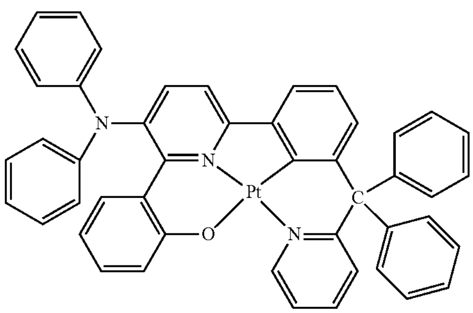
D5
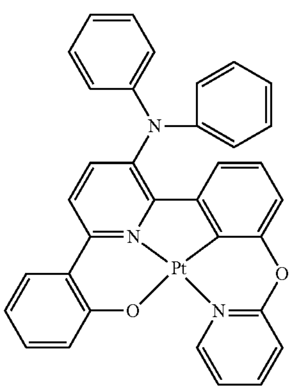
D6
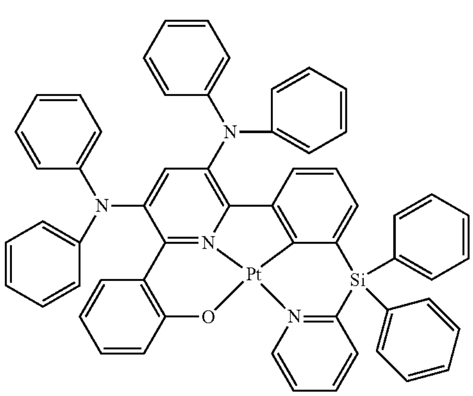
-continued
D7
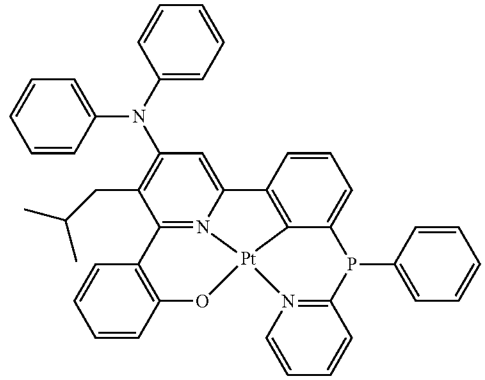
D8
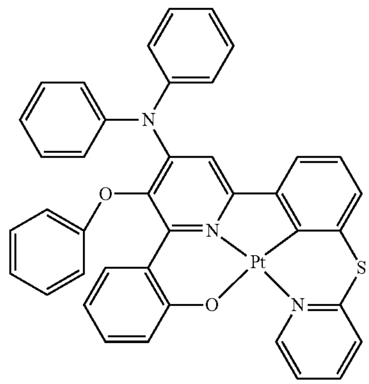
D9
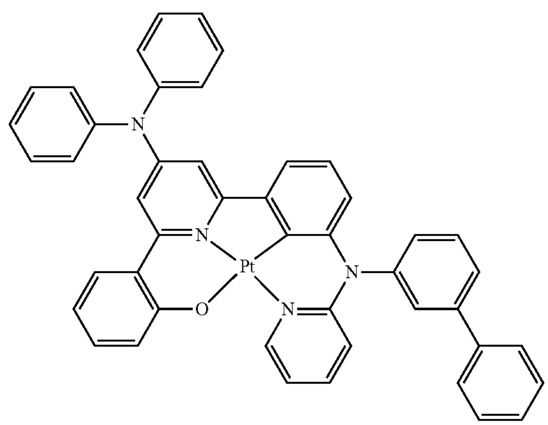
D10
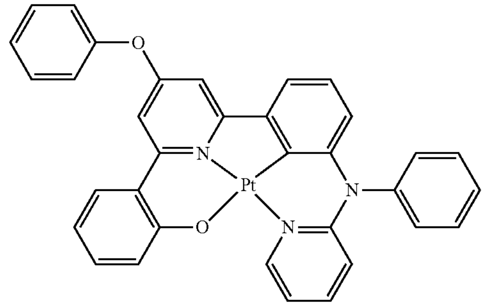

-continued
D11
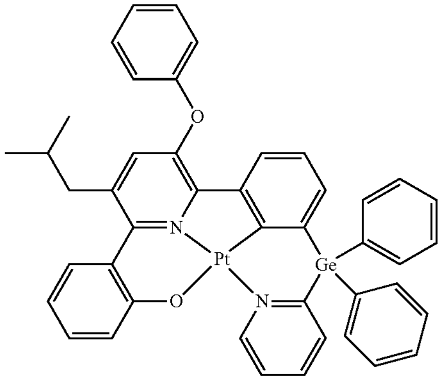
D12
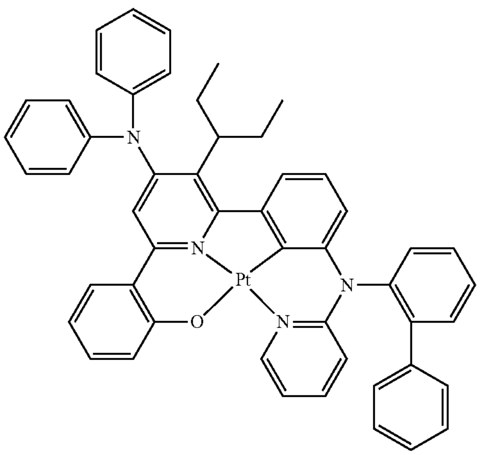
D13
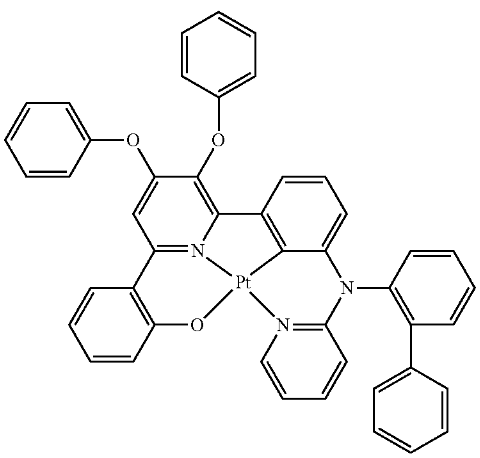
D14
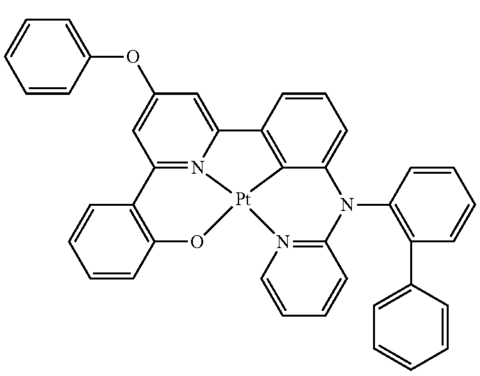
-continued
D15
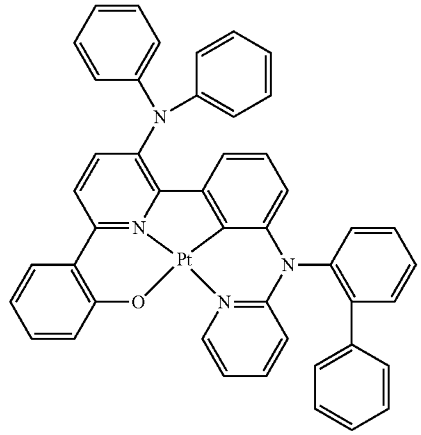
D16
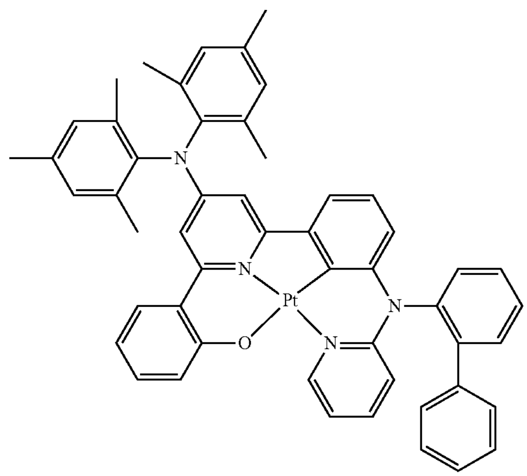
D17
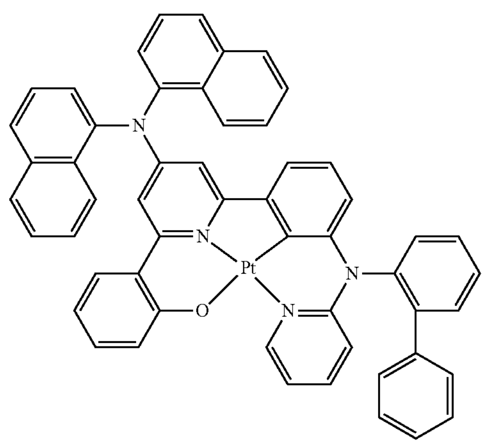

-continued
D18
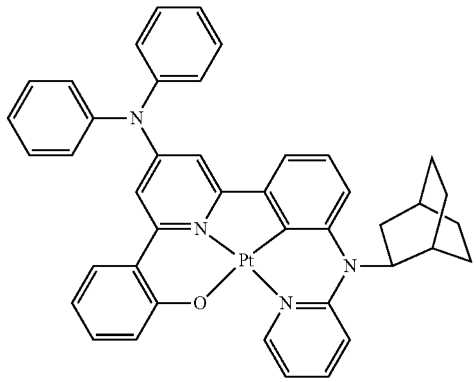
D19
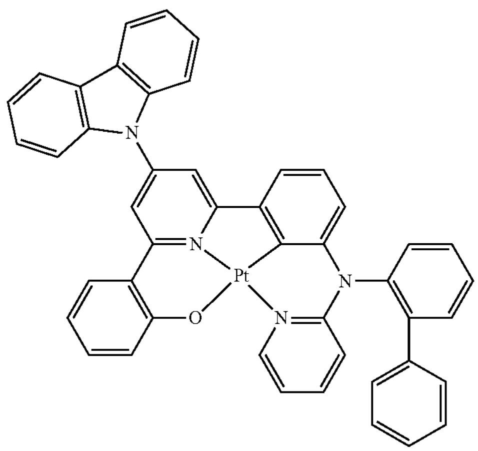
D20
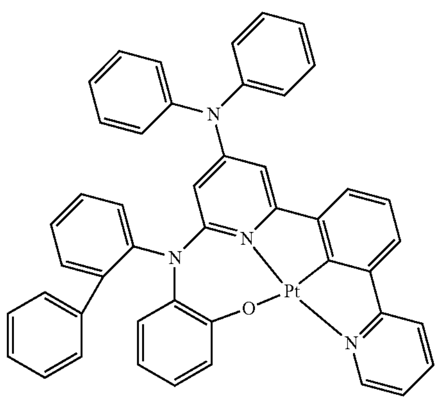
D21
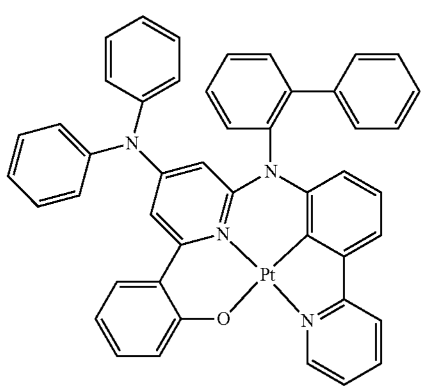
-continued
D22
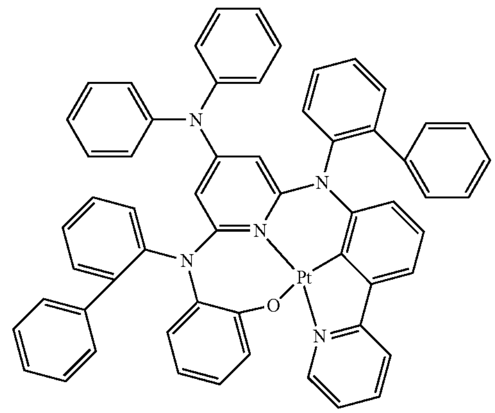
D23
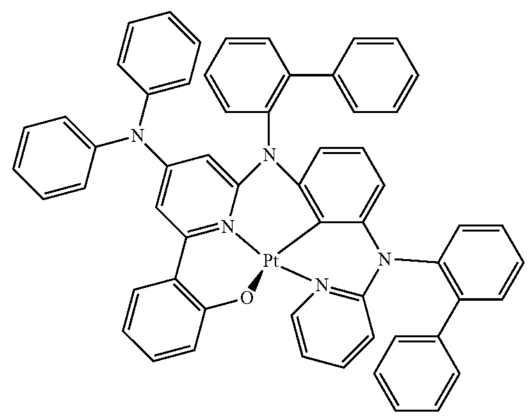
D24
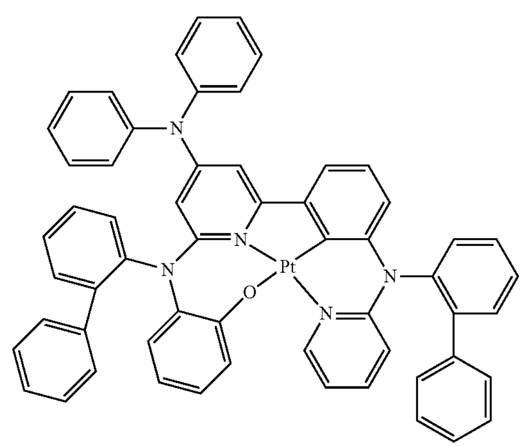
The first compound may be one of Compounds H1-1 to H1-75, but embodiments of the present disclosure are not limited thereto:

H1-1
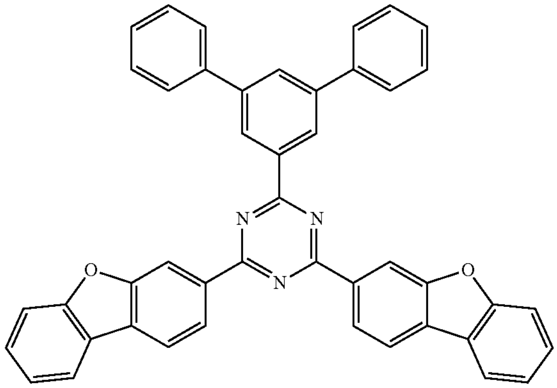
H1-2
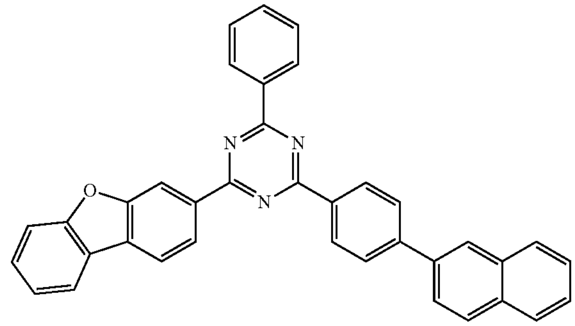
H1-3
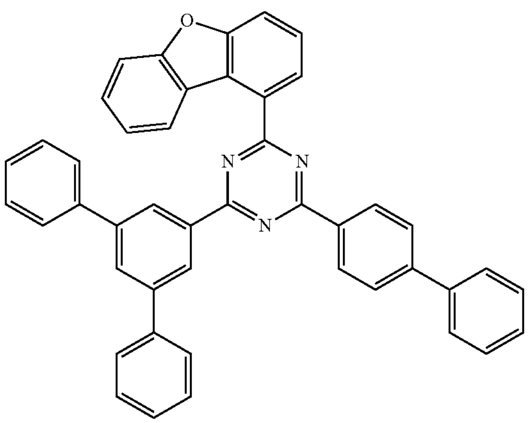
H1-4
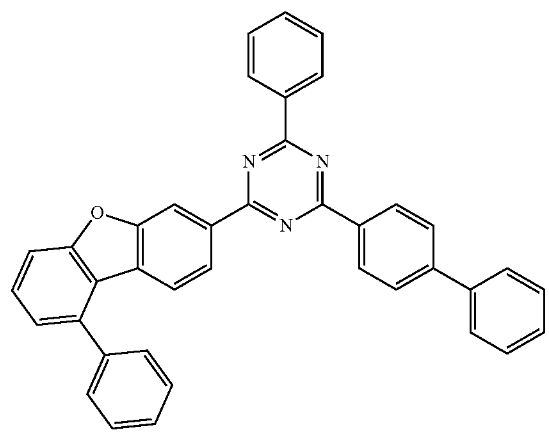
H1-5
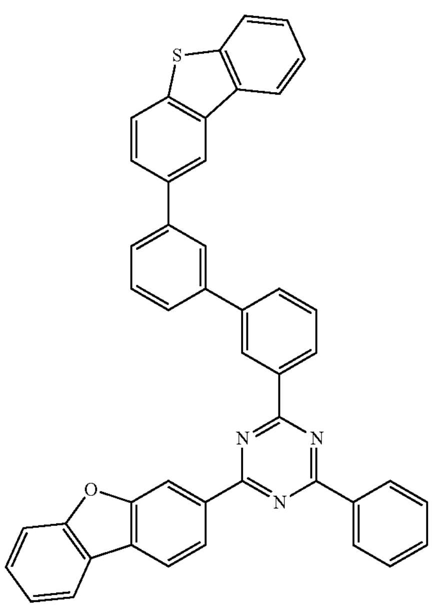
H1-6
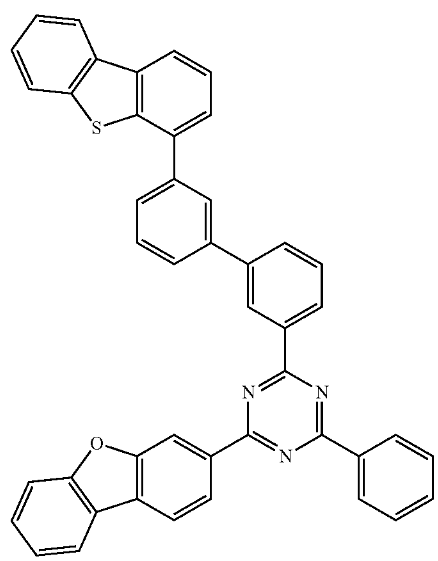

-continued
H1-7
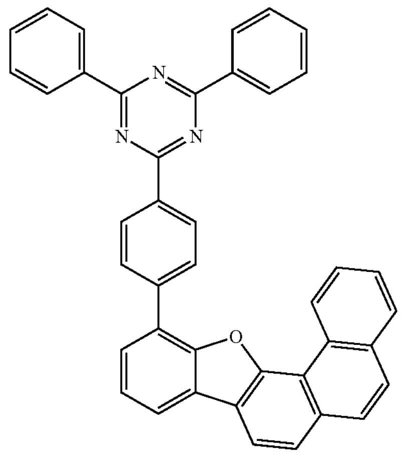
H1-8
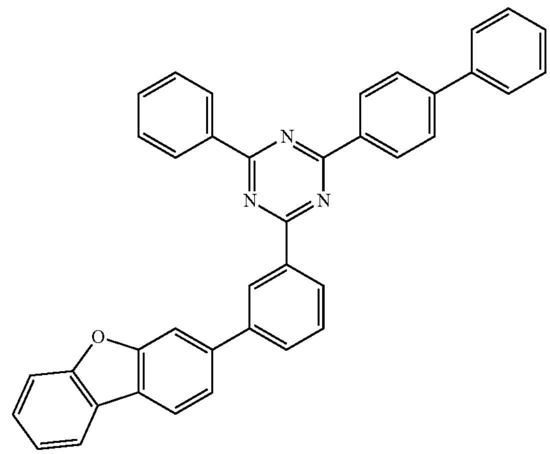
H1-9
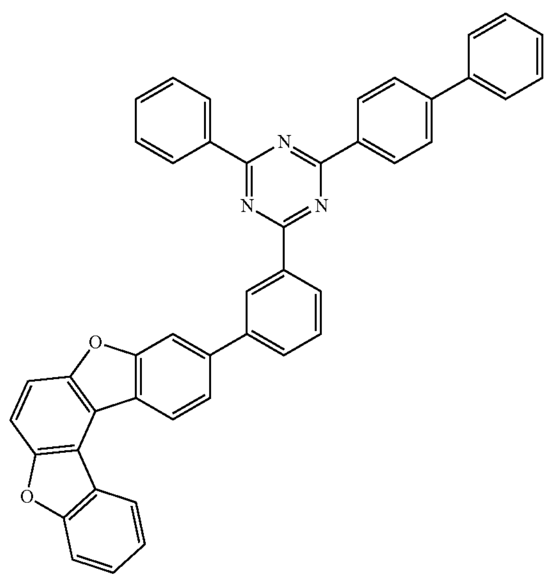
H1-10
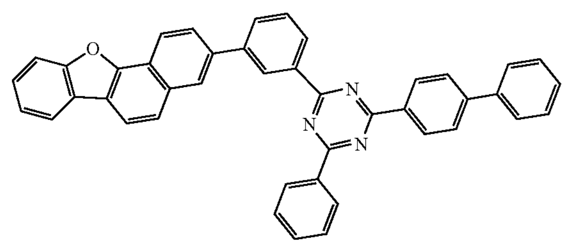
H1-11
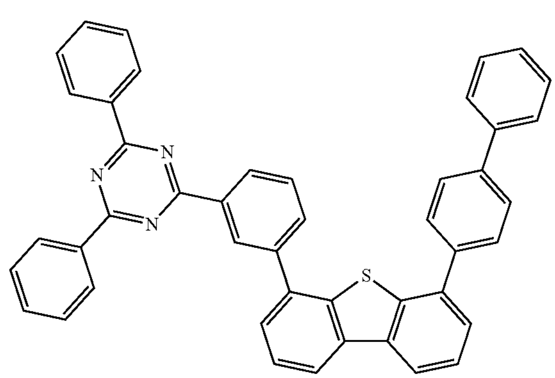
H1-12
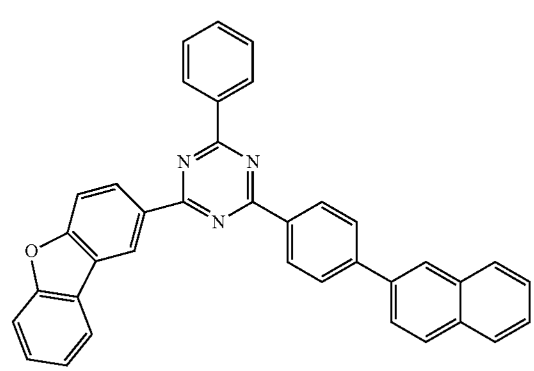

-continued
H1-13
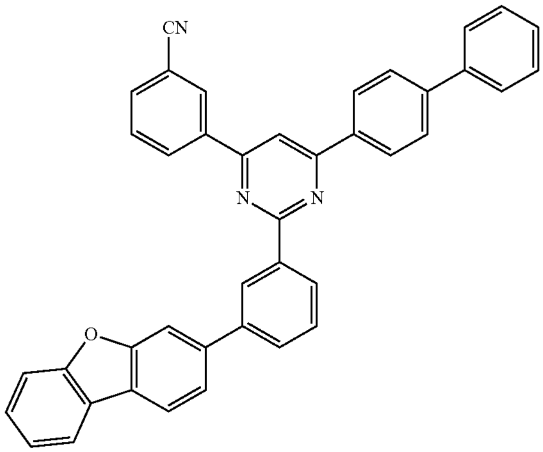
H1-14
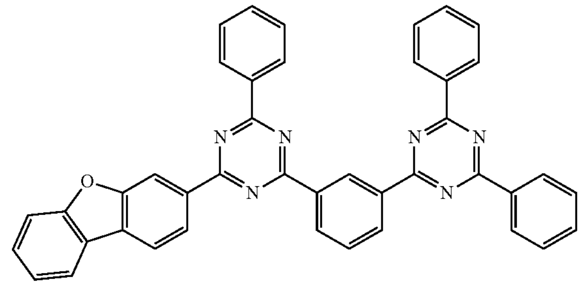
H1-15
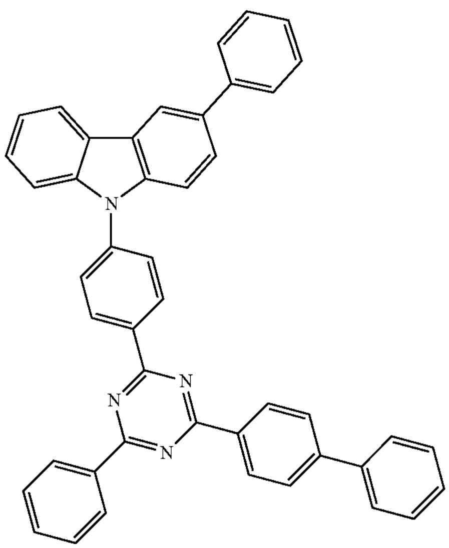
H1-16
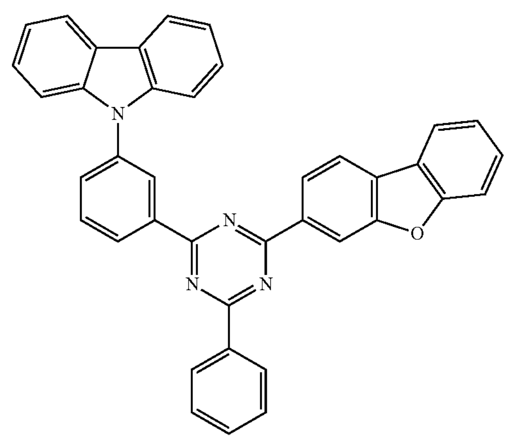
H1-17
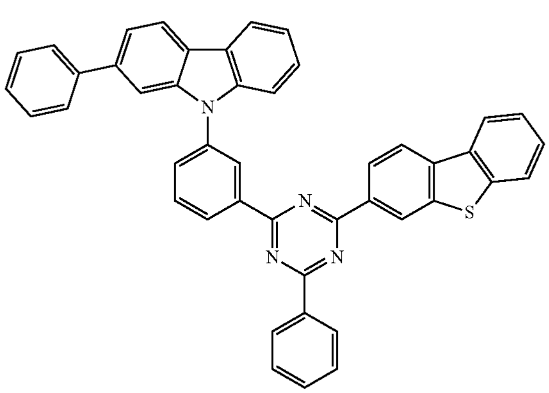
H1-18
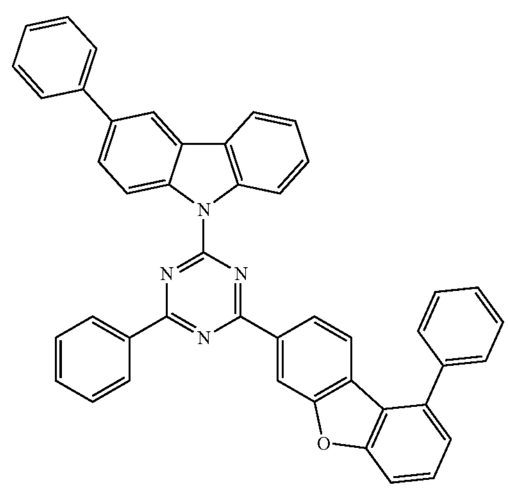

-continued
H1-19
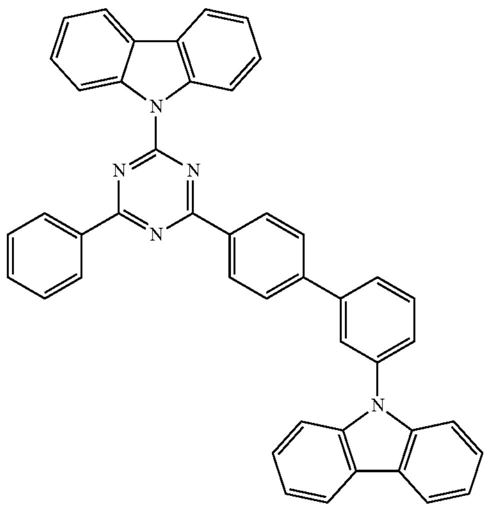
H1-20
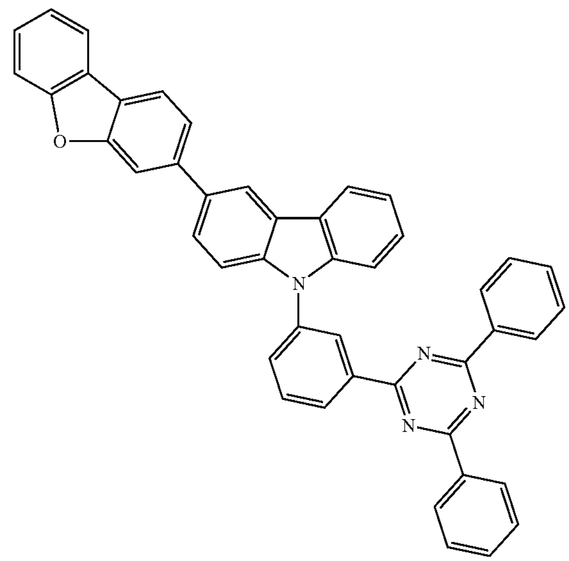
H1-21
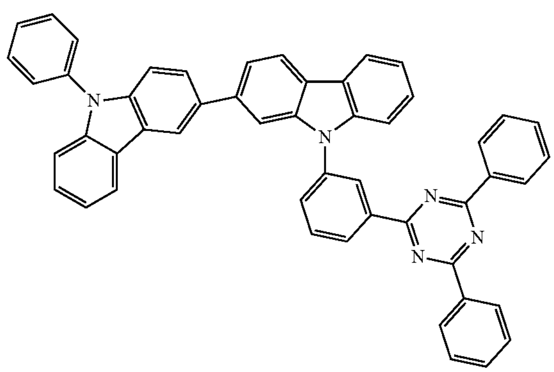
H1-22
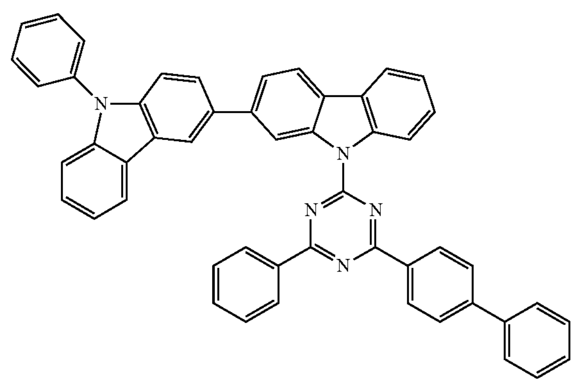
H1-23
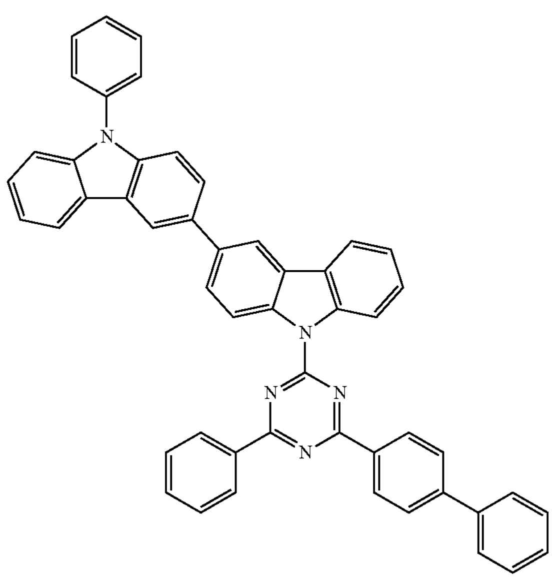
H1-24
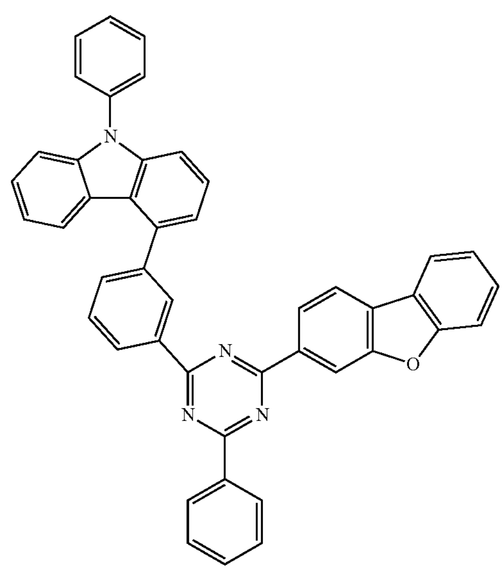

-continued
H1-25
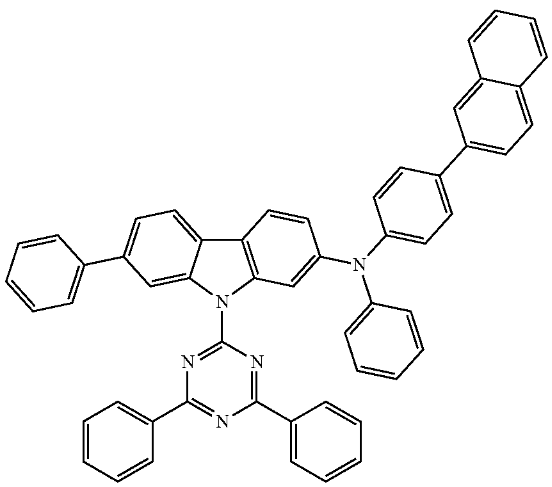
H1-26
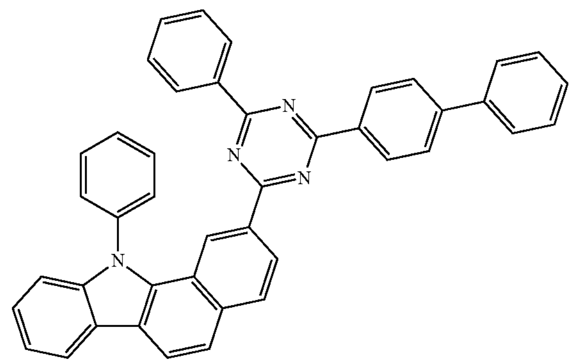
H1-27
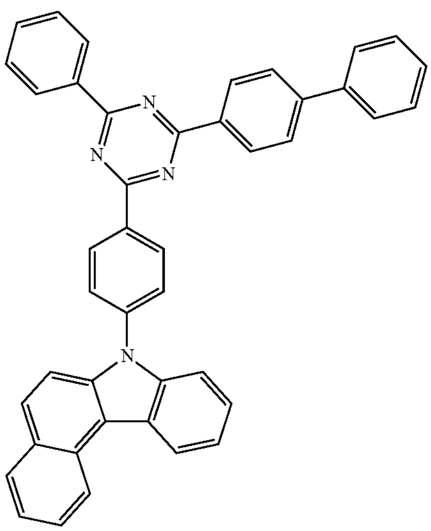
H1-28
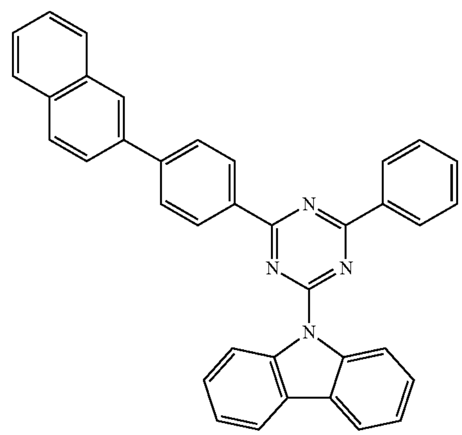
H1-29
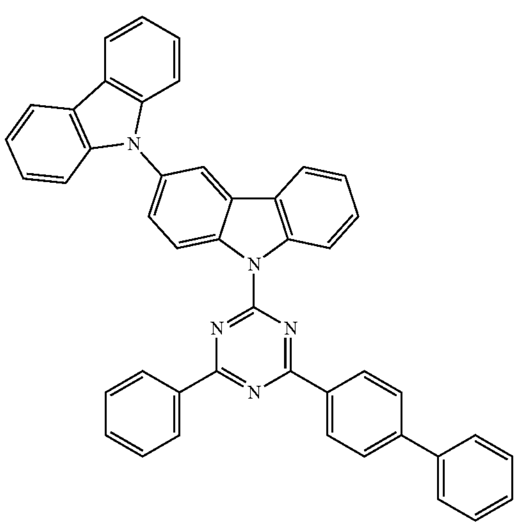
H1-30
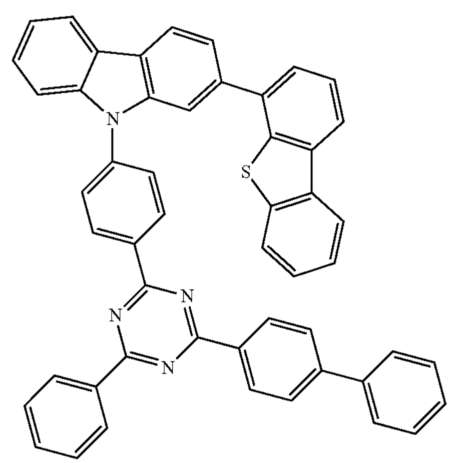

-continued
H1-31
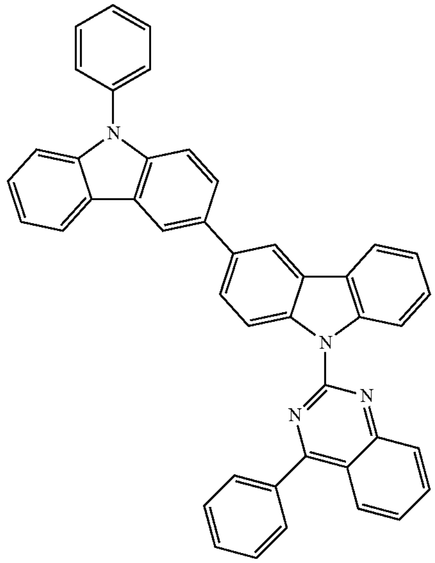
H1-32
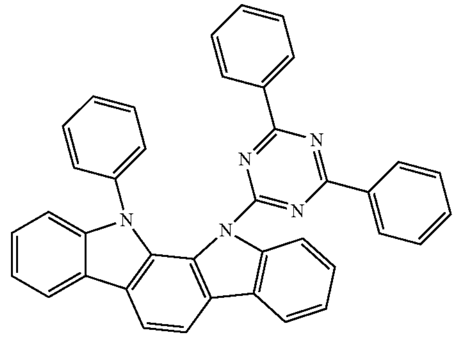
H1-33
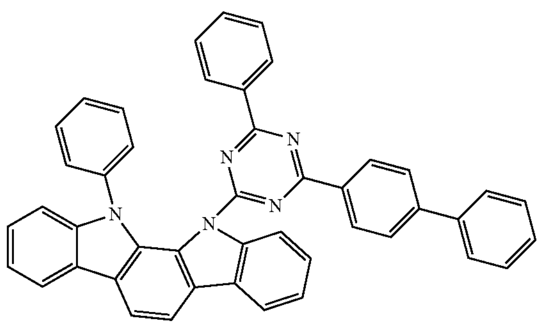
H1-34
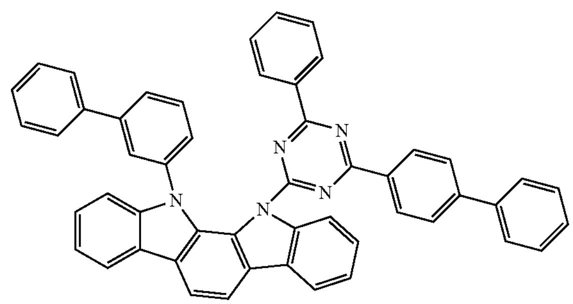
H1-35
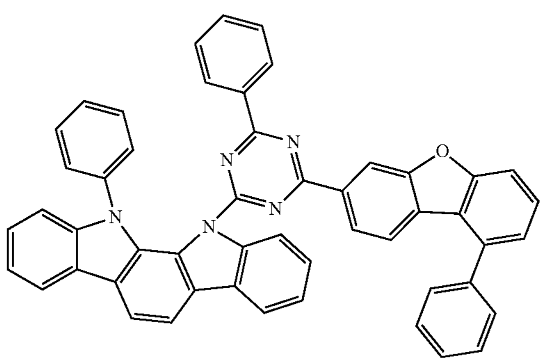
H1-36
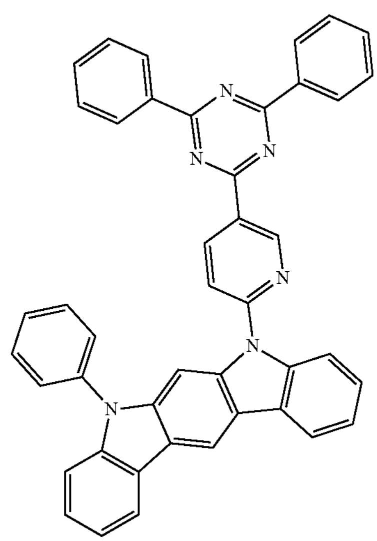

-continued
H1-37
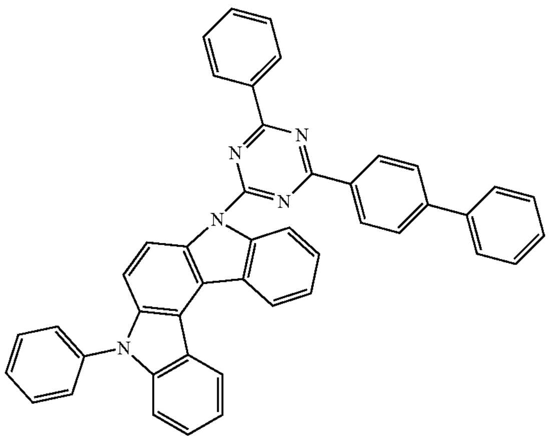
H1-38
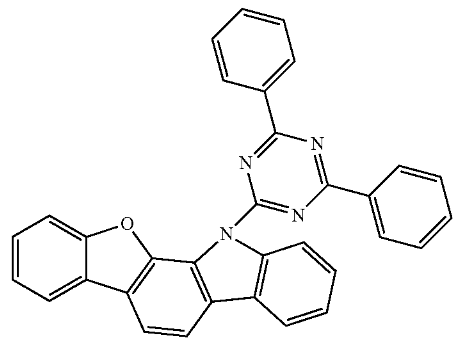
H1-39
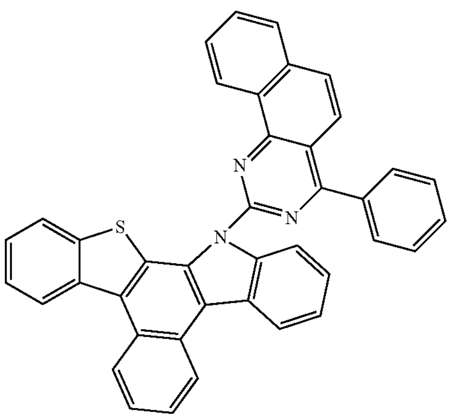
H1-40
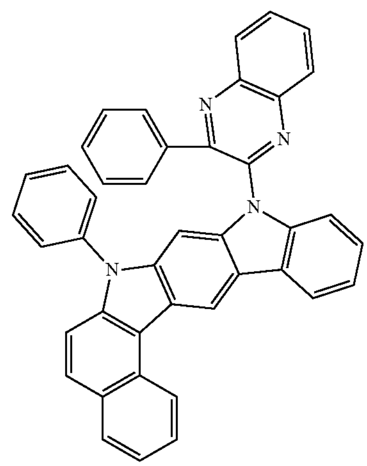
H1-41
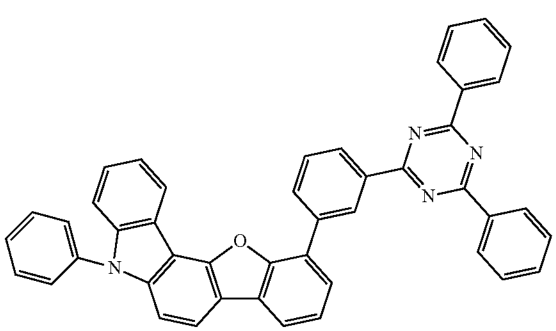
H1-42
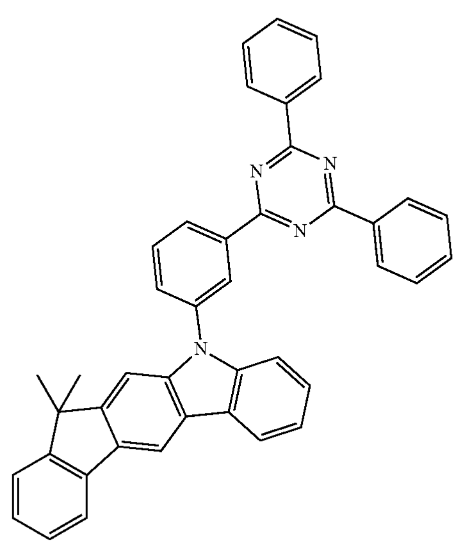

-continued
H1-43
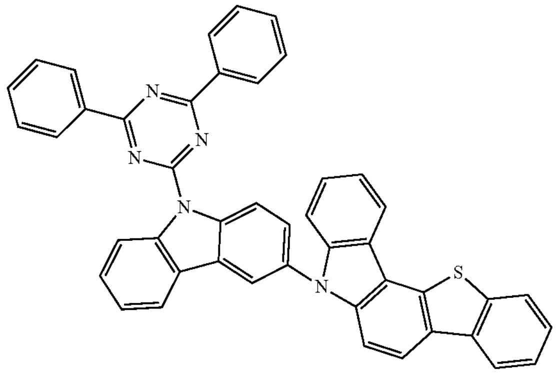
H1-44
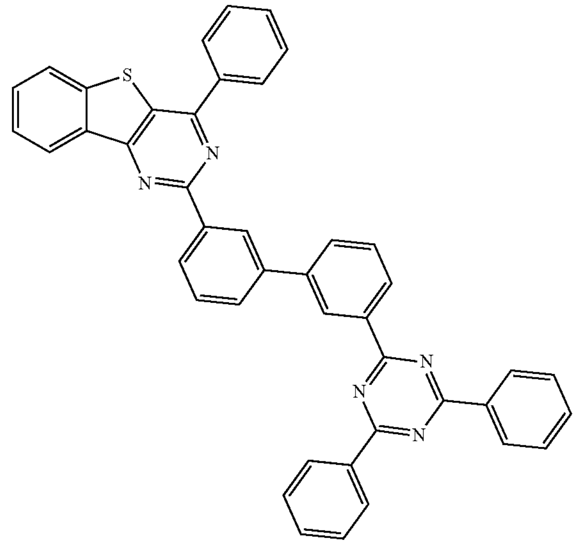
H1-45
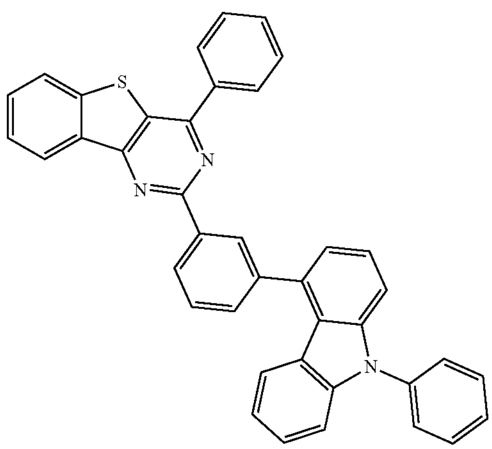
H1-46
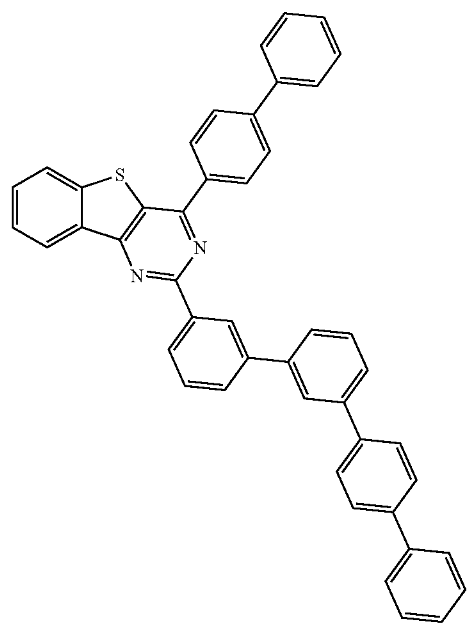
H1-47
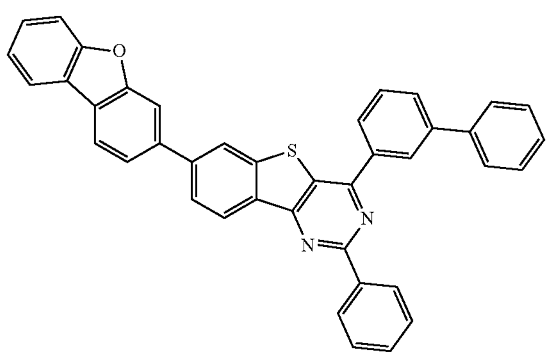
H1-48
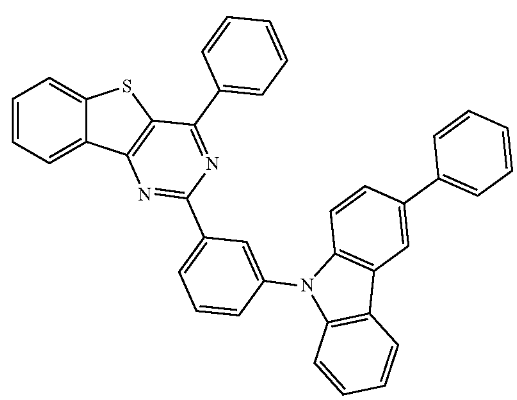

-continued
H1-49
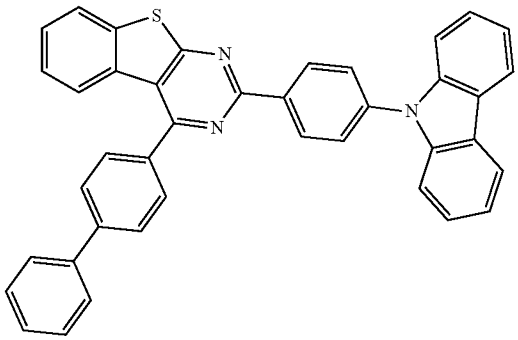
H1-50
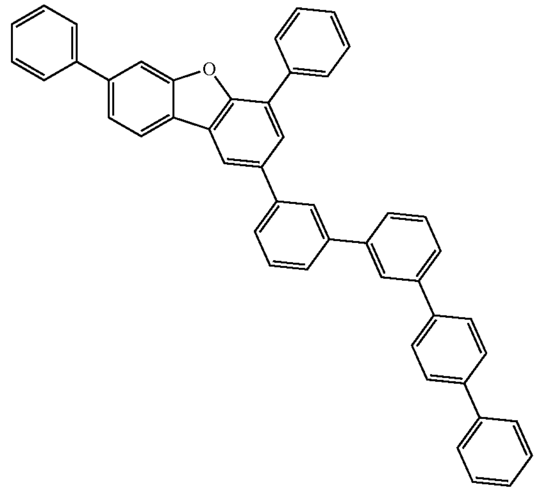
H1-51
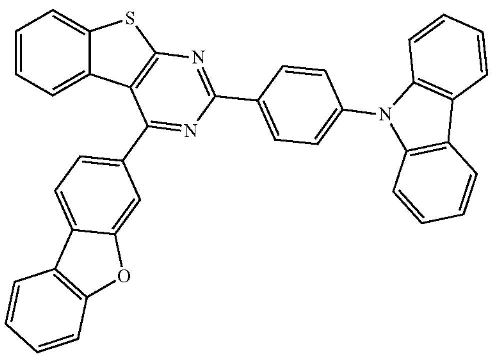
H1-52
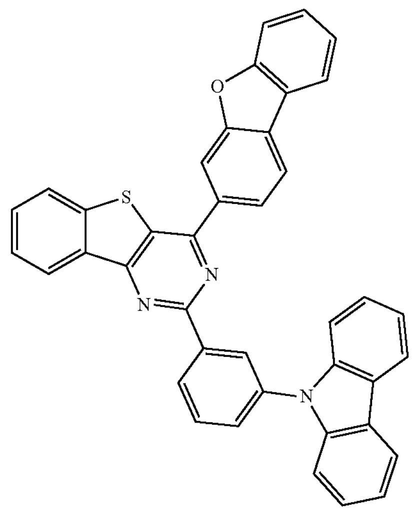
H1-53
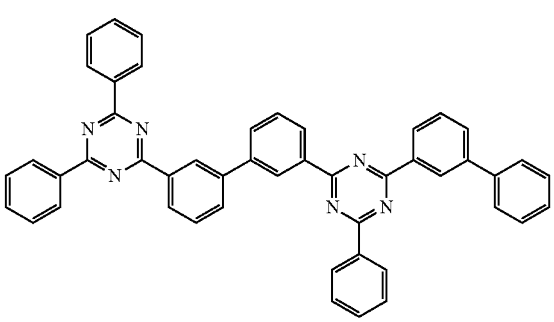
H1-54
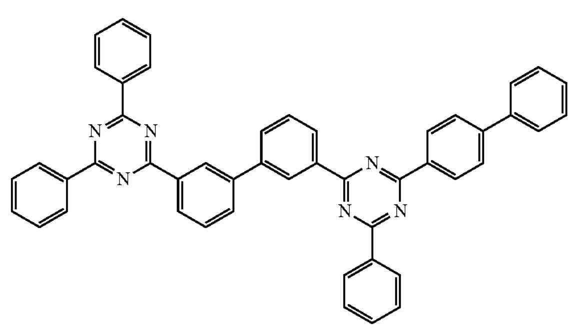

-continued
H1-55
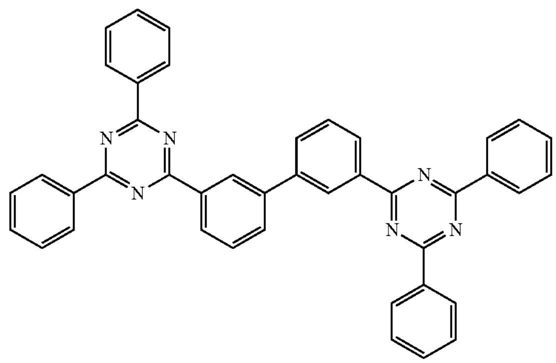
H1-56
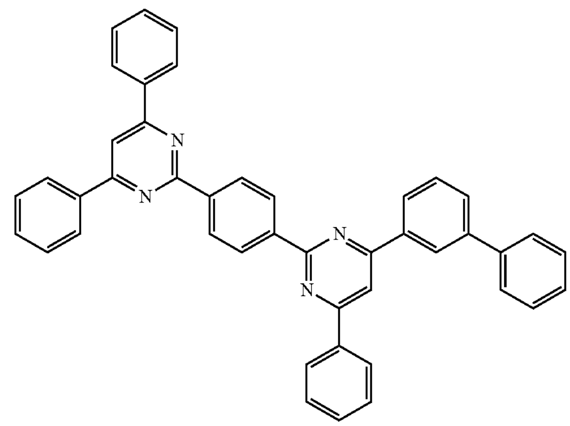
H1-57
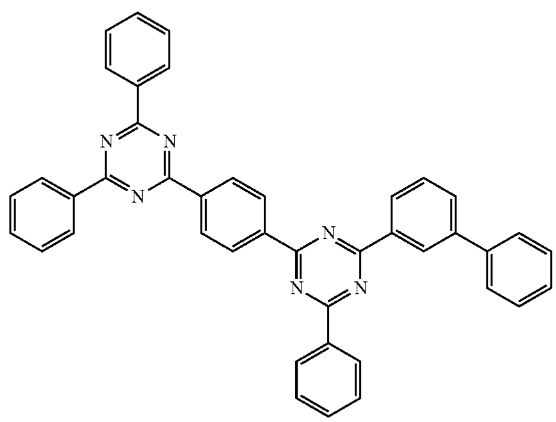
H1-58
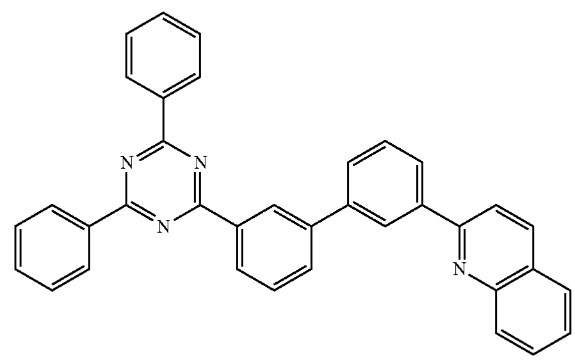
H1-59
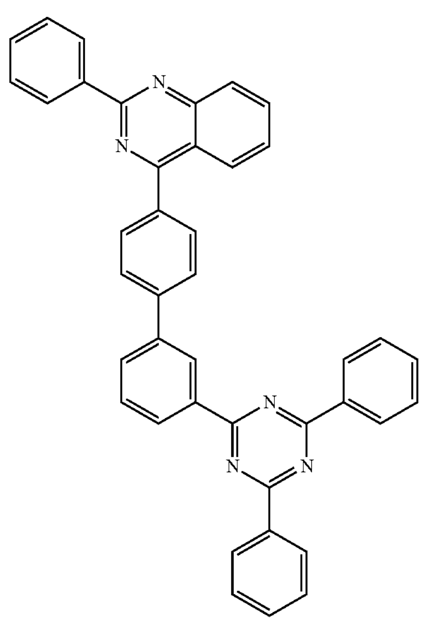
H1-60
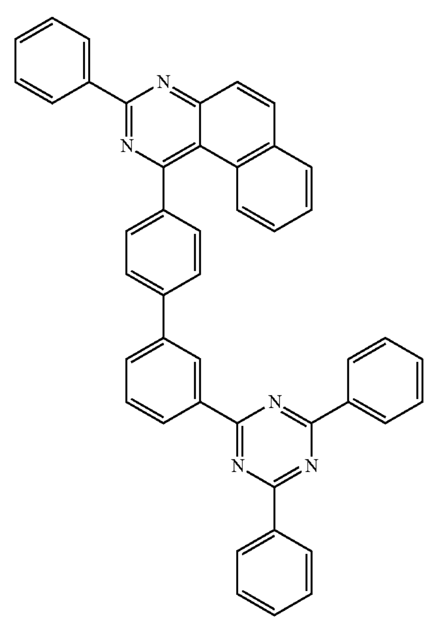

-continued
H1-61
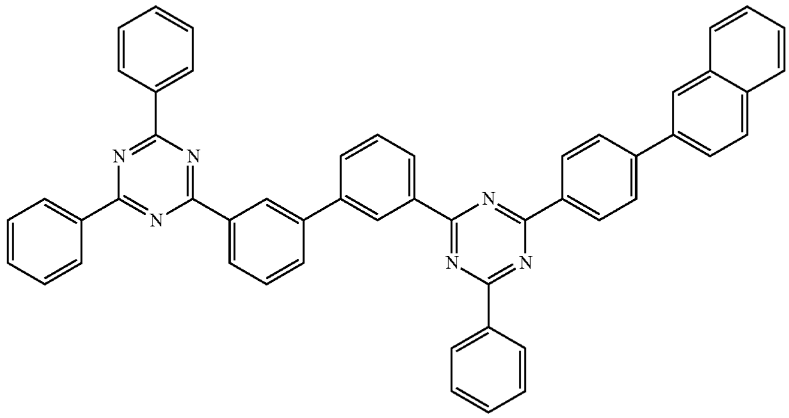
H1-62
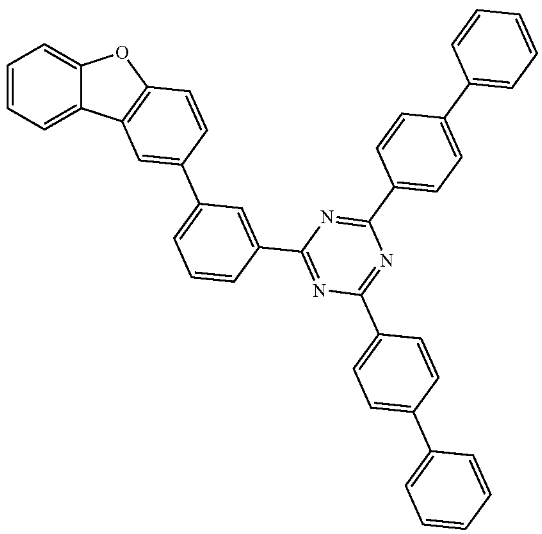
H1-63
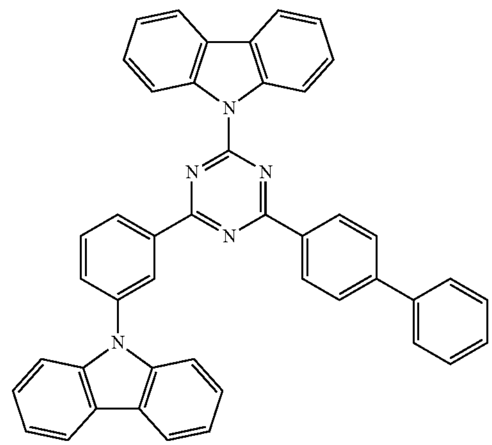
H1-64
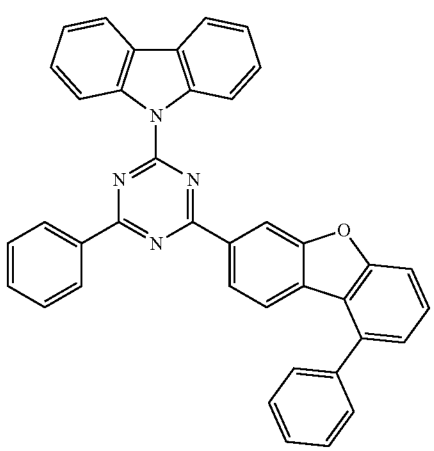
H1-65
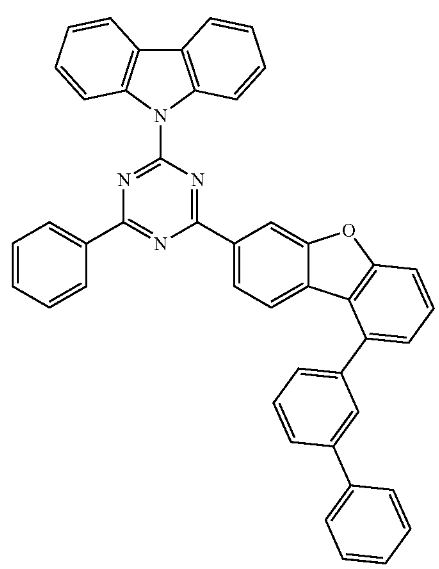

-continued
H1-66
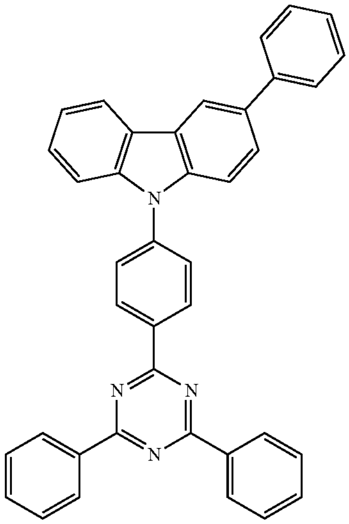
H1-67
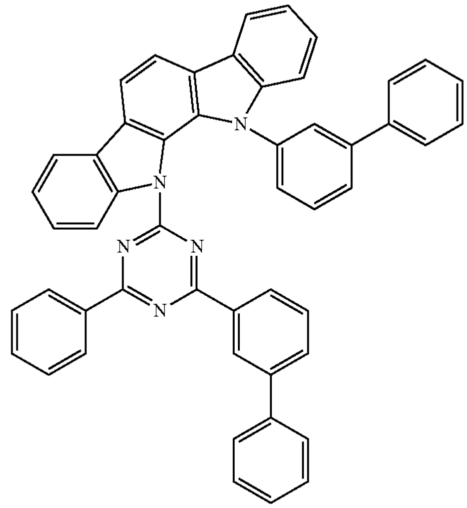
H1-68
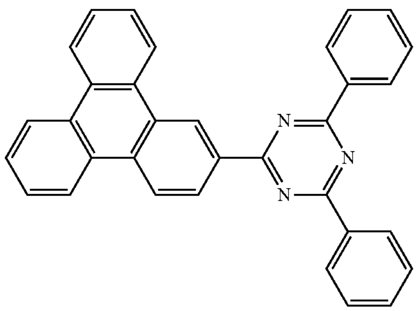
H1-69
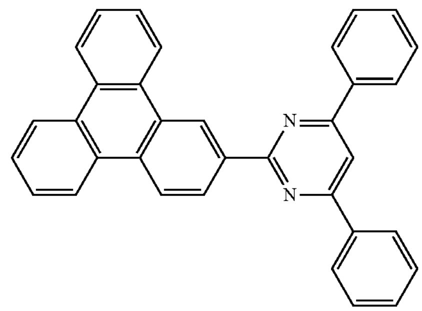
H1-72
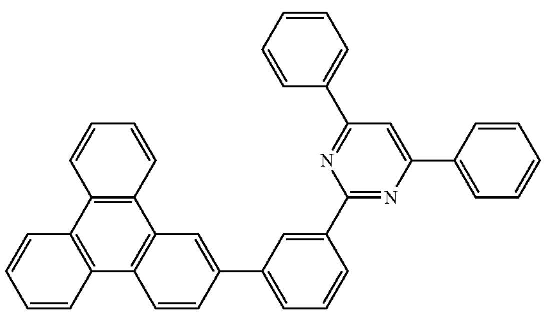
H1-73
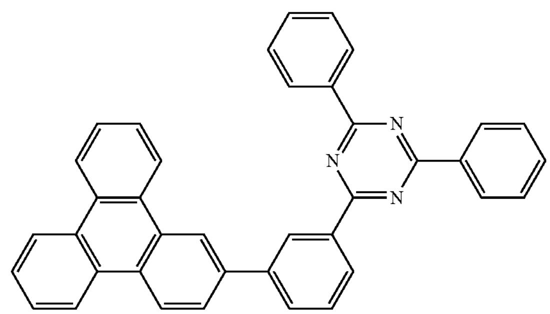
H1-74
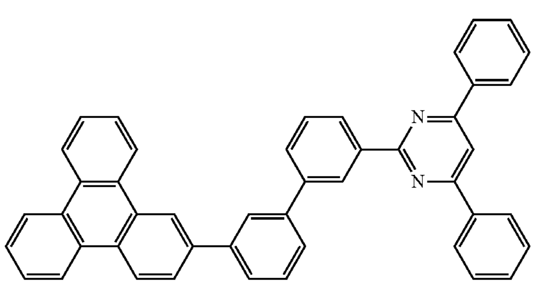
H1-75
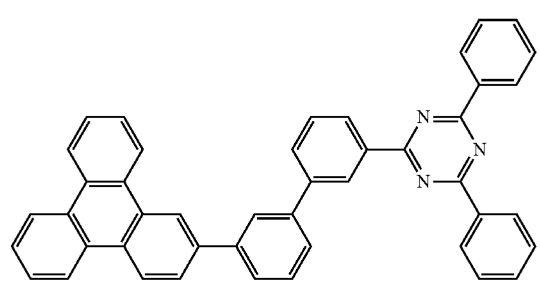

The second compound and the third compound may each independently be one of Compounds H2-1 to H2-73, but embodiments of the present disclosure are not limited thereto:
H2-1
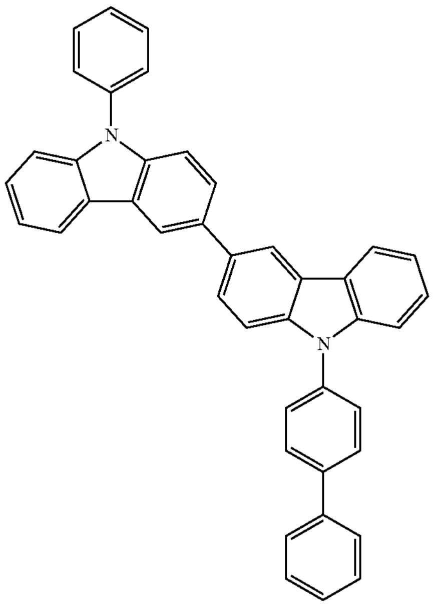
H2-2
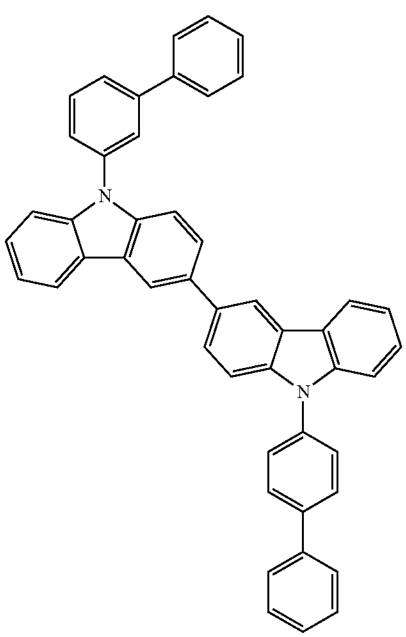
-continued
H2-1
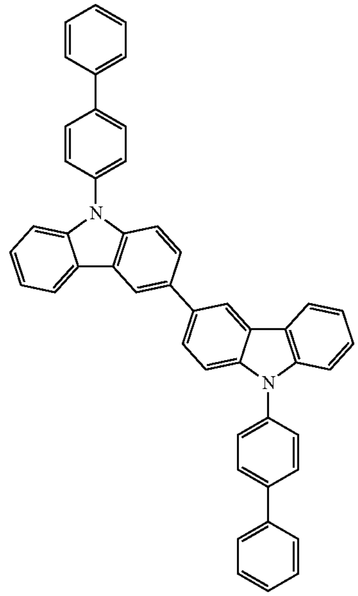
H2-4
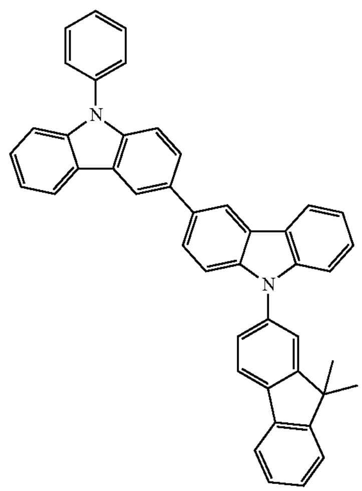
H2-5
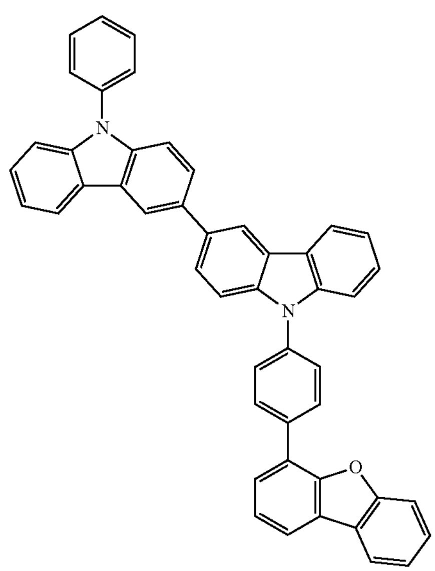

-continued
H2-6
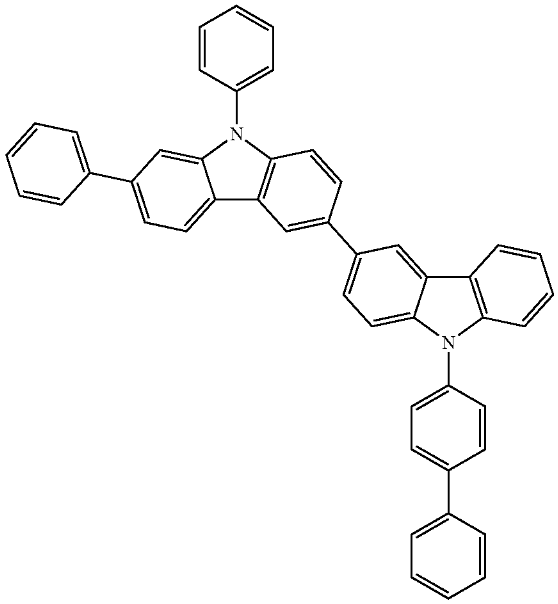
H2-7
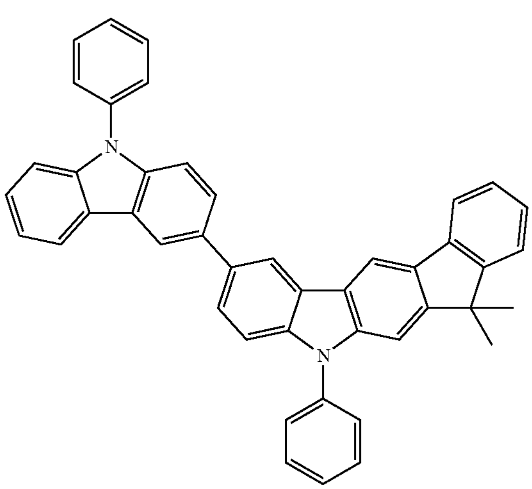
-continued
H2-8
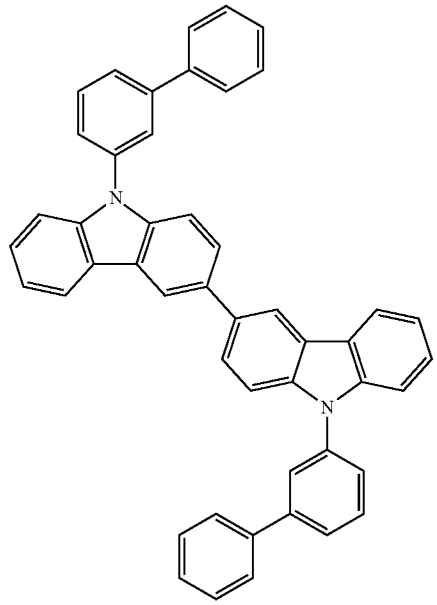
H2-9
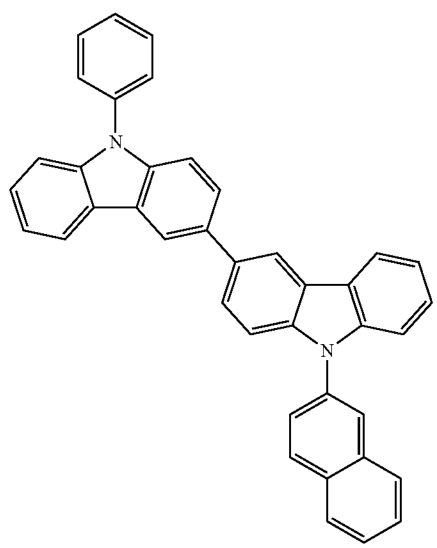

-continued
H2-10
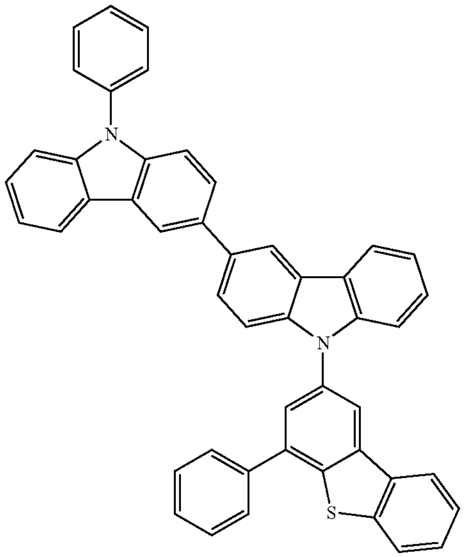
H2-11
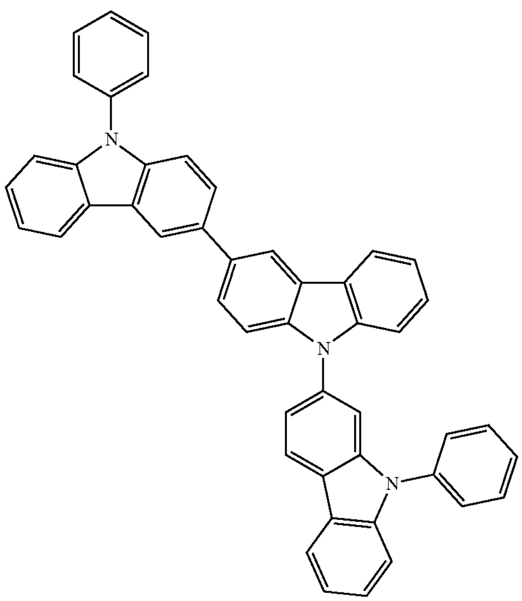
H2-12
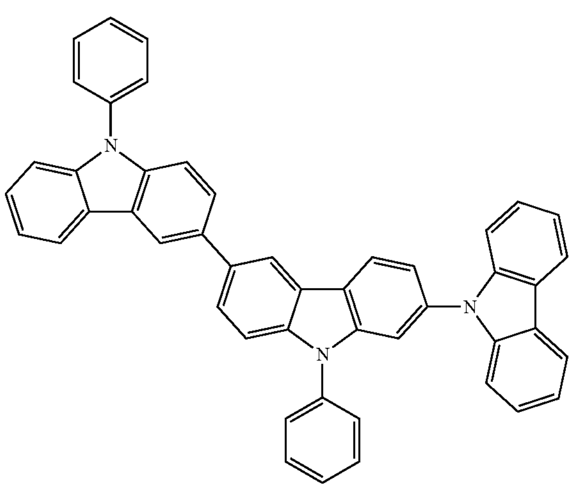
-continued
H2-13
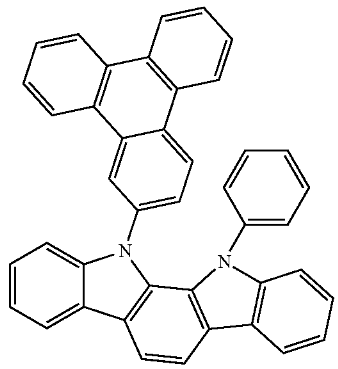
H2-14
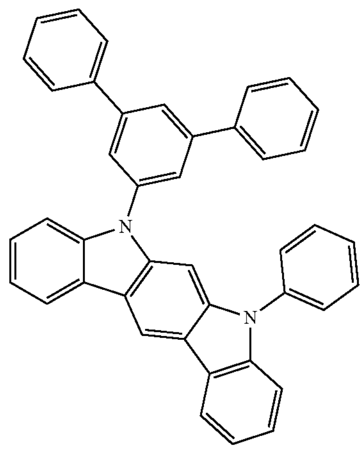
H2-15
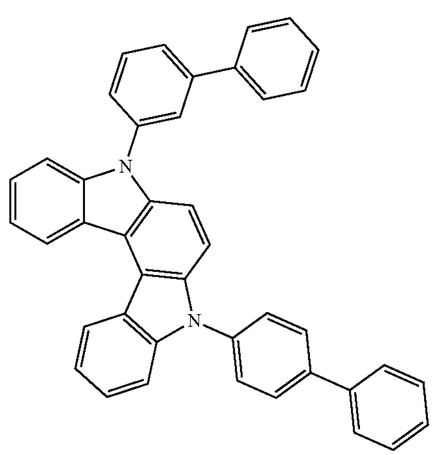

-continued
H2-16
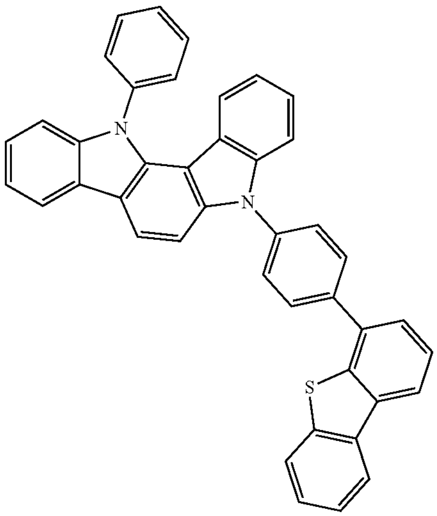
H2-17
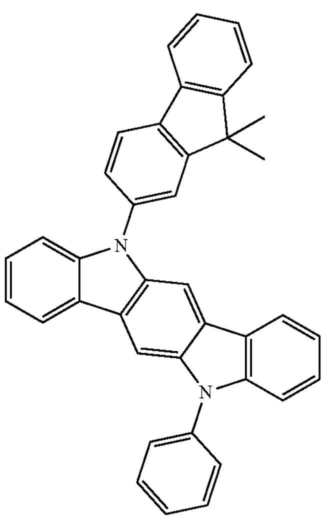
H2-18
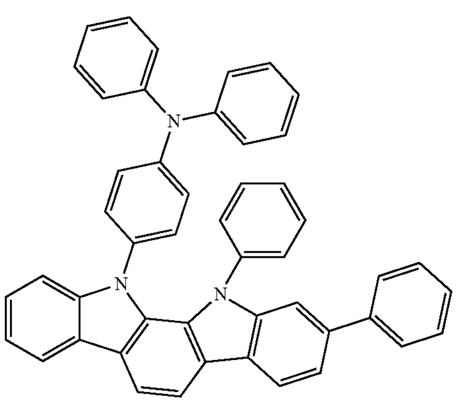
-continued
H2-19
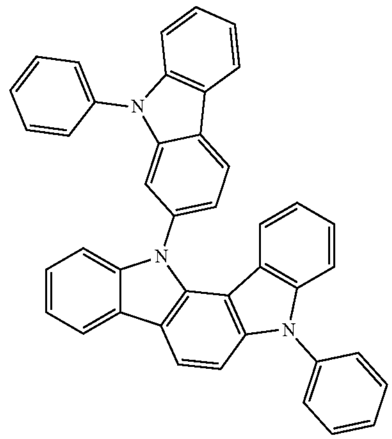
H2-20
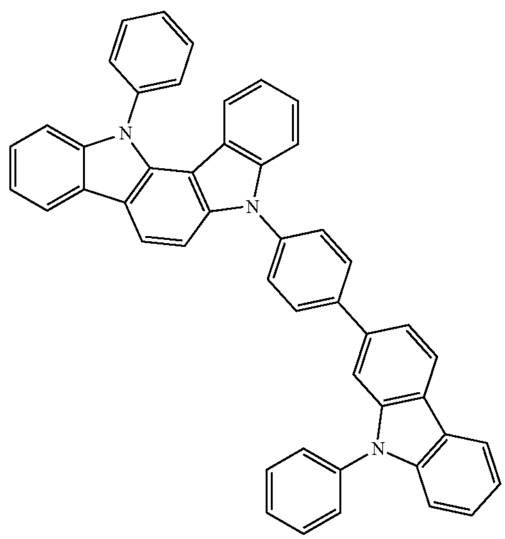
H2-21
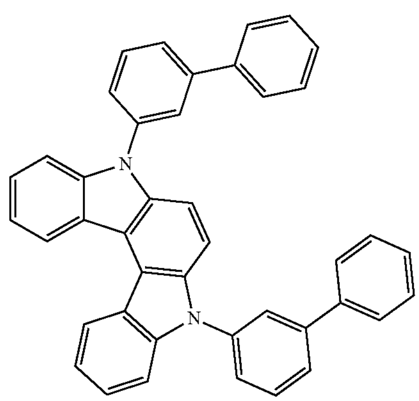

-continued
H2-22
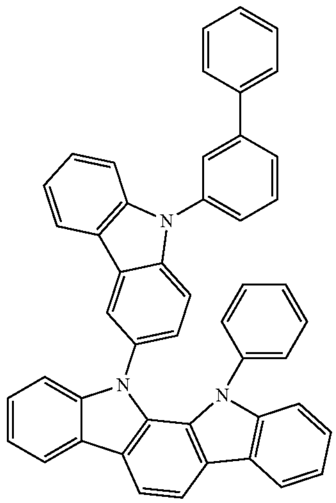
H2-23
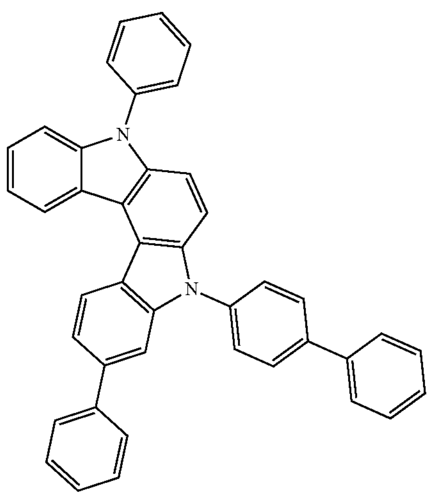
H2-24
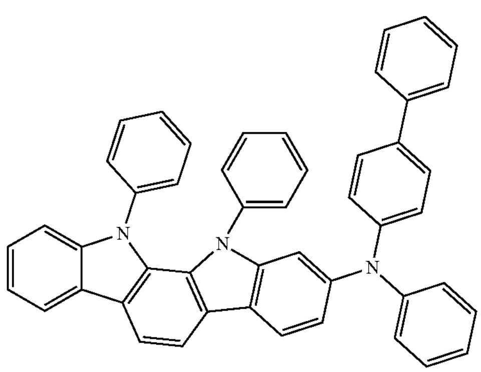
-continued
H2-25
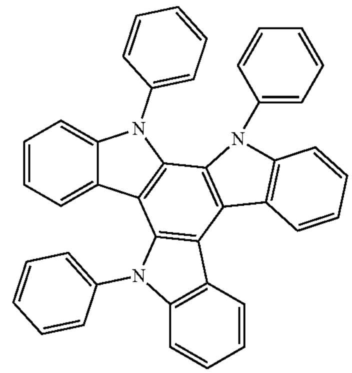
H2-26
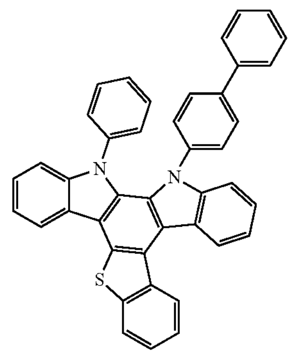
H2-27
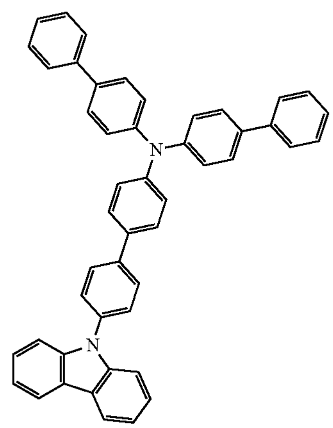
H2-28
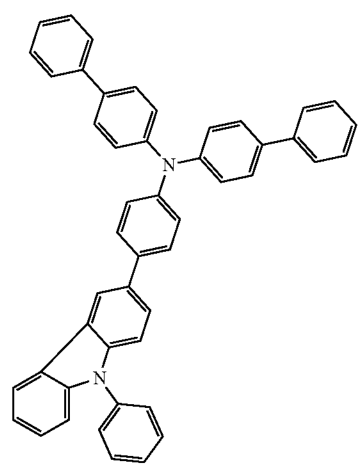

-continued
H2-29
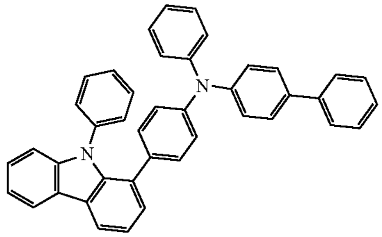
H2-30
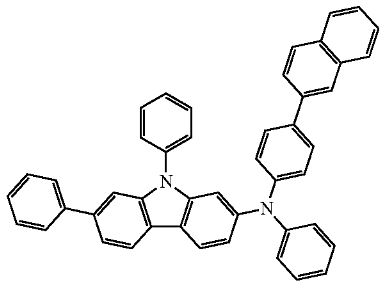
H2-31
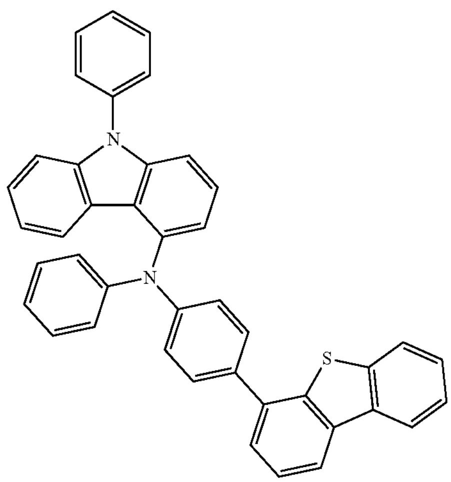
H2-32
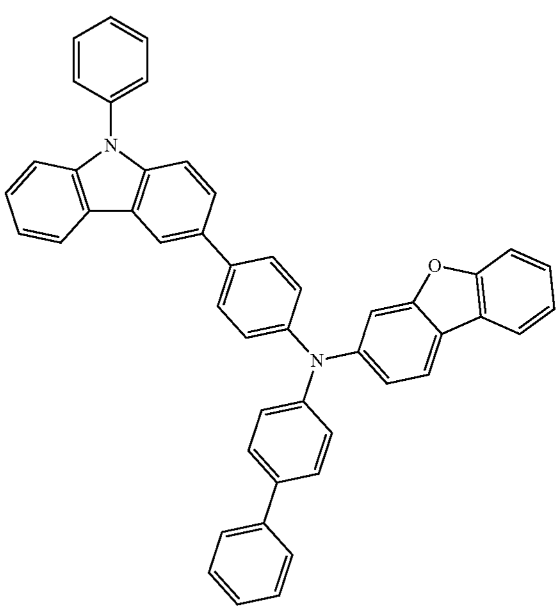
-continued
H2-33
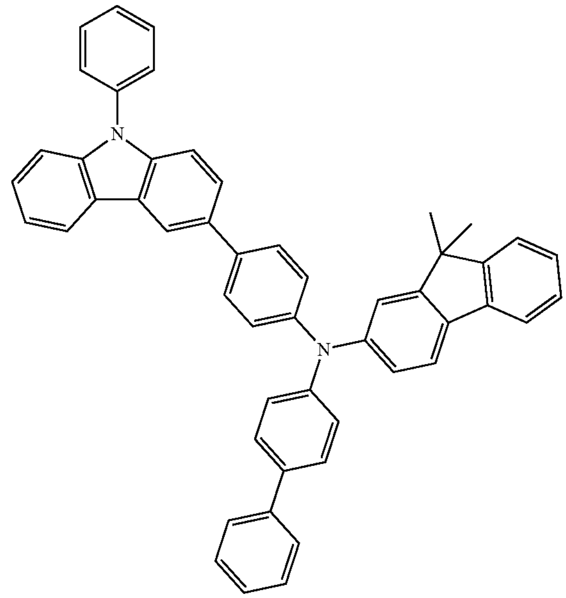
H2-34
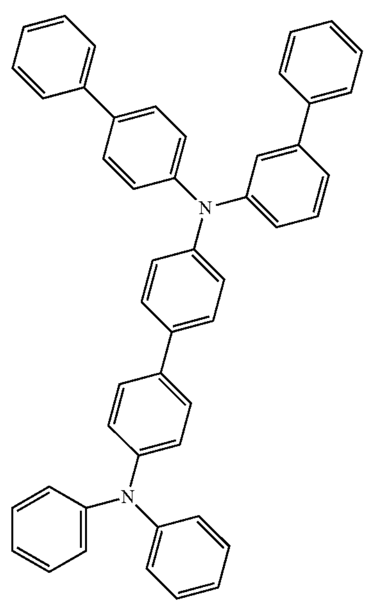

H2-35
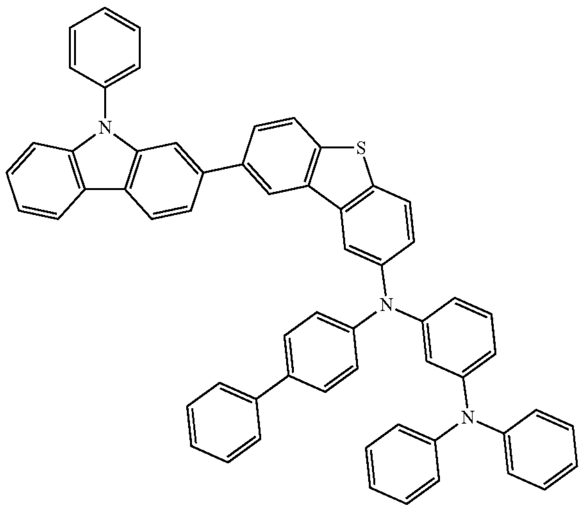
H2-36
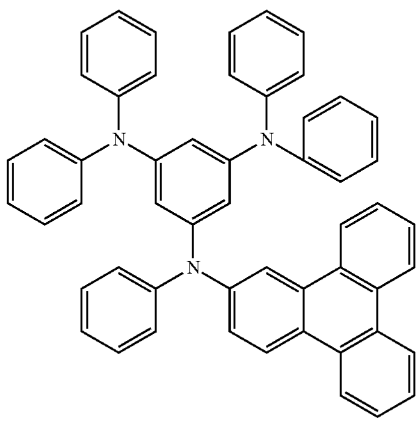
H2-37
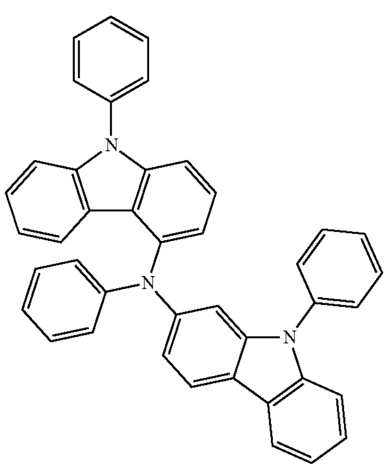
H2-38
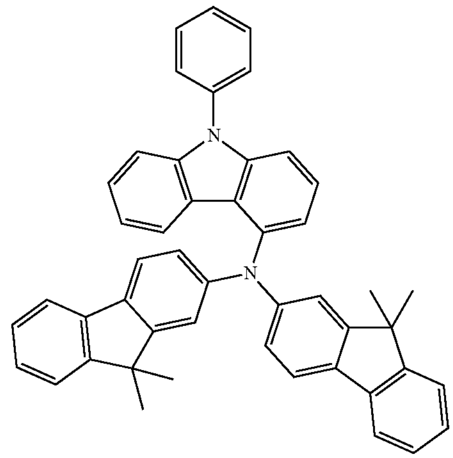
H2-39
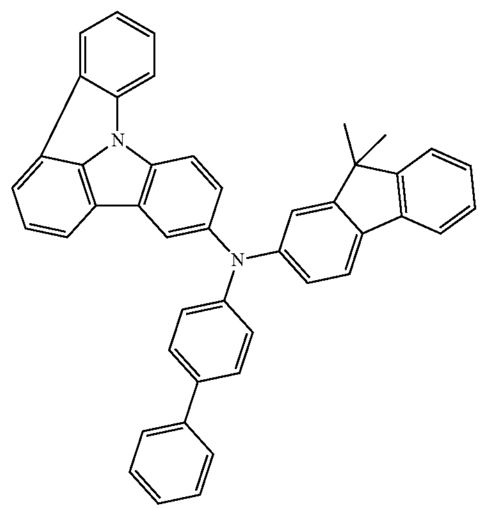
H2-40
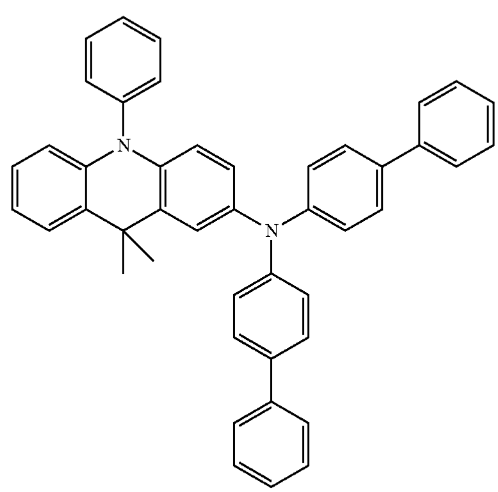

-continued
H1-41
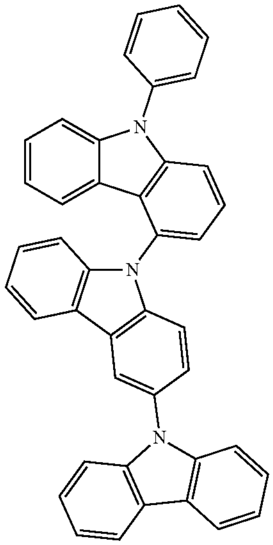
H2-42
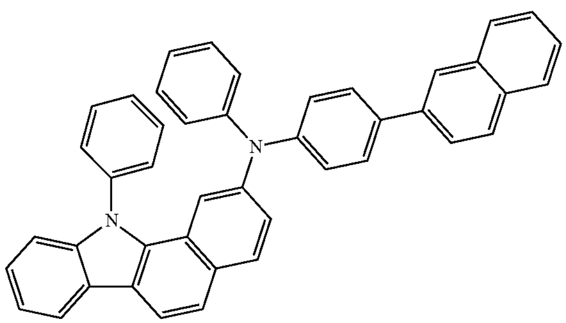
H2-43
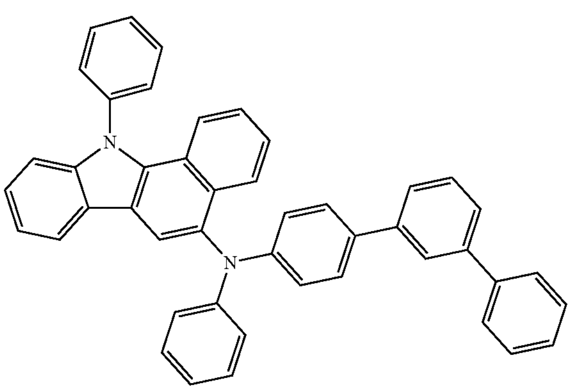
-continued
H2-44
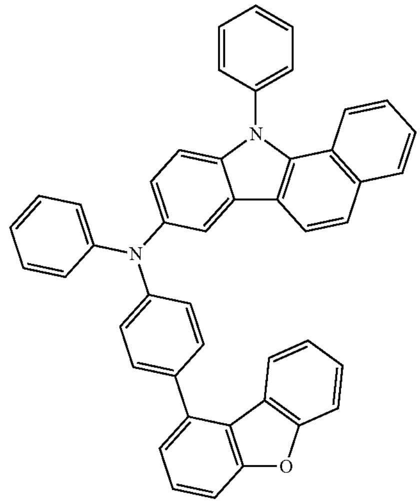
H2-45
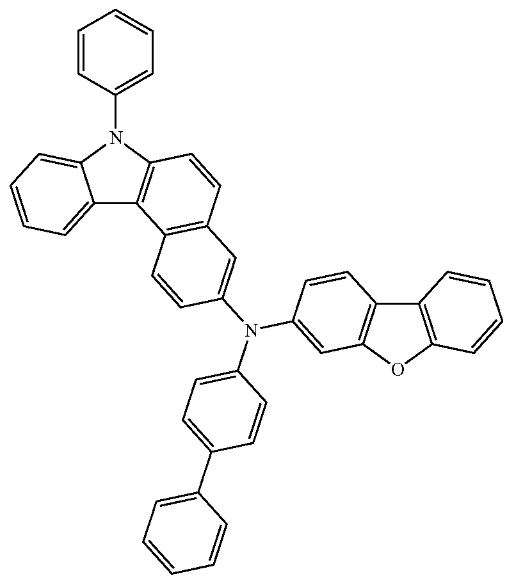
H2-46
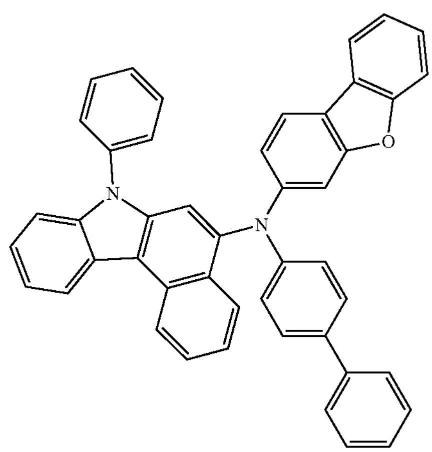

-continued
H2-47
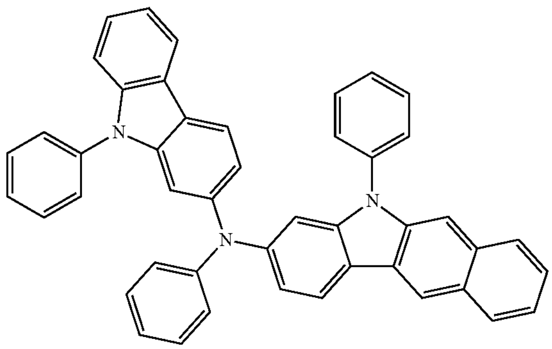
H2-48
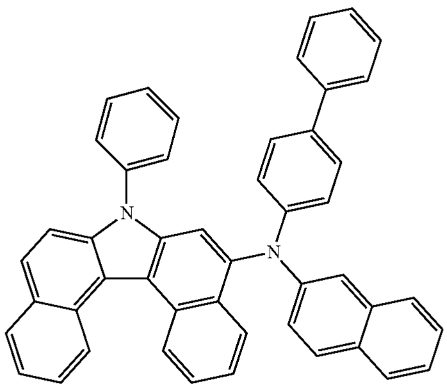
H2-49
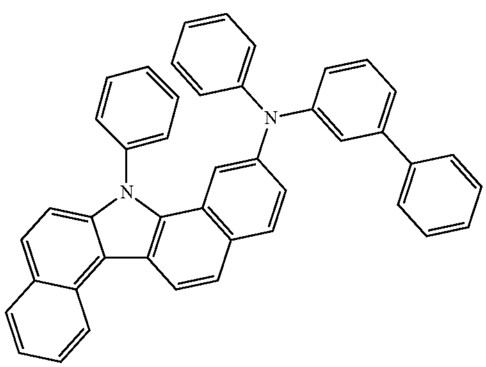
H2-50
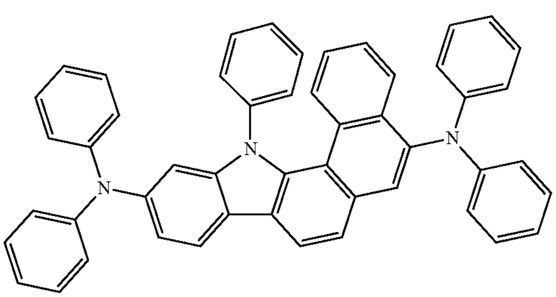
-continued
H2-51
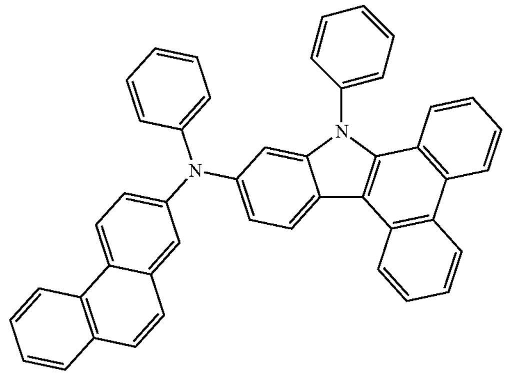
H2-52
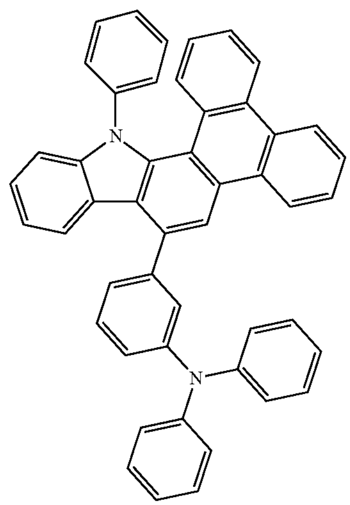
H2-53
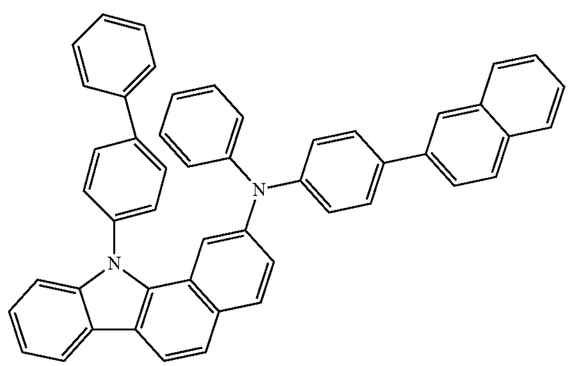

-continued
H2-54
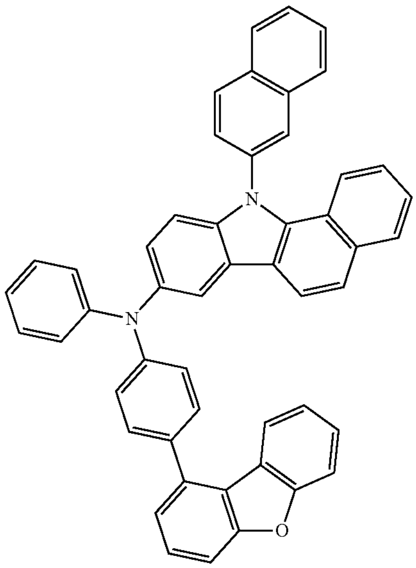
H2-55
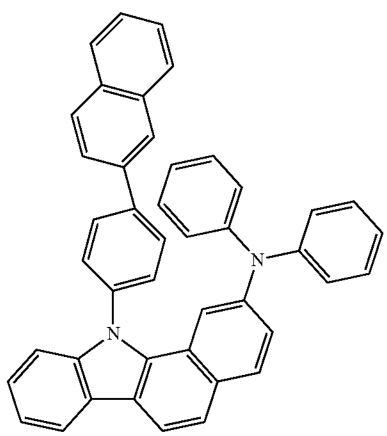
H2-56
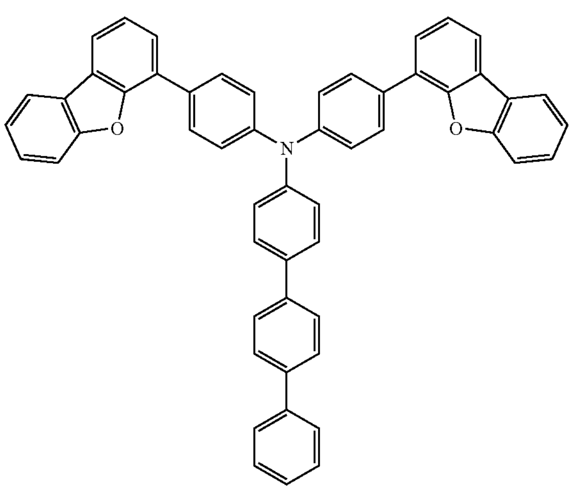
-continued
H2-57
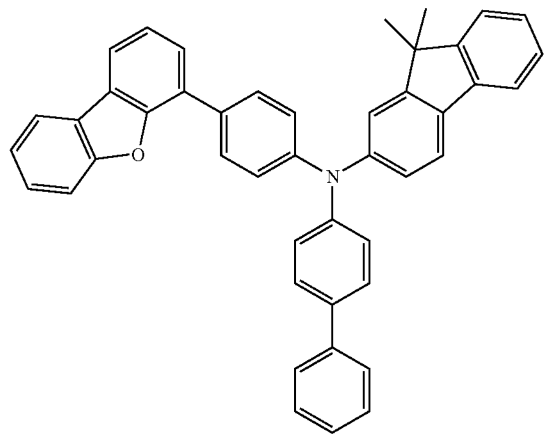
H2-58
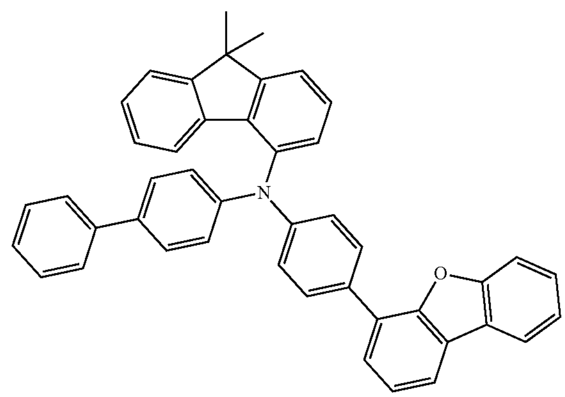
H2-59
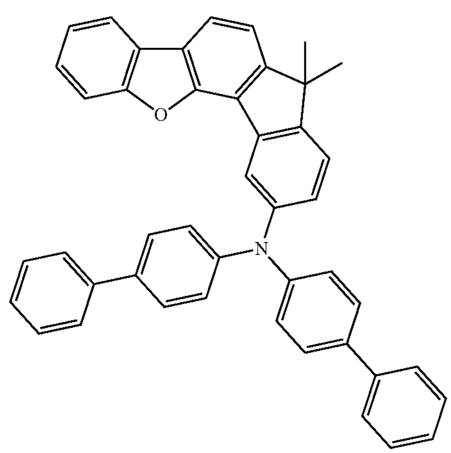

H2-60
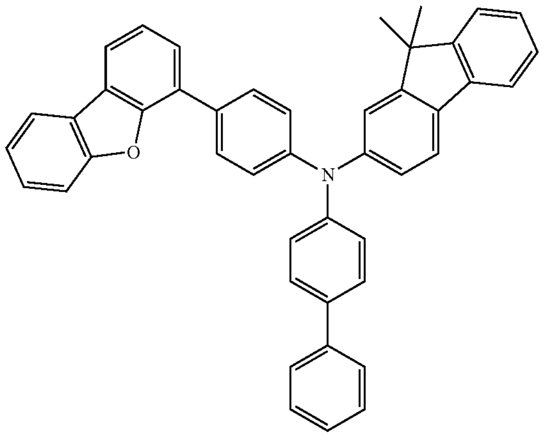
H2-61
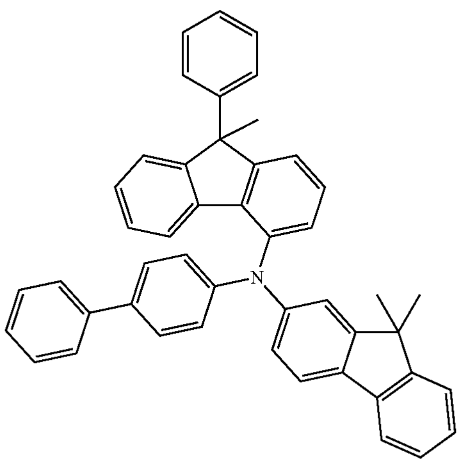
H2-62
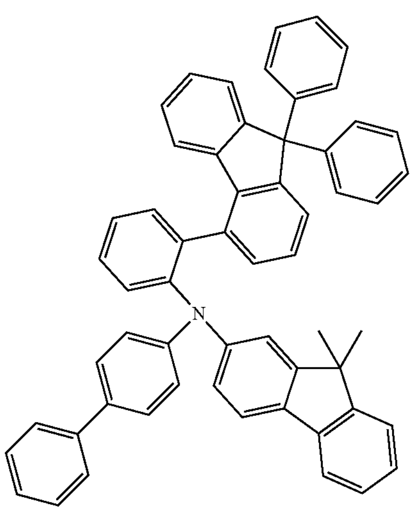
H2-63
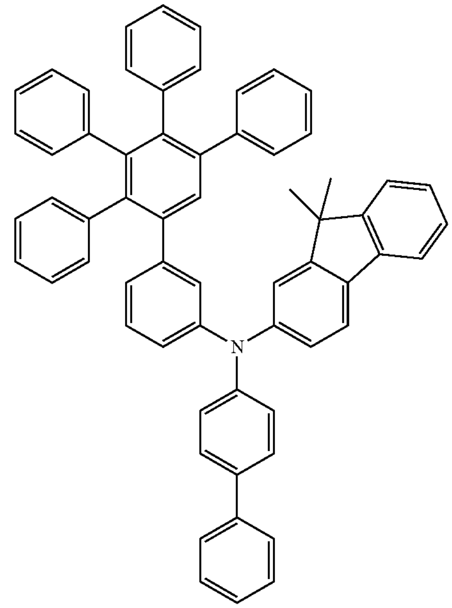
H2-64
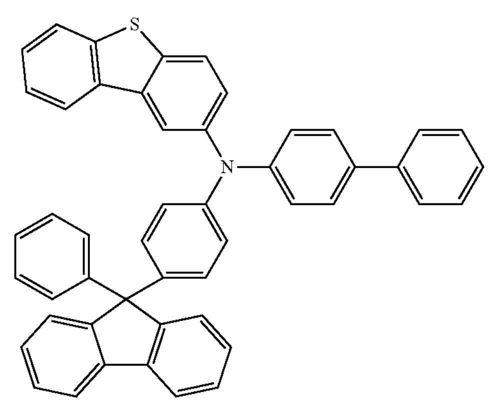
H2-65
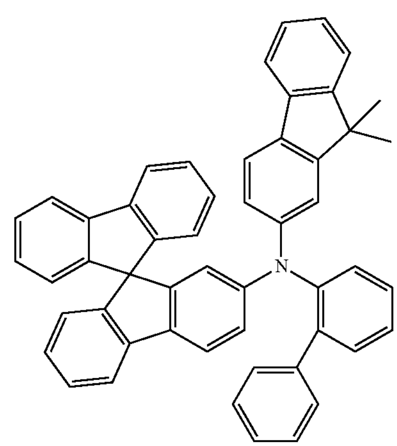

-continued
H2-66
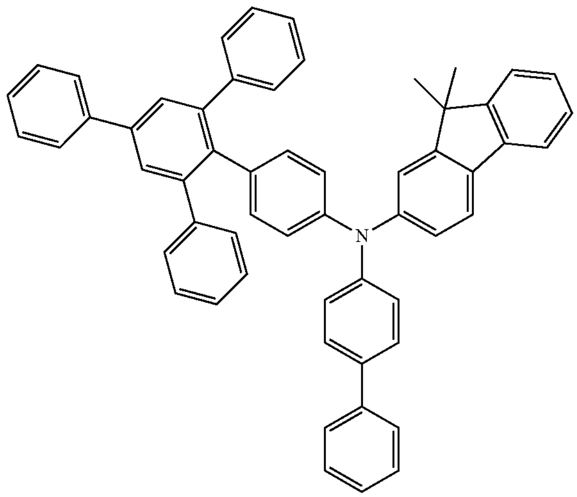
H2-67
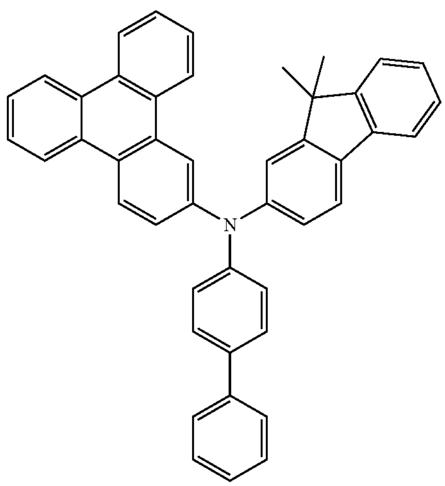
H2-68
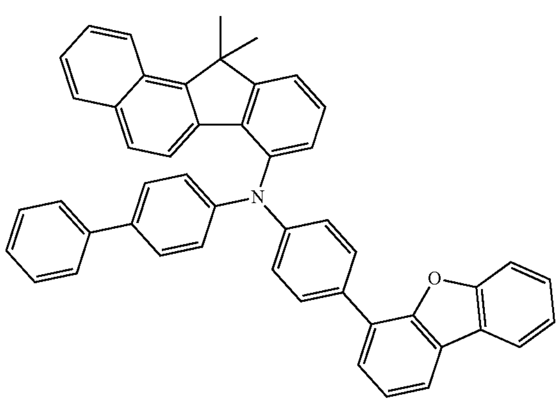
-continued
H2-69
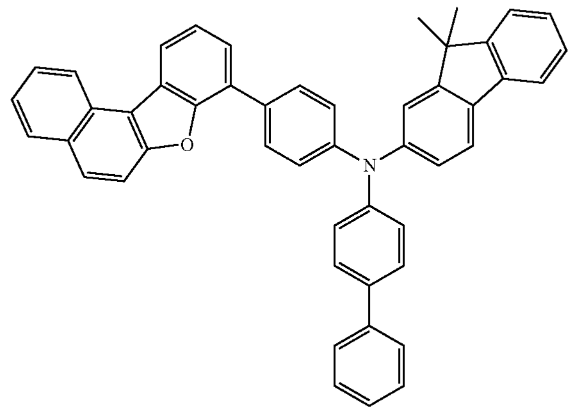
H2-70
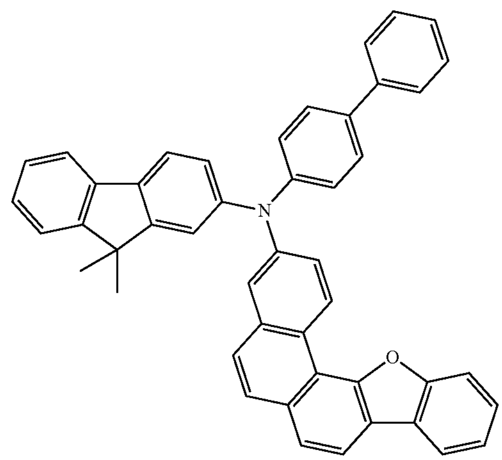
H2-71
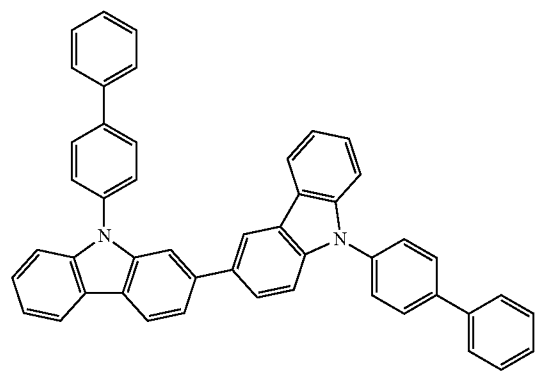
H2-72
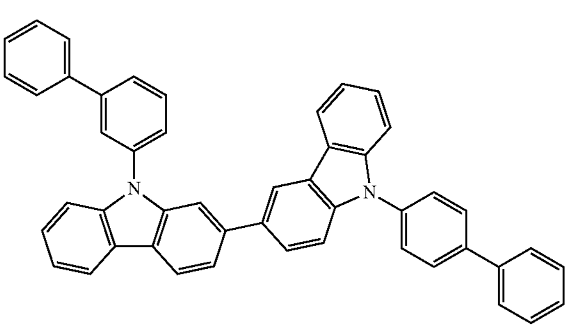

-continued

H2-73

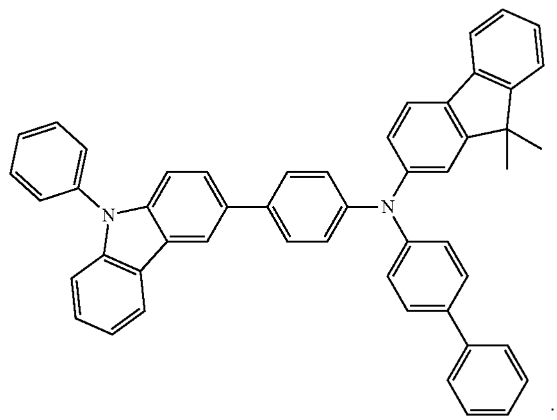

In one or more embodiments, the composition may satisfy Equation 1 and Equation 2:

$$HOMO(H2) > HOMO(D) \quad \text{Equation 1}$$

$$HOMO(H3) > HOMO(D). \quad \text{Equation 2}$$

In Equations 1 and 2,

HOMO (H2) is an absolute value of the HOMO energy level of the second compound,

HOMO (H3) is an absolute value of the HOMO energy level of the third compound, and HOMO (D) is an absolute value of the HOMO energy level of the Pt-containing organometallic compound.

In one or more embodiments, the difference between the absolute value of the HOMO energy level of the second compound and the absolute value of the HOMO energy level of the Pt-containing organometallic compound may be 0.05 eV to 0.6 eV, for example, 0.05 eV to 0.3 eV, and the difference between the absolute value of the HOMO energy level of the third compound and the absolute value of the HOMO energy level of the Pt-containing organometallic compound may be 0.05 eV to 0.6 eV, for example, 0.05 eV to 0.3 eV.

A weight ratio of the second compound to the third compound may be 9:1 to 1:9, for example, 2:7 to 7:2, but embodiments of the present disclosure are not limited thereto.

The composition including the Pt-containing organometallic compound, the first compound, the second compound, and the third compound may be suitably used for an organic layer, for example, an emission layer, in the organic light-emitting device. Another aspect of the present disclosure provides an organic light-emitting device including: a first electrode; a second electrode; and an organic layer disposed between the first electrode and the second electrode and including an emission layer, wherein the organic layer includes the composition.

The organic light-emitting device includes the composition including the Pt-containing organometallic compound, the first compound, the second compound, and the third compound so that the organic light-emitting device may have improved external quantum luminescence efficiency, improved driving voltage, and improved lifespan characteristics.

The composition may be used between a pair of electrodes of the organic light-emitting device. For example, the emission layer may include the composition. Here, the Pt-containing organometallic compound may serve as a dopant, and the first compound, the second compound, and the third compound may each serve as a host.

The organic light-emitting device including the composition may emit red light, green light, or blue light. For example, the organic light-emitting device including the composition may emit green light, but embodiments of the present disclosure are not limited thereto.

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one or more embodiments, in the organic light-emitting device, the first electrode may be an anode, the second electrode may be a cathode, and the organic layer may further include a hole transport region between the first electrode and the emission layer and an electron transport region between the emission layer and the second electrode, wherein the hole transport region includes a hole injection layer, a hole transport layer, an electron blocking layer, or any combination thereof, and the electron transport region includes a hole blocking layer, an electron transport layer, an electron injection layer, or any combination thereof.

The term "organic layer" as used herein refers to a single layer and/or a plurality of layers between the first electrode and the second electrode of the organic light-emitting device. The "organic layer" may include, in addition to an organic compound, an organometallic complex including a metal.

The FIGURE is a schematic cross-sectional view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by, for example, depositing or sputtering a material for forming the first electrode 11 on the substrate. The first electrode 11 may be an anode. The material for forming the first electrode 11 may comprise a material with a high work function to facilitate hole injection. The first electrode 11 may be a reflective electrode, a semi-reflective electrode, or a transmissive electrode. The material for forming the first electrode 11 may be, for example, indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only a hole injection layer or only a hole transport layer. In one or more embodiments, the hole transport region may have a hole injection layer/hole transport layer structure or a hole injection layer/hole transport layer/electron blocking layer structure, which are sequentially stacked in this stated order from the first electrode 11. For example, the hole transport layer comprises at least two layer.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When the hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

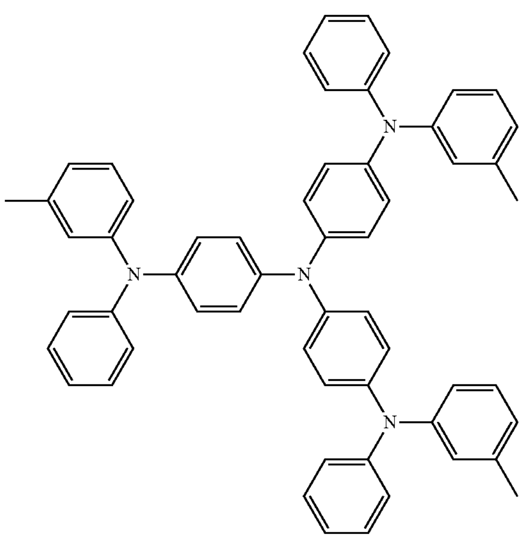

m-MTDATA

-continued

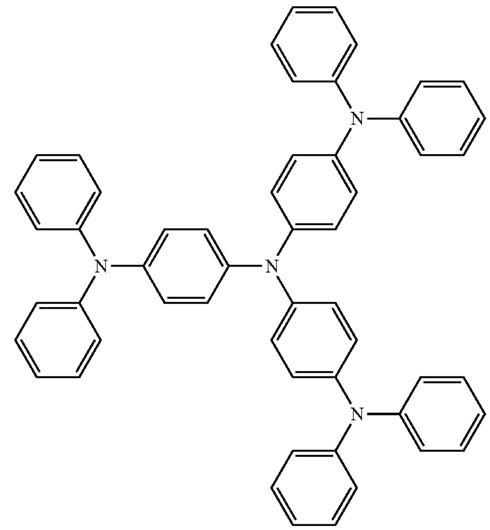

TDATA

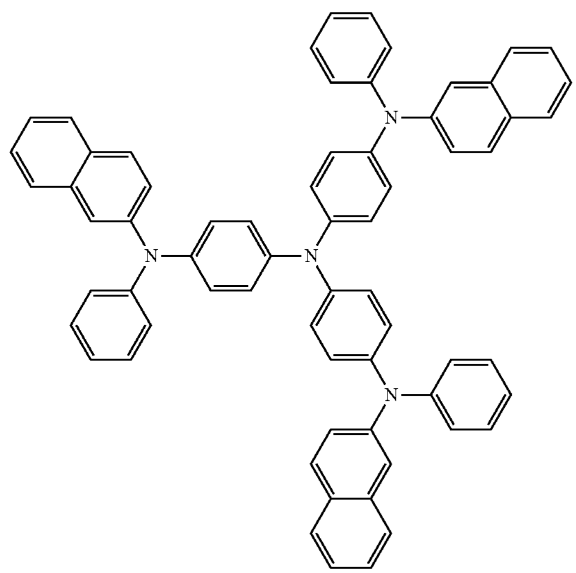

2-TNDATA

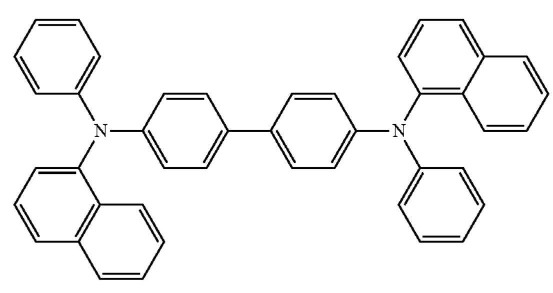

NPB

-continued
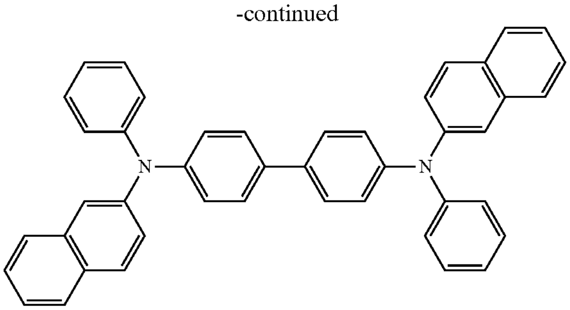
β-NPB
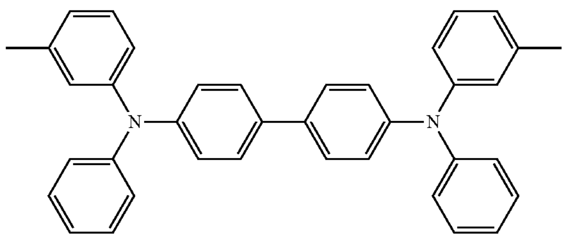
TPD
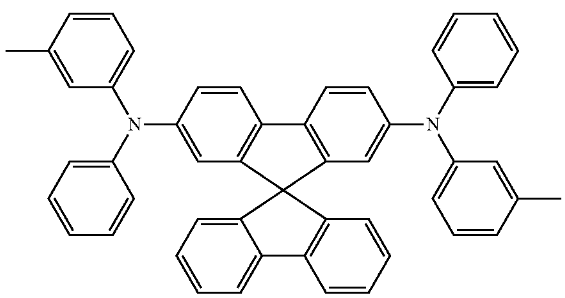
Spiro-TPD
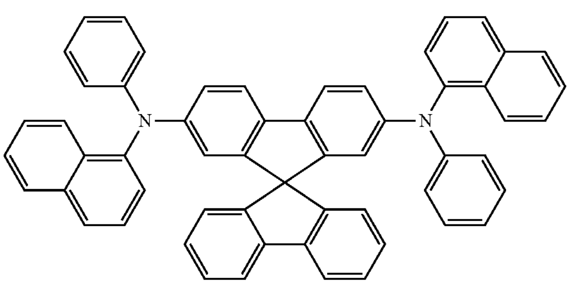
Spiro-NPB
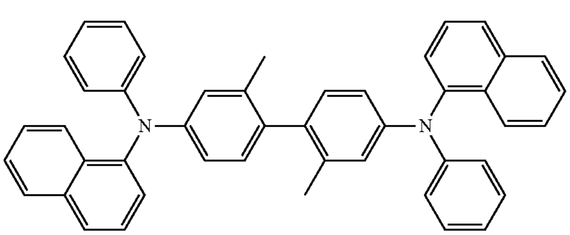
methylated NPB
-continued
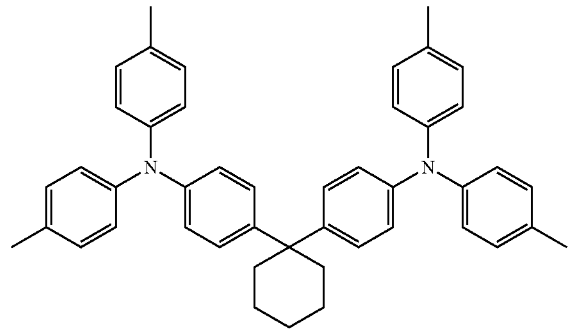
TAPC
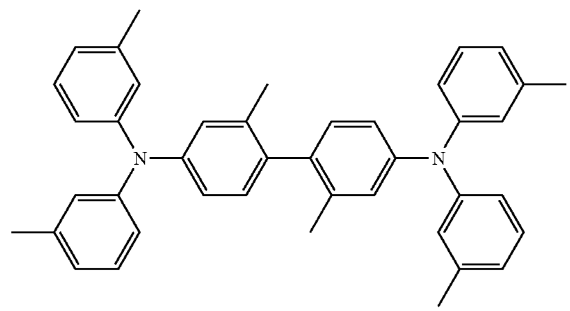
HMTPD
Formula 201
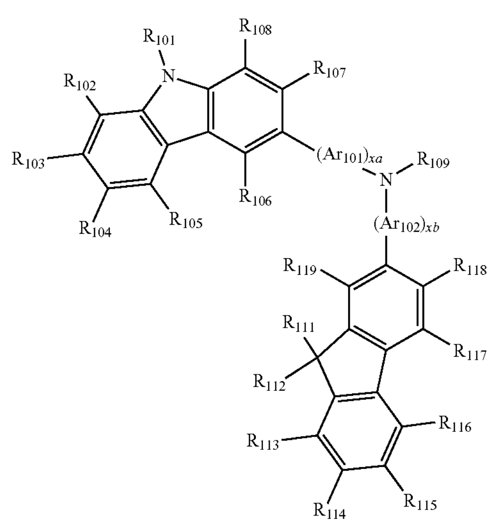
Formula 202
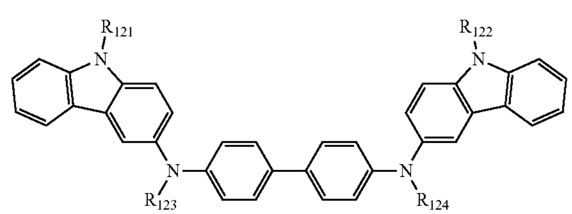

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 201, xa and xb may each independently be an integer from 0 to 5, or may be 0, 1, or 2. For example, xa may be 1 and xb may be 0, but xa and xb are not limited thereto.

$R_{101}$ to $R_{108}$, $R_{111}$ to $R_{119}$, and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and the like), or a $C_1$-$C_{10}$ alkoxy group (for example, a methoxy group, an ethoxy group, a propoxy group, a butoxy group, a pentoxy group, and the like);

a $C_1$-$C_{10}$ alkyl group or a $C_1$-$C_{10}$ alkoxy group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group, or a salt thereof, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof, but embodiments of the present disclosure are not limited thereto.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one or more embodiments, the compound represented by Formula 201 may be represented by Formula 201A, but embodiments of the present disclosure are not limited thereto:

Formula 201A

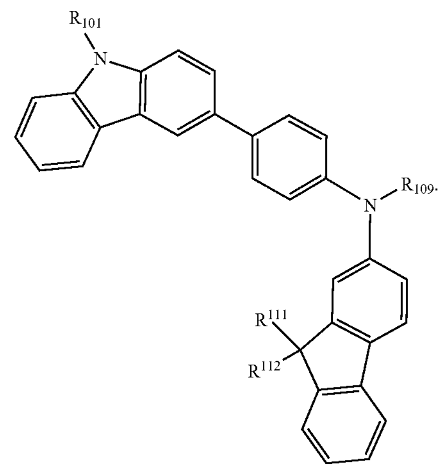

In Formula 201A, $R_{101}$, $R_{111}$, $R_{112}$, and $R_{109}$ may each be the same as described above.

For example, the compound represented by Formula 201 and the compound represented by Formula 202 may each be one of Compounds HT1 to HT20 or any combination thereof, but embodiments of the present disclosure are not limited thereto:

HT1

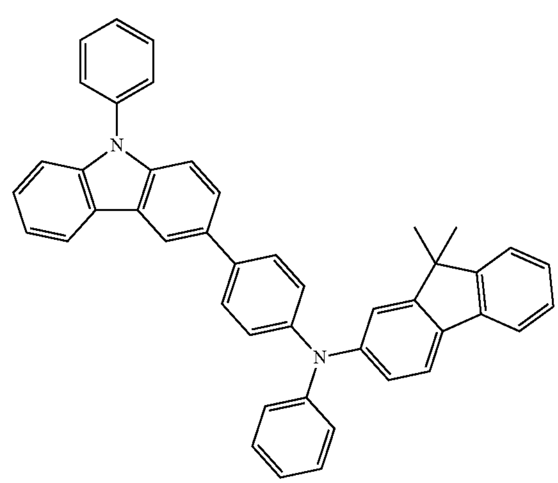

HT2
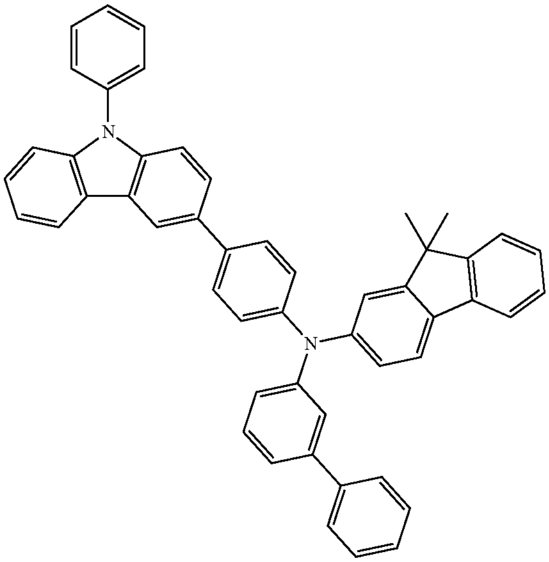
HT3
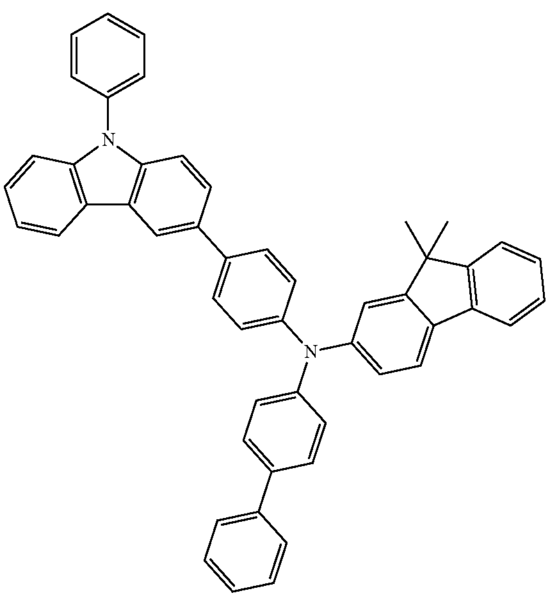
HT4
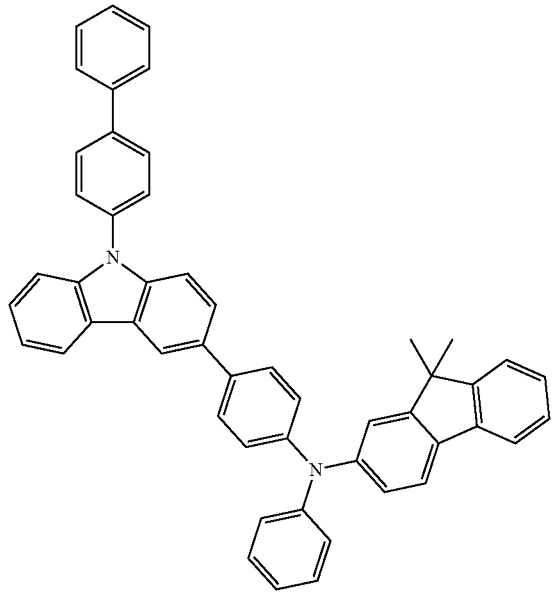
HT5
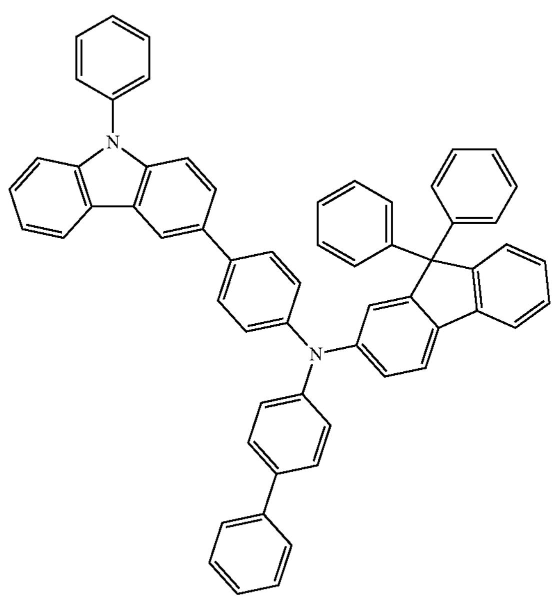

-continued
HT6
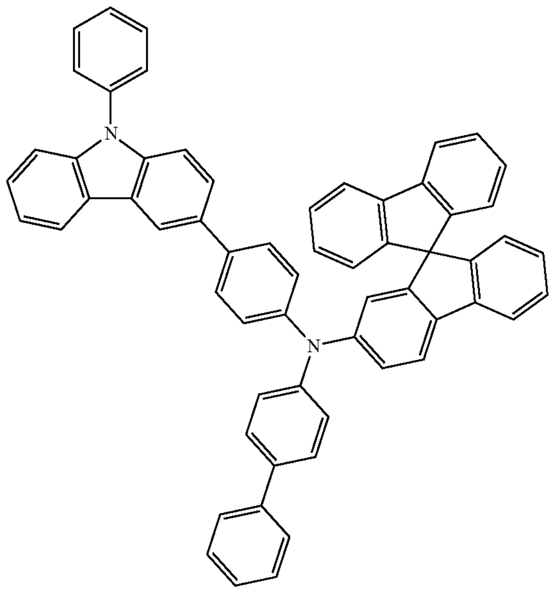
HT7
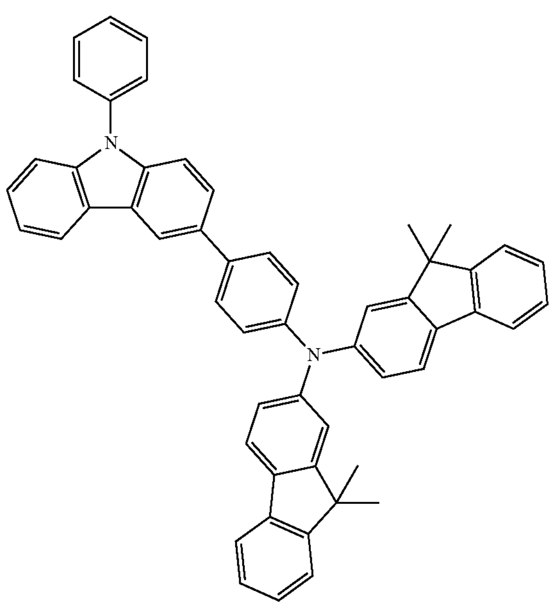
-continued
HT8
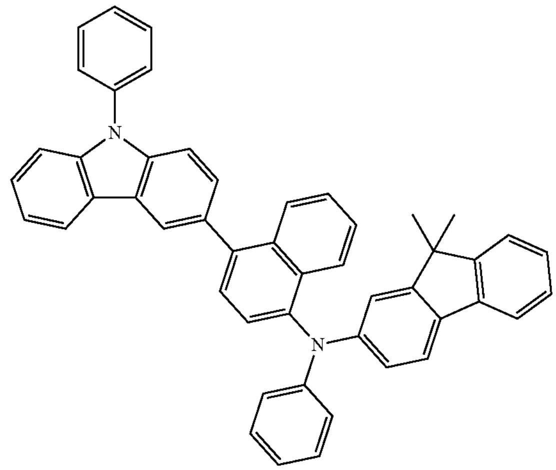
HT9
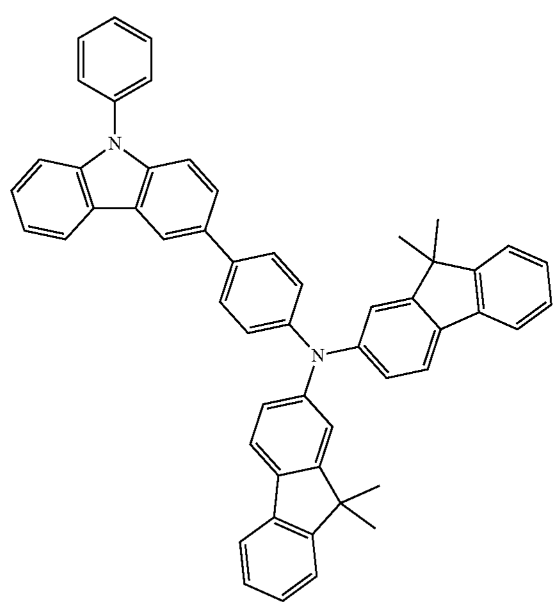

HT10
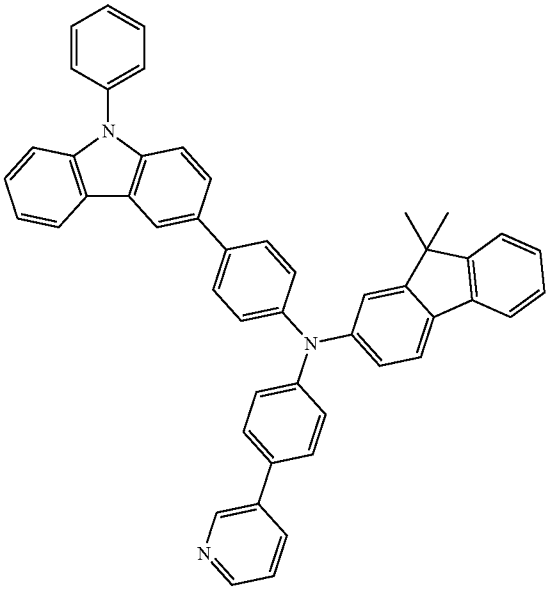
HT11
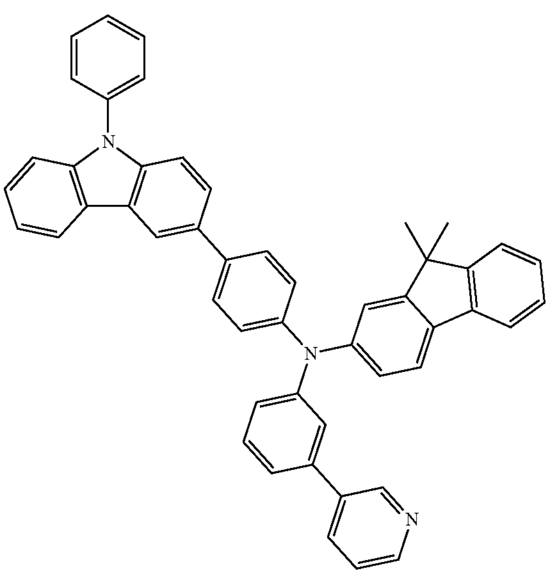
HT12
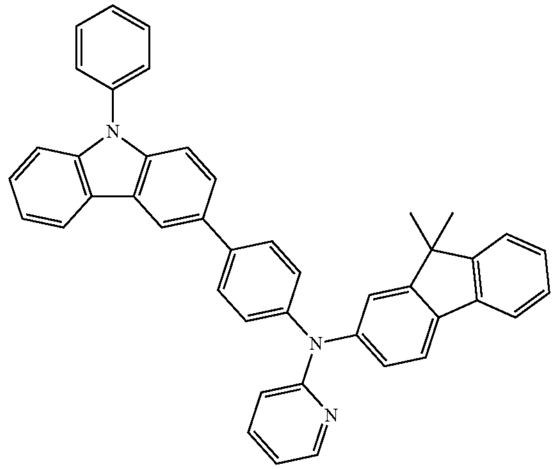
HT13
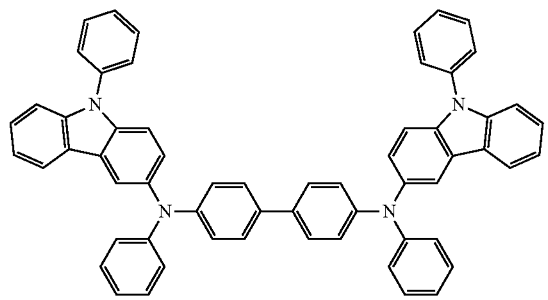
HT14
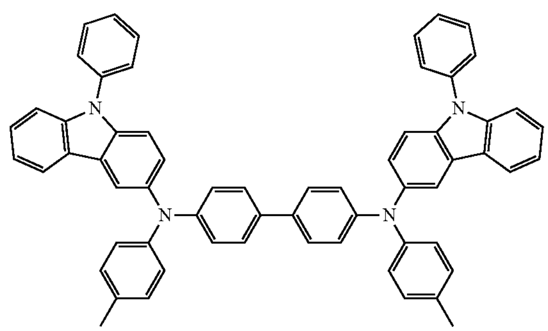
HT15
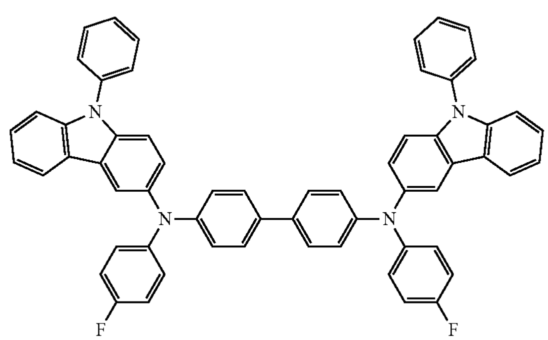

-continued

HT16

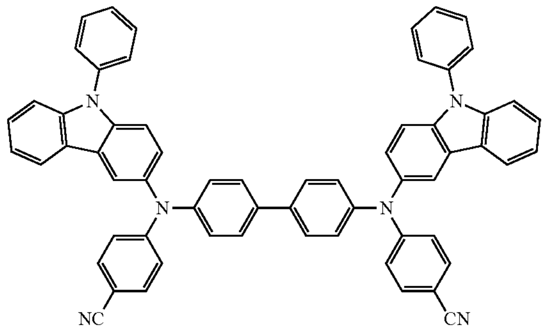

HT17

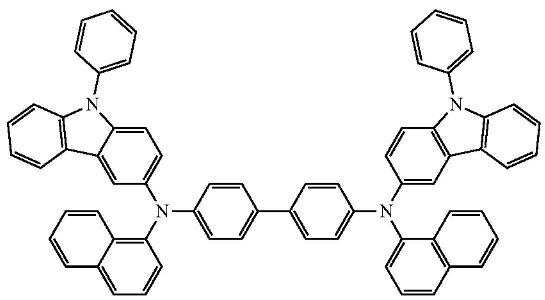

HT18

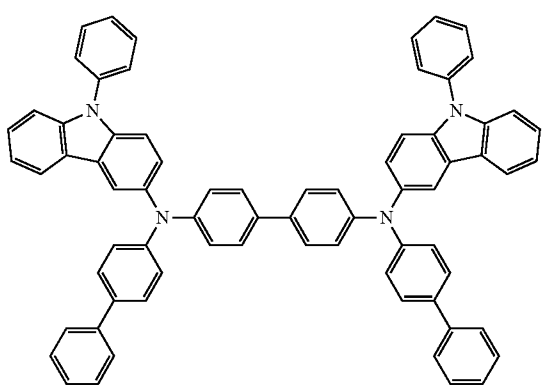

HT19

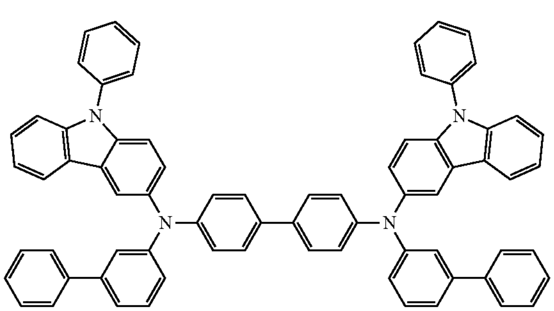

-continued

HT20

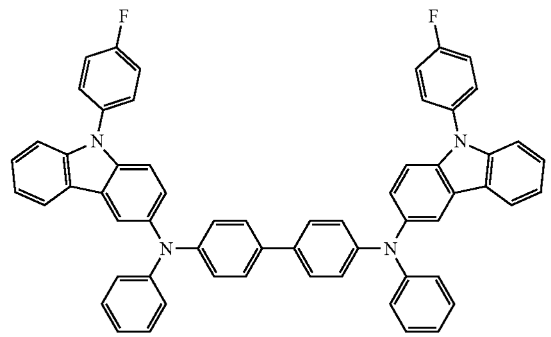

A thickness of the hole transport region may be from about 100 Å to about 10,000 Å, for example, about 100 Å to about 3,000 Å. When the hole transport region includes a hole injection layer, a hole transport layer, or any combination thereof, a thickness of the hole injection layer may be in a range of about 100 Å to about 10000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may comprise a quinone derivative, a metal oxide, a cyano group-containing compound, or any combination thereof, but embodiments of the present disclosure are not limited thereto. Non-limiting examples of the p-dopant are a quinone derivative, such as tetracyanoquinodimethane (TCNQ), 2,3,5,6-tetrafluoro-tetracyano-1,4-benzoquinonedimethane (F4-TCNQ) or F6-TCNNQ; a metal oxide, such as a tungsten oxide or a molybdenum oxide; and a cyano group-containing compound, such as Compound HT-D1 below, but are not limited thereto:

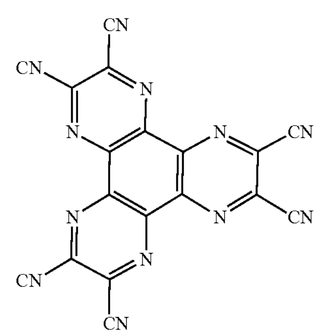

HT-D1

-continued

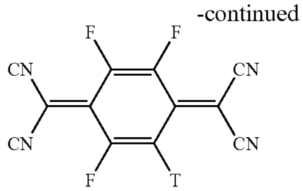

F4-TCNQ

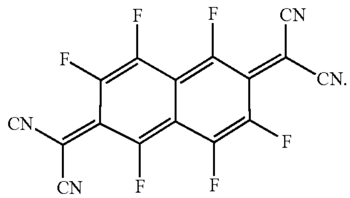

F6-TCNNQ

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for the electron blocking layer may comprise a material for the hole transport region described above, a material for a host to be explained later, or any combination thereof. However, the material for the electron blocking layer is not limited thereto. For example, when the hole transport region includes an electron blocking layer, a material for the electron blocking layer may be mCP, which will be explained later.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

The emission layer may include the composition including the Pt-containing organometallic compound, the first compound, the second compound, and the third compound.

For example, the emission layer may include a dopant and a host, wherein the dopant includes the Pt-containing organometallic compound, and the host includes the first compound, the second compound, and the third compound.

Meanwhile, the emission layer may further include, in addition to the composition, another dopant and/or another host.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 20 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

An electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAlq, or any combination thereof, but embodiments of the present disclosure are not limited thereto:

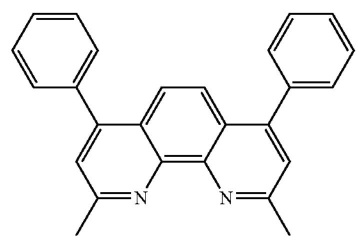

BCP

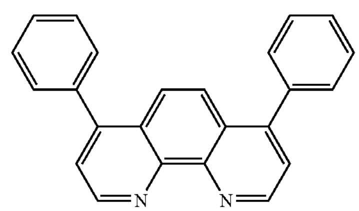

Bphen

A thickness of the hole blocking layer may be from about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer may include BOP, Bphen, $Alq_3$, BAlq, TAZ, NTAZ, or any combination thereof:

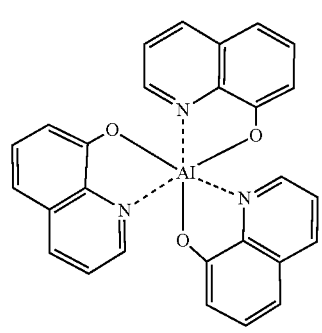

$Alq_3$

-continued
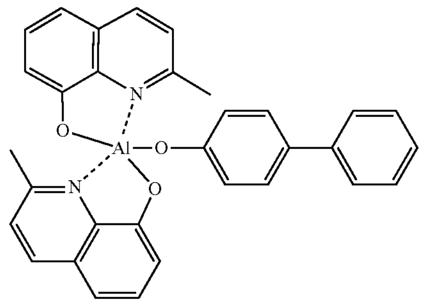
BAIq
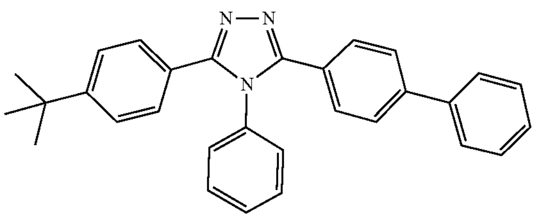
TAZ
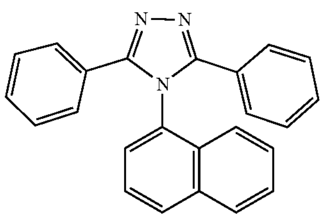
NTAZ
In one or more embodiments, the electron transport layer may include one of ET1 and ET25, or any combination thereof, but are not limited thereto:
ET1
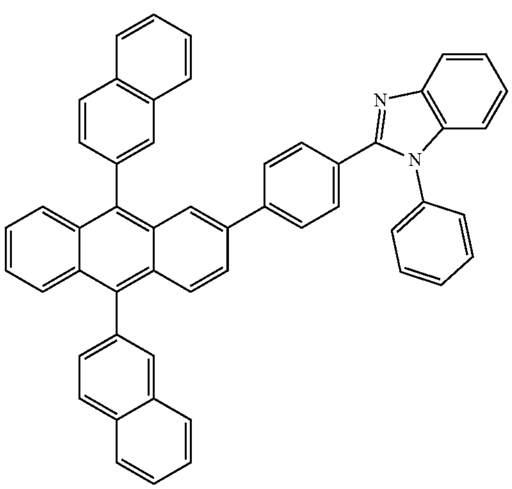
-continued
ET2
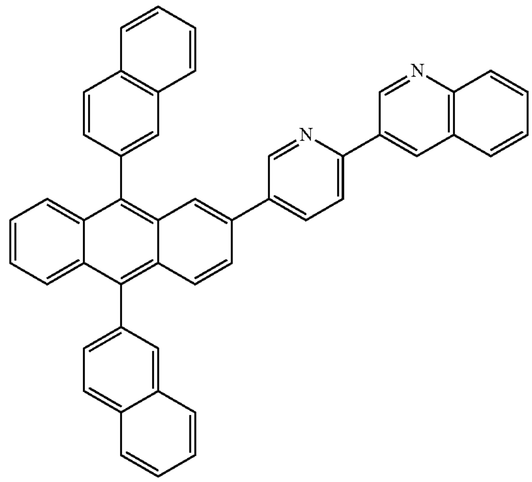
ET3
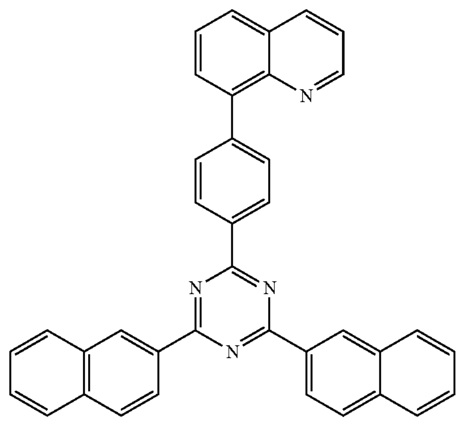
ET4
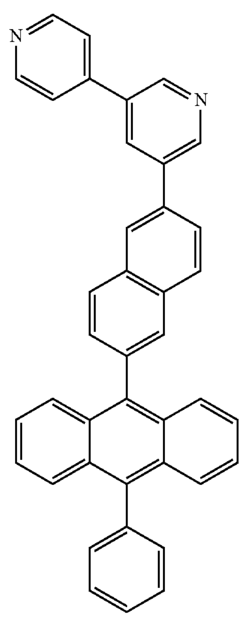

-continued
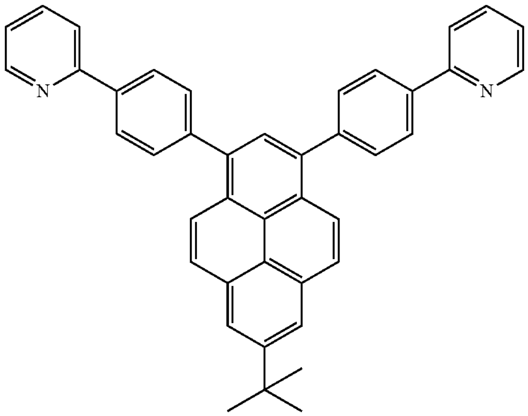
ET5
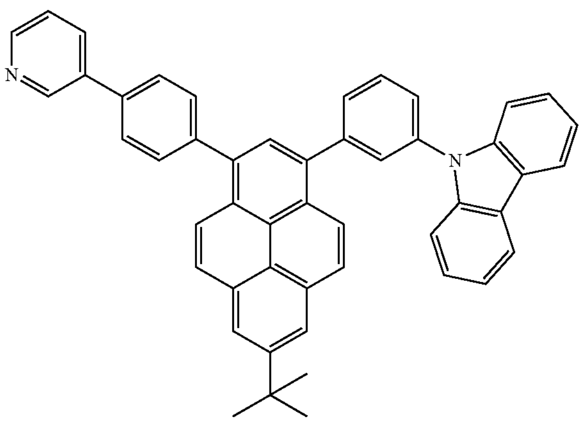
ET6
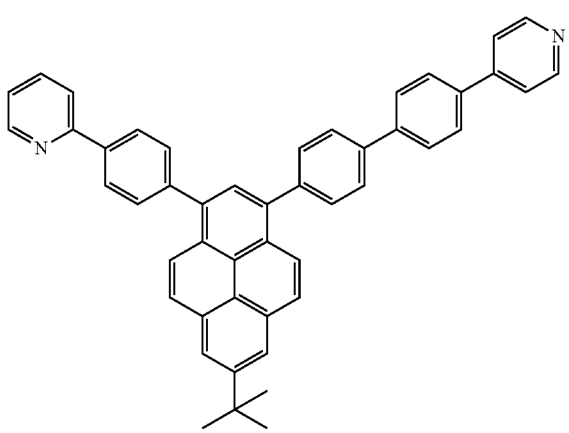
ET7
-continued
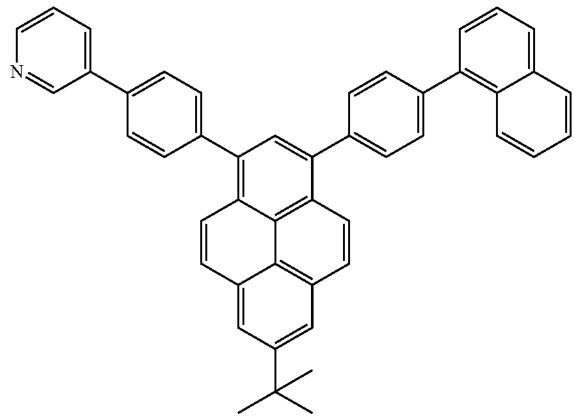
ET8
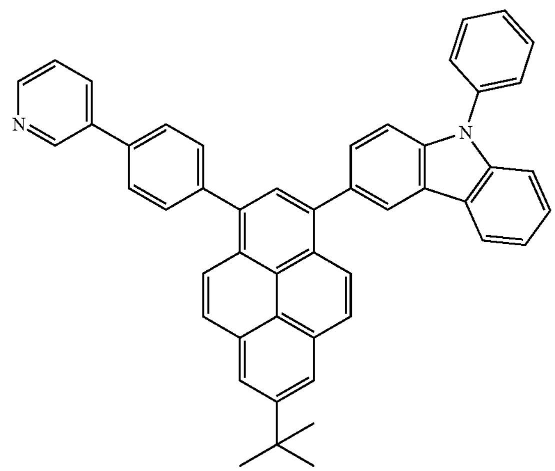
ET9
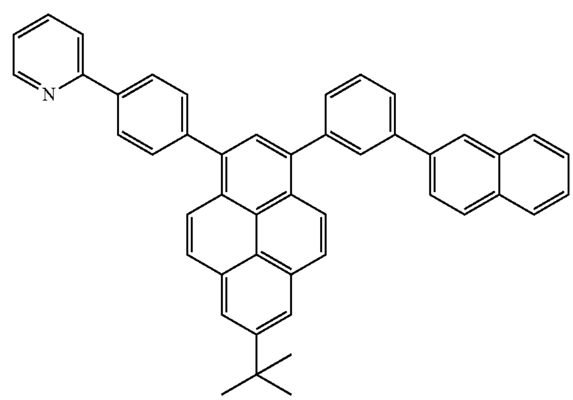
ET10
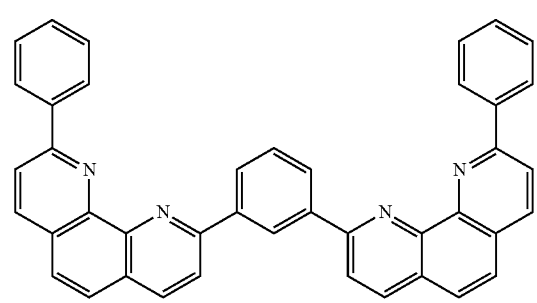
ET11

-continued
ET12
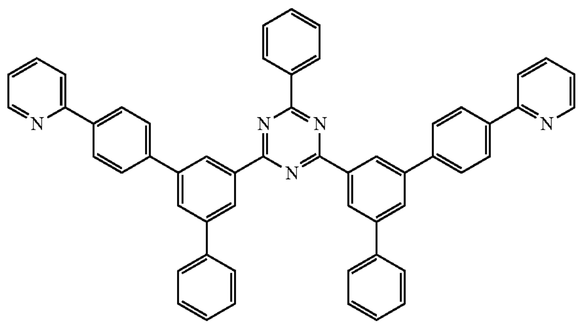
ET13
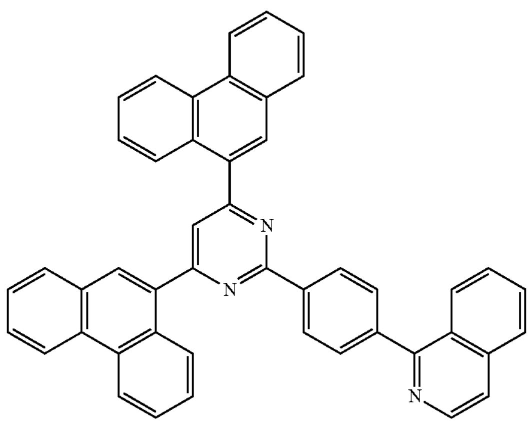
ET14
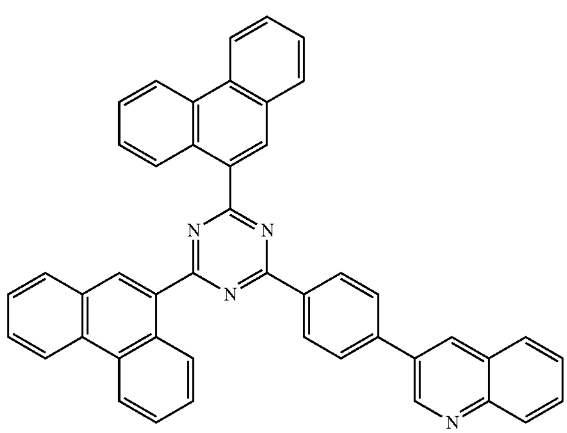
ET15
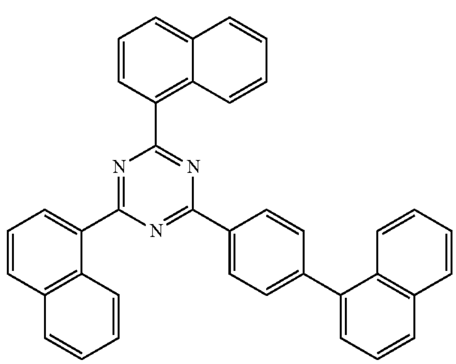
-continued
ET16
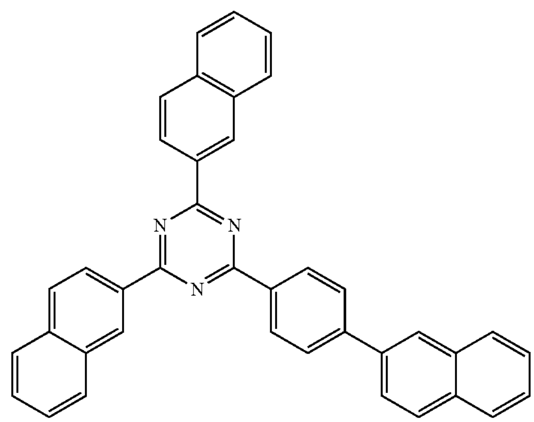
ET17
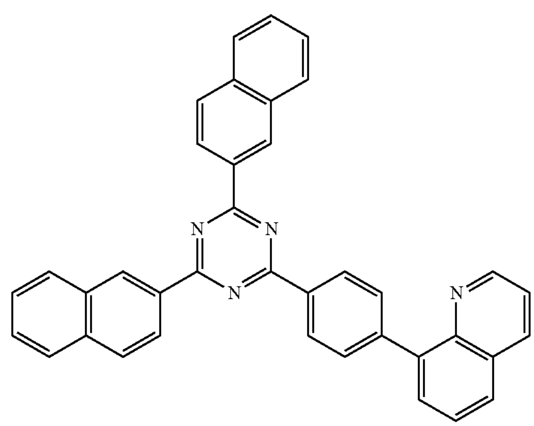
ET18
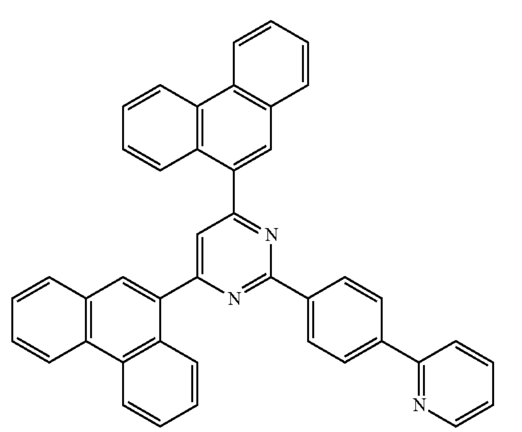

ET19
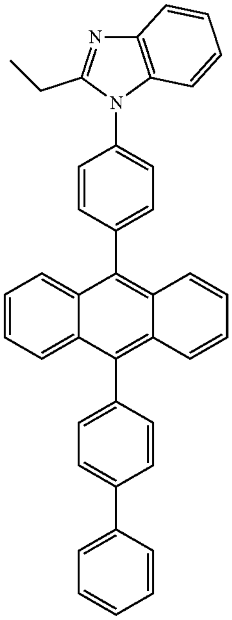
ET20
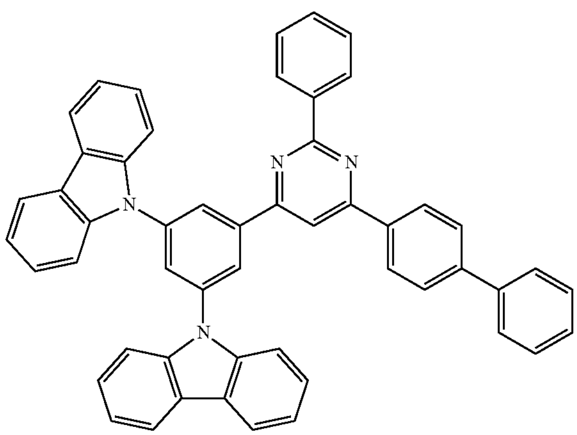
ET21
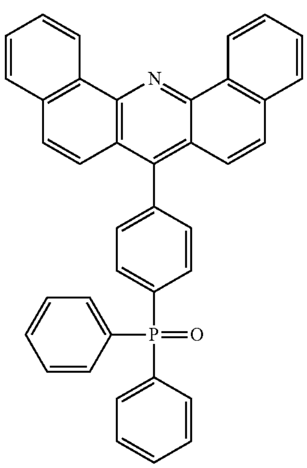
ET22
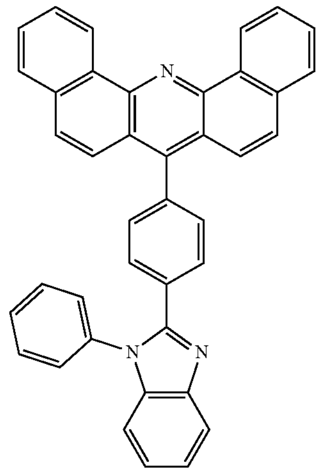
ET23
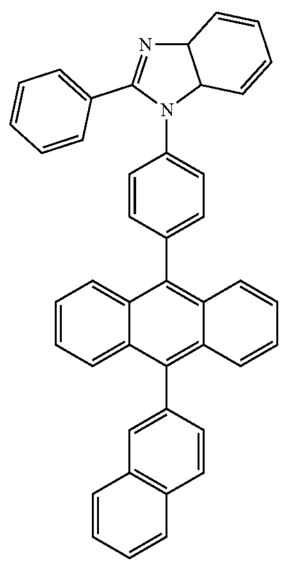
ET24
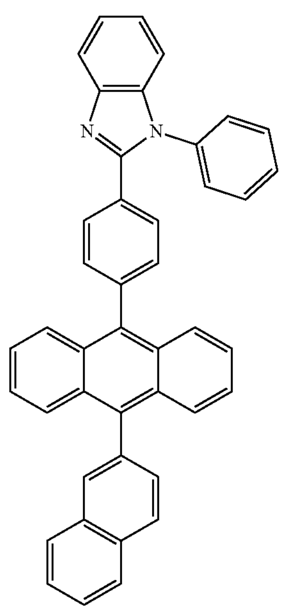

-continued

ET25

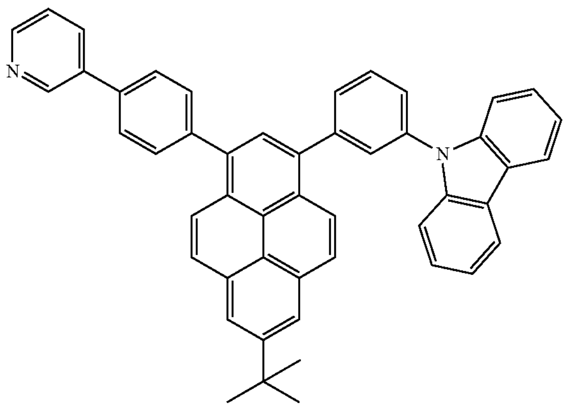

A thickness of the electron transport layer may be from about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. For example, the Li complex may comprise ET-D1(Liq), ET-D2, or any combination thereof:

ET-D1

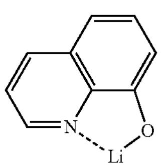

ET-D2

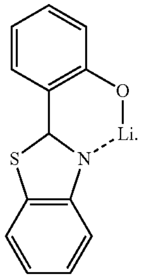

The electron transport region may include an electron injection layer that promotes flow of electrons from the second electrode 19 thereinto.

The electron injection layer may include LiF, a NaCl, CsF, $Li_2O$, BaO, or any combination thereof.

A thickness of the electron injection layer may be from about 1 Å to about 100 Å, for example, about 3 Å to about 90 Å. When a thickness of the electron injection layer is within these ranges, satisfactory electron injection characteristics may be obtained without substantial increase in driving voltage.

The second electrode 19 is disposed on the organic layer 15. The second electrode 19 may be a cathode. A material for forming the second electrode 19 may comprise a metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. To manufacture a top-emission type light-emitting device, a transmissive electrode formed using ITO or IZO may be used as the second electrode 19.

Hereinbefore, the organic light-emitting device according to an embodiment has been described in connection with the FIGURE.

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_2$-$C_{10}$ heterocycloalkyl group" as used herein refers to a monovalent saturated monocyclic group having at least one N, O, P, Si, Se, Ge, B, or S as a ring-forming atom and 2 to 10 carbon atoms, and non-limiting examples thereof include a tetrahydrofuranyl group, and a tetrahydrothiophenyl group. The term "$C_2$-$C_{10}$ heterocycloalkylene group" as used herein refers to a divalent group having the same structure as the $C_2$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one N, O, P, Si, Se, Ge, B, or S as a ring-forming atom, 2 to 10 carbon atoms, and at least one double bond in its ring. Examples of the $C_2$-$C_{10}$ heterocycloalkenyl group are a 2,3-dihydrofuranyl group, and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "($C_1$-$C_{10}$ alkyl)carbazolyl group," as used herein refers to a carbazole group substituted with a $C_1$-$C_{10}$ alkyl group.

The term "di($C_1$-$C_{10}$ alkyl)'X' group" as used herein refers to a 'X' group substituted with two $C_1$-$C_{10}$ alkyl groups.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a cyclic aromatic system that has at least one N, O, P, Si, Se, Ge, B, or S as a ring-forming atom, in addition to 1 to 60 carbon atoms. The term "$C_1$-$C_{60}$ heteroarylene group" as used herein refers to a divalent group having a cyclic aromatic system that has at least one N, O, P, Si, Se, Ge, B, or S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" used herein indicates —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom N, O, P, Si, Se, Ge, B, or S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, Se, Ge, B, or S other than 1 to 30 carbon atoms. The $C_1$-$C_{30}$ heterocyclic group may be a monocyclic group or a polycyclic group.

A substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(=O)(Q_{28})(Q_{29})$, or any combination thereof;

—$N(Q_{31})(Q_{32})$, —$Si(Q_{33})(Q_{34})(Q_{35})$, —$B(Q_{36})(Q_{37})$, or —$P(=O)(Q_{38})(Q_{39})$, or any combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_2$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

Hereinafter, the compound and the organic light-emitting device according to embodiments are described in detail with reference to Synthesis Example and Examples, but are not limited thereto. The wording "'B' was used instead of 'A'" as used in describing Synthesis Example means that an amount of 'A' used was identical to an amount of 'B' used, in terms of a molar equivalent.

EXAMPLES

Synthesis Example 1 (Synthesis of Compound 3-348)

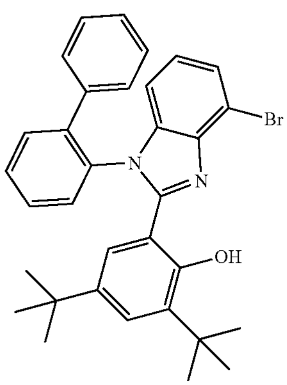

3-348A

+

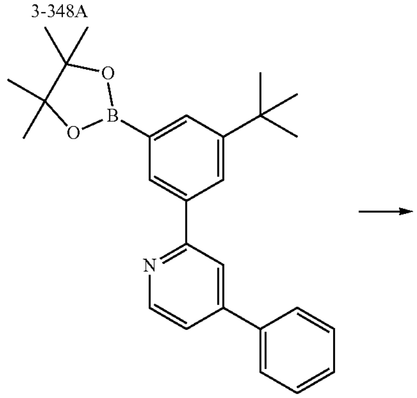

3-348B

-continued

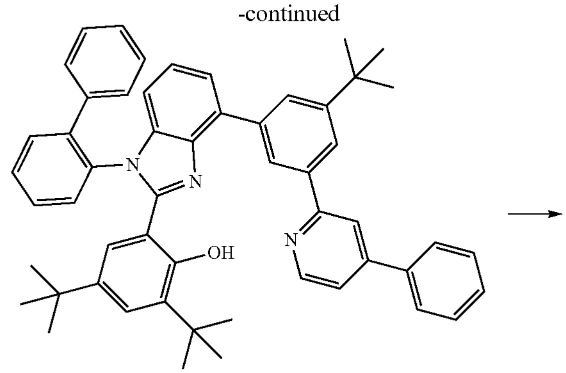

3-348C

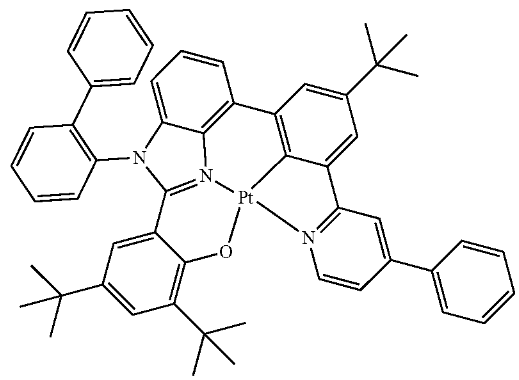

3-348

Synthesis of Ligand 3-348C 2.1 g (0.005 mmol, 1.2 equiv.) of Intermediate 3-348B, 2.2 g (0.004 mol, 1 equiv.) of Intermediate 3-348A (i.e., 2-(1-([1,1'-biphenyl]-2-yl)-4-bromo-1H-benzo[d]imidazol-2-yl)-4,6-di-tert-butylphenol), 1.2 g (0.001 mmol, 0.07 equiv.) of tetrakis(triphenylphosphine)palladium (0), and 1.7 g (0.012 mmol, 3 equiv.) of potassium carbonate were dissolved in 20 mL of a solvent in which tetrahydrofuran (THF) and distilled water ($H_2O$) were mixed at a volume ratio of 3:1, and the mixed solution was refluxed for 12 hours. A temperature of the product obtained therefrom was cooled down to room temperature, and a precipitate was filtered. A resulting filtrate was washed with ethylene acetate (EA)/$H_2O$, and then, subjected to column chromatography (while increasing a volume rate of EN hexane (Hex) to between 20% and 35%), thereby obtaining 2.0 g (yield: 72%) of Ligand 3-348C. The product was identified by Mass Spectrum and HPLC.

HRMS(MALDI) calcd for $C_{54}H_{53}N_3O$: m/z 759.4189, Found: 759.4182.

Synthesis of Compound 3-348

2.0 g (2.38 mmol) of Ligand 3-348C and 0.98 g (2.38 mmol, 1.0 equiv.) of $K_2PtCl_4$ were dissolved in 80 mL of a solvent in which 60 mL of acetic acid (AcOH) was mixed with 20 mL of $H_2O$, and the mixed solution was refluxed for 16 hours. A temperature of the product obtained therefrom was cooled down to room temperature, and a precipitate was filtered and dissolved again in methylene chloride (MC). A resulting filtrate was washed with $H_2O$, and then, subjected to column chromatography (MC 40%, EA 1%, Hex 59%), thereby obtaining 1.1 g (purity: 99% or more, actual yield: 71%) of Compound 3-348. The product was identified by Mass Spectrum and HPLC.

HRMS(MALDI) calcd for $C_{54}H_{51}N_3OPt$: m/z 952.3680, Found: 952.3678.

Synthesis Example 2 (Synthesis of Compound 3-583)

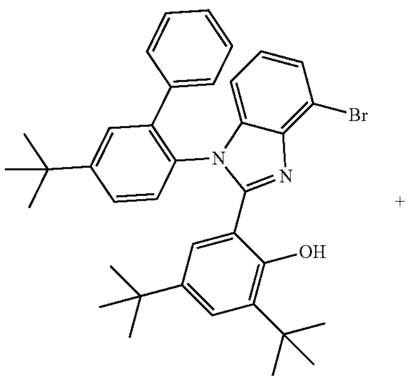

3-583A

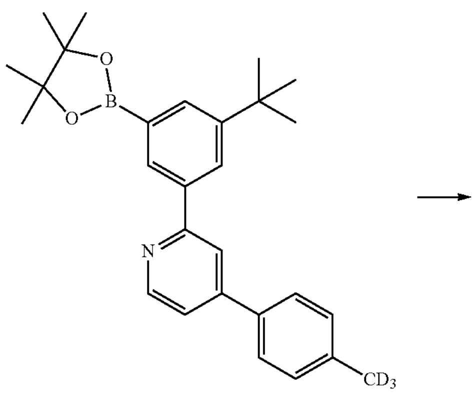

3-583B

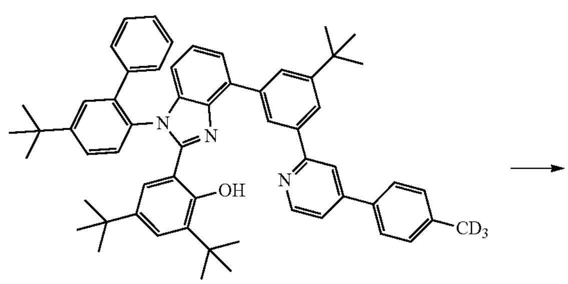

3-583C

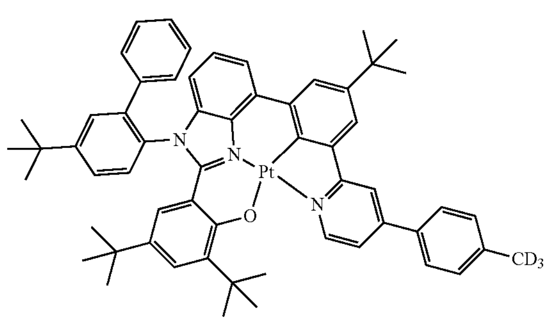

3-583

Synthesis of Ligand 3-583C 2.2 g (0.005 mmol, 1.2 equiv.) of Intermediate 3-583B, 2.4 g (0.004 mol, 1 equiv.) of Intermediate 3-583A (i.e., 2-(4-bromo-1-(5-(tert-butyl)-[1,1'-biphenyl]-2-yl)-1H-benzo[d]imidazol-2-yl)-4,6-di-tert-butylphenol), 1.2 g (0.001 mol, 0.07 equiv.) of tetrakis(triphenylphosphine) palladium (0), and 2.0 g (0.015 mol, 3.7 equiv.) of potassium carbonate were dissolved in 80 mL of a solvent in which THF and distilled water ($H_2O$) were mixed at a ratio of 3:1, and the mixed solution was refluxed for 12 hours. A temperature of the product obtained therefrom was cooled down to room temperature, and a precipitate was filtered. A resulting filtrate was washed with EA/$H_2O$, and then, subjected to column chromatography (gradient elution with EA/Hex 20%-35%), thereby obtaining 2.2 g (yield: 68%) of Ligand 3-583C. The product was identified by Mass Spectrum and HPLC.

HRMS(MALDI) calcd for $C_{59}H_{60}D_3N_3O$: m/z 832.5159, Found: 832.5161.

Synthesis of Compound 3-583

2.2 g (2.26 mmol) of Ligand 3-583C and 1.1 g (2.26 mmol, 1.0 equiv.) of $K_2PtCl_4$ were dissolved in 80 mL of a solvent in which 60 mL of AcOH was mixed with 20 mL of $H_2O$, and the mixed solution was refluxed for 16 hours. A temperature of the product obtained therefrom was cooled down to room temperature, and a precipitate was filtered and dissolved again in MC. A resulting filtrate was washed with $H_2O$, and then, subjected to column chromatography (MC 40%, EA 1%, Hex 59%), thereby obtaining 1.0 g (purity: 99% or more, actual yield: 68%) of Compound 3-583. The product was identified by Mass Spectrum and HPLC.

HRMS(MALDI) calcd for $C_{59}H_{58}D_3N_3OPt$: m/z 1025.4651, Found: 1025.4653.

Evaluation Example 1

HOMO energy levels of the compounds below were measured using a photoelectron spectrometer (for example, AC3 manufactured by RIKEN KEIKI Co., Ltd.) in air, and the results are shown in Table 1.

TABLE 1

| Compound | Actual measurement of HOMO energy level (eV) |
|---|---|
| 3-348 | −5.45 |
| 3-583 | −5.43 |
| H1-15 | −5.95 |
| H1-63 | −6.07 |
| H1-65 | −6.12 |
| H1-75 | −6.07 |
| HA1 | −5.71 |
| H2-2 | −5.58 |
| H2-71 | −5.69 |
| H2-72 | −5.65 |
| HA2 | −5.35 |
| HA3 | −6.00 |

-continued
3-348
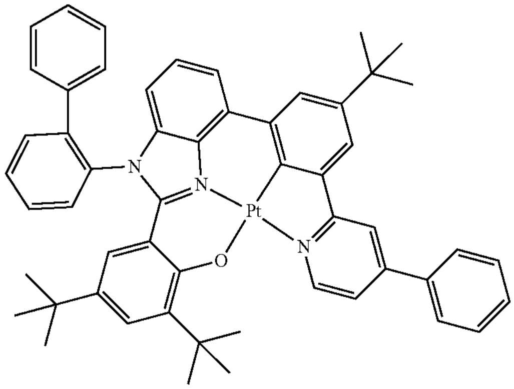
3-583
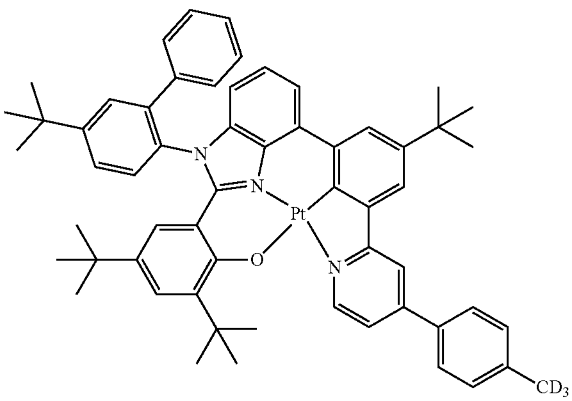
H1-15
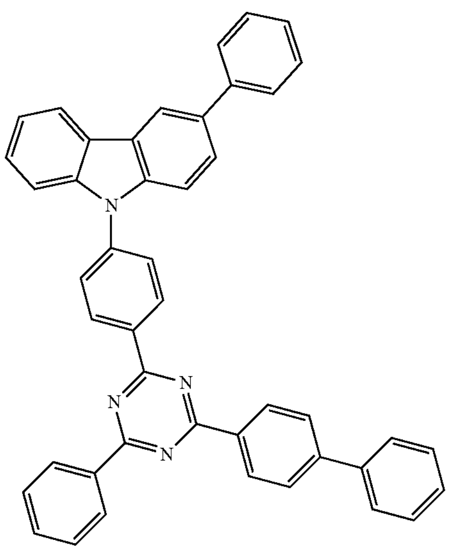
H1-63
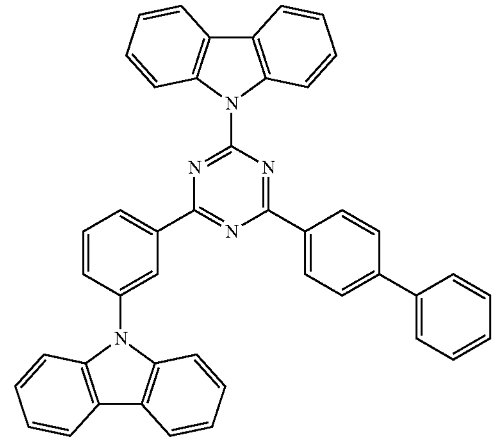
H1-65
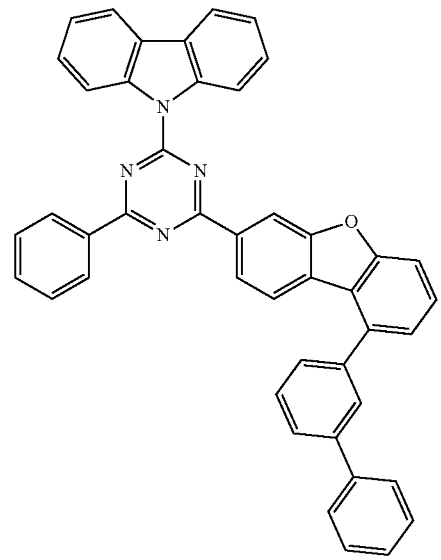
H1-75
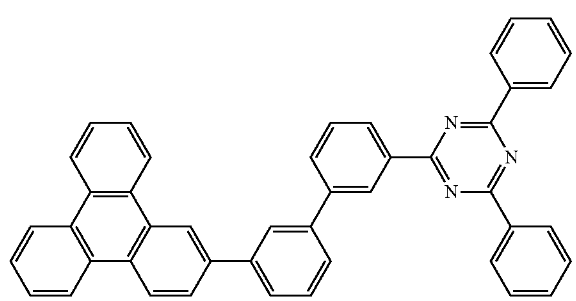

-continued

H2-2

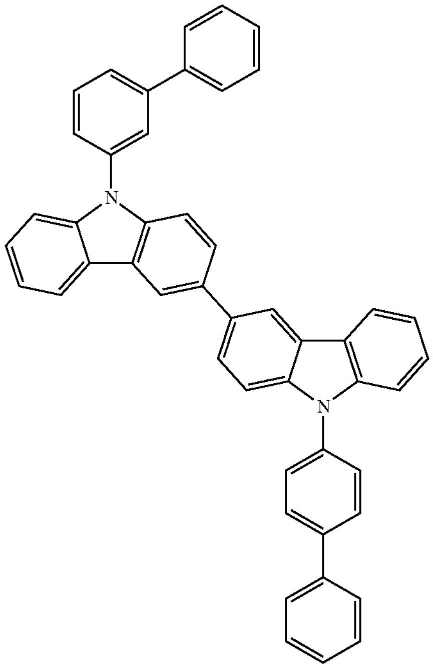

H2-71

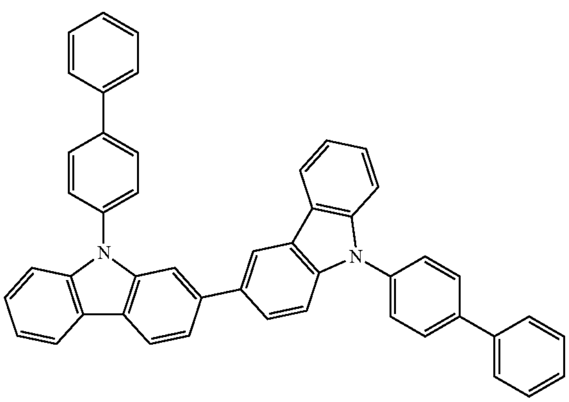

H2-72

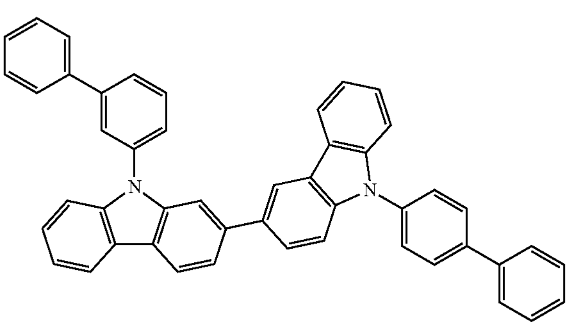

-continued

HA1

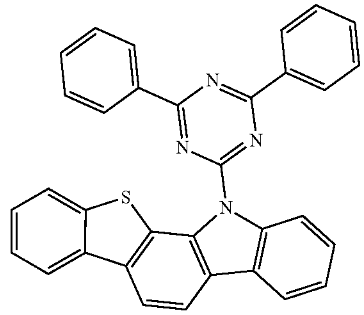

HA2

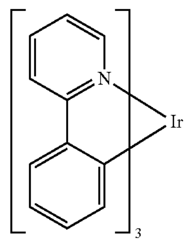

HA3

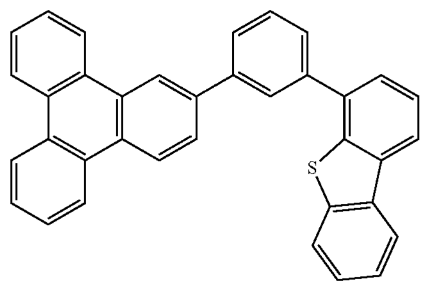

Example 1

A glass substrate on which an ITO electrode was prepared, was cut to a size of 50 mm×50 mm×0.5 mm, sonicated with acetone, isopropyl alcohol and pure water each for 15 minutes, and then, cleaned by exposure to ultraviolet rays and ozone for 30 minutes. Next, F6-TCNNQ was deposited on the ITO electrode (i.e., an anode) of the glass substrate to form a hole injection layer having a thickness of 100 Å, HT3 was deposited on the hole injection layer to form a first hole transport layer having a thickness of 1,260 Å, F6-TCNNQ and HT3 were co-deposited at a weight ratio of 5:95 on the first hole transport layer to form a second hole transport layer having a thickness of 100 Å, and HT3 was deposited on the second hole transport layer to form a third hole transport layer having a thickness of 300 Å.

Then, a host and a dopant were co-deposited at a weight ratio of 85:15 on the third hole transport layer to form an emission layer having a thickness of 400 Å. Here, as the host, a first compound (e.g., Compound H1-63), a second compound (e.g., Compound $H_2$-2), and a third compound (e.g., Compound H2-72) (wherein a weight ratio of the first compound, the second compound, and the third compound was 3:3.5:3.5), and as the dopant, Compound 3-348 was used.

Next, Compounds ET1 and ET-D1 were co-deposited at a weight ratio of 5:5 on the emission layer to form an electron transport layer having a thickness of 360 Å, LiF was deposited on the electron transport layer to form an electron injection layer having a thickness of 5 Å, Al was vacuum-deposited on the electron injection layer to form a second electrode (i.e., a cathode) having a thickness of 800 Å, thereby completing the manufacture of an organic light-emitting device having a structure of ITO/F6-TCNNQ (100 Å)/HT3 (1260 Å)/HT3: F6-TCNNQ (5 wt %) (100 Å)/HT3 (300 Å)/host: dopant (15 wt %) (400 Å)/ET1: ET-D1 (50 wt %) (360 Å)/LiF (5 Å)/Al (800 Å):

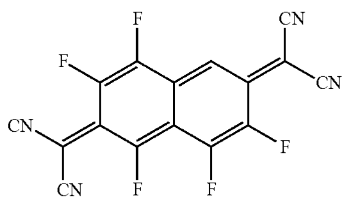

F6-TCNNQ

HT3

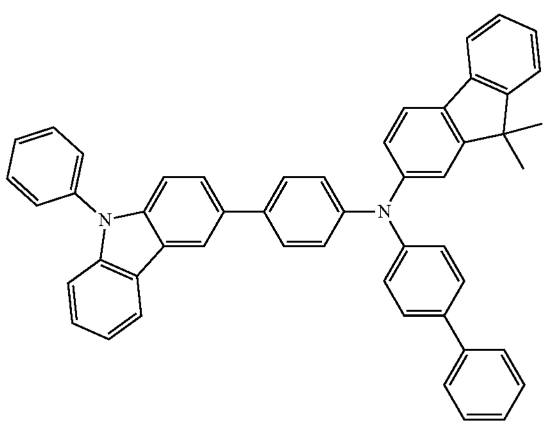

-continued

ET1

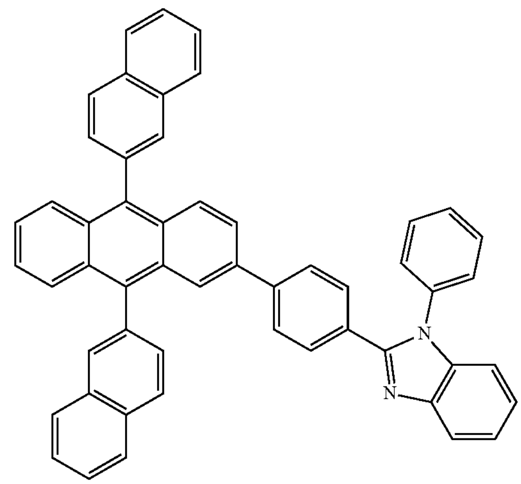

ET-D1

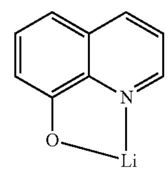

Example 2 and Comparative Examples 1 to 4

Organic light-emitting devices were manufactured in the same manner as in Example 1, except that compounds listed in Table 2 were each used as a host and a dopant in forming an emission layer.

Evaluation Example 2

The external quantum luminescence efficiency (EQE), driving voltage, and lifespan ($T_{95}$) of the organic light-emitting devices manufactured according to Examples 1 and 2 and Comparative Examples 1 to 4 were evaluated, and the results are shown in Table 2. Here, as a device used for the evaluation, a current-voltage meter (Keithley 2400) and a luminance meter (Minolta Cs-1000A) were used. The lifespan ($T_{95}$) (at 16,000 nit) was obtained by evaluating time (hr) that lapsed when luminance was 95% of initial luminance (100%). The EQE and the lifespan ($T_{95}$) were both measured at luminance of 16,000 cd/m$^2$.

TABLE 2

| | | Host | | | | | | |
|---|---|---|---|---|---|---|---|---|
| | Dopant | First compound | Second compound | Third compound | Difference (eV) between absolute value of HOMO energy level of second compound and absolute value of HOMO energy level of third compound | EQE (%) | Driving voltage (V) | Lifespan ($T_{95}$ at 16,000 nit) (hr) |
| Example 1 | 3-348 | H1-63 | H2-2 | H2-72 | 0.07 | 24.1 | 3.9 | 380 |
| | | Weight ratio = 3:3.5:3.5 | | | | | | |
| Example 2 | 3-348 | H1-63 | H2-2 | H2-71 | 0.11 | 23.4 | 4.0 | 375 |
| | | Weight ratio = 3:3:4 | | | | | | |
| Comparative Example 1 | 3-348 | H1-63 | H2-2 | — | — | 23.8 | 3.9 | 250 |
| | | Weight ratio = 4:6 | | | | | | |
| Comparative Example 2 | 3-348 | H1-63 | — | H2-72 | — | 23.1 | 4.4 | 365 |
| | | Weight ratio = 2.5:7.5 | | | | | | |
| Comparative Example 3 | 3-348 | H1-65 | H2-2 | — | — | 23.6 | 4.0 | 280 |
| | | Weight ratio = 4:6 | | | | | | |

TABLE 2-continued
| | Dopant | Host: First compound | Host: Second compound | Host: Third compound | Host: Difference (eV) between absolute value of HOMO energy level of second compound and absolute value of HOMO energy level of third compound | EQE (%) | Driving voltage (V) | Lifespan ($T_{95}$ at 16,000 nit) (hr) |
|---|---|---|---|---|---|---|---|---|
| Comparative Example 4 | 3-348 | HA1 | HA2 | HA3 | 0.65 | 19.5 | 4.3 | 20 |
| | | Weight ratio = 4:2:4 | | | | | | |
3-348
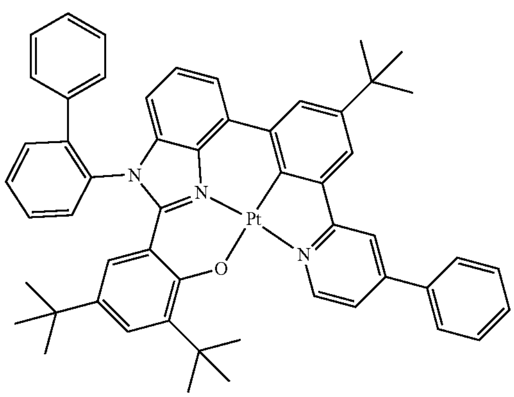
H1-63
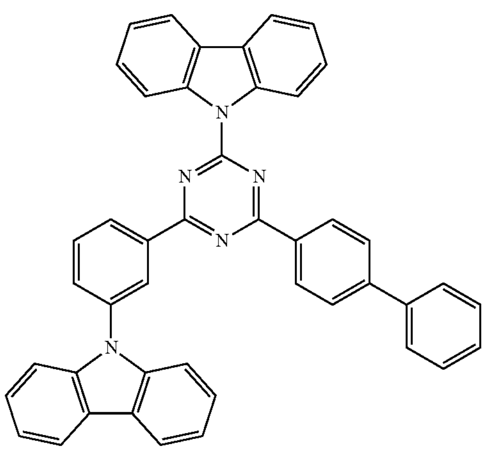
H1-65
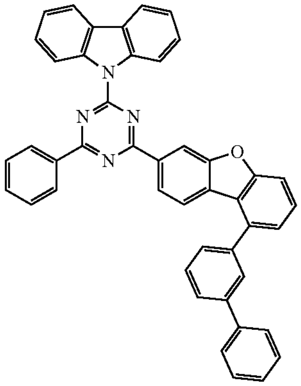
-continued
H2-2
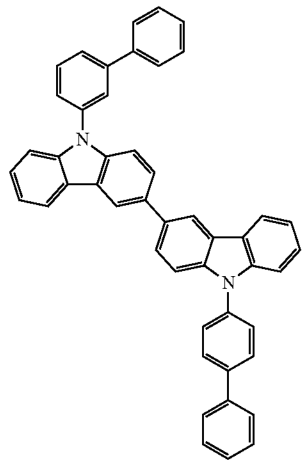
H2-71
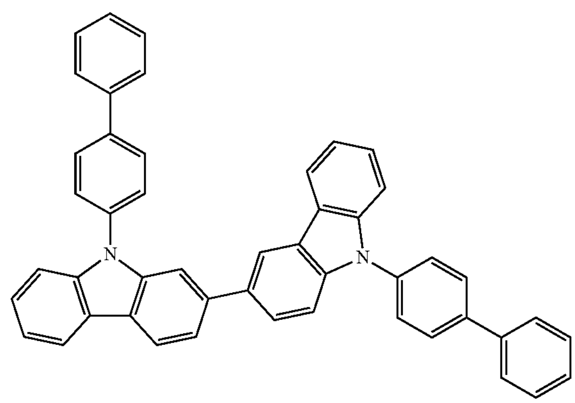
H2-72
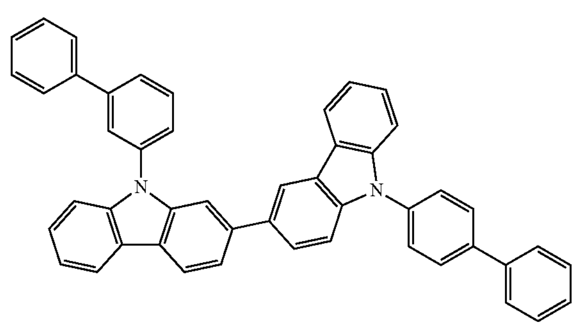

-continued

HA1

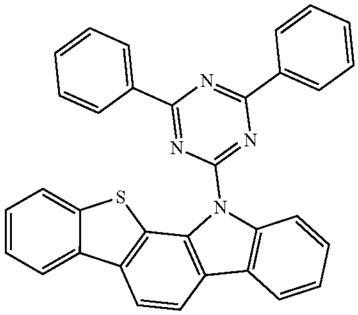

HA2

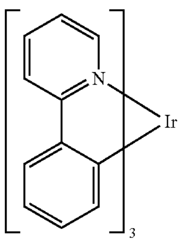

-continued

HA3

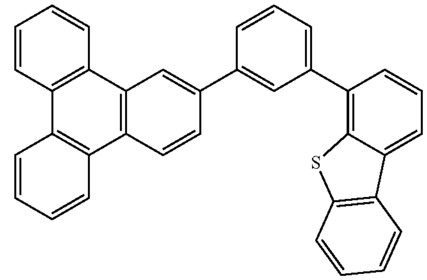

Referring to Table 2, it was confirmed that the organic light-emitting devices of Examples 1 and 2 had high EQE, low driving voltage, and long lifespan characteristics, as compared with the organic light-emitting devices of Comparative Examples 1 to 4.

Examples 3 and 4

Organic light-emitting devices were manufactured in the same manner as in Examples 1 and 2, respectively, except that, Compound 3-583 was used instead of Compound 3-348 as a dopant in forming an emission layer.

Evaluation Example 3

The EQE, driving voltage, and lifespan ($T_{95}$) of the organic light-emitting devices of Examples 3 and 4 were evaluated in the same manner as in Evaluation Example 2, and the results are shown in Table 3.

TABLE 3

| | | Host | | | | | | |
|---|---|---|---|---|---|---|---|---|
| | Dopant | First compound | Second compound | Third compound | Difference (eV) between absolute value of HOMO energy level of second compound and absolute value of HOMO energy level of third compound | EQE (%) | Driving voltage (V) | Lifespan ($T_{95}$ at 16,000 nit) (hr) |
| Example 3 | 3-583 | H1-63 | H2-2 | H2-72 | 0.07 | 25.5 | 3.8 | 500 |
| | | Weight ratio = 3:3.5:3.5 | | | | | | |
| Example 4 | 3-583 | H1-63 | H2-2 | H2-71 | 0.11 | 24.4 | 3.9 | 510 |
| | | Weight ratio = 3:3:4 | | | | | | |

3-583

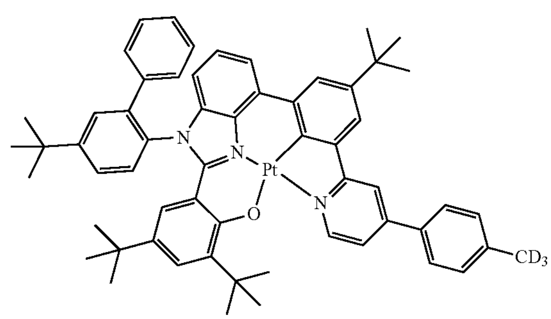

Referring to Table 3, it was confirmed that the organic light-emitting devices of Examples 3 and 4 had excellent EQE, excellent driving voltage, and excellent lifespan characteristics.

According to the one or more embodiments, the composition has excellent electric characteristics and excellent stability, and thus, an electronic device, for example, an organic light-emitting device, including the composition may have improved external quantum luminescence efficiency, improved driving voltage, and improved lifespan characteristics.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope as defined by the following claims.

What is claimed is:

1. A composition comprising a platinum-containing organometallic compound, a first compound, a second compound, and a third compound, wherein the composition does not comprise iridium, the Pt-containing organometallic compound, the first compound, the second compound, and the third compound are different from each other, the first compound comprises at least one electron transport moiety, the second compound and the third compound do not include a metal, each of an absolute value of a HOMO energy level of the second compound and an absolute value of a HOMO energy level of the third compound is 5.30 eV to 5.85 eV, the difference between the absolute value of the HOMO energy level of the second compound and the absolute value of the HOMO energy level of the third compound is 0.01 eV to 0.30 eV, and each of the HOMO energy level of the second compound and the HOMO energy level of the third compound is measured using a photoelectron spectrometer in air.

2. The composition of claim 1, wherein the Pt-containing organometallic compound comprises Pt and a tetradentate organic ligand, wherein the Pt and the tetradentate organic ligand form 3 or 4 cyclometallated rings.

3. The composition of claim 2, wherein the tetradentate organic ligand comprises a benzimidazole group and a pyridine group.

4. The composition of claim 1, wherein an absolute value of the HOMO energy level of the Pt-containing organometallic compound is 5.25 eV to 5.55 eV, and the HOMO energy level of the Pt-containing organometallic compound is measured using a photoelectron spectrometer in air.

5. The composition of claim 1, wherein the electron transport moiety is a cyano group, a fluoro group, a π-electron-deficient nitrogen-containing cyclic group, a group represented by one of the following formulae, or any combination thereof:

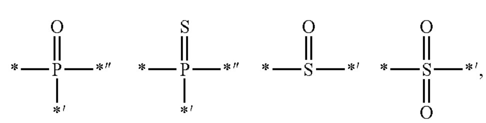

wherein, in the formulae above, *, *', and *" each indicate a binding site to a neighboring atom.

6. The composition of claim 1, wherein at least one of the second compound and the third compound does not include an electron transport moiety.

7. The composition of claim 1, wherein at least one of the second compound and the third compound independently comprises:

i) a condensed ring in which one or more fifth rings and one or more sixth rings are condensed with each other, ii) a group represented by

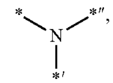

or iii) any combination thereof, the fifth ring is a cyclopentadiene group, a pyrrole group, a furan group, a thiophene group, or a silole group, the sixth ring is a π-electron-rich $C_3$-$C_{30}$ cyclic group, and

*, *', and *" each indicate a binding site to a neighboring atom.

8. The composition of claim 1, wherein the Pt-containing organometallic compound is an organometallic compound represented by Formula 1, the first compound is a compound represented by Formula 2, or the second compound and the third compound are each independently represented by one of Formulae 3-1 to 3-4:

Formula 1

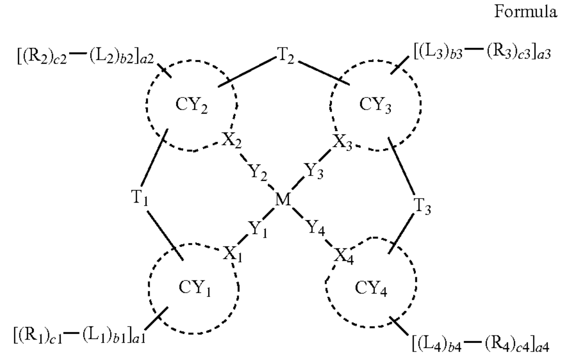

Formula 2

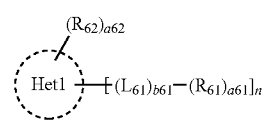

Formula 3-1

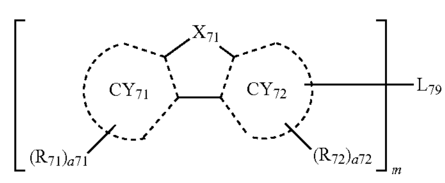

Formula 3-2

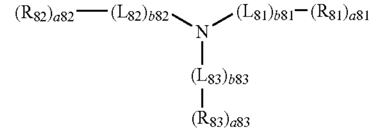

-continued

Formula 3-3

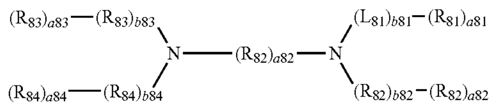

Formula 3-4

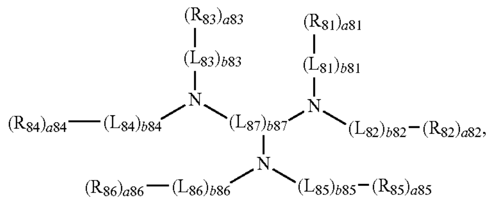

wherein, M in Formula 1 is Pt, $Y_1$ to $Y_4$ in Formula 1 are each independently a chemical bond, O, S, $N(R_a)$, $C(R_a)(R_b)$, or $Si(R_a)(R_b)$, $X_1$ to $X_4$ in Formula 1 are each independently C or N, ring $CY_1$ to ring $CY_4$ in Formula 1 are each independently a $C_5$-$C_{30}$ carbocyclic group or a $C_1$-$C_{30}$ heterocyclic group, $T_1$ in Formula 1 is a single bond, a double bond, *—N($R_{51}$)—*', *—B($R_{51}$)—*', *—P($R_{51}$)—*', *—C($R_{51}$)($R_{52}$)—*', *—Si($R_{51}$)($R_{52}$)—*', *—Ge($R_{51}$)($R_{52}$)—*', *—S—*', *—Se—*', *—O—*', *—C(=O)—*', *—S(=O)—*', *—S(=O)$_2$—*', *—C($R_{51}$)=*', *=C($R_{51}$)—*', *—C($R_{51}$)=C($R_{52}$)—*', *—C(=S)—*', or *—C≡C—*', $T_2$ in Formula 1 is a single bond, a double bond, *—N($R_{53}$)—*', *—B($R_{53}$)—*', *—P($R_{53}$)—*', *—C($R_{53}$)($R_{54}$)—*', *—Si($R_{53}$)($R_{54}$)—*', *—Ge($R_{53}$)($R_{54}$)—*', *—S—*', *—Se—*', *—O—*', *—C(=O)—*', *—S(=O)—*', *—S(=O)$_2$—*', *—C($R_{53}$)=*', *=C($R_{53}$)—*', *—C($R_{53}$)=C($R_{54}$)—*', *—C(=S)—*', or *—C≡C—*', $T_3$ in Formula 1 is a single bond, a double bond, *—N($R_{55}$)—*', *—B($R_{55}$)—*', *—P($R_{55}$)—*', *—C($R_{55}$)($R_{56}$)—*', *—Si($R_{55}$)($R_{56}$)—*', *—Ge($R_{55}$)($R_{56}$)—*', *—S—*',*—Se—*', *—C(=O)—*', *—S(=O)—*', *—S(=O)$_2$—*', *—C($R_{55}$)=*', *=C($R_{55}$)—*', *—C($R_{55}$)=C($R_{56}$)—*', *—C(=S)—*', or *—C≡C—*', Het1 in Formula 2 is a π-electron-deficient nitrogen-containing $C_1$-$C_{30}$ cyclic group, ring $CY_{71}$ and ring $CY_{72}$ in Formula 3-1 are each independently a π-electron-rich $C_3$-$C_{30}$ cyclic group, ring $CY_{71}$ and ring $CY_{72}$ in Formula 3-1 are optionally linked to each other via a π-electron-rich $C_3$-$C_{30}$ cyclic group unsubstituted or substituted with at least one $R_{10a}$, $X_{71}$ in Formula 3-1 is O, S, N-$(L_{75})_{b75}$-$(R_{75})_{a75}$, $C(R_{75})(R_{76})$, or $Si(R_{75})(R_{76})$, $L_{79}$ in Formula 3-1 is a single bond, or a π-electron-rich $C_3$-$C_{30}$ cyclic group unsubstituted or substituted with at least one $R_{10a}$; or absent, n in Formula 2 is one of an integer from 1 to 10, m in Formula 3-1 is 1, 2, or 3, wherein, when m is 1, $L_{79}$ is absent, $L_1$ to $L_4$, $L_{61}$, $L_{75}$, and $L_{81}$ to $L_{87}$ in Formulae 1, 2, and 3-1 to 3-4 are each independently a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, b1 to b4, b61, b75, and b81 to b87 in Formulae 1, 2, and 3-1 to 3-4 are each independently an integer from 1 to 10, $R_a$, $R_b$, $R_1$ to $R_4$, $R_{51}$ to $R_{56}$, $R_{61}$, $R_{62}$, $R_{71}$, $R_{72}$, $R_{75}$, $R_{76}$, and $R_{81}$ to $R_{86}$ in Formulae 1, 2, and 3-1 to 3-4 are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(=O)($Q_8$)($Q_9$), c1 to c4 in Formula 1 are each independently an integer from 1 to 10, a1 to a4, a61, a62, a71, a72, a75, and a81 to a86 in Formulae 1, 2, and 3-1 to 3-4 are each independently an integer from 0 to 20, two or more of $R_a$, $R_b$, $R_1$ to $R_4$, and $R_{51}$ to $R_{56}$ in Formula 1 are optionally linked to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $R_{10a}$ is the same as defined in connection with $R_1$,

* and *' each indicate a binding site to a neighboring atom, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(═O)($Q_{18}$)($Q_{19}$), or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(═O)($Q_{28}$)($Q_{29}$), or any combination thereof;

—N($Q_{31}$)($Q_{32}$), —Si($Q_{33}$)($Q_{34}$)($Q_{35}$), —B($Q_{36}$)($Q_{37}$), or —P(═O)($Q_{38}$)($Q_{39}$); or any combination thereof, and $Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl, —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_2$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

9. The composition of claim 8, wherein in Formula 1, $Y_1$ is O or S, $Y_2$ to $Y_4$ are each a chemical bond, $X_1$ and $X_3$ are each C, and $X_2$ and $X_4$ are each N.

10. The composition of claim 8, wherein

Het1 in Formula 2 is a group represented by one of Formulae 2-1 to 2-42:

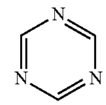
2-1

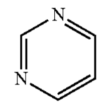
2-2

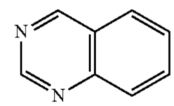
2-3

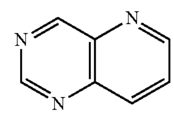
2-4

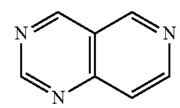
2-5

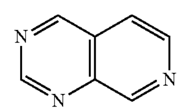
2-6

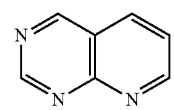
2-7

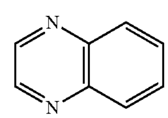
2-8

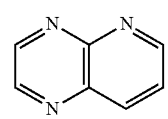
2-9

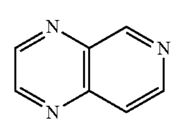
2-10

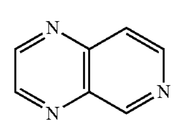
2-11

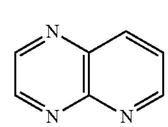
2-12

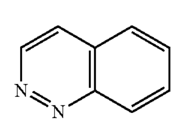
2-13

-continued
2-14
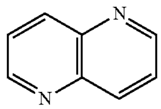
2-15
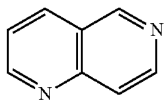
2-16
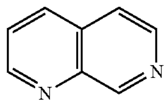
2-17
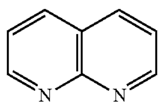
2-18
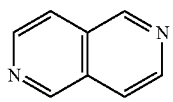
2-19
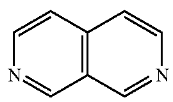
2-20
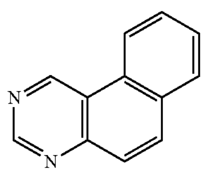
2-21
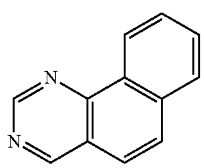
2-22
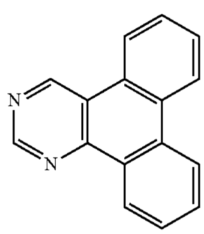
2-23
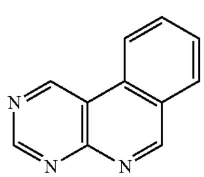
2-24
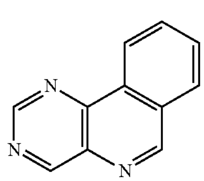
-continued
2-25
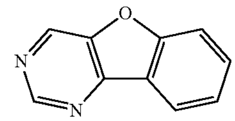
2-26
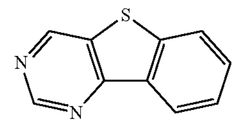
2-27
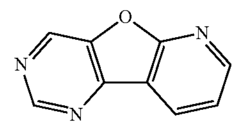
2-28
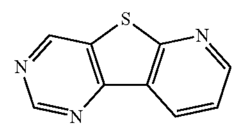
2-29
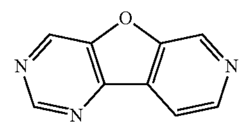
2-30
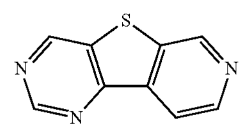
2-31
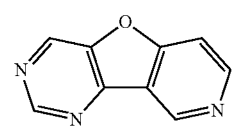
2-32
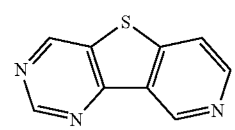
2-33
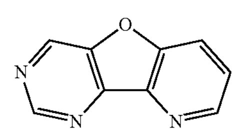
2-34
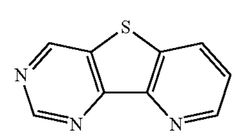
2-35
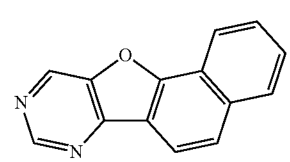

-continued
2-36
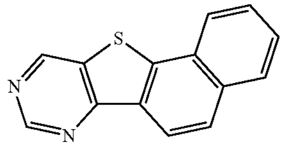
2-37
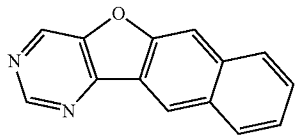
2-38
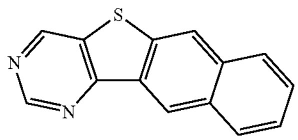
2-39
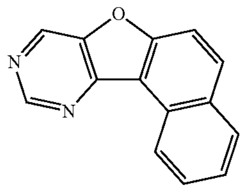
2-40
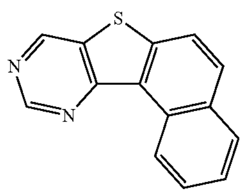
2-41
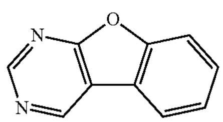
2-42
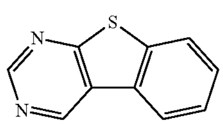
.
11. The composition of claim 8, wherein a group represented by
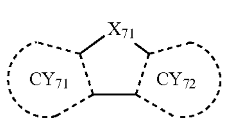
in Formula 3-1 is a group represented by one of Formulae 3(1) to 3(96):
3(1)
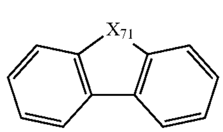
-continued
3(2)
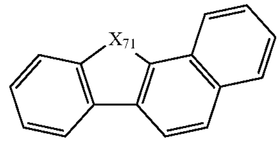
3(3)
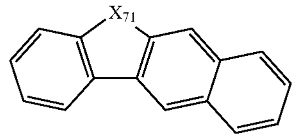
3(4)
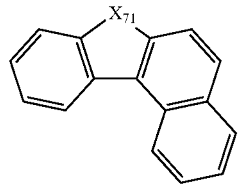
3(5)
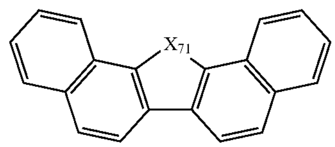
3(6)
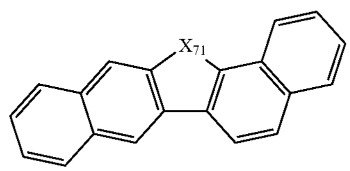
3(7)
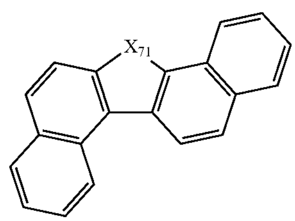
3(8)
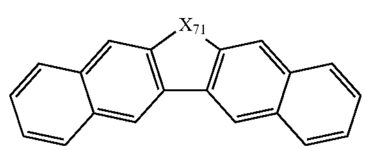
3(9)
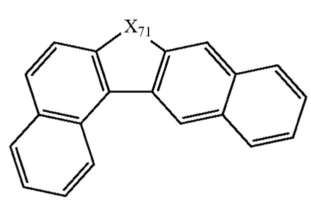
3(10)
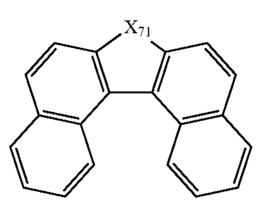

-continued
3(11)
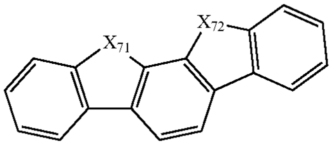
3(12)
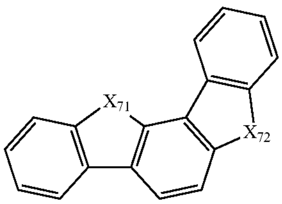
3(13)
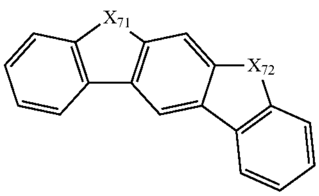
3(14)
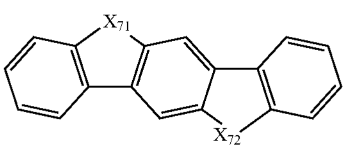
3(15)
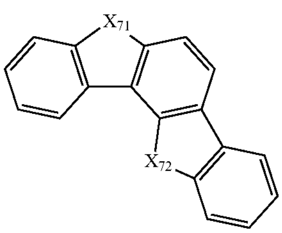
3(16)
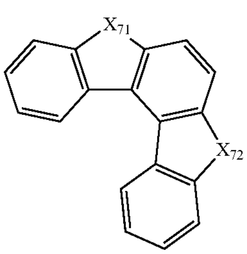
3(17)
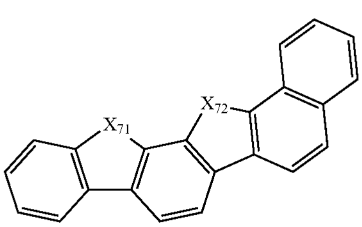
3(18)
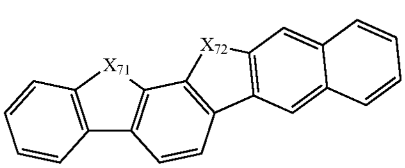
-continued
3(19)
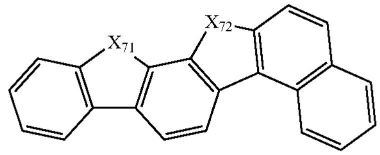
3(20)
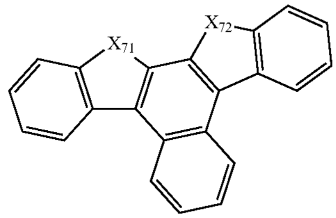
3(21)
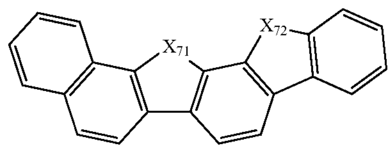
3(22)
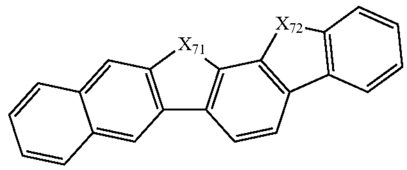
3(23)
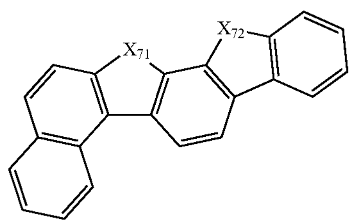
3(24)
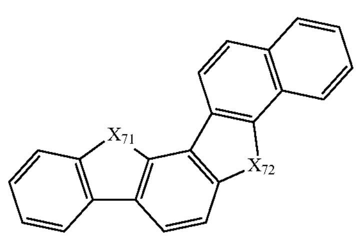
3(25)
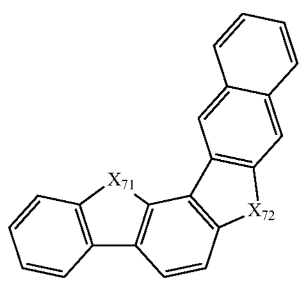

-continued
3(26)
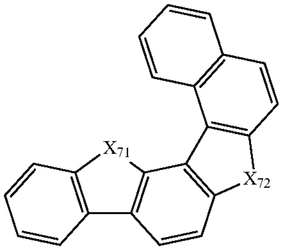
3(27)
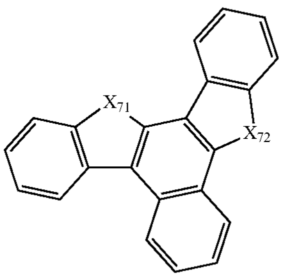
3(28)
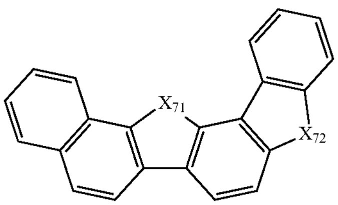
3(29)
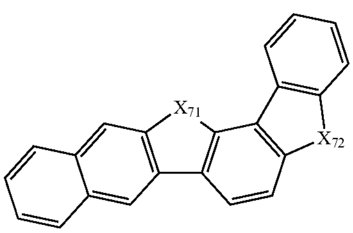
3(30)
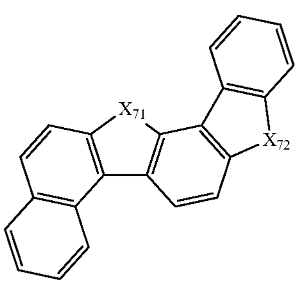
3(31)
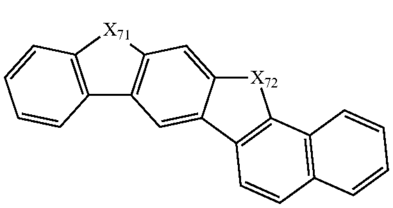
-continued
3(32)
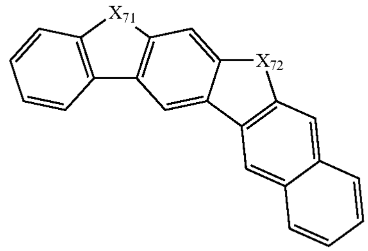
3(33)
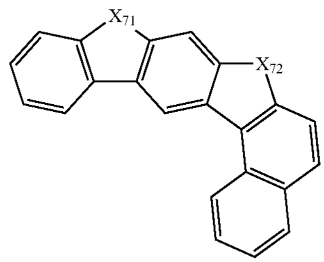
3(34)
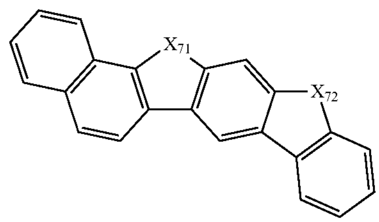
3(35)
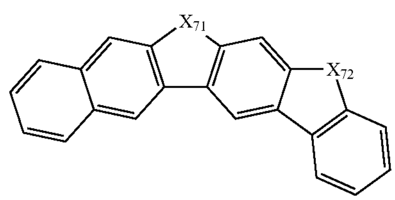
3(36)
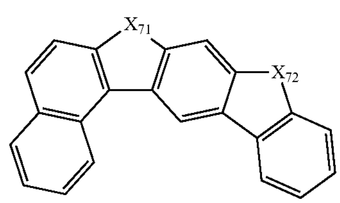
3(37)
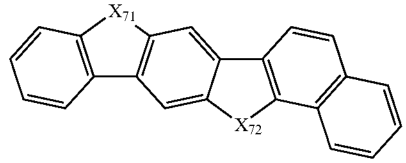
3(38)
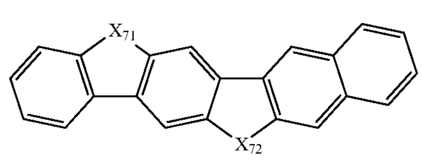

-continued
3(39)
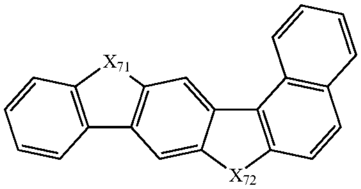
3(40)
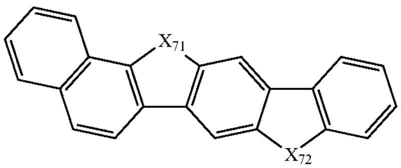
3(41)
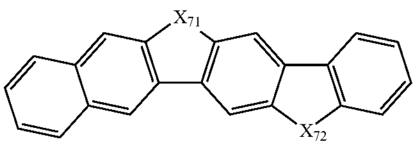
3(42)
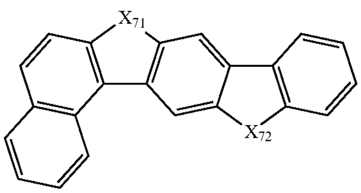
3(43)
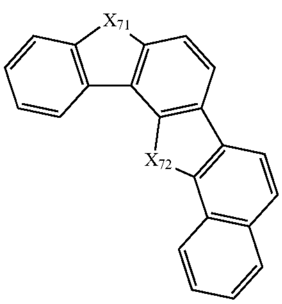
3(44)
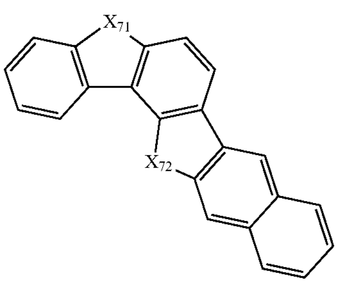
3(45)
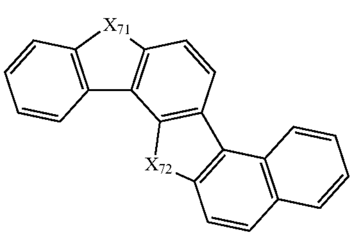
-continued
3(46)
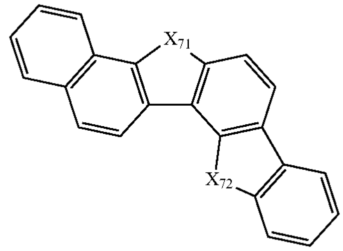
3(47)
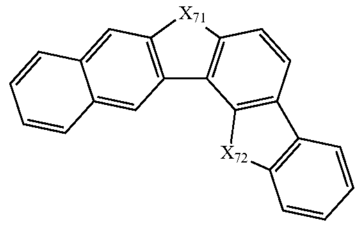
3(48)
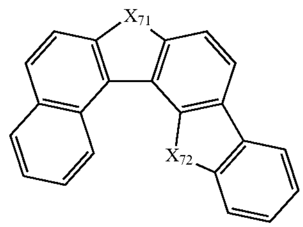
3(49)
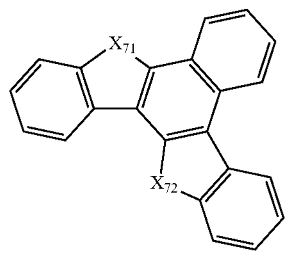
3(50)
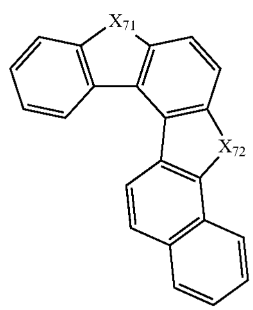
3(51)
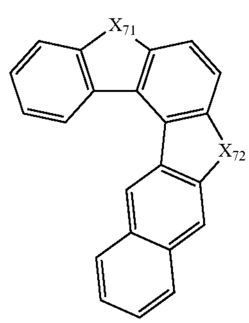

-continued
3(52)
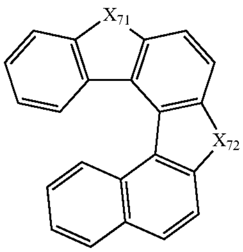
3(53)
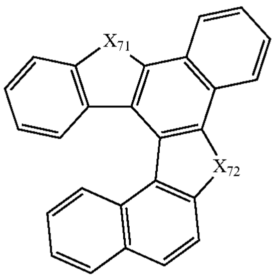
3(54)
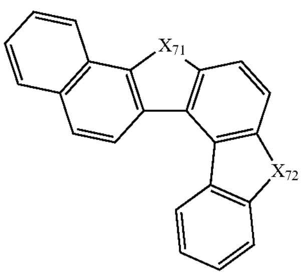
3(55)
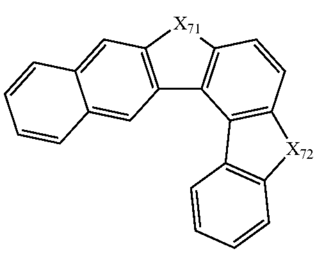
3(56)
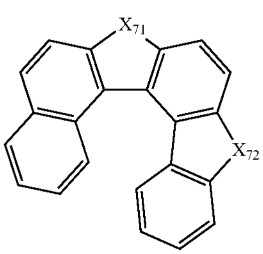
3(57)
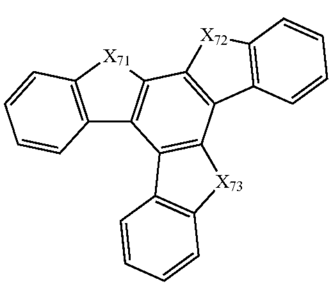
-continued
3(58)
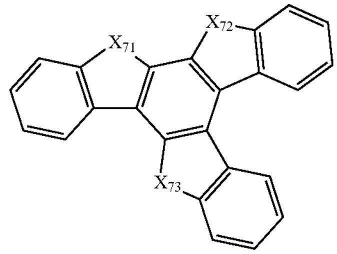
3(59)
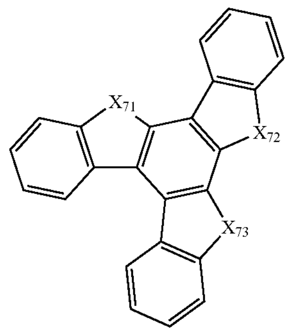
3(60)
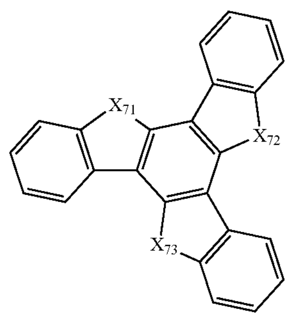
3(61)
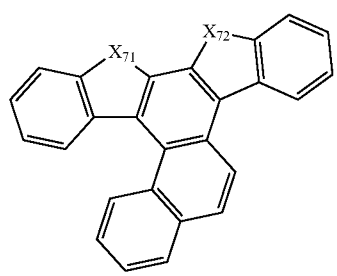
3(62)
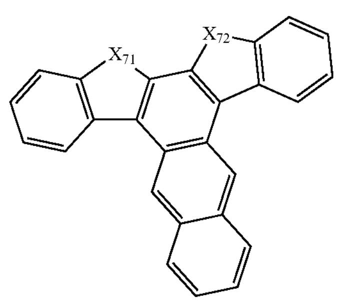

-continued
3(63)
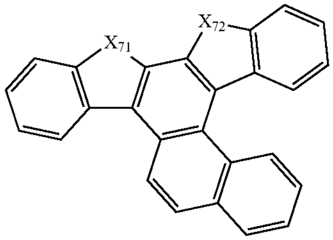
3(64)
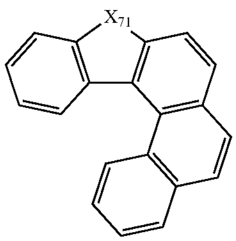
3(65)
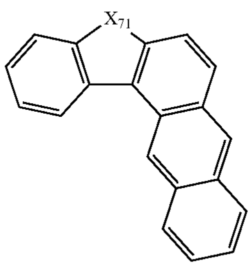
3(66)
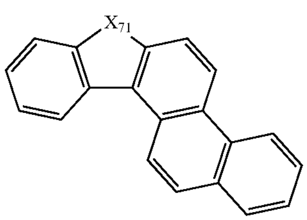
3(67)
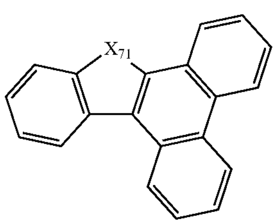
3(68)
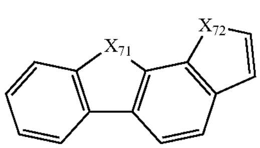
3(69)
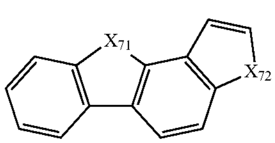
3(70)
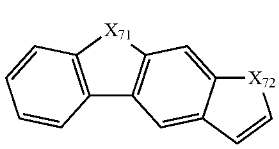
-continued
3(71)
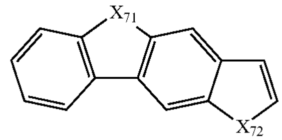
3(72)
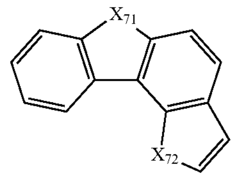
3(73)
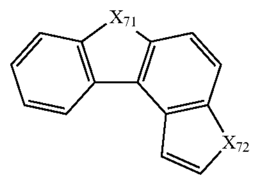
3(74)
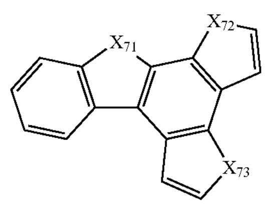
3(75)
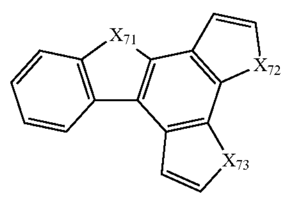
3(76)
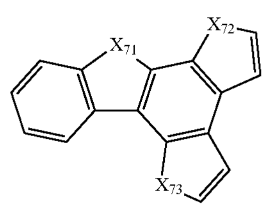
3(77)
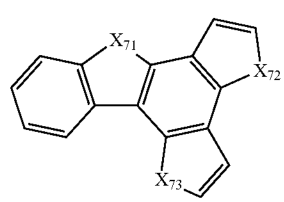
3(78)
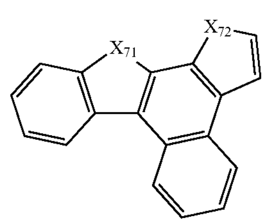

-continued
3(79)
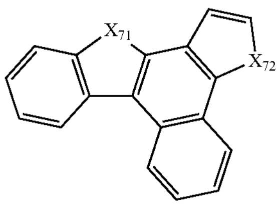
3(80)
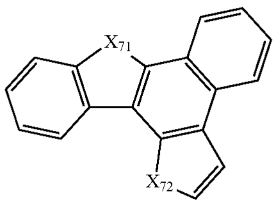
3(81)
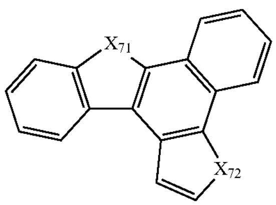
3(82)
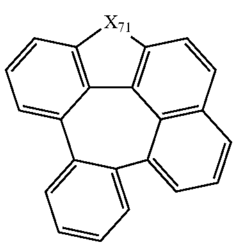
3(83)
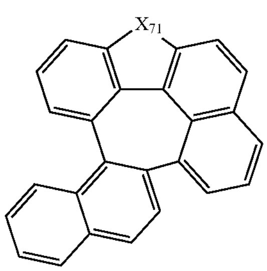
3(84)
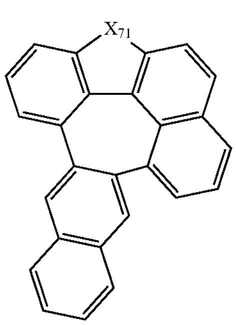
-continued
3(85)
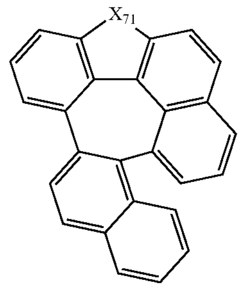
3(86)
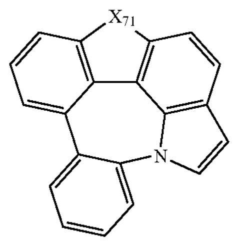
3(87)
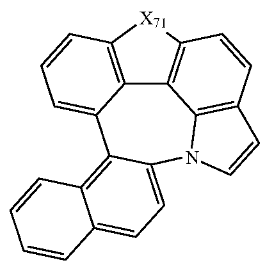
3(88)
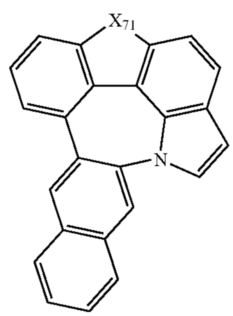
3(89)
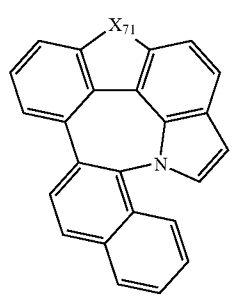
3(90)
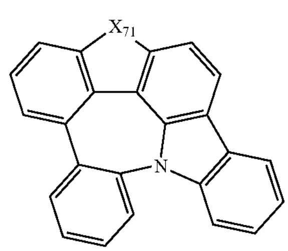

-continued

3(91)

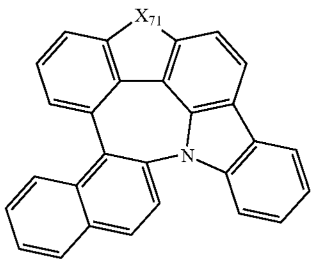

3(92)

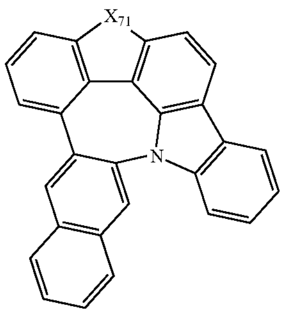

3(93)

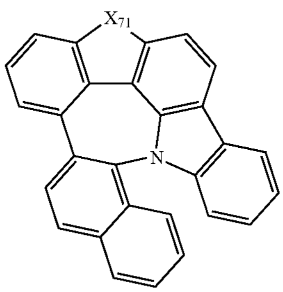

3(94)

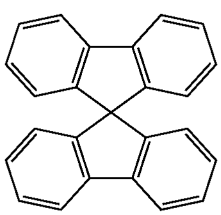

3(95)

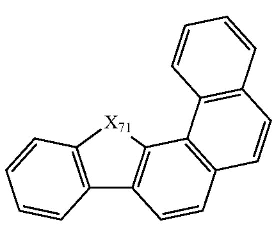

3(96)

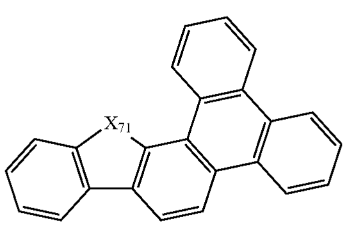

, wherein, in Formulae 3(1) to 3(96), $X_{71}$ is the same as defined in claim 8, $X_{72}$ is O, S, $N(R_{78a})$, $C(R_{78a})(R_{78b})$, or $Si(R_{78a})(R_{78b})$, $X_{73}$ is O, S, $N(R_{79a})$, $C(R_{79a})(R_{79b})$, or $Si(R_{79a})(R_{79b})$, and $R_{78a}$, $R_{78b}$, $R_{79a}$, and $R_{79b}$ are each the same as defined in connection with $R_{71}$ in claim 8.

12. The composition of claim 8, wherein in Formula 1, a1 to a4 are each independently an integer from 1 to 20, and at least one of $R_1$ to $R_4$ is each independently a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, or —$B(Q_6)(Q_7)$.

13. The composition of claim 8, wherein i) $L_{75}$, $L_{79}$, and $L_{81}$ to $L_{87}$ in Formulae 3-1 to 3-4 are each independently a π-electron-rich $C_3$-$C_{30}$ cyclic group unsubstituted or substituted with deuterium, a $C_1$-$C_{20}$ alkyl group, a $C_1$-$C_{20}$ alkoxy group, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, a tetraphenyl group, —$N(Q_{31})(Q_{32})$, or any combination thereof, or ii) $L_{79}$ in Formula 3-1 is a single bond, $R_{71}$, $R_{72}$, $R_{75}$, $R_{76}$, and $R_{81}$ to $R_{86}$ in Formulae 3-1 to 3-4 are each independently:

hydrogen or deuterium;

a $C_1$-$C_{20}$ alkyl group unsubstituted or substituted with deuterium, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, a tetraphenyl group, —$N(Q_{31})(Q_{32})$, or any combination thereof;

a π-electron-rich $C_3$-$C_{30}$ cyclic group unsubstituted or substituted with deuterium, a $C_1$-$C_{20}$ alkyl group, a $C_1$-$C_{20}$ alkoxy group, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, a tetraphenyl group, —$N(Q_{31})(Q_{32})$, or any combination thereof; or

—$N(Q_1)(Q_2)$.

14. The composition of claim 8, wherein the Pt-containing organometallic compound is a compound represented by Formula 1-1 or 1-2:

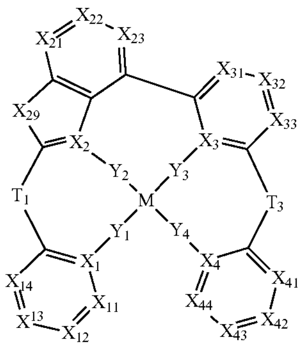

1-1

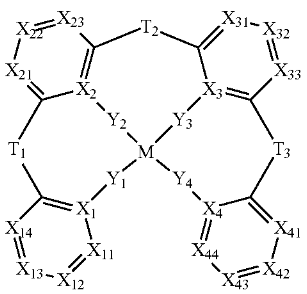

1-2 wherein, in Formulae 1-1 and 1-2,

M, $Y_1$ to $Y_4$, $X_1$ to $X_4$, and $T_1$ to $T_3$ are each the same as defined in claim 8, $X_{11}$ is N or C-[$(L_{11})_{b11}$-$(R_{11})_{c11}$], $X_{12}$ is N or C-[$(L_{12})_{b12}$-$(R_{12})_{c12}$], $X_{13}$ is N or C-[$(L_{13})_{b13}$-$(R_{13})_{c13}$], and $X_{14}$ is N or C-[$(L_{14})_{b14}$-$(R_{14})_{c14}$], $L_{11}$ to $L_{14}$, b11 to b14, $R_{11}$ to $R_{14}$, and c11 to c14 are each the same as defined in connection with $L_1$, b1, $R_1$, and c1 in claim 8, respectively, $X_{21}$ is N or C-[$(L_{21})_{b21}$-$(R_{21})_{c21}$], $X_{22}$ is N or C-[$(L_{22})_{b22}$-$(R_{22})_{c22}$], and $X_{23}$ is N or C-[$(L_{23})_{b23}$-$(R_{23})_{c23}$], $L_{21}$ to $L_{23}$, b21 to b23, $R_{21}$ to $R_{23}$, and c21 to c23 are each the same as defined in connection with $L_2$, b2, $R_2$, and c2 in claim 8, respectively, $X_{29}$ is O, S, C($R_{27}$)($R_{28}$), Si($R_{27}$)($R_{28}$), or N-[$(L_{29})_{b29}$-$(R_{29})_{c29}$], $R_{27}$ to $R_{29}$ are each the same as defined in connection with $R_2$ in claim 8, and $L_{29}$, b29, and c29 are each the same as defined in connection with $L_2$, b2, and c2 in claim 8, respectively, $X_{31}$ is N or C-[$(L_{31})_{b31}$-$(R_{31})_{c31}$], $X_{32}$ is N or C-[$(L_{32})_{b32}$-$(R_{32})_{c32}$], and $X_{33}$ is N or C-[$(L_{33})_{b33}$-$(R_{33})_{c33}$], $L_{31}$ to $L_{33}$, b31 to b33, $R_{31}$ to $R_{33}$, and c31 to c33 are each the same as defined in connection with $L_3$, b3, $R_3$, and c3 in claim 8, respectively, $X_{41}$ is N or C-[$(L_{41})_{b41}$-$(R_{41})_{c41}$], $X_{42}$ is N or C-[$(L_{42})_{b42}$-$(R_{42})_{c42}$], $X_{43}$ is N or C-[$(L_{43})_{b43}$-$(R_{43})_{c43}$], and $X_{44}$ is N or C-[$(L_{44})_{b44}$-$(R_{44})_{c44}$], $L_{41}$ to $L_{44}$, b41 to b44, $R_{41}$ to $R_{44}$, and c41 to c44 are each the same as defined in connection with $L_4$, b4, $R_4$, and c4 in claim 8, respectively, two of $R_{11}$ to $R_{14}$ are optionally linked to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, two of $R_{21}$ to $R_{23}$ are optionally linked to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, two of $R_{31}$ to $R_{33}$ are optionally linked to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, and two of $R_{41}$ to $R_{44}$ are optionally linked to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

15. The composition of claim 1, wherein the composition satisfies Equation 1 and Equation 2 below:

$$\text{HOMO(H2)} > \text{HOMO(D)} \quad \text{Equation 1}$$

$$\text{HOMO(H3)} > \text{HOMO(D)}, \quad \text{Equation 2}$$

wherein, in Equations 1 and 2,

HOMO (H2) is an absolute value of a HOMO energy level of the second compound,

HOMO (H3) is an absolute value of a HOMO energy level of the third compound,

HOMO (D) is an absolute value of a HOMO energy level of the Pt-containing organometallic compound, and the HOMO energy level of the Pt-containing organometallic compound is measured using a photoelectron spectrometer in air.

16. The composition of claim 15, wherein the difference between the absolute value of the HOMO energy level of the second compound and the absolute value of the HOMO energy level of the Pt-containing organometallic compound is 0.05 eV to 0.6 eV, and the difference between the absolute value of the HOMO energy level of the third compound and the absolute value of the HOMO energy level of the Pt-containing organometallic compound is 0.05 eV to 0.6 eV.

17. An organic light-emitting device comprising:

a first electrode;

a second electrode; and an organic layer disposed between the first electrode and the second electrode and including an emission layer, wherein the organic layer includes the composition of claim 1.

18. The organic light-emitting device of claim 17, wherein the emission layer includes the composition.

19. The organic light-emitting device of claim 18, wherein the emission layer includes a dopant and a host, the dopant includes the platinum-containing organometallic compound of the composition, and the host includes the first compound of the composition, the second compound of the composition, and the third compound of the composition.

20. The organic light-emitting device of claim 18, wherein the emission layer emits green light.

* * * * *